United States Patent
Nataraj et al.

(10) Patent No.: US 7,246,198 B2
(45) Date of Patent: Jul. 17, 2007

(54) CONTENT ADDRESSABLE MEMORY WITH PROGRAMMABLE WORD WIDTH AND PROGRAMMABLE PRIORITY

(75) Inventors: Bindiganavale S. Nataraj, Cupertino, CA (US); Nilesh A. Gharia, San Jose, CA (US); Rupesh R. Roy, Santa Clara, CA (US); Jose P. Pereira, Cupertino, CA (US); Varadarajan Srinivasan, Los Altos Hills, CA (US); Sandeep Khanna, Santa Clara, CA (US); Hok F. Wong, Cupertino, CA (US)

(73) Assignee: NetLogic Microsystems, Inc., Mountain View, CA (US)

( * ) Notice: Subject to any disclaimer, the term of this patent is extended or adjusted under 35 U.S.C. 154(b) by 0 days.

(21) Appl. No.: 11/154,066

(22) Filed: Jun. 15, 2005

(65) Prior Publication Data

US 2005/0262295 A1 Nov. 24, 2005

Related U.S. Application Data

(63) Continuation of application No. 10/000,122, filed on Oct. 31, 2001, now Pat. No. 6,934,795, which is a continuation-in-part of application No. 09/940,832, filed on Aug. 27, 2001, now Pat. No. 6,542,391, and a continuation-in-part of application No. 09/815,778, filed on Mar. 24, 2001, now Pat. No. 7,110,407, and a continuation-in-part of application No. 09/729,871, filed on Dec. 5, 2000, and a continuation-in-part of application No. 09/594,206, filed on Jun. 14, 2000, now Pat. No. 6,801,981, and a continuation-in-part of application No. 09/594,209, filed on Jun. 14, 2000, now Pat. No. 6,813,680, and a continuation-in-part of application No. 09/594,201, filed on Jun. 14, 2000, now Pat. No. 6,799,243, and a continuation-in-part of application No. 09/594,194, filed on Jun. 14, 2000, now Pat. No. 6,751,701, and a continuation-in-part of application No. 09/594,202, filed on Jun. 14, 2000, now Pat. No. 6,795,892, and a continuation-in-part of application No. 09/590,642, filed on Jun. 8, 2000, now Pat. No. 6,342,087, and a continuation-in-part of application No. 09/590,428, filed on Jun. 8, 2000, now Pat. No. 6,763,425, and a continuation-in-part of application No. 09/590,775, filed on Jun. 8, 2000, now Pat. No. 6,687,785, and a continuation-in-part of application No. 09/406,170, filed on Sep. 23, 1999, now Pat. No. 7,143,231.

(51) Int. Cl.
*G06F 13/00* (2006.01)

(52) U.S. Cl. .................. 711/108; 711/212; 711/221

(58) Field of Classification Search .................. 711/108
See application file for complete search history.

(56) References Cited

U.S. PATENT DOCUMENTS 3,257,646 A 6/1966 Roth (Continued)

FOREIGN PATENT DOCUMENTS

EP 0267612 A2 5/1988

(Continued)

OTHER PUBLICATIONS

Advanced Micro Devices, "Final Am99C10A 256×48 Content Addressable Memory" Publication No. 08125, Rev. G, Dec. 1992, pp. 1-21.

(Continued)

*Primary Examiner*—Reba I. Elmore
(74) *Attorney, Agent, or Firm*—Shemwell Mahamedi, LLP

(57) ABSTRACT

A content addressable memory (CAM) device including a CAM array and a priority index table. The CAM array has a plurality of rows of CAM cells, each row including a plurality of row segments and being adapted to store a data word that spans a selectable number of the row segments. The priority index table is coupled to the plurality of rows of CAM cells and is adapted to store a plurality of priority numbers, each priority number being indicative of a priority of a corresponding data word stored in the CAM array.

23 Claims, 41 Drawing Sheets

U.S. PATENT DOCUMENTS

| | | |
|---|---|---|
| 3,353,159 A | 11/1967 | Lee, III |
| 3,602,899 A | 8/1971 | Lindquist et al. |
| 3,675,211 A | 7/1972 | Raviv |
| 3,685,020 A | 8/1972 | Meade |
| 3,868,642 A | 2/1975 | Sachs |
| 3,949,368 A | 4/1976 | West |
| 4,030,077 A | 6/1977 | Florence |
| 4,112,502 A | 9/1978 | Schueneman |
| 4,159,538 A | 6/1979 | Motsch |
| 4,244,033 A | 1/1981 | Hattori |
| 4,464,732 A | 8/1984 | Clark |
| 4,472,805 A | 9/1984 | Wacyk et al. |
| 4,523,301 A | 6/1985 | Kadota |
| 4,575,818 A | 3/1986 | Almy et al. |
| 4,611,280 A | 9/1986 | Linderman |
| 4,622,653 A | 11/1986 | McElroy |
| 4,646,271 A | 2/1987 | Uchiyama |
| 4,656,626 A | 4/1987 | Yudichak et al. |
| 4,670,858 A | 6/1987 | Almy |
| 4,747,080 A | 5/1988 | Yamada |
| 4,758,982 A | 7/1988 | Price |
| 4,780,845 A | 10/1988 | Threewitt |
| 4,785,398 A | 11/1988 | Joyce et al. |
| 4,791,606 A | 12/1988 | Threewitt et al. |
| 4,813,002 A | 3/1989 | Joyce et al. |
| 4,845,668 A | 7/1989 | Sano et al. |
| 4,888,731 A | 12/1989 | Chuang et al. |
| 4,896,261 A | 1/1990 | Nolan |
| 4,903,234 A | 2/1990 | Sakaraba et al. |
| 4,928,260 A | 5/1990 | Chuang et al. |
| 4,958,377 A | 9/1990 | Takahashi |
| 4,959,811 A | 9/1990 | Szczepanek |
| 4,975,873 A | 12/1990 | Nakabayashi et al. |
| 4,991,134 A | 2/1991 | Ivsin |
| 4,996,666 A | 2/1991 | Duluk, Jr. |
| 5,010,516 A | 4/1991 | Oates |
| 5,014,195 A | 5/1991 | Farrell et al. |
| 5,036,486 A | 7/1991 | Noguchi et al. |
| 5,051,948 A | 9/1991 | Watabe et al. |
| 5,053,991 A | 10/1991 | Burrows |
| 5,068,822 A | 11/1991 | Lawrence |
| 5,072,422 A | 12/1991 | Rachels |
| 5,107,501 A | 4/1992 | Zorian |
| 5,111,427 A | 5/1992 | Kobayashi et al. |
| 5,123,105 A | 6/1992 | Wyland et al. |
| 5,226,005 A | 7/1993 | Lee et al. |
| 5,239,642 A | 8/1993 | Gutierrez et al. |
| 5,247,688 A | 9/1993 | Ishigami |
| 5,265,100 A | 11/1993 | McClure et al. |
| 5,317,756 A | 5/1994 | Komatsu et al. |
| 5,319,589 A | 6/1994 | Yamagata et al. |
| 5,319,590 A | 6/1994 | Montoye |
| 5,319,763 A | 6/1994 | Ho et al. |
| 5,325,501 A | 6/1994 | Carlstedt |
| 5,339,268 A | 8/1994 | Machida |
| 5,351,208 A | 9/1994 | Jiang |
| 5,383,146 A | 1/1995 | Threewitt |
| 5,386,413 A | 1/1995 | McAuley et al. |
| 5,388,066 A | 2/1995 | Hamamoto et al. |
| 5,388,189 A | 2/1995 | Kung |
| 5,394,353 A | 2/1995 | Nusinov et al. |
| 5,396,449 A | 3/1995 | Atallah et al. |
| 5,406,508 A | 4/1995 | Hayashibara |
| 5,414,704 A | 5/1995 | Spinney |
| 5,422,838 A | 6/1995 | Lin |
| 5,423,015 A | 6/1995 | Chung |
| 5,440,709 A | 8/1995 | Edgar |
| 5,440,715 A | 8/1995 | Wyland |
| 5,440,753 A | 8/1995 | Hou et al. |
| 5,444,649 A | 8/1995 | Nemirovsky |
| 5,446,685 A | 8/1995 | Holst |
| 5,448,733 A | 9/1995 | Satoh et al. |
| 5,454,094 A | 9/1995 | Montove |
| 5,455,576 A | 10/1995 | Clark, II et al. |
| 5,465,335 A | 11/1995 | Anderson |
| 5,467,319 A | 11/1995 | Nusinov et al. |
| 5,469,161 A | 11/1995 | Bezek |
| 5,483,480 A | 1/1996 | Yoneda |
| 5,485,418 A | 1/1996 | Hiraki et al. |
| 5,490,102 A | 2/1996 | Jubran |
| 5,491,703 A | 2/1996 | Barnaby et al. |
| 5,513,134 A | 4/1996 | Cooperman et al. |
| 5,515,370 A | 5/1996 | Rau |
| 5,517,441 A | 5/1996 | Dietz et al. |
| 5,524,231 A | 6/1996 | Brown |
| 5,555,397 A | 9/1996 | Sasama et al. |
| 5,576,985 A | 11/1996 | Holtz |
| 5,592,432 A | 1/1997 | Vishlitzky et al. |
| 5,598,115 A | 1/1997 | Holst |
| 5,613,136 A | 3/1997 | Casavant et al. |
| 5,615,135 A | 3/1997 | Waclawsky et al. |
| 5,619,676 A | 4/1997 | Fukuda et al. |
| 5,621,677 A | 4/1997 | Jones |
| 5,642,114 A | 6/1997 | Komoto |
| 5,642,322 A | 6/1997 | Yoneda |
| 5,646,878 A | 7/1997 | Samra |
| 5,649,149 A | 7/1997 | Stormon et al. |
| 5,699,288 A | 12/1997 | Kim et al. |
| 5,706,224 A | 1/1998 | Srinivasan et al. |
| 5,717,901 A | 2/1998 | Sung et al. |
| 5,726,942 A | 3/1998 | Yoneda et al. |
| 5,740,098 A | 4/1998 | Adams et al. |
| 5,745,488 A | 4/1998 | Thompson et al. |
| 5,752,069 A | 5/1998 | Roberts et al. |
| 5,787,458 A | 7/1998 | Miwa |
| 5,818,786 A | 10/1998 | Yoneda |
| 5,818,873 A | 10/1998 | Wall et al. |
| 5,828,324 A | 10/1998 | Clark, II |
| 5,828,593 A | 10/1998 | Schultz et al. |
| 5,841,874 A | 11/1998 | Kempke et al. |
| 5,860,085 A | 1/1999 | Stormon et al. |
| 5,870,324 A | 2/1999 | Helwig et al. |
| 5,893,931 A | 4/1999 | Peng et al. |
| 5,920,886 A | 7/1999 | Feldmeir |
| 5,930,359 A | 7/1999 | Kempke et al. |
| 5,930,790 A | 7/1999 | Law et al. |
| 5,933,363 A | 8/1999 | Shindo |
| 5,940,852 A | 8/1999 | Rangasayee |
| 5,943,252 A | 8/1999 | Schultz et al. |
| 5,946,704 A | 8/1999 | Yoneda et al. |
| 5,949,696 A | 9/1999 | Threewitt |
| 5,949,734 A | 9/1999 | Matano |
| 5,978,885 A | 11/1999 | Clark, II |
| 5,999,435 A | 12/1999 | Henderson et al. |
| 6,000,008 A | 12/1999 | Simcoe |
| 6,006,306 A | 12/1999 | Haywood et al. |
| 6,009,504 A | 12/1999 | Krick |
| 6,011,795 A | 1/2000 | Varghese et al. |
| 6,014,732 A | 1/2000 | Naffziger |
| 6,044,005 A | 3/2000 | Gibson et al. |
| 6,065,064 A | 5/2000 | Satoh et al. |
| 6,069,573 A | 5/2000 | Clark, II et al. |
| 6,081,440 A | 6/2000 | Washburn et al. |
| 6,081,441 A | 6/2000 | Ikeda |
| 6,081,442 A | 6/2000 | Igarashi et al. |
| 6,098,147 A | 8/2000 | Mizuhara |
| 6,108,227 A | 8/2000 | Voelkel |
| 6,108,747 A | 8/2000 | Kaganoi |
| 6,115,365 A | 9/2000 | Newberg et al. |
| 6,122,702 A | 9/2000 | Pelagalli et al. |
| 6,125,049 A | 9/2000 | Nataraj |
| 6,144,574 A | 11/2000 | Kobayashi |
| 6,147,890 A | 11/2000 | Kawana et al. |
| 6,147,891 A | 11/2000 | Nataraj |

| | | | | | | |
|---|---|---|---|---|---|---|
| 6,148,364 | A | 11/2000 | Srinivasan et al. | 2003/0231630 A1 | 12/2003 | Messenger |

FOREIGN PATENT DOCUMENTS

| | | |
|---|---|---|
| EP | 0381249 A2 | 8/1990 |
| EP | 0622805 A1 | 11/1994 |
| EP | 0660332 A1 | 6/1995 |
| EP | 0774758 A2 | 5/1997 |
| EP | 0858077 | 8/1998 |
| EP | 0872802 A2 | 10/1998 |
| EP | 0918335 | 5/1999 |
| EP | 0944093 A1 | 9/1999 |
| EP | 1063827 A2 | 12/2000 |
| EP | 1096504 | 5/2001 |
| JP | 07-021785 | 1/1995 |
| JP | 08-273376 | 1/1996 |
| JP | 08-167295 | 6/1996 |
| JP | 09-279525 | 9/1997 |
| JP | 11-102589 | 4/1999 |
| WO | WO 99/31581 | 6/1999 |
| WO | WO 01/11630 A1 | 2/2001 |

| | | | |
|---|---|---|---|
| 6,154,384 | A | 11/2000 | Nataraj et al. |
| 6,161,144 | A | 12/2000 | Michels et al. |
| 6,166,938 | A | 12/2000 | Wong |
| 6,166,939 | A | 12/2000 | Nataraj et al. |
| 6,175,513 | B1 | 1/2001 | Khanna |
| 6,175,514 | B1 | 1/2001 | Henderson et al. |
| 6,181,698 | B1 | 1/2001 | Hariguchi |
| 6,191,970 | B1 | 2/2001 | Pereira |
| 6,195,701 | B1 | 2/2001 | Kaiserswerth et al. |
| 6,199,140 | B1 | 3/2001 | Srinivasan et al. |
| 6,219,748 | B1 | 4/2001 | Srinivasan et al. |
| 6,226,710 | B1 | 5/2001 | Melchior |
| 6,229,742 | B1 | 5/2001 | Srinivasan et al. |
| 6,237,061 | B1 | 5/2001 | Srinivasan et al. |
| 6,237,072 | B1 | 5/2001 | Houlsdworth |
| 6,240,000 | B1 | 5/2001 | Sywyk et al. |
| 6,240,485 | B1 | 5/2001 | Srinivasan et al. |
| 6,243,280 | B1 | 6/2001 | Wong et al. |
| 6,243,281 | B1 | 6/2001 | Pereira |
| 6,249,467 | B1 | 6/2001 | Pereira et al. |
| 6,252,789 | B1 | 6/2001 | Pereira et al. |
| 6,253,280 | B1 | 6/2001 | Voelkel |
| 6,266,262 | B1 | 7/2001 | Washburn et al. |
| 6,275,426 | B1 | 8/2001 | Srinivasan et al. |
| 6,289,414 | B1 | 9/2001 | Feldmeier et al. |
| 6,298,414 | B1 | 10/2001 | Yoshida et al. |
| 6,310,880 | B1 | 10/2001 | Waller |
| 6,317,350 | B1 | 11/2001 | Pereira et al. |
| 6,353,873 | B1 | 3/2002 | Melchior |
| 6,362,992 | B1 | 3/2002 | Cheng |
| 6,362,993 | B1 | 3/2002 | Henderson et al. |
| 6,370,613 | B1 | 4/2002 | Diede et al. |
| 6,374,326 | B1 | 4/2002 | Kansal et al. |
| 6,377,577 | B1 | 4/2002 | Bechtolsheim et al. |
| 6,381,673 | B1 | 4/2002 | Srinivasan et al. |
| 6,389,506 | B1 | 5/2002 | Ross et al. |
| 6,393,514 | B1 | 5/2002 | Khanna et al. |
| 6,418,042 | B1 | 7/2002 | Srinivasan et al. |
| 6,430,074 | B1 | 8/2002 | Srinivasan |
| 6,438,674 | B1 | 8/2002 | Perloff |
| 6,445,628 | B1 | 9/2002 | Pereira et al. |
| 6,460,112 | B1 | 10/2002 | Srinivasan et al. |
| 6,467,019 | B1 | 10/2002 | Washburn |
| 6,487,131 | B1 | 11/2002 | Clark et al. |
| 6,493,791 | B1 | 12/2002 | Akkary |
| 6,493,793 | B1 | 12/2002 | Pereira et al. |
| 6,499,081 | B1 | 12/2002 | Nataraj et al. |
| 6,502,163 | B1 | 12/2002 | Ramankutty |
| 6,539,455 | B1 | 3/2003 | Khanna et al. |
| 6,542,391 | B2 | 4/2003 | Pereira et al. |
| 6,564,289 | B2 | 5/2003 | Srinivasan et al. |
| 6,567,340 | B1 | 5/2003 | Nataraj et al. |
| 6,574,702 | B2 | 6/2003 | Khanna et al. |
| 6,588,006 | B1 | 7/2003 | Watkins |
| 6,591,331 | B1 | 7/2003 | Khanna |
| 6,597,690 | B1 | 7/2003 | Mehta et al. |
| 6,606,681 | B1 | 8/2003 | Uzun |
| 6,678,786 | B2 | 1/2004 | Srinivasan et al. |
| 6,687,785 | B1* | 2/2004 | Pereira ............. 711/108 |
| 6,697,276 | B1 | 2/2004 | Pereira et al. |
| 6,697,911 | B2 | 2/2004 | Srinivasan et al. |
| 6,700,809 | B1 | 3/2004 | Ng et al. |
| 6,711,049 | B1 | 3/2004 | Hsu et al. |
| 6,732,227 | B1 | 5/2004 | Baumann |
| 6,763,425 | B1* | 7/2004 | Pereira ............. 711/108 |
| 6,795,892 | B1* | 9/2004 | Pereira et al. ....... 711/108 |
| 6,799,243 | B1* | 9/2004 | Pereira et al. ....... 711/108 |
| 6,801,981 | B1* | 10/2004 | Pereira et al. ....... 711/108 |
| 6,934,795 | B2* | 8/2005 | Nataraj et al. ....... 711/108 |
| 2001/0053150 | A1 | 12/2001 | Clear et al. |
| 2002/0129198 | A1 | 9/2002 | Nataraj et al. |
| 2003/0056001 | A1 | 3/2003 | Mate et al. |

OTHER PUBLICATIONS

Akata et al., "A Scheduling Content-Addressable Memory for ATM Space Division Switch Control," IEEE International Solid-State Circuits Conference, Feb. 1991, New York.

Bremier-Barr et al., "Routing with a Clue", Computer Communications Review, ACM Sigcomm '99 Conference, Aug. 30, 1999-Sep. 3, 1999, p. 203-213.

Chae et al., "Content-Addressable Memory for VLSI Pattern Inspection," IEEE Journal of Solid-State Circuits, vol. 23, No. 1, Feb. 1988, pp. 74-78.

Cisco Systems, Inc., "Policy Based Routing", 1996 pp. 1-7.

Deering et al., "Internet Protocol, Version 6 (IPv6) Specification," Networking Working Group, Request for Comments: 2460, Dec. 1998, pp. 1-39.

GEC Plessey Semiconductors, "P2800 2K×64 Multi-Port Content Addressable Memory", Preliminary Information, Feb. 1997, pp. 1-15.

GEC Plessey Semiconductors, "P2800 Multi-Port Content Addressable Memory", Functional Product Specification GPS-FPS-2800-12, Jan. 1996.

Ghose et al., "Response Pipelined CAM Chips: The First Generation and Beyond," 7th International Conference on VLSI Design, Jan. 1994, pp. 365-368.

Gupta et al., "Packet Classifications on Multiple Fields," SIGCOMM (Sep. 2, 1999) 14 pages.

Gupta et al., "Routing Lookups in Hardware at Memory Access Speeds," Proc. Infocom, San Francisco, Apr. 1998, pp. 1-8.

Hayashi et al., "High Speed Table Lookup Engine for IPv6 Longest Prefix Match," IEEE Global Telecommunications Conference, 1999, pp. 1576-1581.

Huang et al., "A Fast IP-Routing Lookup Scheme for Gigabit Switching Routers," IEEE, 1999, pp. 1429-1436.

Huang et al., "A Novel IP-Routing Lookup Scheme and Hardware Architecture for Multigigabit Switching Routers," IEEE Journal on Selected Areas in Comm., vol. 17, No. 6, Jun. 1999, pp. 1093-1104.

Huang et al., Jen-Yi Pan and Chi-An Su, "A Fast IP-Routing Lookup Scheme for Gigabit Switching Routers," IEEE, 1999, pp. 1429-1436.

Jones et al., "A 9-kbit Association Memory for High Speed Parallel Processing Applications", IEEE Journal of Solid-State Circuits, vol. 23, No. 2, Apr. 1988, pp. 543-548.

Kadota et al., "An 8-kbit Content-Addressable and Reentrant Memory", IEEE Journal of Solid-State Circuits, vol. SC-20, No. 5, Oct. 1985, pp. 951-956.

Kobayashi et al., "A Longest Prefix Match Search Engine for Multi-Gigabit IP Processing," IEEE, 2000 pp. 1360-1364.

Kobayashi et al., "A 50 Mpps Longest Prefix Match Search Engine LSI for Multi-Gigabit IP Forwarding," Technical Report of IEICE, IN08-119, Nov. 1998, pp. 7-12.

Kobayashi et al., "A Processor Based High-Speed Longest Prefix Match Search Engine," IEEE 2001 pp. 233-239.

KSLI KE5B064A1 Address Processor Ver. 2.0.2 Preliminary (believed to be published late 1995 or early 1996).

KSLI KE5B064H Series Address Processor Ver. 1.0.1 (believed to be published late 1995 or early 1996).

Lakshman et al., "High-Speed Policy-Based Packet Forwarding Using Efficient Multi-Dimensional Range Matching", SIGCOMM, 1988, pp. 203-214.

Landrock et al., "Association Storage Module", IBM Technical Disclosure Bulletin, vol. 25, No. 5, Oct. 1992, pp. 2341-2342.

Lara Networks, Inc., "LNI7020 Search Engine, Version 2.0," pp. 1-129 downloaded Apr. 5, 2001 from URL http://www.st.com.

Lara Networks, Inc., "LNI7040 Search Engine, Version 1.1," pp. 1-142 downloaded Mar. 27, 2001 from URL http://www.laranetworks.com.

McAuley et al., "A Self-Testing Reconfiguration CAM", IEEE Journal of Solid-State Circuits, vol. 26, No. 3, Mar. 1991, pp. 257-261.

Mosaid Technologies Inc., "The Next Generation of Content Addressable Memories," Sep. 1999, 8 pages.

Motorola Semiconductor Technical Data, "Advance Information 16K×64 CAM", MCM69C432, Jan. 1996, pp. 4 pages.

Music Semiconductors, "MU9C1480 LANCAM Handbook" Nov. 1994.

Music Semiconductors, "MU9C1480 LANCAM" Advance Information, Mar. 22, 1990, 1-11.

Music Semiconductors, "MU9C2480 LANCAM" Preliminary Data Sheet, Aug. 25, 1995, pp. 1-24.

Music Semiconductors, "MUAA (TM) CAM Family" Advance Information, Feb. 24, 1998, Rev.O, pp. 1-16.

Music Semiconductors, Advance Information, "MUAA Routing CoProcessor (RCP) Family", (Oct. 1, 1998), Rev. 1b, pp. 1-16.

NEC Corporation, "High Speed Address Search Engine," Document No. S1345E3V0PF00 (3rd edition), Feb. 1999, 2 pgs.

Ogura et al., "A 4-kbit Associative Memory LSI", IEEE Journal of Solid-State Circuits, vol. SC-20, No. 6, Dec. 1985, pp. 1277-1284.

Ramirez-Chavez, "Encoding Don't Cares in Static and Dynamic Content-Addressable Memories", Transaction Briefs, IEEE transactions on Circuits and Systems-II: Analog and Digital Processing, vol. 39, No. 8, Aug. 1992, pp. 575-578.

Robinson, "Patterson Addressable Memory," IEEE Micro, Jun. 1992, pp. 20-30.

Schultz et al., "High-Performance CAMs for 10 GB/S and Beyond," Gibabit Ethernet Conference (GEC 2000), Mar. 27, 2000, pp. 147-154.

Shin et al., "A Special-Purpose Content Addressable Memory Chip for Real-Time Image Processing," IEEE Journal of Solid-State Circuits, vol. 27, No. 5, May 1992, pp. 737-744.

Srinivasan et al., "Fast Address Lookups Using Controlled Prefix Expansion," ACM Transactions on Computer Systems, vol. 17, No. 1, Feb. 1999, pp. 1-40.

Srinivasan et al., "Fast and Scalable Layer Switching" ACM Applications, Technologies, Architectures, and Protocols for Computer Communication, pp. 191-202, 1998.

Srinivasan et al., "Packet Classification using Tuple Space Search," SIGCOMM (Sep. 2, 1999), 12 pages.

Stardust.com, "WhitePaper—Introduction to QoS policies," 1999, pp. 1-22.

Tamaru, "The Trend of Functional Memory Development", Invited Paper Special Issue on LSI Memories IEICE Trans, Electron, vol. E76-C, No. 11, Nov. 1993, pp. 1545-1554.

Waldvogel et al., "Scalable High Speed IP Routing Lookups," ACM SIGCOMM, 1997, pp. 25-35.

Waldvogel et al., "Scalable High Speed Prefix Matching," ACM Transactions on Computer Systems, vol. 19, No. 4, Nov. 2001, pp. 440-482.

Wang et al., "Realization of Bidirection Association Memory Using a Pseudo-Parallel Searching Approach," 1995 IEEE International Conference on Neural Networks, vol. 3, pp. 1502-1507, Dec. 1995.

Xiao et al., "Internet QoS: A Big Picture", IEEE Network, Mar./Apr. 1999, pp. 8-18.

* cited by examiner

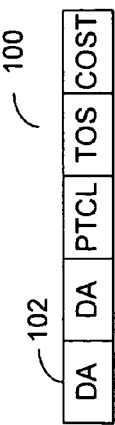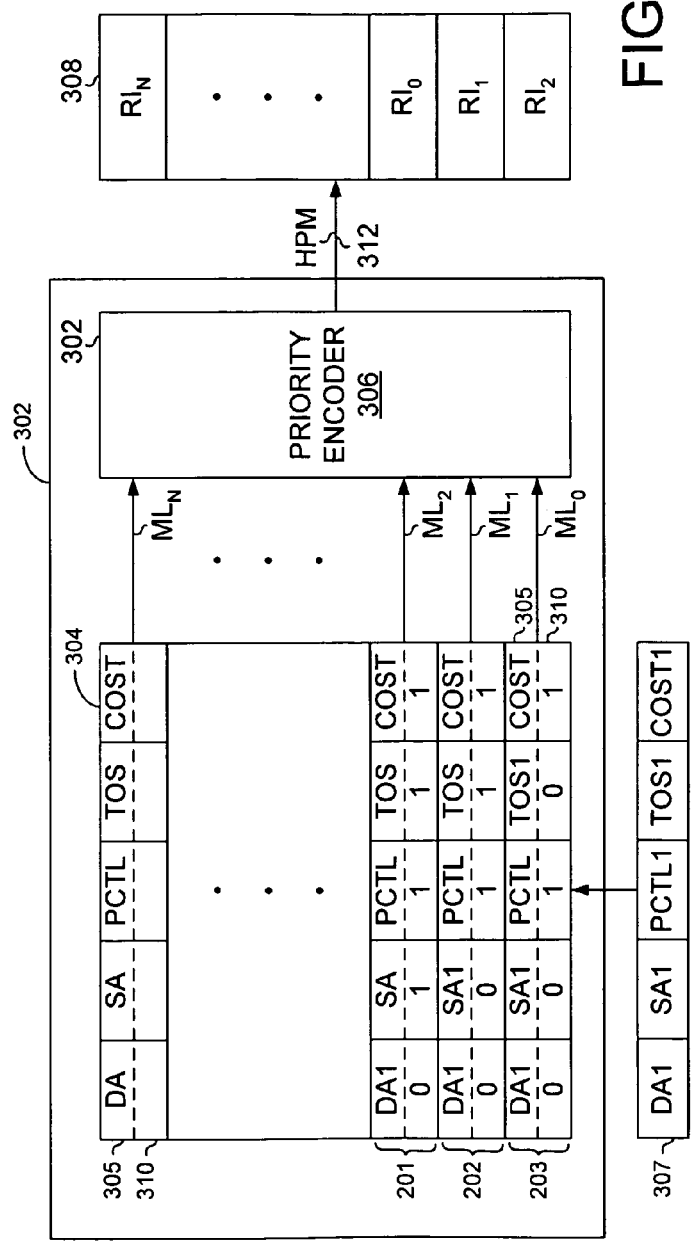

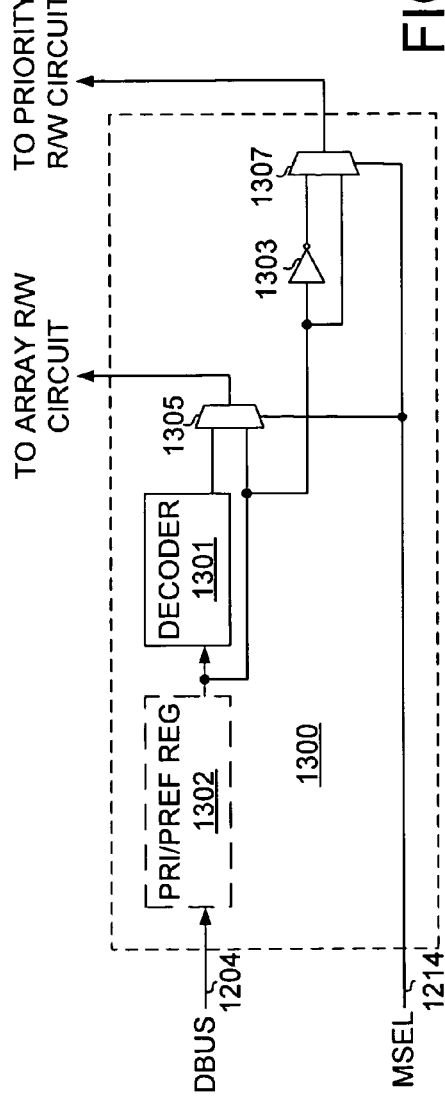
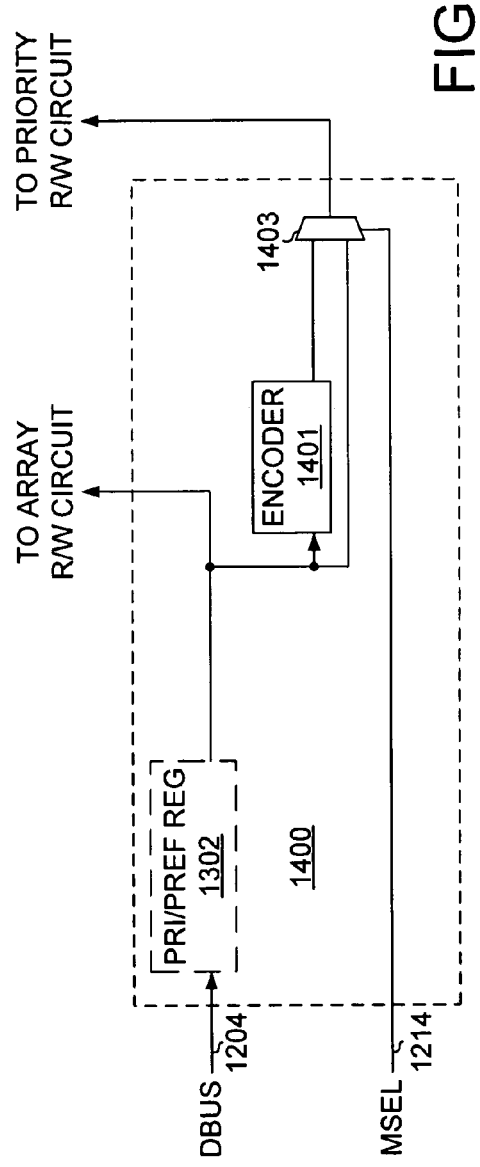
FIG. 13
FIG. 14

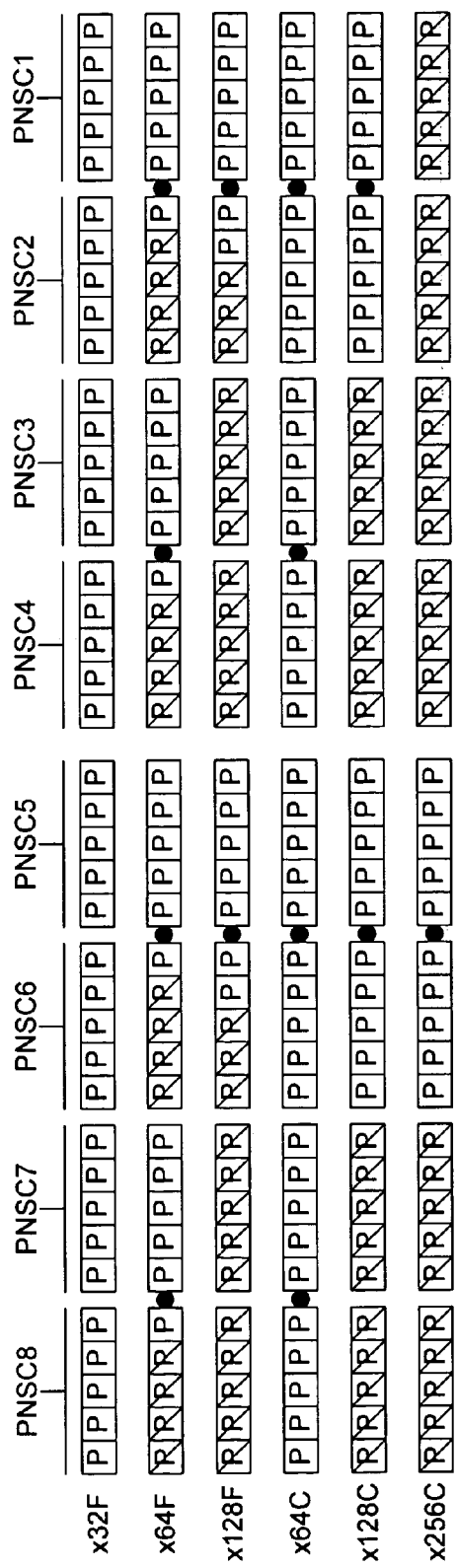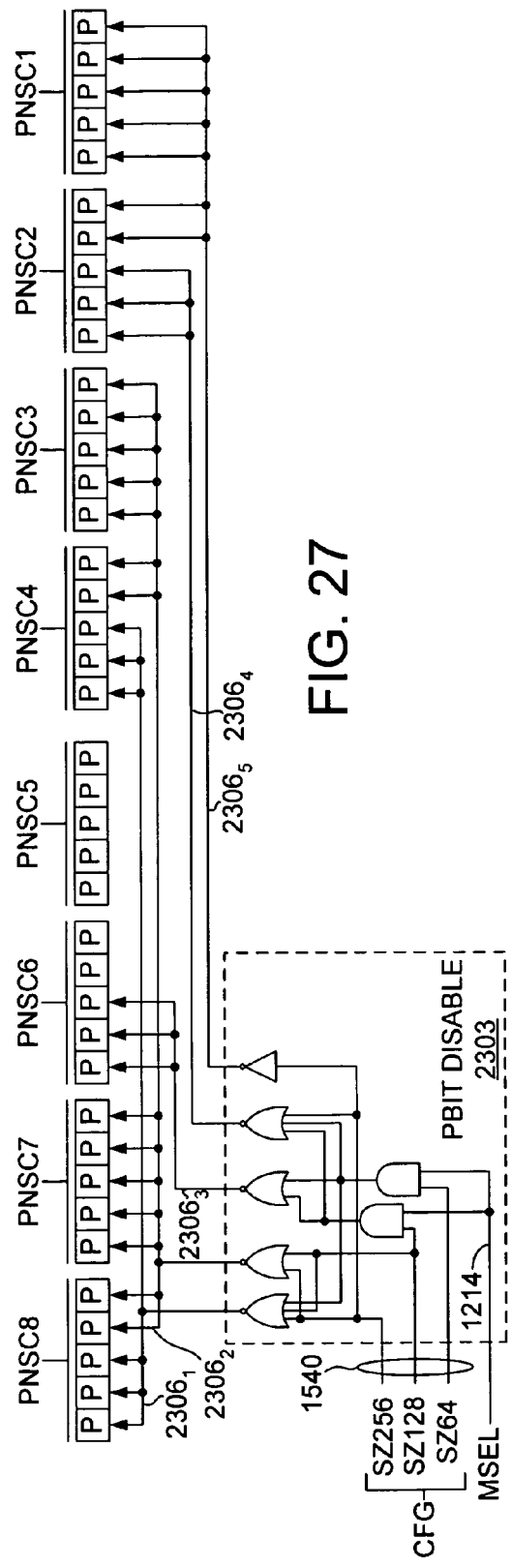
FIG. 26
FIG. 27

| x64 | x32 | $E_B$ | $W_B$ | $W_A$ | R2 | R1 |
|---|---|---|---|---|---|---|
| X | 1 | X | 0 | 0 | HP2 | HP1 |
| X | 1 | X | 0 | 1 | HP2 | HP3 |
| X | 1 | X | 1 | 0 | HP4 | HP1 |
| X | 1 | X | 1 | 1 | HP4 | HP3 |
| 1 | 0 | 0 | 0 | X | HP2 | HP1 |
| 1 | 0 | 0 | 1 | X | HP4 | HP3 |
| 1 | 0 | 1 | X | 0 | HP2 | HP1 |
| 1 | 0 | 1 | X | 1 | HP2 | HP3 |
| 0 | 0 | X | X | X | HP2 | HP1 |

| x64 | x32 | $E_D$ | $W_D$ | $W_C$ | R4 | R3 |
|---|---|---|---|---|---|---|
| X | 1 | X | 0 | 0 | HP6 | HP5 |
| X | 1 | X | 0 | 1 | HP6 | HP7 |
| X | 1 | X | 1 | 0 | HP8 | HP5 |
| X | 1 | X | 1 | 1 | HP8 | HP7 |
| 1 | 0 | 0 | 0 | X | HP6 | HP5 |
| 1 | 0 | 0 | 1 | X | HP8 | HP7 |
| 1 | 0 | 1 | X | 0 | HP6 | HP5 |
| 1 | 0 | 1 | X | 1 | HP6 | HP7 |
| 0 | 0 | X | X | X | HP6 | HP5 |

| x32 | $E_F$ | $W_F$ | $W_E$ | R6 | R5 |
|---|---|---|---|---|---|
| 1 | X | 0 | 0 | R2 | R1 |
| 1 | X | 0 | 1 | R2 | R3 |
| 1 | X | 1 | 0 | R4 | R1 |
| 1 | X | 1 | 1 | R4 | R3 |
| 0 | 0 | 0 | X | R2 | R1 |
| 0 | 0 | 1 | X | R4 | R3 |
| 0 | 1 | X | 0 | R2 | R1 |
| 0 | 1 | X | 1 | R2 | R3 |

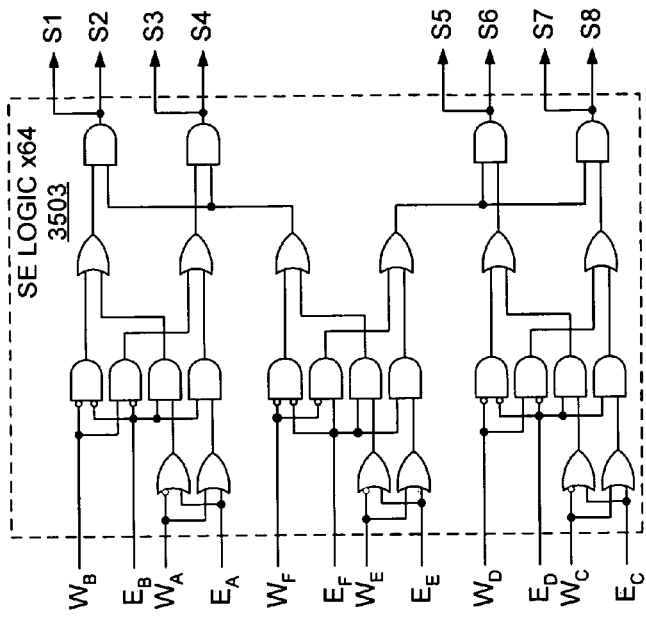
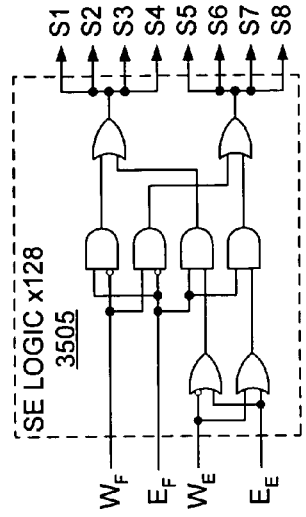
FIG. 37
FIG. 38
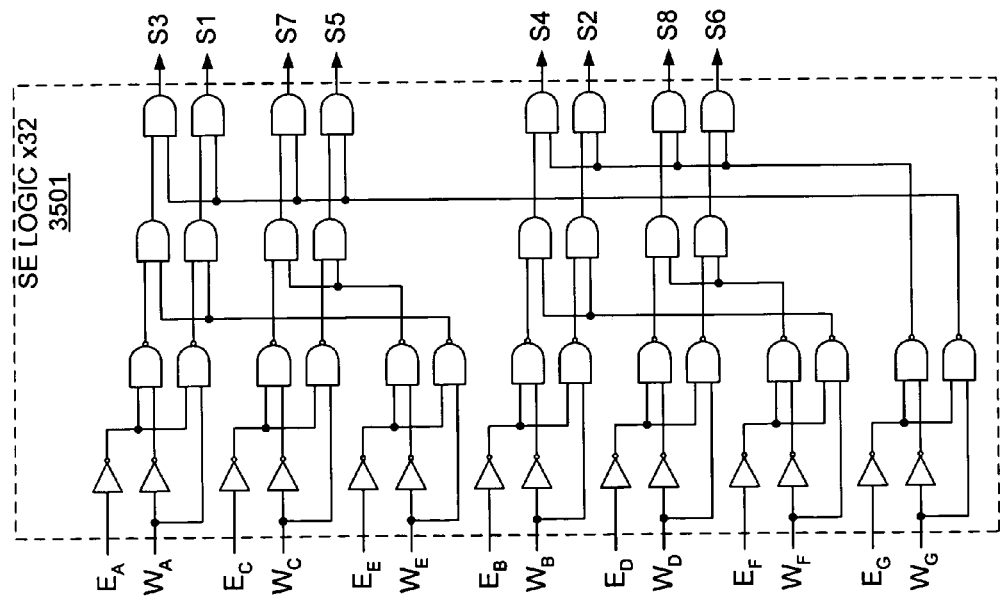
FIG. 36

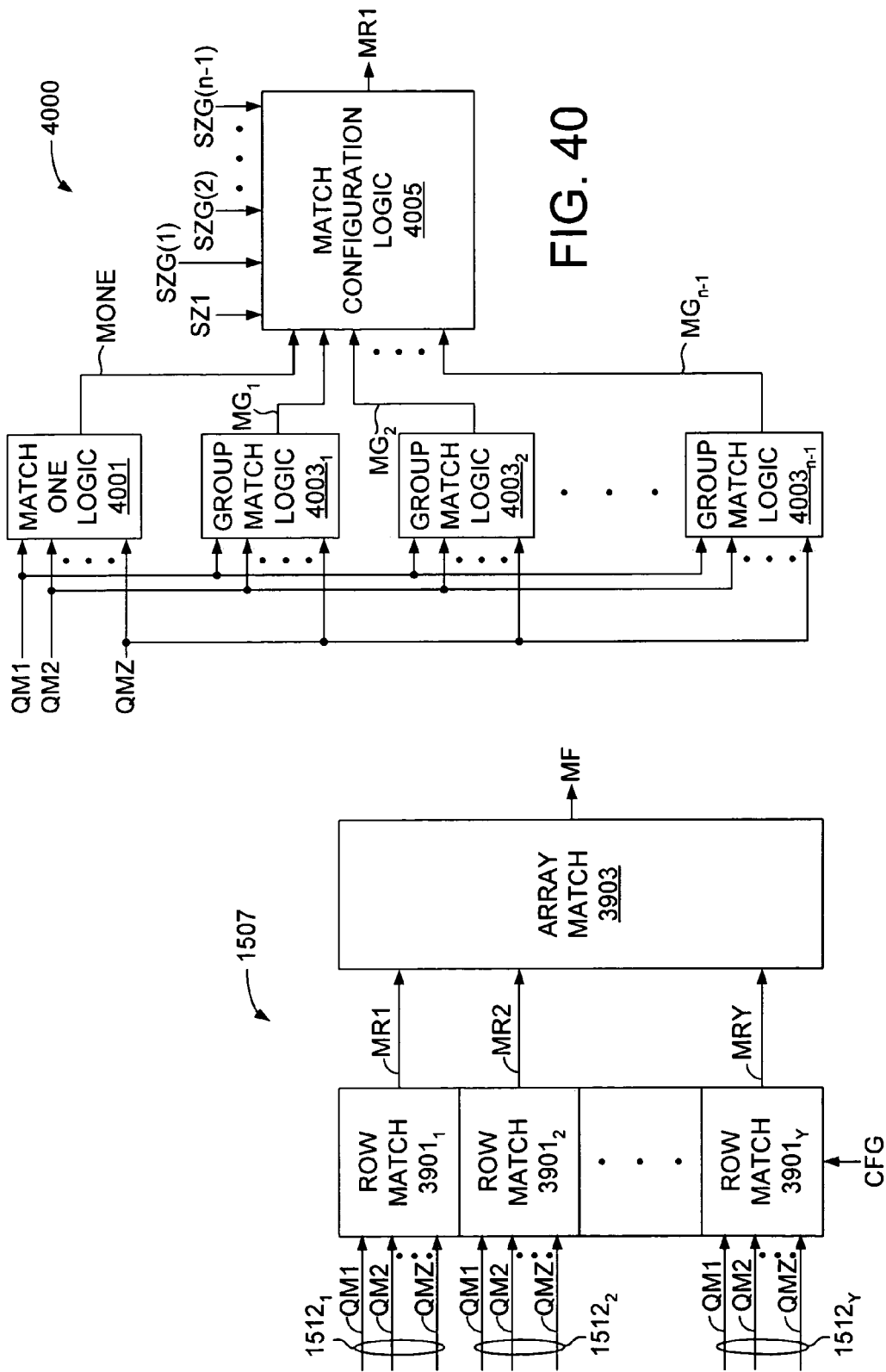

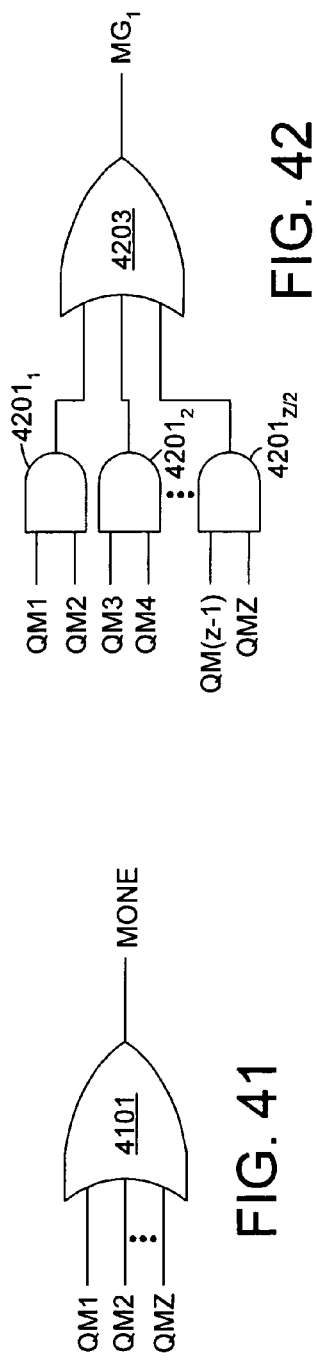
FIG. 41
FIG. 42
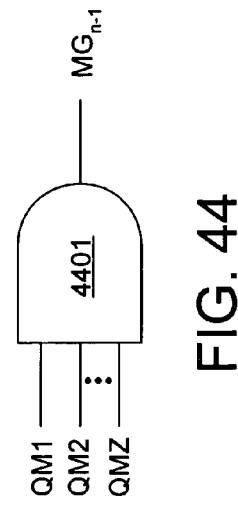
FIG. 44
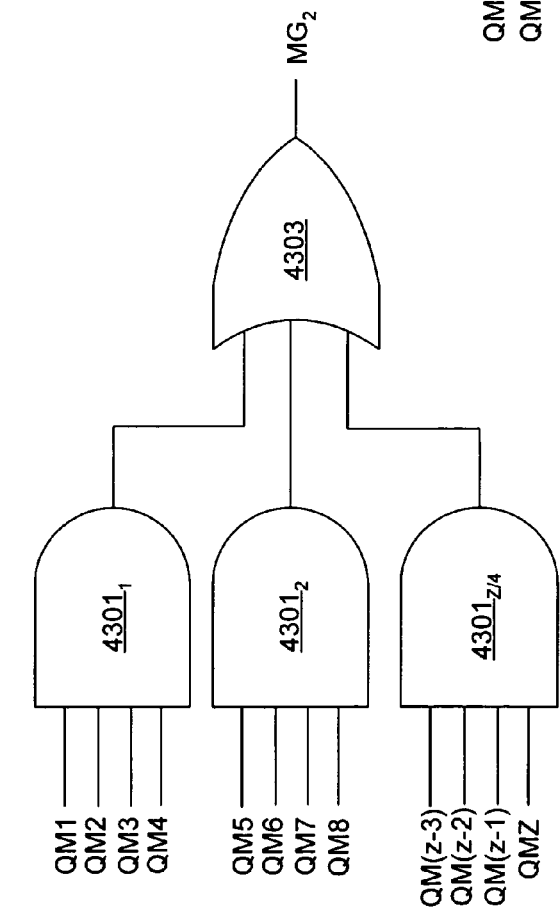
FIG. 43

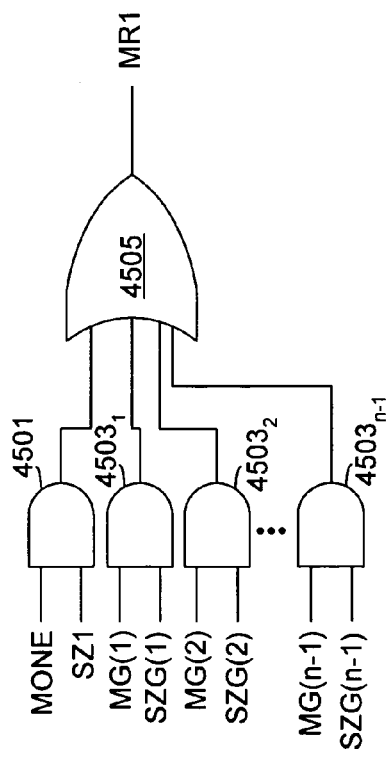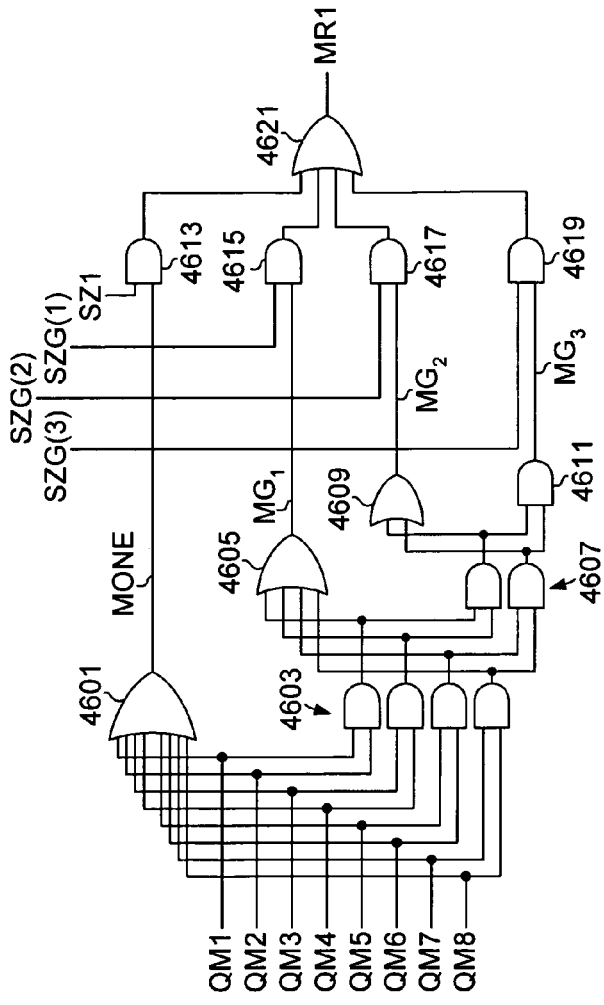
FIG. 45
FIG. 46

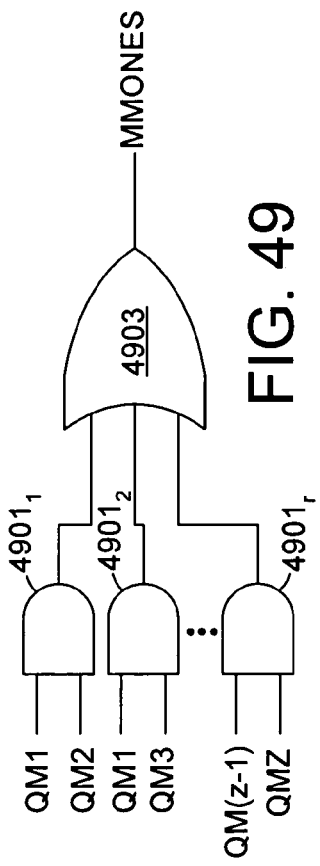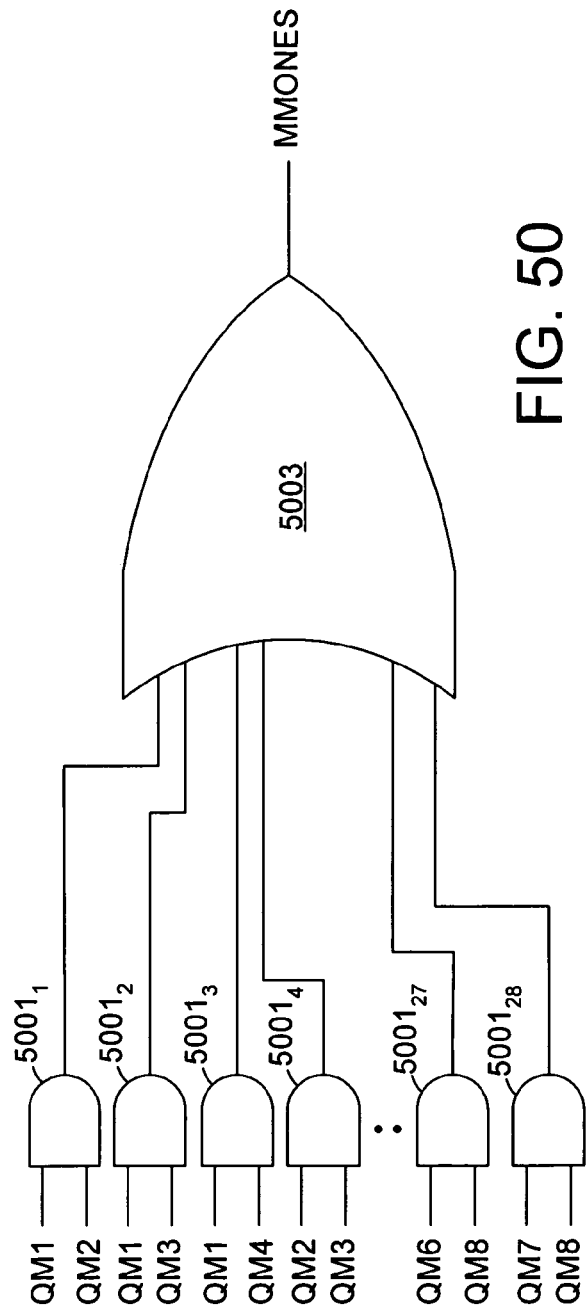

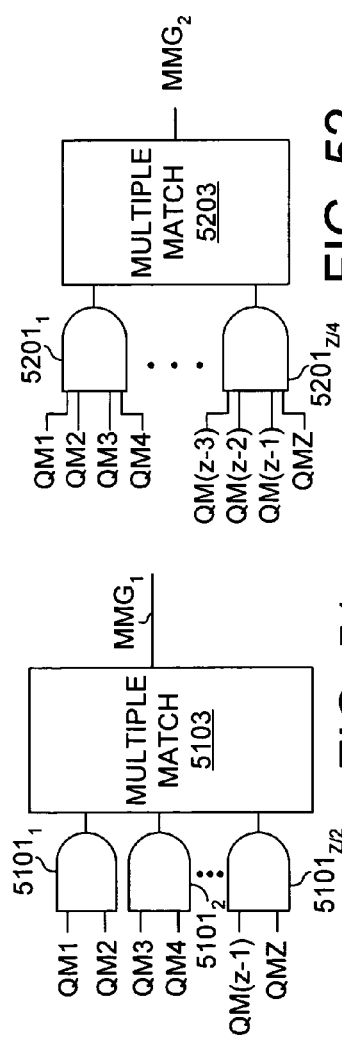
FIG. 51
FIG. 52
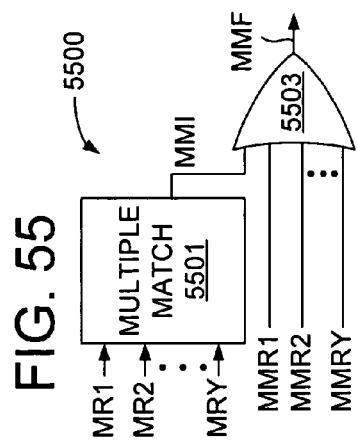
FIG. 53
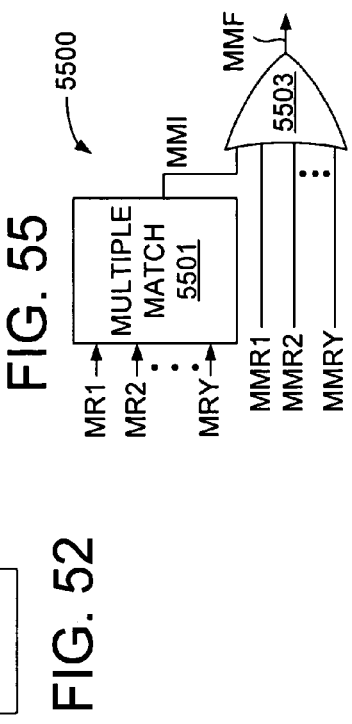
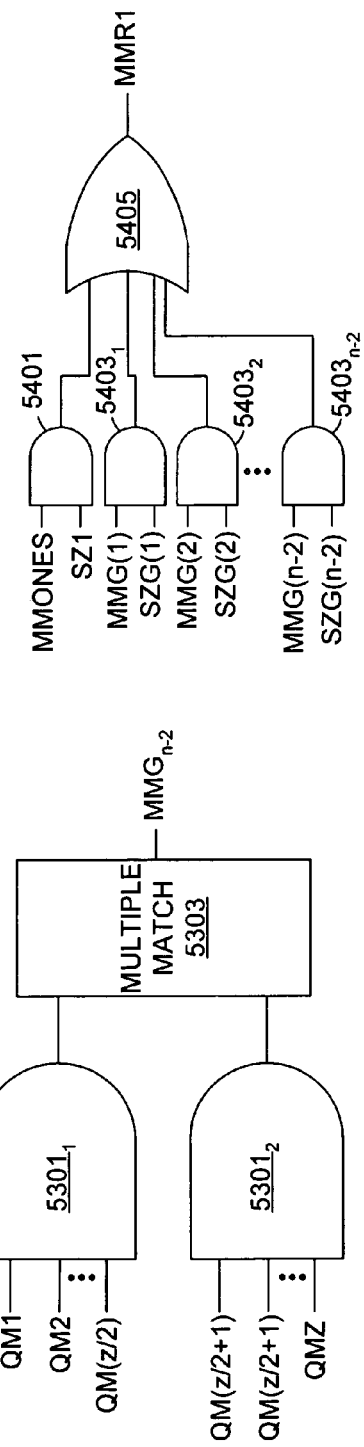
FIG. 54
FIG. 55

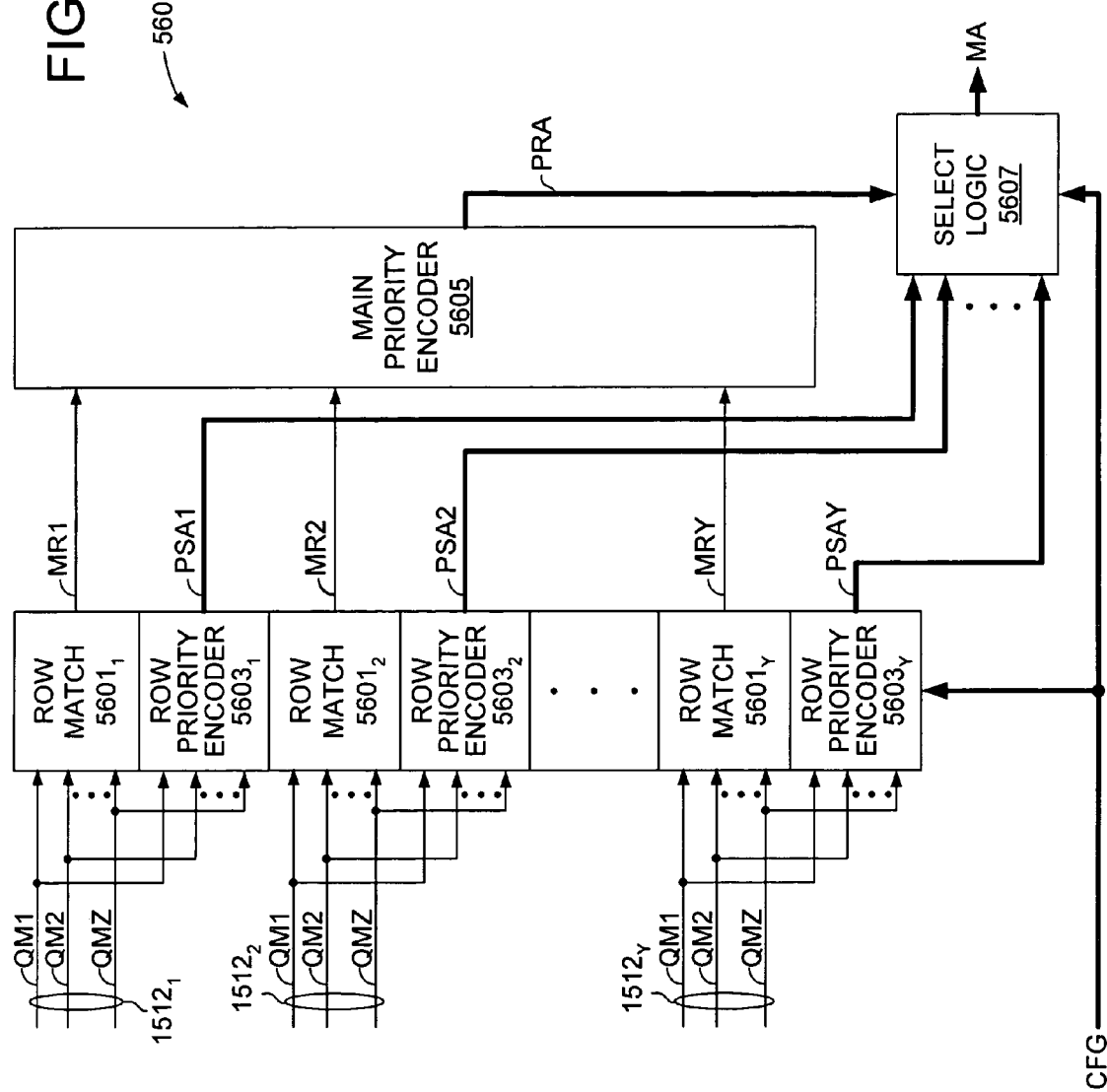

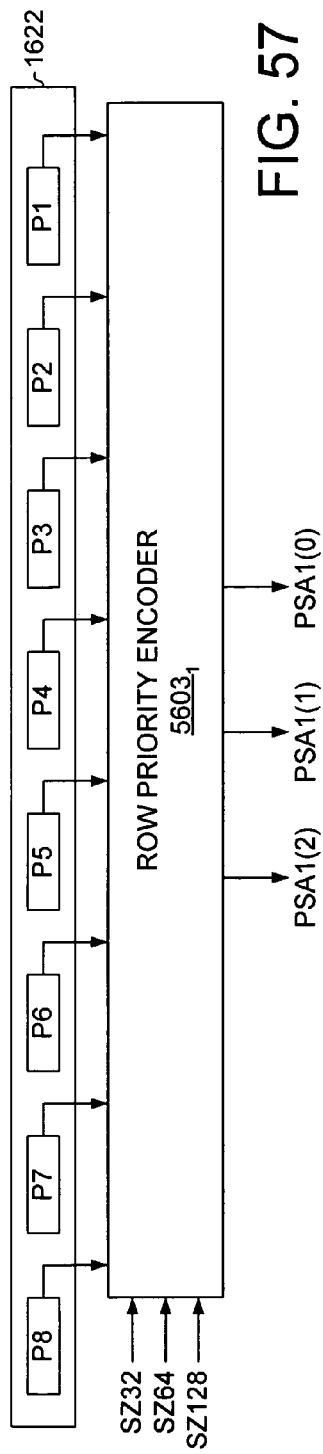

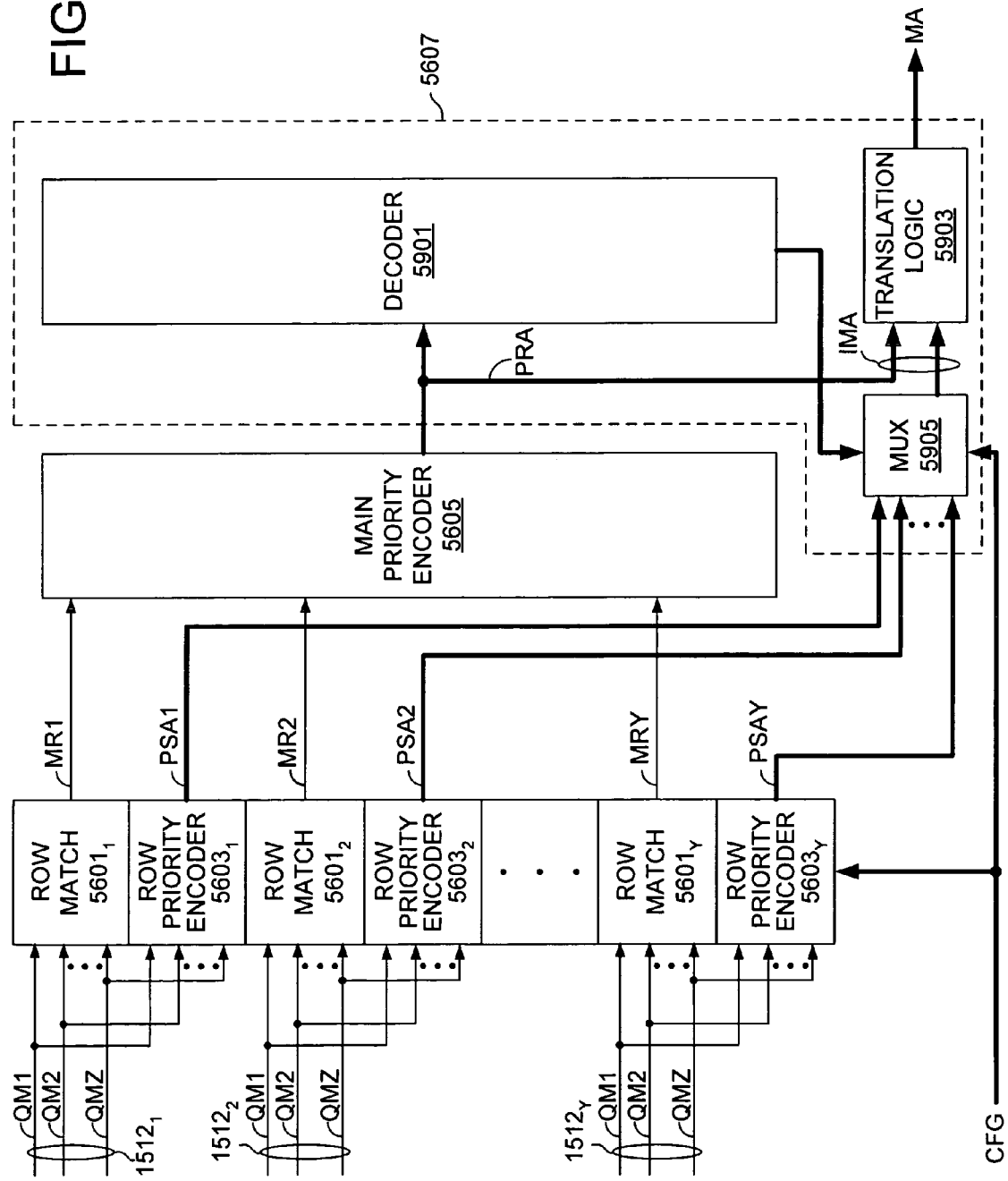

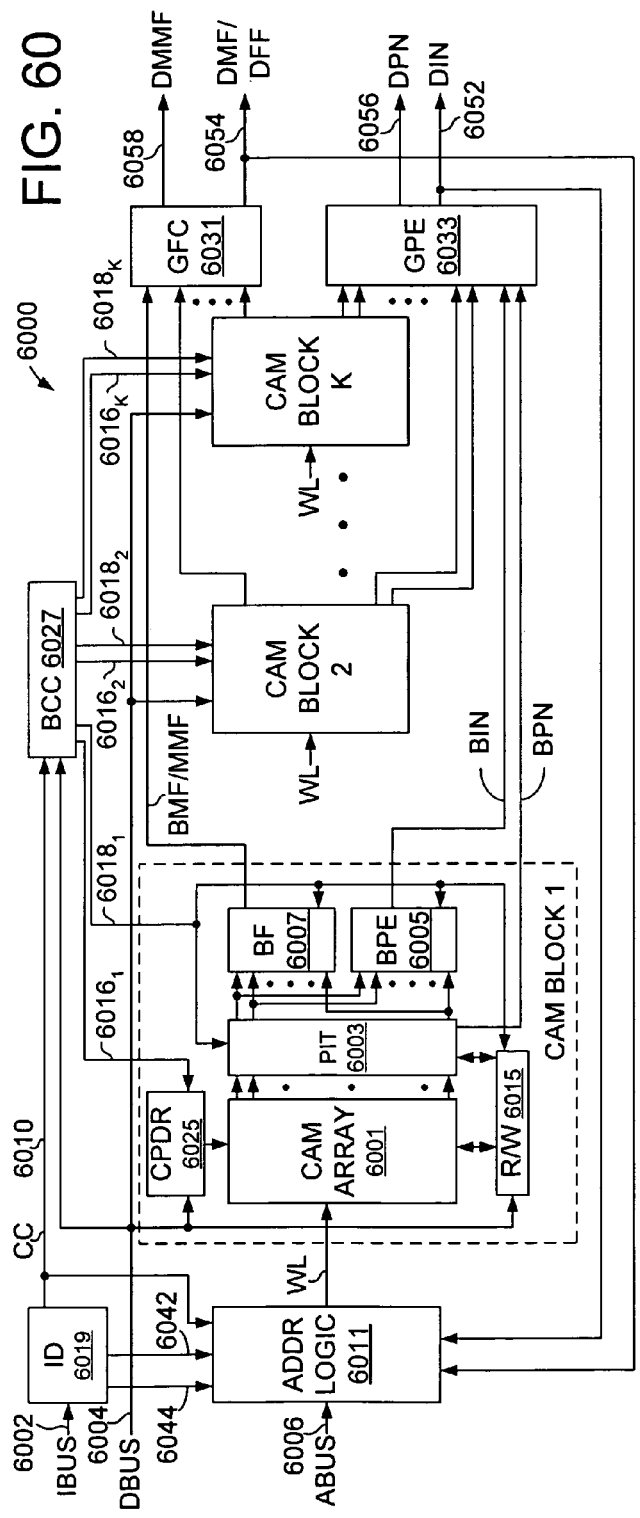
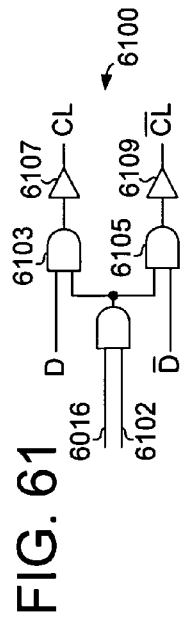
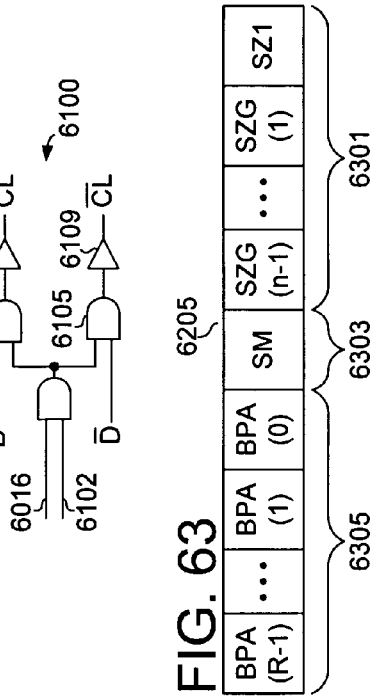
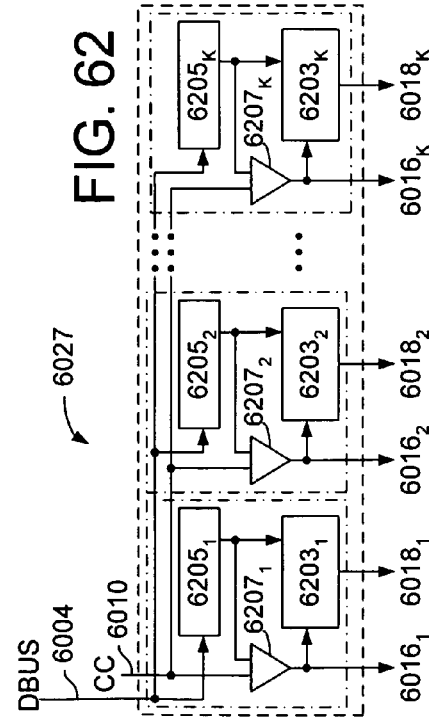

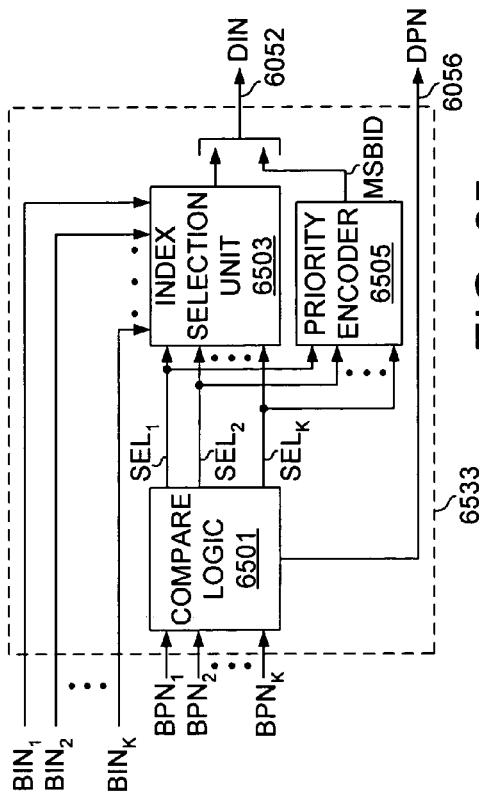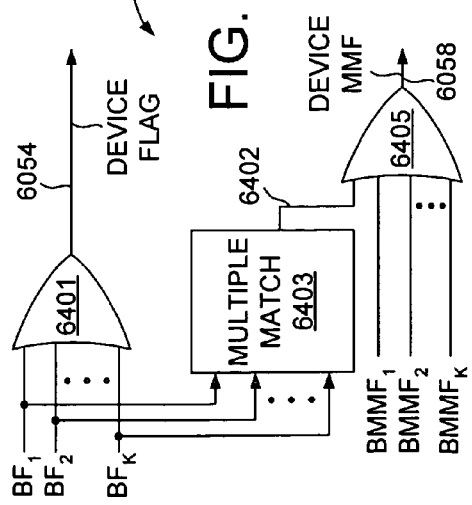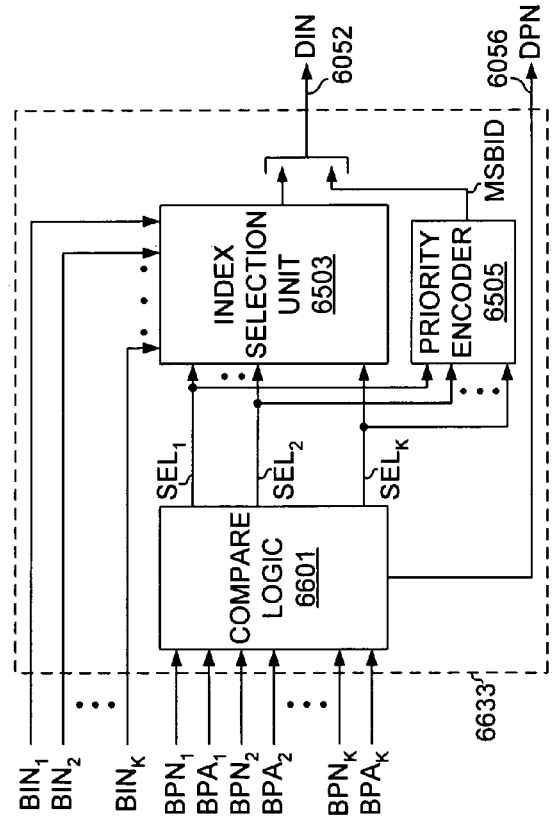

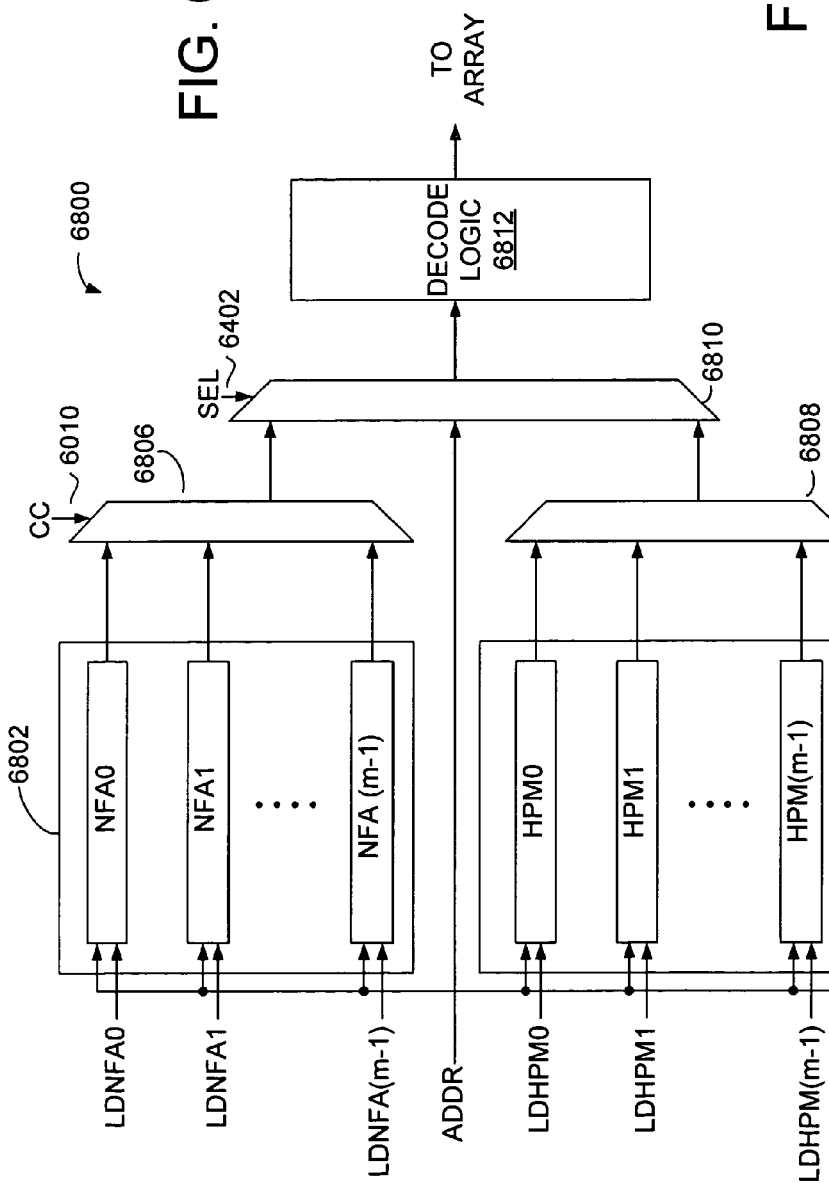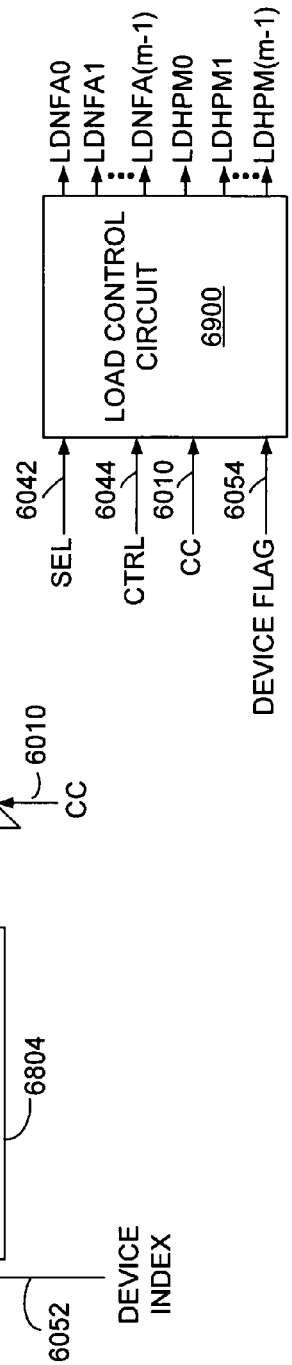

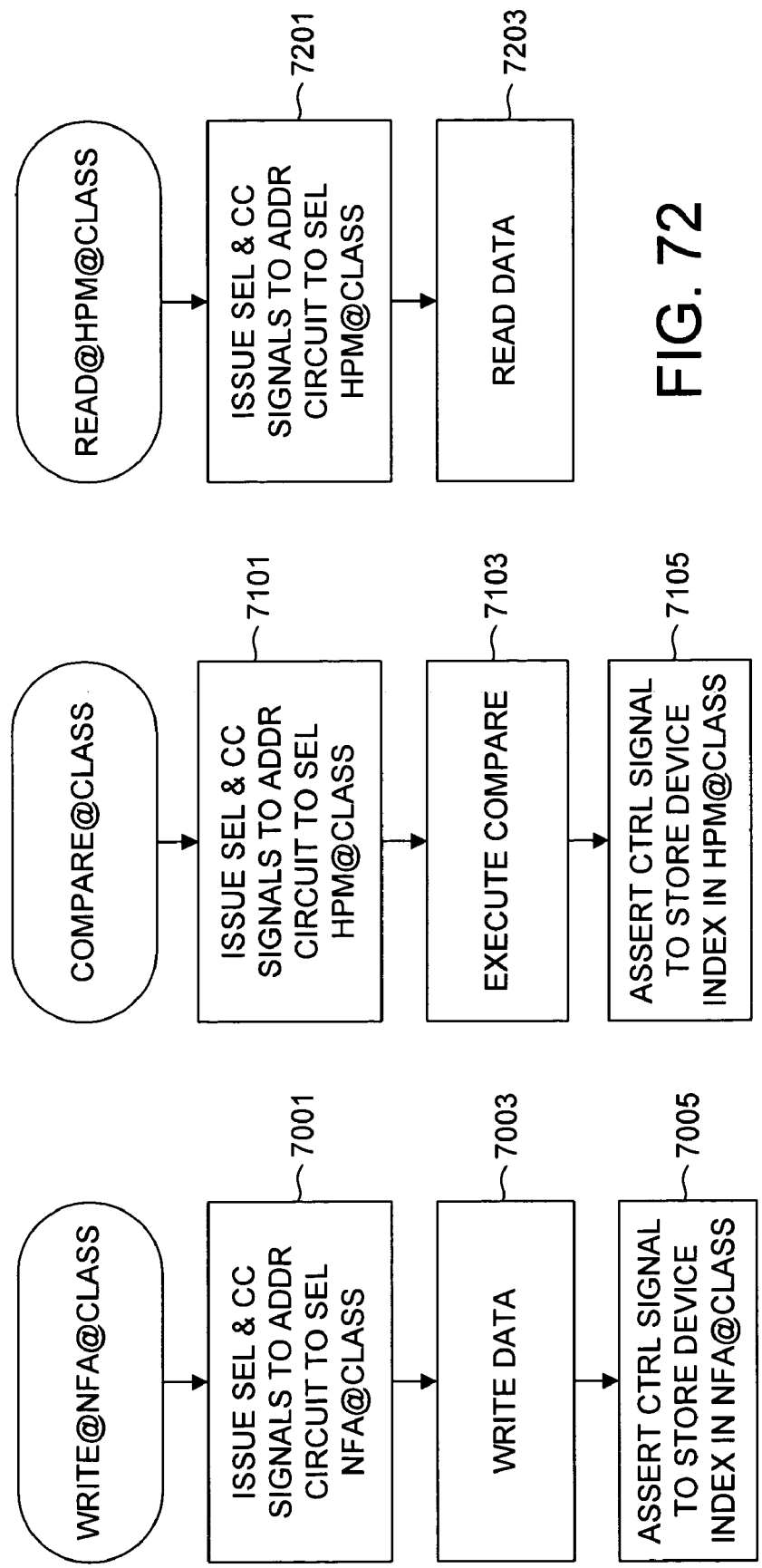

CONTENT ADDRESSABLE MEMORY WITH PROGRAMMABLE WORD WIDTH AND PROGRAMMABLE PRIORITY

CROSS-REFERENCE TO RELATED APPLICATIONS

This application is a continuation of U.S. patent application Ser. No. 10/000,122 filed Oct. 31, 2001, now U.S. Pat. No. 6,934,795 which is continuation-in-part of each of the following U.S. Patent Applications:

| Application No. | Filing Date |
| --- | --- |
| 09/406,170 now U.S. Pat. No. 7,143,231 | Sep. 23, 1999 |
| 09/590,642 (U.S. Pat. No. 6,324,087) | Jun. 8, 2000 |
| 09/590,428 (U.S. Pat. No. 6,763,425) | Jun. 8, 2000 |
| 09/590,775 (U.S. Pat. No. 6,687,785) | Jun. 8, 2000 |
| 09/594,206 (U.S. Pat. No. 6,801,981) | Jun. 14, 2000 |
| 09/594,209 (U.S. Pat. No. 6,813,680) | Jun. 14, 2000 |
| 09/594,201 (U.S. Pat. No. 6,799,243) | Jun. 14, 2000 |
| 09/594,194 (U.S. Pat. No. 6,751,701) | Jun. 14, 2000 |
| 09/594,202 (U.S. Pat. No. 6,795,892) | Jun. 14, 2000 |
| 09/729,871 | Dec. 5, 2000 |
| 09/815,778 now U.S. Pat. No. 7,110,407 | Mar. 24, 2001 |
| 09/940,832 (U.S. Pat. No. 6,542,391) | Aug. 27, 2001 |

FIELD OF THE INVENTION

The present invention relates generally to packet processing and more particularly to content addressable memory devices and systems.

BACKGROUND

Routers are devices that direct traffic in a network. Each router in the network has a route table that typically includes routing information to enable incoming packets to be forwarded or routed to their destination in the network. Some routers forward packets based only on the destination address indicated in the packet. Other, more complex, routers forward or route packets based on policies defined, for example, by a network administrator. The latter routing schemes are commonly referred to as policy-based routing.

Policy-based routing can enable packets to be forwarded or routed in a network based on any number of criteria, including the source of the packet, the destination of the packet, the cost of forwarding the packet through different routes or paths in the network, or the bandwidth available on different routes in the network. Policy-based routing can also be used to provide a certain Quality of Service (QOS) or Type of Service (TOS) to differentiated traffic in the network. For example, one or more of the various fields (e.g., the TOS bits) in the header of an Internet Protocol (IP) packet can be used by policy-based routers to forward IP packets in a network.

Each policy-based router implements a policy through the use of route maps that define how to forward the packet in the network. Each route map statement or policy statement contains one or more match clauses and a set clause. The match clauses are a series of conditions that are used to determine if an incoming packet satisfies a particular policy. If all of the match clauses of a policy statement are satisfied, the set clause specifies how the router should forward the packet in the network. If one of the match clauses of a particular policy statement is not satisfied, then the policy-based router investigates subsequent policy statements.

FIG. 1 shows exemplary processed policy information 100 of an incoming packet to a policy-based router. Policy information 100 includes several policy fields 102 including a destination address (DA) for the packet, a source address (SA) of the packet, protocol type (PTCL) such as those defined by for an IP packet header, TOS, and COST. Policy information 100 may be received by a policy-based router that implements a policy such as policy 200 shown in FIG. 2. Policy 200 includes three separate policy statements 201 through 203. If policy information 100 satisfies the match clause (i.e., the "if" clause) of one of the policy statements, the set clause (i.e., the "then" clause) of that policy statement determines routing information for the packet in the network. For example, if the destination address of the incoming packet is DA1, the source address is SA1, and the TOS field of the packet is TOS1, then routing information $RI_2$ should be selected.

A policy-based router can use a content addressable memory (CAM)-based system to implement a filtering or classification function to determine whether an incoming packet matches a policy statement. FIG. 3 shows one example of a system 300 that implements policy-based routing using a ternary CAM 302. The policy statements or policy words 201-203 are stored in separate rows in ternary CAM array 304. A ternary CAM array is one that is able to mask entries in a CAM array on a bit-by-bit basis. Ternary CAM array 304 has rows of CAM cells 305 for storing policy field information, and corresponding rows of mask cells 310 for storing mask data. Routing information $RI_0$-$RI_2$ is typically stored in an external memory 308 at addresses corresponding to those at which the respective policy words 201-203 are stored in ternary CAM array 304. Each policy field that corresponds to a match clause for a given policy statement is unmasked by having its corresponding mask bits set, for example, to a logic zero. Conversely, each policy field that does not have a match clause for a given policy statement is masked by having its corresponding mask bits set, for example, to a logic one.

When an incoming packet is received by a policy-based router, it is processed to determine the policy field information. The processed policy field information is provided to system 300 as policy search key 307. For each policy statement in CAM array 304 that matches the policy search key, the corresponding match line $ML_0$-$ML_N$ will be asserted and provided to priority encoder 306. In response to the match lines, priority encoder 306 outputs the address of the highest priority matching entry in CAM array 304 to HPM bus 312. If there is more than one matching policy statement in CAM array 304, priority encoder 306 determines that the highest priority matching policy statement is the one stored at the lowest logical address of CAM array 304. For example, as shown in FIG. 3, if CAM array 304 is loaded with policy statement 203 at address zero (i.e., the lowest logical address), statement 202 at address one, and statement 201 at address 2, and a policy search key of DA1, SA1, PTCL1, TOS1, COST1 is provided to CAM array 304, then each of policy statements 201-203 is identified as a match on match lines $ML_0$-$ML_2$, respectively. Priority encoder 306 outputs address zero on the HPM bus to select route information $RI_2$ from address zero in memory 308.

Because priority encoder 306 determines the highest priority matching location based on predetermined logical address assignments, policy statements 201-203 are typically preordered or prioritized such that higher priority policy statements are stored in lower logical addresses of CAM array 304 than lower priority policy statements. A policy statement has a higher priority than another policy statement when the route information for the first policy statement is to be selected over the second policy statement even though both policy statements may match the policy search key (e.g., with masking). The prioritizing of the policy statements is typically performed by table management hardware and/or software, which adds overhead to the router. Further, when a policy is changed by adding a new policy statement that has a higher (or equal) priority than at least one of the policy statements already stored in CAM array 304, the table management hardware and/or software often must reprioritize or reorder all or part of CAM array 304. This is typically involves loading the CAM array with the new policy statement and reloading the CAM array with all the policy statements of equal or lower priority. This can add significant overhead to the router (e.g., delay and additional hardware and software) to change even just one policy statement in a given policy. If the CAM array is not loaded correctly, either upon initialization or upon change, addition or removal of a policy statement, an incorrect route may be selected from memory 308.

SUMMARY

A CAM device having a programmable data storage width is disclosed. In one embodiment, the CAM device includes a CAM array arranged in rows of CAM cells, each row including a multiple row segments to store and compare data words that span one or more of the row segments according to a programmed data storage width. A priority index table is coupled to the plurality of rows of CAM cells to store priority numbers that indicate relative priorities of respective data words stored in the CAM array.

In one embodiment, the CAM device also includes write circuitry that includes a coding circuit and a select circuit. The coding circuit is adapted to receive a write data value and to convert the write data value into a coded value. In one embodiment, the coded value is a decoded value and the select circuit is responsive to a control signal to select either the decoded value or the write data value to be stored in the CAM array. In an alternative embodiment, the coded value is an encoded value and the select circuit is responsive to the control signal to select either the encoded value or the write data value to be stored in the priority index table.

In another embodiment, the CAM device includes a plurality of CAM blocks, each having a respective programmable data storage width and a priority index table.

These and other objects, features, and advantages of the present invention will be apparent from the accompanying drawings and from the detailed description that follows below.

BRIEF DESCRIPTION OF THE DRAWINGS

The features and advantages of the present invention are illustrated by way of example and are by no means intended to limit the scope of the present invention to the particular embodiments shown, and in which:

FIG. 1 is an example of policy information;

FIG. 2 is an example of a policy having policy statements;

FIG. 3 is an example of storing a policy in a conventional ternary CAM;

FIG. 13 illustrates an embodiment of a selective coding logic circuit 1300 that includes a decoder circuit to generate a mask value and an inverter circuit to generate a priority number;

FIG. 14 illustrates a selective coding logic circuit according to such an alternative embodiment;

FIG. 26 illustrates exemplary concatenations and disabled cells within a row of priority cells to achieve the priority number configurations described in reference to Table 8;

FIG. 27 illustrates an embodiment of the priority bit disable circuit of FIG. 23;

FIG. 36 illustrates an embodiment of the ×32 segment enable subcircuit of FIG. 35;

FIG. 37 illustrates an embodiment of the ×64 segment enable subcircuit of FIG. 35;

FIG. 38 illustrates an embodiment of the ×128 segment enable subcircuit of FIG. 35;

FIG. 39 illustrates an embodiment of the match flag logic of FIG. 15;

FIG. 40 illustrates a row match circuit according to one embodiment;

FIG. 41 illustrates a match one logic circuit according to one embodiment;

FIG. 42 illustrates an embodiment of a first group match logic circuit;

FIG. 43 illustrates an embodiment of a second group match logic circuit;

FIG. 44 illustrates an embodiment of a third group match logic circuit;

FIG. 45 shows one embodiment of the match configuration logic of FIG. 40;

FIG. 46 illustrates a row match circuit according to another embodiment;

FIG. 49 illustrates a multiple match one logic circuit according to one embodiment;

FIG. 50 illustrates a more specific embodiment of the multiple match one logic circuit of FIG. 49;

FIG. 51 illustrates an embodiment of a first group multiple match logic circuit;

FIG. 52 illustrates an embodiment of a second group multiple match logic circuit;

FIG. 53 illustrates an embodiment of a third group multiple match logic circuit;

FIG. 54 illustrates an embodiment of the multiple match configuration logic of FIG. 48;

FIG. 55 illustrates an embodiment of the array multiple match logic of FIG. 47;

FIG. 56 illustrates an embodiment of the priority encoder logic of FIG. 15;

FIG. 57 illustrates an embodiment of a row priority encoder;

FIG. 58 is a truth table of the operation of the row priority encoder of FIG. 57;

FIG. 59 illustrates an embodiment of the select logic circuit of FIG. 56;

FIG. 60 illustrates an embodiment of a CAM device that includes multiple independently selectable CAM blocks;

FIG. 61 shows a 1-bit comparand driver that may be used in an embodiment of the comparand driver of FIG. 60;

FIG. 62 illustrates a block control circuit according to one embodiment;

FIG. 63 illustrates a block configuration register according to one embodiment;

FIG. 64 illustrates an embodiment of the global flag circuit of FIG. 60

FIG. 65 illustrates an embodiment of a global priority encoder that may be used within the multiple-block CAM device of FIG. 60;

FIG. 66 illustrates an embodiment of a global priority encoder that may be used within a multiple-block CAM device having programmable block priorities;

FIG. 68 illustrates an embodiment of an address circuit that may be included within the address logic of FIG. 60;

FIG. 69 illustrates a load control circuit that may be used within the address circuit of FIG. 68;

FIG. 70 illustrates an exemplary operation of the instruction decoder of FIG. 59 in response to an instruction to write to the next free address of a class-based storage partition of a CAM device;

FIG. 71 illustrates an exemplary operation of the instruction decoder of FIG. 59 in response to an instruction to compare a comparand with the contents of a class-based storage partition of a CAM device;

FIG. 72 illustrates an exemplary operation of the instruction decoder of FIG. 59 in response to an instruction read a CAM word from the highest priority match address of a class-based storage partition of a CAM device;

DETAILED DESCRIPTION

Figure 4:
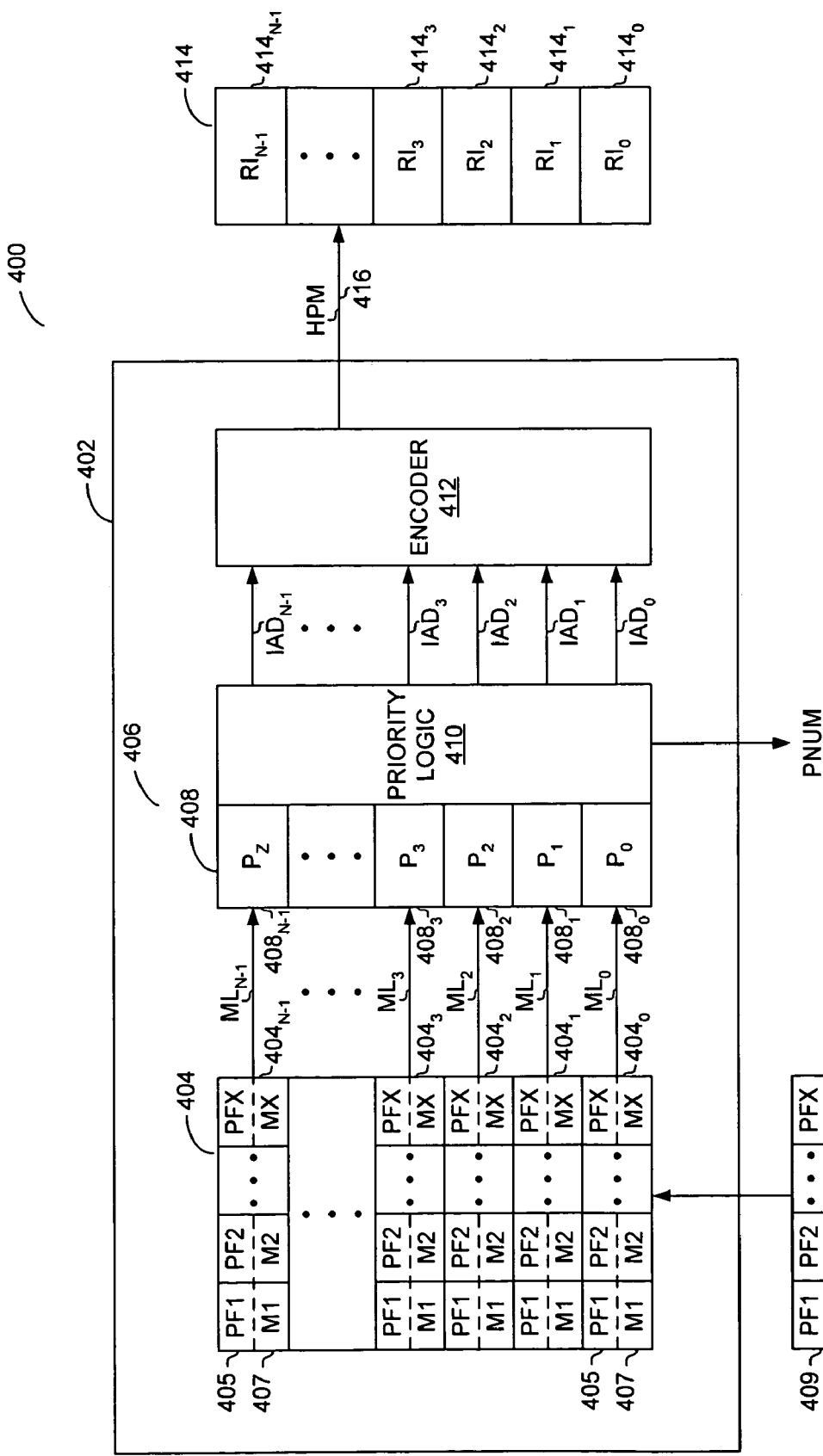
FIG. 4 is one embodiment of a classification system for a policy-based router.

In the following description, for purposes of explanation, specific nomenclature is set forth to provide a thorough understanding of the present invention. However, it will be apparent to one skilled in the art that these specific details may not be required to practice the present invention. In other instances, well-known circuits and devices are shown in block diagram form to avoid obscuring the present invention unnecessarily. Additionally, the interconnection between circuit elements or blocks may be shown as buses or as single signal lines. Each of the buses may alternatively be single signal lines, and each of the single signal lines may alternatively be buses. Herein, a signal is said to be "asserted" when the signal is driven to a low or high logic state (or charged to a high logic state or discharged to a low logic state) to indicate a particular condition. Conversely, a signal is said to be "deasserted" to indicate that the signal is driven (or charged or discharged) to a state other than the asserted state (including a high or low logic state, or the floating state that may occur when the signal driving circuit is transitioned to a high impedance condition, such as an open drain or open collector condition). A signal driving circuit is said to "output" a signal to a signal receiving circuit when the signal driving circuit asserts (or deasserts, if explicitly stated or indicated by context) the signal on a signal line coupled between the signal driving and signal receiving circuits. A signal line is said to be "activated" when a signal is asserted on the signal line, and "deactivated" when the signal is deasserted. Additionally, the prefix symbol "/" attached to signal names indicates that the signal is an active low signal (i.e., the asserted state is a logic low state). Active low signals may be changed to active high signals and vice-versa as is generally known in the art.

A CAM device having a programmable data storage width, programmable priority encoder, and search-mode dependent mask write function is disclosed in various embodiments. In one embodiment, the CAM device includes a policy statement table for storing policy statements. The policy statement table may be implemented by a ternary CAM array that stores the policy statements and associated mask data. Each policy statement has associated with it a priority number that indicates the priority of the policy statement relative to other policy statements. The priority numbers are separately stored in a priority index table. The priority index table includes priority logic that determines the most significant priority number from among the policy statements that match an incoming packet during a classification or filter operation. The priority logic also identifies the location in the priority index table of the most significant priority number. The most significant priority number may be the priority number with the lowest or highest numerical value. The identified location in the priority index table can be used to access associated route information or other information stored in a route memory array located external to or within the CAM device. When the route memory array is external to the CAM device, the CAM device may include an encoder to encode the identified location in the priority index table into an address for the route memory.

The CAM device configuration obviates preloading the policy statements in the policy statement table in a predetermined order. Instead, the priority logic determines the most significant priority number from among matching policy statements regardless of the order in which the policy statements are stored in the table. This can reduce the hardware and/or software needed for table management of the table, and can increase the performance of a router incorporating the CAM device.

In addition, new policy statements can be added at any location in the policy statement table, and associated priority numbers loaded into corresponding locations in the priority index table. If a new policy statement has a priority that is greater than or equal to a priority of a policy statement already stored in the policy statement table, the priority number of the previously stored policy statement may be updated to accommodate the new policy statement. Similarly, when a policy statement is removed (i.e., invalidated or overwritten) from the policy statement table, the priority numbers of the previously stored lower priority policy statements may be updated. The updating functions can be performed by the priority logic in the priority index table, or by inequality circuits in the priority index table. The updating functions can be performed without the need to physically reorder the policy statements in the policy statement table, or to physically reorder the priority numbers in the priority index table. This also can reduce the hardware and/or software needed for table management of the policy statement table, and can increase the performance of a router incorporating the CAM device.

The CAM device can also be used in other non-networking applications. For example, the CAM device can be used to process if-then-else functions in other applications.

Classifying or Filtering Policy Statements

FIG. 4 shows one embodiment of a classification or filtering system 400 for a policy-based router. System 400 includes CAM device 402 and route memory 414. CAM device 402 includes policy statement table 404, priority index table 406 and encoder 412, and may be an integrated circuit component formed on a single semiconductor substrate.

For this embodiment, policy statement table 404 is stored in a ternary CAM array that stores policy statements or policy words. Ternary CAM array 404 has rows of CAM cells 405 for storing policy field information PF1-PFX, where X is any number. Each policy field PF1-PFX can include any policy information including DA, SA, PTCL, TOS, and COST, or any other type of policy field to assist in the classification or filtering of the policy statement to provide a certain Quality of Service (QoS), Class of Service (CoS), and the like. Each policy field may include any number of bits. Additional information associated with each policy field may be stored in one or more additional binary or ternary CAM cells or other types of memory cells disposed in each row of CAM 404. Ternary CAM 404 also has rows of mask cells 407 for storing mask data M1-MX corresponding to each row of policy fields 405. Global masks (not shown) may be used to mask entire columns in CAM array 404 as generally known in the art. For alternative embodiments, CAM array 404 may be any other type of CAM including a binary CAM, or any other type of memory to store policy statements to be compared with processed policy information of an incoming packet.

Ternary CAM array 404 can be any ternary CAM array that is capable of locally masking each entry on a bit-by-bit basis. Each policy field that corresponds to a match clause for a given policy statement will be unmasked by having its corresponding mask bits set, for example, to a logic zero (or, alternatively, a logic one). Conversely, each policy field that does not have a match clause for a given policy statement will be masked by having its corresponding mask bits set, for example, to a logic one (or, alternatively, a logic zero). As each policy field, and/or individual bits within a policy field, can be masked, CAM device 402 also supports rule and route aggregation. That is, CAM device 402 supports ranges of addresses or policy field information.

Each policy statement loaded into ternary CAM array 404 has associated with it a priority number $P_0$-$P_Z$ and route information $RI_0$-$RI_{N-1}$. The priority number indicates the priority of the policy statement relative to other policy statements in a given policy. The policy numbers may be assigned by a user of CAM device 402 including, for example, a network administrator or the router itself. The priority numbers $P_0$-$P_Z$ are separately stored at locations $408_0$-$408_{N-1}$, respectively, of priority memory 408 of priority index table 406. Route information $RI_0$-$RI_{N-1}$ for the particular policy statements are stored at locations $414_0$-$414_{N-1}$, respectively, in route memory 414. The route information may include, for example, forwarding or next hop information, authentication information, QOS, TOS, time to live information or other packet filtering and classification information for an incoming packet to the router incorporating system 400. A policy statement, its priority number, and its route information are each stored at the corresponding addresses in each of their respective memory arrays.

Priority memory 408 and route memory 414 may each be any type of memory array including volatile, non-volatile, random access memory (RAM), and/or read only access memory (ROM). For one embodiment, priority memory 408 comprises a CAM array.

Priority memory 408 may be n bits wide to accommodate $Z=2^n$ priority numbers, where n is any number. For one example, priority memory 408 may be 20 bits wide to accommodate up to $2^{20}$ or 1 Meg (i.e., 1,048,576) priority numbers. Each addressable location within the priority memory 408 (i.e., location in which a priority number may be stored) is referred to herein as a priority number storage circuit. The total number of addressable locations N in priority memory 408 may be greater than, less than, or equal to Z.

The priority numbers may be assigned in ascending priority order such that zero is the highest priority number and $2^n-1$ is the lowest priority number. Alternatively, the priority numbers may be assigned in descending priority order such that $2^n-1$ is the highest priority number and zero is the lowest priority number. Each priority number may be assigned so as to identify the priority of each policy statement relative to other policy statements. For one embodiment, the priority numbers may be assigned consecutively. For example, the highest priority policy statement can be assigned the highest priority number (e.g., zero or $2^n-1$), the next lower priority policy statement can be assigned the next lower priority number (e.g., one or $2^n-2$), and so forth. For another embodiment, gaps may be left in the priority number assignments to allow for the addition of future priority numbers associated with new policy statements.

Priority index table 406 also includes priority logic 410 that compares the priority numbers with each other for all corresponding policy statements that match an incoming packet. Priority logic 410 identifies the most significant priority number PNUM in memory 408 from among the compared priority numbers, and further identifies the location of PNUM in priority memory 408. PNUM has the lowest numerical value when the priority numbers are assigned in ascending priority order (referred to herein as an ascending priority order), and PNUM has the highest numerical value when the priority numbers are assigned in descending priority order (referred to herein as a descending priority order). Priority logic 410 may also output PNUM from CAM device 402. The identified location of PNUM in the priority memory is provided on internal address lines $IAD_0$-$IAD_{N-1}$ to encoder 412. For one example, one of $IAD_0$-$IAD_{N-1}$ is asserted to indicate the location in priority memory 408 of PNUM from among the compared priority numbers. This location also corresponds to the location of the highest priority matching policy statement in ternary CAM array 404.

The address of the identified location of the highest priority matching policy statement in ternary CAM array 404 is determined by encoder 412 and output to HPM bus 416. The encoded address can then be used to access the corresponding route information from memory 414. Encoder 412 may be any encoding logic that takes the information on address lines $IAD_0$-$IAD_{N-1}$ and generates an encoded address. For one embodiment, encoder 412 is a ROM. It should be noted that priority memory 408 and priority logic 410 effectively form a programmable priority decoder (i.e., a circuit that receives match information from CAM array 404 and that decodes the match information according to a programmed set of priority numbers to generate an internal address indicator). Similarly, the combination of the priority memory 408, priority logic 410 and encoder 412 effectively forms a programmable priority encoder.

For another embodiment, route memory 414 may also be included within CAM device 402. For this embodiment, encoder 412 may be omitted and route memory 414 may be accessed directly by internal address lines $IAD_0$-$IAD_{N-1}$.

Figure 5:
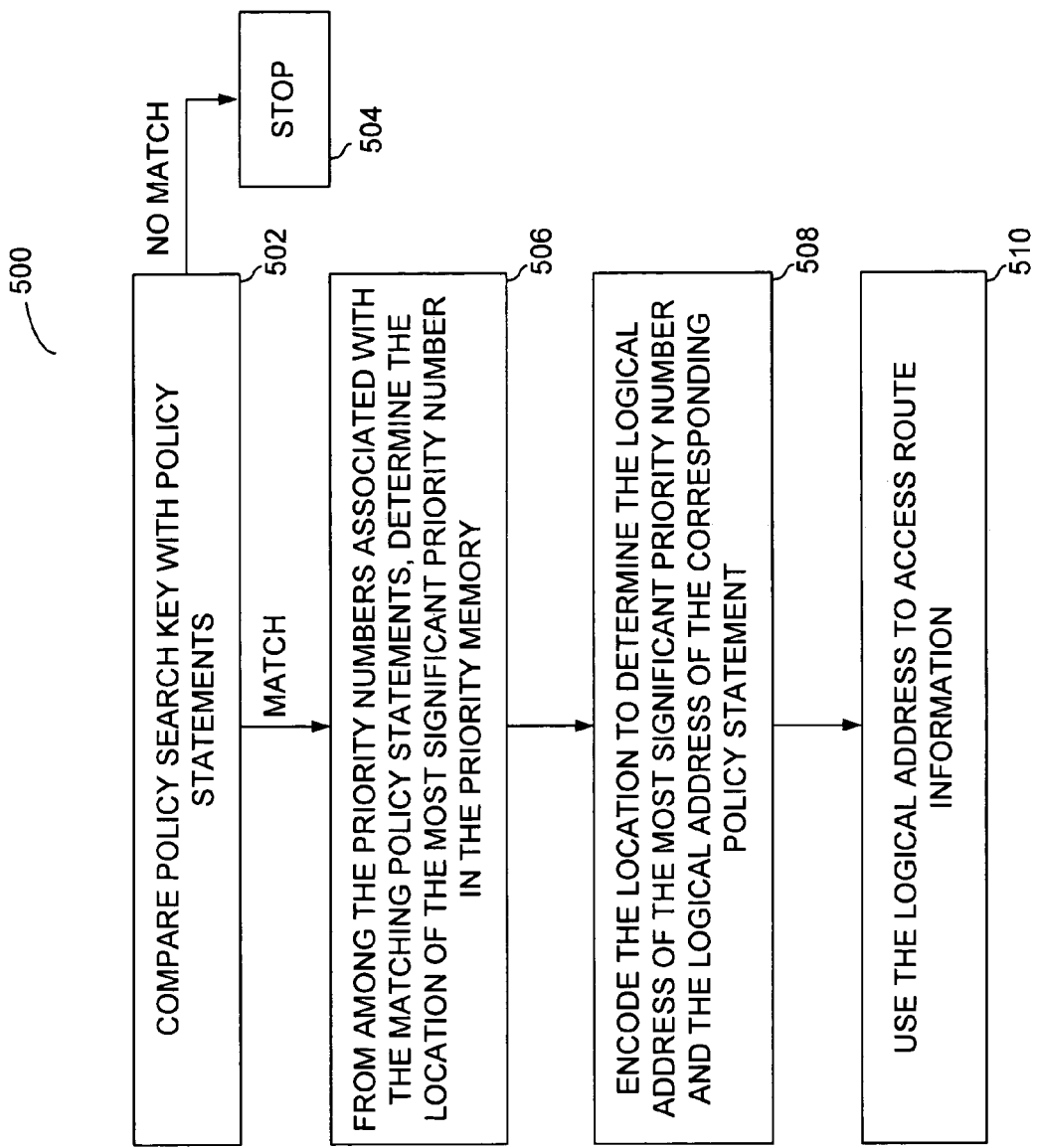
FIG. 5 is one embodiment of performing the classification operation for the system of FIG. 4.

FIG. 5 summarizes the classification or filtering function 500 (i.e., search or compare operation) performed by CAM device 402 for an incoming packet according to a policy stored in ternary CAM 404. An incoming packet received by a policy-based router incorporating system 400 is initially processed to determine the policy field information. The policy field information is provided to system 400 as policy search key 409. At step 502, the policy fields of policy search key 409 are compared with the policy statements stored in ternary CAM array 404. For each policy statement that matches the policy search key, the corresponding match line $ML_0$-$ML_{N-1}$ is asserted. If no match is found, then the process stops at step 504.

At step 506, priority logic 410 determines PNUM and identifies its location in priority memory 408. The identified location is provided on internal address lines $IAD_0$-$IAD_{N-1}$ to encoder 412. At step 508, encoder 412 determines the address of the identified location in priority index table 406. This encoded address is also the logical address of the highest priority matching policy statement in ternary CAM array 404. Encoder 412 outputs the encoded address to HPM bus 416. The encoded address can then be used at step 510 to access the corresponding route information in memory 414. Steps 508 and/or 510 may be omitted when encoder 412 is removed from CAM device 402, and priority logic 410 may directly access the route information in memory 414.

For another embodiment, $IAD_0$-$IAD_{N-1}$ are provided to CAM array 404 to access the highest priority matching policy statement, which may then be read from CAM device 402. Alternatively, HPM bus 416 may be provided to CAM array 404 (e.g., through a decoder) to access the highest priority matching policy statement.

Figure 6:
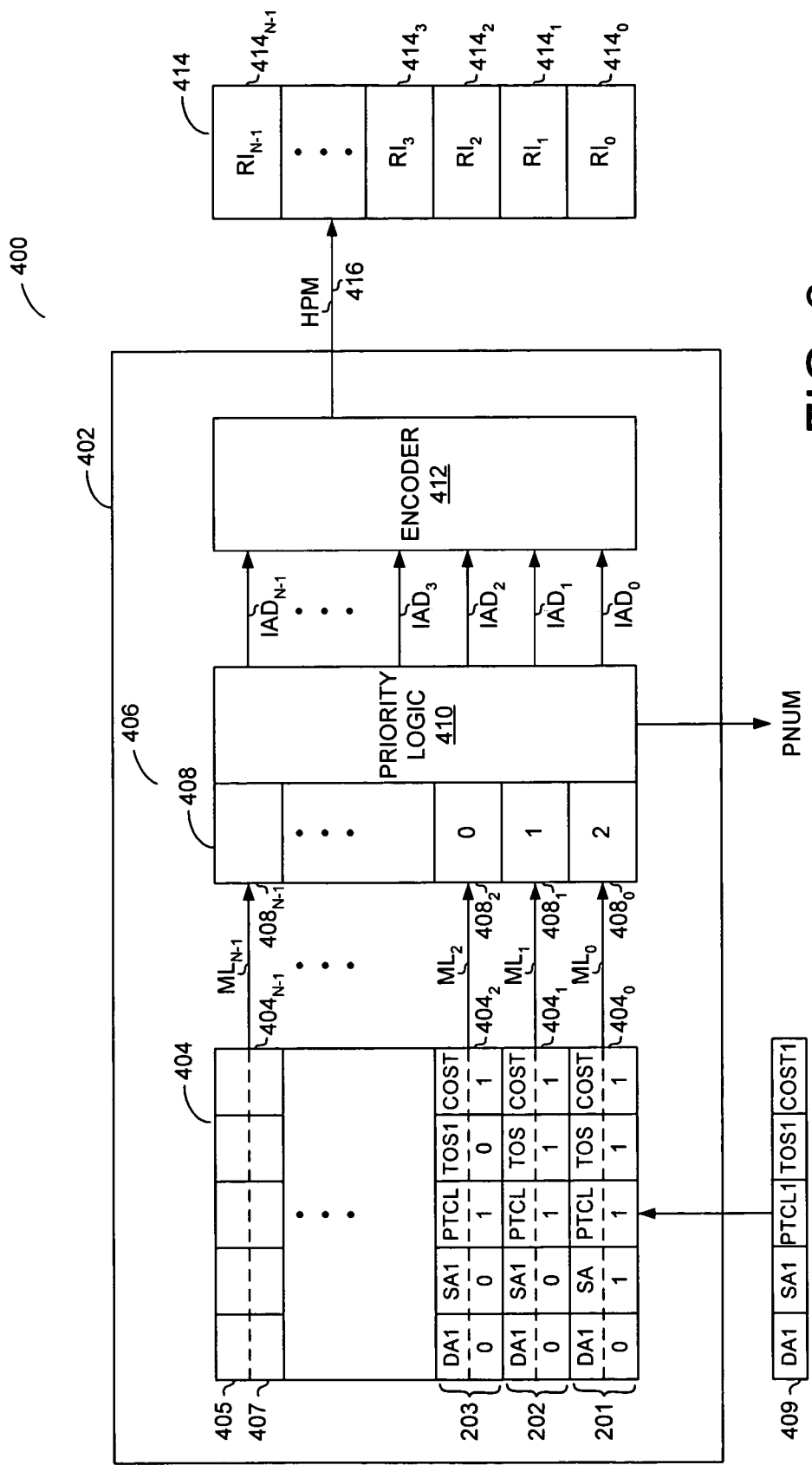
FIG. 6 is one example of performing the classification operation on a particular policy stored in the CAM array of FIG. 4.

FIG. 6 shows one example in which policy statements 201, 202, and 203 from FIG. 2 are stored at locations $404_0$, $404_1$, and $404_2$ (i.e., addresses 0, 1, and 2), respectively, of ternary CAM array 404. The corresponding priority numbers 2, 1, and 0 are stored at locations $408_0$, $408_1$, and $408_2$, respectively, in memory 408. Additionally, the corresponding route information $RI_0$, $RI_1$, and $RI_2$, are stored at locations $414_0$, $414_1$, and $414_2$, respectively of route memory 414. The policy statements and priority numbers are written into their respective memories using conventional write circuits, counters, and/or address decoders, etc. (not shown).

For this embodiment, the priority numbers have been assigned in ascending priority order such that policy statement 203 is identified as the highest priority policy statement by being assigned priority number 0, the lowest numerical value; policy statement 201 is identified as the having the lowest priority policy statement by being assigned priority number 2, the highest numerical value; and, policy statement 202 is identified as having a priority greater than that of policy statement 201, but less than that of policy statement 203, by being assigned priority number 1.

For an alternative embodiment, the priority numbers may be assigned in descending priority order such that policy statement 201 is identified as the highest priority policy statement by being assigned priority number 2, the highest numerical value; policy statement 203 is identified as having the lowest priority policy statement by being assigned priority number 0, the lowest numerical value; and, policy statement 202 is identified as having a priority greater than that of policy statement 201, but less than that of policy statement 203, by being assigned priority number 1.

The process of determining the route information for policy search key 409 is illustrated with the aid of FIG. 5. At step 502, the policy fields of policy search key 409 are compared with the policy statements stored in ternary CAM array 404. In this example, the policy search key has policy fields of DA=DA1, SA=SA1, PTCL=PTCL1, TOS=TOS1, and COST=COST1. CAM array 404 determines that each of the policy statements 201-203, as masked by their respective mask data, matches policy search key 409. In response, each of match lines $ML_0$-$ML_2$ is asserted.

At step 506, priority logic 410 compares, with each other, priority numbers 0, 1, and 2 associated with matching policy statements 203, 202, and 201 respectively. Priority logic 410 determines that priority number 0 is the most significant priority number, asserts $IAD_2$, and deasserts the other internal address lines. Encoder 412 encodes the internal address information, at step 508, and generates an external address of 2 on HPM bus 416. The external address can be used to access route information $RI_2$ stored at address two in route memory 414.

In contrast to the conventional system described above, CAM device 402 is able to identify the highest priority matching policy statement stored in ternary CAM array 404 regardless of where the policy statements are stored in CAM array 404.

The process illustrated in FIG. 5 identifies the location in priority memory 408 of the most significant priority number from among the compared priority numbers. Once this location is identified, the priority number stored at the identified location can be read out from CAM device 402 by a read circuit (not shown), or a new priority number can be written into that location by a write circuit (not shown). In the former case, the user of the CAM device 402 (e.g., a network administrator or the policy-based router itself) can determine what priorities have been assigned to policy statements already stored in CAM array 404. In the latter case, priority numbers can be updated by the user for already stored policy statements. This provides the user with flexibility in the control and management of the policy statements stored in CAM device 402.

For added flexibility, the user can read a policy statement (e.g., one or more of the policy fields and/or one or more of the corresponding mask data) based on priority numbers already stored in the priority memory, or write a new policy statement for a priority number already stored in the priority memory. For these embodiments, priority memory 408 may be a CAM. For an alternative embodiment, each priority number may be separately compared by a comparison circuit with an externally applied priority number.

A process for reading and writing a policy statement or other value to the CAM array 404 based on a priority number already stored in the priority memory is disclosed in U.S. patent application Ser. No. 09/729,871, filed Dec. 5, 2000, which is hereby incorporated by reference in its entirety.

Priority Index Table

Figure 7:
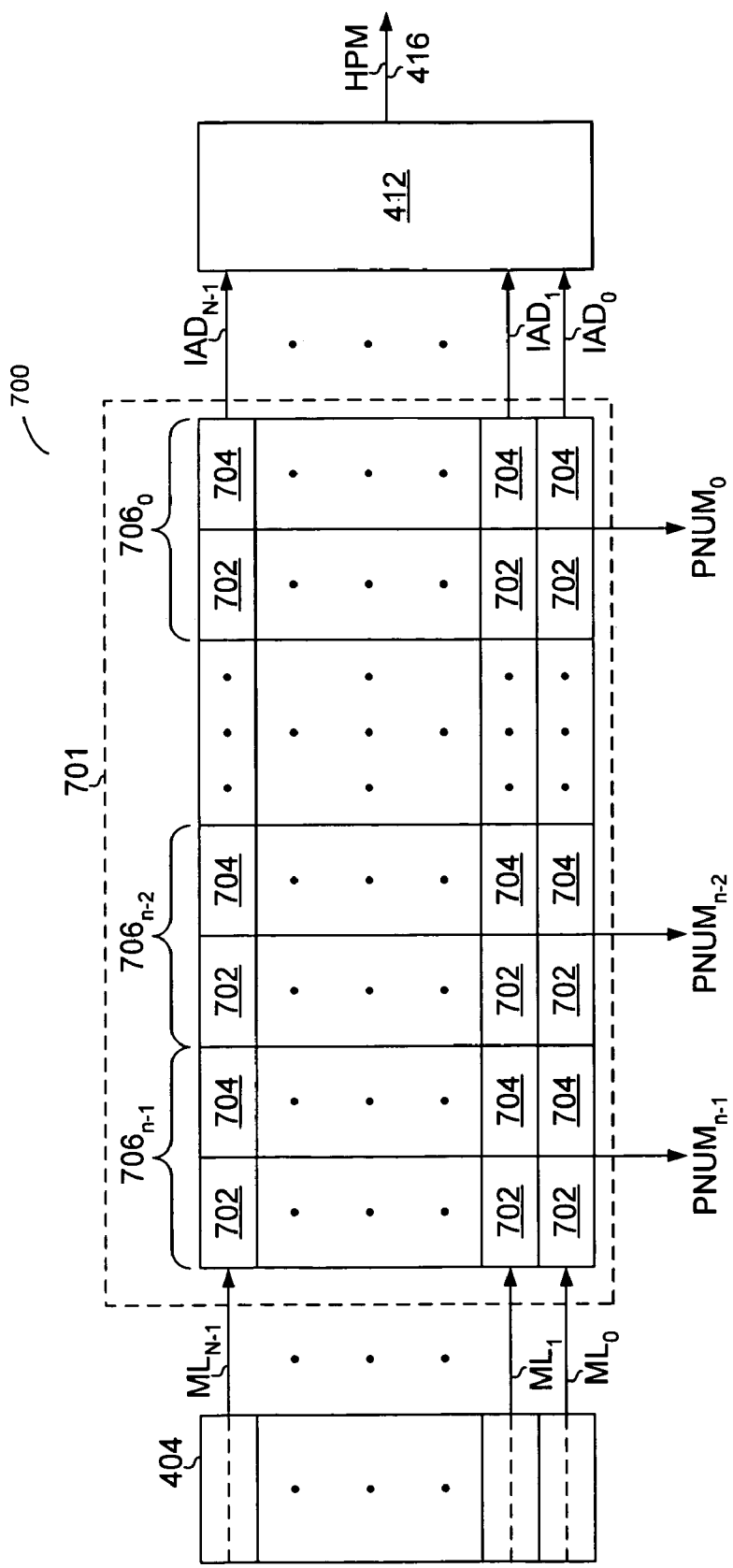
FIG. 7 is illustrates an embodiment of the priority index table of FIG. 4.

FIG. 7 shows CAM device 700 that includes priority index table 701 that is one embodiment of priority index table 406. In this embodiment, priority memory 408 and priority logic 410 are merged together on a bit-by-bit basis to form priority index table 701. The priority memory includes memory elements 702 that each store one bit of a priority number for a given row. Each memory element may be any type of storage mechanism including volatile or non-volatile memory cells. The priority logic includes priority logic elements 704. Each priority logic element 704 is associated with, or corresponds to, one of the memory elements 702 such that columns $706_0$-$706_{n-1}$ of priority index table 701 have a memory element/priority logic element pair for each of its rows. Each priority logic element 704 effectively compares the priority number bit stored in its associated memory element 702 with the priority number bits stored in every other memory element of its column to determine one of bits $PNUM_0$-$PNUM_{n-1}$ for the most significant priority number. Bits $PNUM_0$-$PNUM_{n-1}$ comprise the most significant priority number from among the policy statements that match a policy search key.

Figure 8:
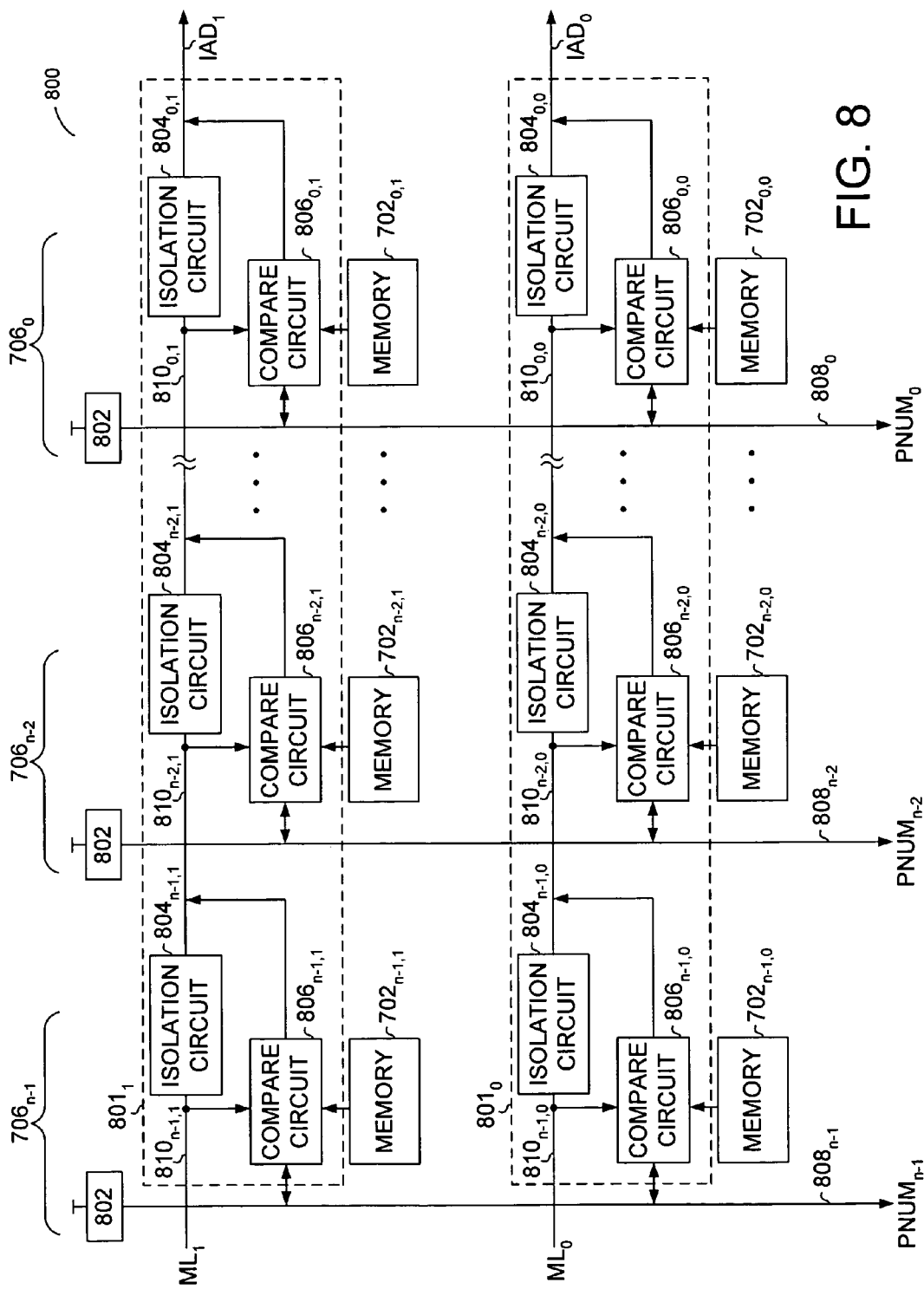
FIG. 8 illustrates an embodiment of two rows of the priority index table of FIG. 7.

FIG. 8 shows priority index table 800 that is one embodiment of two rows of priority index table 701. For this embodiment, each priority logic element 704 includes a compare circuit 806 and an isolation circuit 804. Each compare circuit 806 is connected in a wired-OR configuration with the other compare circuits in its respective column by one of priority signal lines $808_0$-$808_{n-1}$. Each priority signal line may be pre-charged towards a power supply voltage (or any other predetermined voltage) by a pre-charge circuit 802. Each compare circuit 806 may be any digital or analog compare circuit that, when executing step 506 of FIG. 5, effectively compares the priority number bit stored in its respective storage element 702 with the priority number bits stored in every other storage element 702 of the same column. Additionally, each compare circuit monitors the comparison result of the more significant priority number bits through the logical states of match line segments 810. Match line segments 810 are coupled between match lines $ML_0$-$ML_{N-1}$ and internal address lines $IAD_0$-$IAD_{N-1}$ by isolation circuits 804. The isolation circuits isolate the comparison results generated for less significant priority bit locations from affecting the comparison results generated for more significant priority bit locations. The isolation circuits may also work together with the comparison circuits to control the state of the match line segments.

Figure 9:
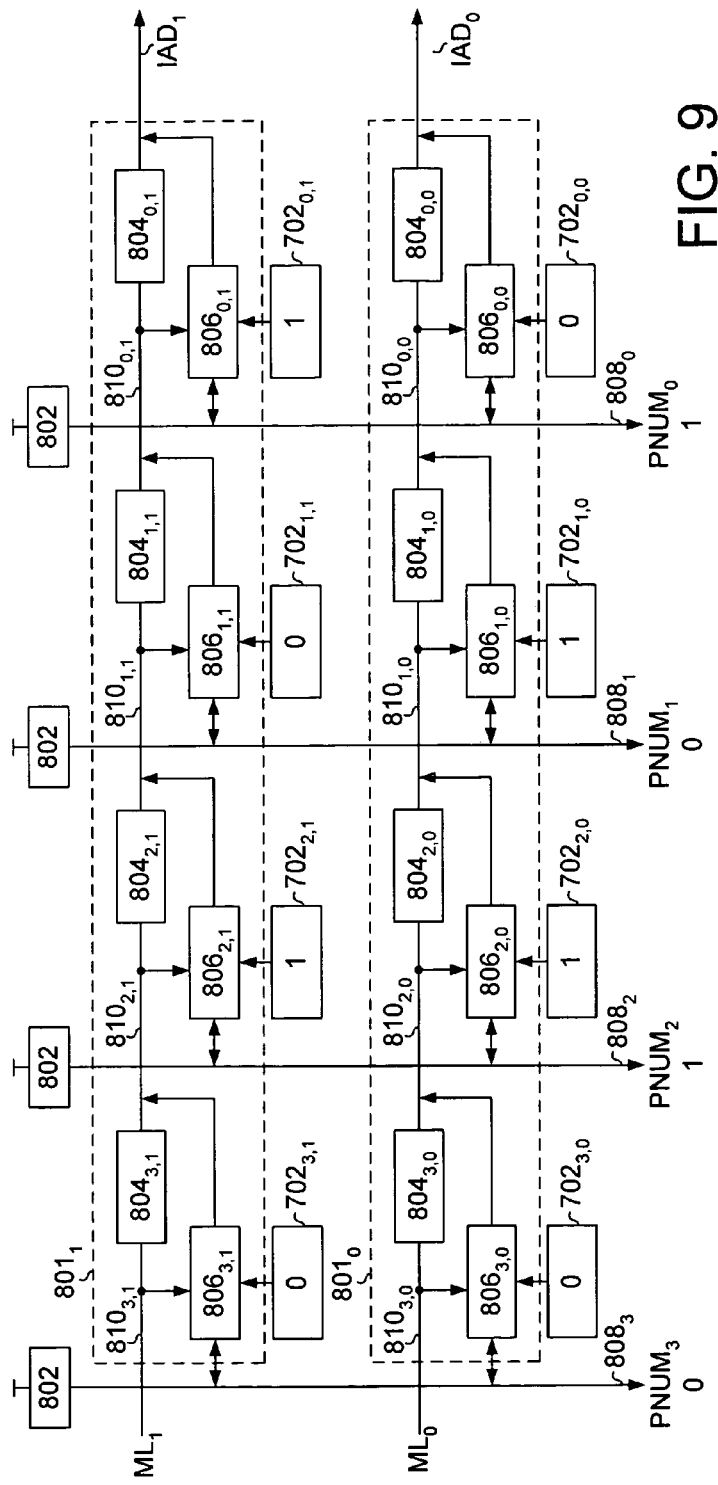
FIG. 9 is one example of determining the most significant priority number stored in the rows of the priority index table.

The operation of priority index table 800 can be illustrated with an example shown in FIG. 9 and with the aid of FIG. 5. In this example, priority index table 800 comprises a 2×4 matrix of rows and columns. For other embodiments, any numbers of rows and columns can be used. Row zero stores priority number 0110 having the decimal equivalent of the number 6, and row one stores priority number 0101 having the decimal equivalent of the number 5. For this example, each of row zero and row one of CAM array 404 have policy statements that match the policy search key such that match lines $ML_0$ and $ML_1$ are asserted (step 502). Also, for this example, the priority numbers are stored in ascending priority order such that 0101 is the more significant priority number between 0101 and 0110.

At step 506, compare circuits $806_{0,0}$-$806_{3,1}$ determine that 0101 is the more significant priority number PNUM, and cause $IAD_1$ to be asserted to indicate that 0101 is stored in row one of the priority index table. Compare circuits $806_{0,0}$-$806_{3,1}$ determine that PNUM is 0101 as follows. The most significant bit $PNUM_3$ is resolved first. When any memory element 702 stores a logic zero and the corresponding match line segment 810 is asserted, the corresponding priority signal line 808 is discharged. Thus, each of compare circuits $806_{3,1}$ and $806_{3,0}$ discharge signal line $808_3$ such that $PNUM_3$ is a logic zero. Additionally, compare circuit $806_{3,1}$ compares the state of priority signal line $808_3$ with the priority number bit stored in $702_{3,1}$, and determines that both have the same logic state. This causes compare circuit $806_{3,1}$ not to affect the logical state of match line segment $810_{2,1}$ such that match line segment $810_{2,1}$ has the same logic state as match line segment $810_{3,1}$ ($ML_1$). Similarly, compare circuit $806_{3,0}$ compares the state of priority signal line $808_3$ with the priority number bit stored in $702_{3,0}$ and determines that both have the same state. This causes compare circuit $806_{3,0}$ not to affect the logical state of match line segment $810_{2,0}$ such that match line segment $810_{2,0}$ has the same logic state as match line segment $810_{3,0}$ ($ML_0$).

The next most significant bit $PNUM_2$ is then resolved. Memory elements 702 that store a logic one do not discharge their corresponding priority signal lines 808. Since memory elements $702_{2,1}$ and $702_{2,0}$ both store logic one states, signal line $808_2$ remains pre-charged such that $PNUM_2$ is a logic one. Additionally, compare circuit $806_{2,1}$ compares the state of priority signal line $808_2$ with the priority number bit stored in $702_{2,1}$, and determines that both have the same logic state. This causes compare circuit $806_{2,1}$ not to affect the logical state of match line segment $810_{1,1}$ such that match line segment $810_{1,1}$ has the same logic state as match line segment $810_{2,1}$. Similarly, compare circuit $806_{2,0}$ compares the state of priority signal line $808_2$ with the priority number bit stored in $702_{2,0}$ and determines that both have the same logic state. This causes compare circuit $806_{2,0}$ to not affect the logical state of match line segment $810_{1,0}$ such that match line segment $810_{1,0}$ has the same logic state as match line segment $810_{2,0}$.

PNUM$_1$ is resolved next. Since memory element $702_{1,1}$ stores a logic zero and match line segment $810_{1,1}$ is asserted, compare circuit $806_{1,1}$ discharges priority signal line $808_1$. This causes PNUM$_1$ to be a logic zero. Additionally, compare circuit $806_{1,1}$ compares the logic zero state of priority signal line $808_1$ with the logic zero stored in $702_{1,1}$ and allows match line segment $810_{0,1}$ to have the same state as match line segment $810_{1,1}$. Compare circuit $806_{1,0}$, however, compares the logic zero on priority signal line $808_1$ with the logic one stored in memory element $702_{1,0}$, and de-asserts match line segment $810_{0,0}$. When a match line segment is de-asserted, all subsequent compare circuits for that row will de-assert the remaining match line segments of the row such that the corresponding internal address line IAD will be de-asserted. When IAD is de-asserted for a particular row, this indicates that the most significant priority number is not stored in that row. Additionally, when the remaining match line segments are de-asserted for a row, the compare circuits for that row do not discharge the remaining priority signal lines regardless of the logic states stored in the corresponding memory elements of that row. For example, compare circuit $806_{0,0}$ does not discharge priority signal line $808_0$ even though memory element $702_{0,0}$ stores a logic zero. Additionally, isolation circuits $804_{3,0}$, $804_{2,0}$, and $804_{1,0}$ isolate the de-asserted match line segment $810_{0,0}$ from match line segment $810_{3,0}$, $810_{2,0}$, and $810_{1,0}$ such that PNUM$_3$, PNUM$_2$, and PNUM$_1$ are not affected by the de-assertion of match line segment $810_{0,0}$.

Lastly, the least significant bit PNUM$_0$ is resolved. Compare circuit $806_{0,1}$ alone determines PNUM$_0$ since compare circuit $806_{0,0}$ cannot discharge priority signal line $808_0$. Since memory element $702_{0,1}$ stores a logic one and match line segment $810_{0,1}$ is asserted, compare circuit $806_{0,1}$ leaves priority signal line $808_0$ pre-charged, and PNUM$_0$ is a logic one. Additionally, compare circuit $806_{0,1}$ allows IAD$_1$ to have the same state as match line segment $810_{0,1}$. Since match line segment $810_{0,1}$ is asserted, IAD$_1$ will be asserted indicating that the most significant priority number is stored in that row.

Thus, when the processing of step 506 is completed, bits PNUM$_3$-PNUM$_0$ indicate that the most significant priority number stored in the priority index table is 0101, and IAD$_1$ is asserted identifying that 0101 is stored in row one.

Any circuits may be used for compare circuits 806 and/or isolation circuits 804 to implement the process illustrated above. Table 1 shows one example of a truth table for implementing each compare circuit 806, where X (column) and Y (row) are any integers. Other truth tables may be used (and corresponding logic generated accordingly) including those that logically complement one of more of the signals indicated in Table 1. Any logic or circuitry may be used to implement the truth table of Table 1.

TABLE 1

| STATE | 808 | 702 | $810_{X,Y}$ | $810_{X-1,Y}$ |
|---|---|---|---|---|
| 0 | 0 | 0 | 0 | 0 |
| 1 | 0 | 0 | 1 | 1 |
| 2 | 0 | 1 | 0 | 0 |

TABLE 1-continued

| STATE | 808 | 702 | $810_{X,Y}$ | $810_{X-1,Y}$ |
|---|---|---|---|---|
| 3 | 0 | 1 | 1 | 0 |
| 4 | 1 | 0 | 0 | 0 |
| 5 | 1 | 0 | 1 | 1 |
| 6 | 1 | 1 | 0 | 0 |
| 7 | 1 | 1 | 1 | 1 |

Figure 10:
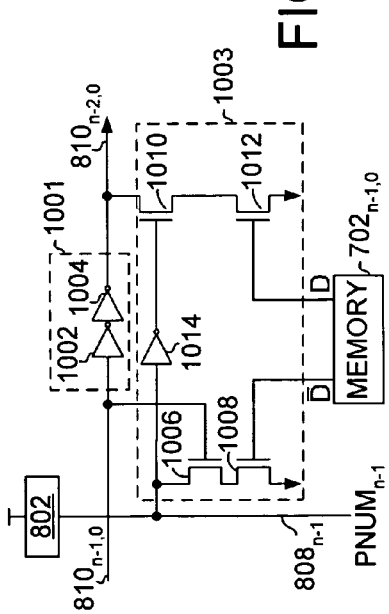
FIG. 10 is one embodiment of a compare circuit and an isolation circuit for the priority logic element of FIG. 7.

FIG. 10 shows one embodiment of a circuit, referred to herein as a priority logic element or priority cell, for implementing the truth table of Table 1. The priority logic element of FIG. 10 includes compare circuit 1003, isolation circuit 1001, and memory element $702_{n-1,0}$. Compare circuit 1003 is one embodiment of compare circuit $806_{n-1,0}$, and isolation circuit 1001 is one embodiment of isolation circuit $804_{n-1,0}$. The embodiment of FIG. 10 may be used to implement all of the priority logic elements 704 in the priority index table.

Compare circuit 1003 includes inverter 1014, transistors 1006 and 1008 connected in series between priority signal line $808_{n-1}$ and ground, and transistors 1010 and 1012 connected in series between match line segment $810_{n-2,0}$ and ground. N-channel transistor 1006 has its drain coupled to signal line $808_{n-1}$, it gate coupled to match line segment $810_{n-1,0}$, and its source coupled to the drain of n-channel transistor 1008. Transistor 1008 has its gate coupled to receive the logical complement of the priority number bit (/D) stored in memory element $702_{n-1,0}$, and its source coupled to ground. N-channel transistor 1010 has its drain coupled to match line segment $810_{n-2,0}$, its gate coupled to signal line $808_{n-1}$ via inverter 1014, and its source coupled to the drain of n-channel transistor 1012. Transistor 1012 has its gate coupled to receive the priority number bit (D) stored in memory element $702_{n-1,0}$, and its source coupled to ground. Any of transistors 1006, 1008, 1010, and 1012 can be replaced with other types of transistors and the logic adjusted accordingly.

Isolation circuit 1001 includes inverters 1002 and 1004. For alternative embodiments, only one inverter may be used and the logic of the next compare circuit adjusted accordingly. For other embodiments, other isolation circuits such as one or more AND, OR, or XOR logic gates or pass gates may be used.

For the example described above with respect to FIG. 9, the most significant priority number is the lowest number such that 0101 is the most significant number between 0101 and 0110. For another embodiment, the priority numbers are stored in descending priority order such that 0110 is the most significant priority number between 0101 and 0110. Such an embodiment is described in U.S. patent application Ser. No. 09/729,871.

The previously described embodiments of system 400 of FIG. 4 show that policy statements can be loaded into CAM array 404 in any order. When an incoming packet is received, CAM device 402 can identify the address in CAM array 404 of the highest priority policy statement that matches the policy information of the incoming packet. The identified address can then be used to access routing information stored in route memory 414. CAM device 402 can perform this function without the user having to preorder the policy statements for entry into the CAM array. This can reduce the hardware and/or software needed for table management of the CAM array, and can increase the performance of a router incorporating the CAM device 402.

CAM device 402 can operate asynchronously or synchronously. When CAM device 402 operates synchronously, it receives a clock signal that may be used to clock in the policy search key and an instruction that causes the process of FIG. 5 to be performed by CAM device 402. CAM device 402 may implement the classification function of FIG. 5 in one or more clock cycles.

Inserting and Deleting Policy Statements

As previously described, priority numbers for policy statements may be assigned in ascending or descending priority order such that there are gaps left between the numbers to accommodate the new priority numbers associated with new policy statements to be stored in CAM array 404. Alternatively, the priority numbers may be assigned in consecutive ascending or descending priority order. New policy statements and their associated priority numbers can be added to the tables 404 and 408 in conformance with either assignment method without having to reload or physically reorder the policy statements or the priority numbers in the respective tables.

Each new policy statement can be loaded into any location (e.g., the next free location) in CAM array 404, and can be assigned a new priority number without having to reload or reorder CAM array 404 and priority memory 408. When a new policy statement is received, its priority number can be compared with the existing priority numbers already stored in priority memory 408 to determine if a policy statement already exists that has been assigned that priority. It is generally desirable that no two policy statements have the same priority number. Thus, if the priority number already exists, the network administrator or the policy-based router itself can assign the new policy statement a new priority number, or the priority number of the existing policy statement can be updated (i.e., incremented or decremented). Since the existing priority numbers are stored in ascending or descending order, updating one priority number may also result in the need to update other priority numbers such that no two priority numbers are the same.

When a policy statement is deleted from CAM array 404, the corresponding priority number in priority memory 408 is also deleted. The policy statements and priority numbers can be deleted by setting one or more valid bits to an appropriate state for the row of CAM array 404 that stores the policy statement to be deleted. The valid bit(s) may be stored in CAM array 404, priority memory 408, or in each of the memory arrays.

When a priority number is deleted, the remaining priority numbers in priority memory 408 can be left unchanged. This may leave gaps in the priority numbers stored in the priority memory. These gaps may be filled in by new priority numbers associated with new policy statements to be added to the CAM device 402, or they may remain as unused gaps. For another embodiment, remaining priority numbers in the priority memory can be updated to remove gaps left by deleted policy statements. For example, if the priority numbers are assigned in ascending priority order, and one of the priority numbers is deleted or invalidated, then any other priority numbers that are greater than the deleted number can be decremented to maintain continuity in the sequence of priority numbers. Similarly, if the priority numbers are assigned in descending priority order, and one of the priority numbers is deleted or invalidated, then any other priority numbers that are less than the deleted number can be incremented to maintain continuity in the sequence of priority numbers.

For one embodiment, CAM device 402 may include circuitry to determine if at least one of the existing priority numbers stored in memory 408 is greater than or equal to (e.g., for ascending priority order), or, alternatively, less than or equal to (e.g., for descending priority order), a new priority number. If so, the existing priority numbers that are identified by the comparison may be updated such that a new policy statement does not have the same priority number as an existing policy statement. Similarly, CAM device 402 may include circuitry to maintain continuity in a sequence of priority numbers upon deletion (including change or invalidation) of a priority number. Such circuits are described in U.S. patent application Ser. No. 09/729,871.

Depth Cascading CAM Devices

As described above, CAM device 402 stores policy statements in CAM array 404 and identifies the highest priority matching policy statement without having to presort or prearrange the policy statements in the CAM array. CAM device 402 may also be included in a system that has multiple CAM devices connected in a depth cascade configuration that expands the number of memory locations in CAM array 404 and priority memory 408 to accommodate more policy statements and their associated priority numbers. Such a system is described in U.S. patent application Ser. No. 09/729,871.

Classless Inter Domain Routing (CIDR)

CAM device 402 can also be used to process Internet Protocol (IP) packets that use the Classless Inter Domain Routing (CIDR) scheme. With CIDR, an IP address has a generalized network prefix of a particular number of bits of a 32-bit IPv4 (Internet Protocol version 4) address or a 128-bit IPv6 (Internet Protocol version 6) address. The network prefix or mask indicates the number of left-most contiguous bits in the IP address that are used to filter an IP address in a routing table. That is, the network prefix indicates the number of higher-order or left-most contiguous bits in the IP address that participate in an address comparison with the routing table.

Conventional ternary CAM devices such as CAM 300 of FIG. 3 can store the IP addresses in rows 305, and their corresponding prefixes in rows 310. Routing information associated with a particular IP address is loaded into a corresponding address location in route memory 308. Due to the operation of priority encoder 306, IP addresses are generally presorted or prearranged prior to entry into a CAM device such that the IP address with the longest network prefix is located in the lowest logical address of the CAM array, and the IP address with the shortest network prefix is located in the highest logical address of the CAM array. When the IP addresses are presorted, a search on the CAM array for a particular IP address will identify the IP address that has the longest corresponding prefix, that is, will identify the best match. Accordingly, a search operation based on such IP prefixes is referred to herein as a longest prefix match (LPM) search.

A considerable amount of time is generally required to prearrange all of the CIDR address entries prior to loading the entries into a CAM device. Additionally, a considerable amount of time and overhead is also generally required to maintain the order of the routing table when entries are deleted or overwritten, or when new entries are to be added. Other architectures have been proposed that increase the size of the CAM array by adding additional logic in the CAM array itself and another match coupled to the rows of mask cells.

CAM device 402 of FIG. 4 can be used to process IP addresses without adding additional logic or signal lines to ternary CAM array 404. IP addresses can be loaded into CAM cell rows 405, and the corresponding decoded prefix data can be loaded into mask rows 407. Decoding logic can be provided in CAM device 402 to decode the prefix number. Additionally, the prefix data is encoded into a binary number and stored in corresponding locations in priority memory 408. Encoding logic can be provided in CAM device 402 to encode the prefix number into a binary (or other code) number.

When a search is performed for the IP address with the longest prefix (i.e., an LPM search), all matching locations in CAM array 404 will assert their corresponding match lines $ML_0$-$ML_{N-1}$. Priority logic 410 then compares, with each other, the encoded prefix numbers associated with the matching IP address. Priority logic 410 identifies the most significant encoded prefix number (i.e., the highest prefix number), and identifies its location in priority memory 408 to $IAD_0$-$IAD_{N-1}$. The encoded most significant prefix number may also be output from CAM device 402. Encoder 412 then encodes the identified location into an address for output to HPM bus 416. The corresponding route information can then be accessed in route memory 414. As in the previous embodiments described above, route memory 414 may also be included within CAM device 402.

For another embodiment, there may more than one identical most significant priority number identified by priority logic 410. For this embodiment, encoder 412 may be a conventional priority encoder that determines which address to output based on a predetermined priority (i.e., based on logical address locations).

CAM device 402 can process the CIDR based IP addresses without preloading the IP addresses in the CAM array in a predetermined order. Additionally, new IP address may be added at the next free address or any other designated address in CAM array 404 without reordering or reloading the CAM array. This can reduce the hardware and/or software needed for table management of the CAM array, and can increase the performance of a router incorporating the CAM device 402.

Figure 11:
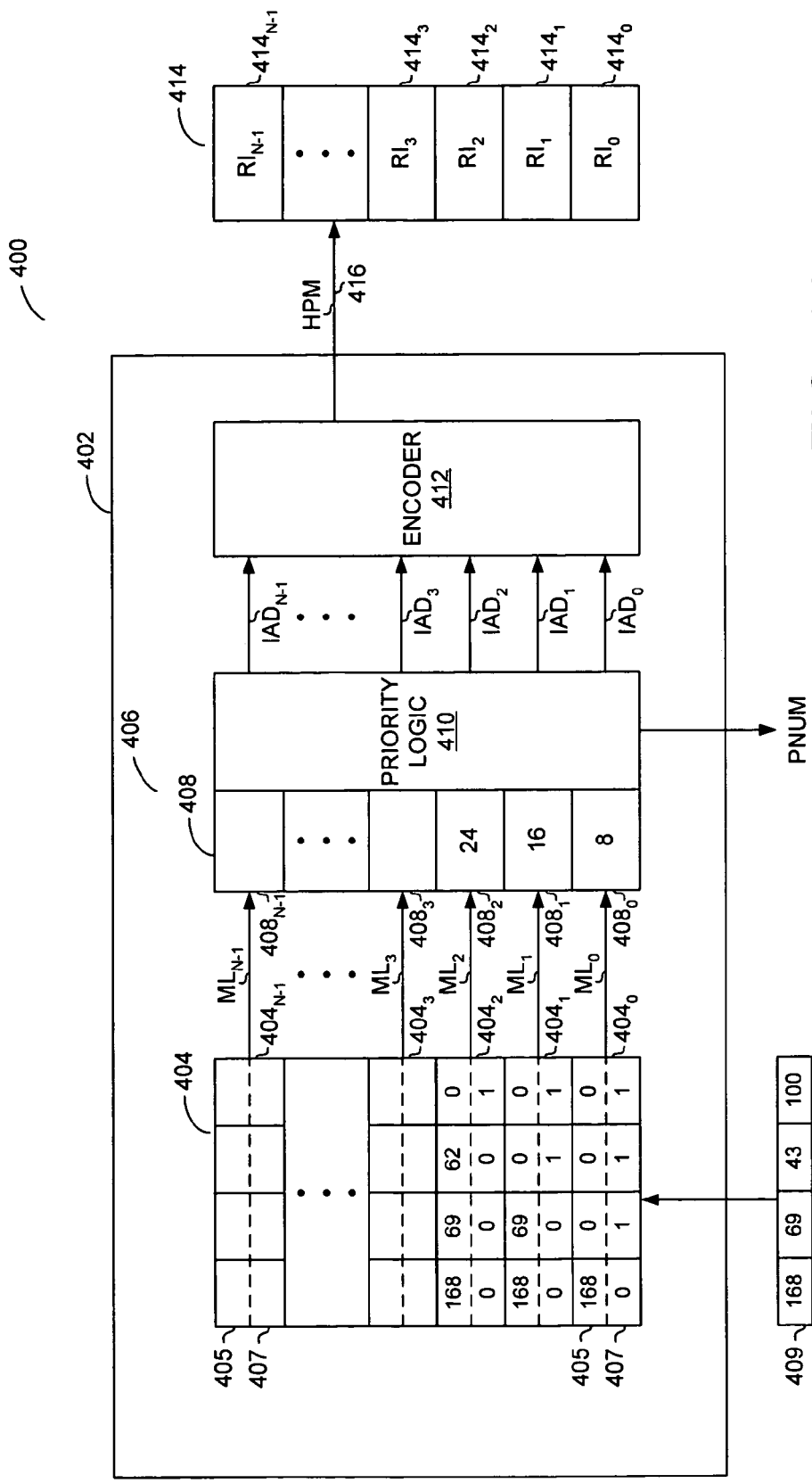
FIG. 11 is one example of processing Internet protocol addresses based on a classless inter domain routing scheme in the digital signal processor of FIG. 4.

The operation of CAM device 402 for processing CIDR based IP addresses can be illustrated by the example of FIG. 11. In FIG. 11, ternary CAM array 404 has IP address 168.0.0.0/8 stored at location $404_0$, 168.69.0.0/16 stored at location $404_1$, and 168.69.62.0/24 stored at location $404_2$. For this embodiment, each IP address is stored in array 404 as four eight-bit binary numbers. Also for this embodiment, when the decoded prefix data is a logic zero it does not mask the corresponding bits of the IP address. Priority memory 408 stores the prefixes 8, 16, and 24 at locations $408_0$, $408_1$, and $408_2$, and the corresponding routing information $RI_0$, $RI_1$, and $RI_2$ are stored at locations $414_0$, $414_1$, and $414_2$ of route memory 414.

A search key of 168.69.43.100 is provided to CAM array 404, and the IP address with the best match (i.e., the longest prefix data) is determined as follows. When the search key is compared with the IP addresses, 168.69.0.0/16 and 168.0.0.0/8 are both identified as matches and $ML_0$ and $ML_1$ asserted. Between these two IP addresses, 168.69.0.0/16 is the best match as it has a longer prefix. Priority logic 410 compares the prefixes 16 and 8 stored at locations $408_0$ and $408_1$ and determines that 16 is greater than 8. The priority logic outputs 16 as the longest matching prefix to PNUM, and also identifies location $408_1$ by asserting $IAD_1$. Encoder 412 then encodes $IAD_0$-$IAD_{N-1}$ and generates an address of 1 on HPM bus 416 to access route information $RI_1$ in route memory 414.

Any of the embodiments of CAM device 402 described above can be used to implement priority logic 410 to process CIDR based IP addresses and their prefix numbers (e.g., with priority numbers/encoded prefix numbers stored in descending priority order and priority logic 410 configured accordingly). Additionally, multiple CAM devices can be depth cascaded as described in U.S. patent application Ser. No. 09/729,871 to implement a system that provides a sufficient number of CAM array locations for storing IP addresses.

CAM Device with Selective Mask Generation

Figure 12:
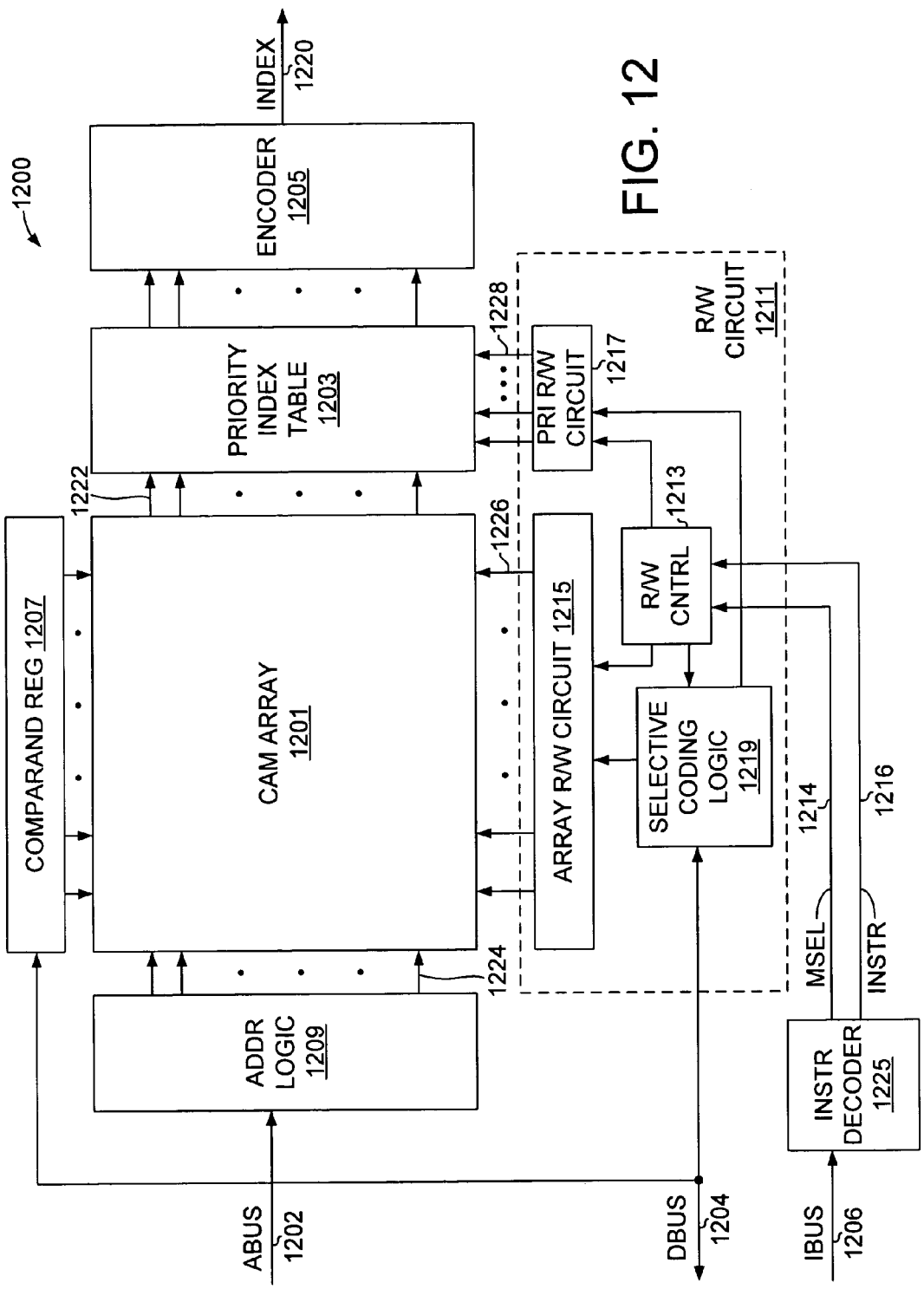
FIG. 12 illustrates an embodiment of a CAM device 1200 having a selective mask generation function.

FIG. 12 illustrates an embodiment of a CAM device 1200 having a selective mask generation function. The CAM device includes a CAM array 1201, address logic 1209, instruction decoder 1225, comparand register 1207, priority index table 1203, encoder 1205, and read/write circuit 1211. The CAM device 1200 may further include logic (not shown) for generating match flag, multiple match flag and/or full-flag signals.

Instructions, addresses and data are input to the CAM device 1200 via an instruction bus 1206, address bus 1202 and data bus 1204, respectively. The data may include, without limitation, comparand values to be stored in the comparand register 1207 (or applied directly to comparand signal lines of the CAM array), data values to be stored in the CAM array 1201, priority numbers to be stored in the priority index table 1203 and configuration values to be stored within one or more configuration registers (not shown) of the CAM device 1200. Each of the buses 1202, 1204, 1206 is preferably a multi-conductor signal path coupled to at least one host device, such as a general purpose processor, digital signal processor, network processor, application specific integrated circuit (ASIC) or other instruction issuing device. Also, in alternative embodiments, one or more of the buses 1202, 1204, 1206 may be eliminated and the corresponding signals time-multiplexed onto another of the buses. Further, signal transfer over any or all of the buses may be synchronous (e.g., clock signal or other timing information provided to indicate signal sampling time) or asynchronous. The CAM array 1201 is coupled to (i.e., connected directly to or through one or more intervening circuits) the address logic 1209, priority index table 1203 (which, for example, may be an embodiment of the priority index table 406 of FIG. 4), comparand register 1207, and read/write circuit 1211. The address logic 1209 is used to select a particular row of the CAM array 1201 and/or the priority index table 1203 for read or write access. The comparand register 1207 is used to store a comparand value received via the data bus 1204, and to output the comparand value to the CAM array 1201 during a compare operation. (In alternative embodiments the comparand register 1207 may be omitted and the comparand value input directly to the CAM array 1201 from the data bus 1204.) The priority index table 1203 is used to store priority values associated with data values stored in the CAM array 1201 and operates in conjunction with the CAM array 1201 and encoder 1205 to generate a match index 1220 (i.e., address of a highest priority value within the CAM array that is determined to match a comparand value) during a compare operation. The read/write circuit 1211 is used to sense the output of a selected row of CAM cells or priority cells (i.e., row of CAM cells or priority cells selected by the address logic 1209) during a read operation and to transmit a value to a selected row of CAM cells and/or priority cells during a write operation. As discussed below, in one embodiment, a priority number and mask value may be concurrently stored in the priority index table 1203 and CAM array 1201, respectively.

The CAM array 1201 includes a plurality of CAM cells arranged in rows and columns. Each row of CAM cells includes data storage elements to store one or more data words referred to herein as CAM words and may also include mask storage elements to store a local mask word (for example, CAM array 1201 may be ternary CAM array 404 of FIG. 4). A local mask word is used to mask (i.e., prevent) selected bits within a corresponding CAM word from affecting a comparison result. Each row of CAM cells within the CAM array 1201 may additionally include storage for a validity value that indicates whether a valid CAM word is stored within the row. In the case of segmented rows of CAM cells, discussed below, a separate validity value may be stored for each row segment.

During a compare operation, a comparand value may be masked by a global mask value, then compared simultaneously with all the CAM words stored in the CAM array 1201. Each of the rows of CAM cells in the CAM array 1201 is coupled to a corresponding row of priority cells in the priority index table via a respective match line 1222, and any match between the comparand value and a valid CAM word results in a match signal being asserted on the match line and received within the priority index table 1203. When one or more match signals are asserted on the match lines 1222, the priority index table 1203 and encoder 1205 operate as described above in reference to FIGS. 4-6 to determine the highest priority one of the asserted match signals (i.e., by comparing the corresponding priority numbers), and to and output a corresponding index 1220.

During a read or write operation to the CAM array 1201 and/or priority index table 1203, the address logic 1209 activates one of a plurality of word lines 1224 according to an address received from the address bus 1202 or from a source within the CAM device 1200. The activated word line enables a corresponding row of CAM cells within the CAM array 1201 to receive and store a CAM word or mask word from the read/write circuit 1211 during an array write operation, and to output a CAM word or mask word to the read/write circuit 1211 during an array read operation. The activated word line also enables a corresponding row of priority cells within the priority index table 1203 to receive and store a priority number from the read/write circuit 1211 during a priority write operation and to output a priority number to the read/write circuit 1211 during a priority read operation.

In one embodiment, each column of CAM cells within the CAM array 1201 is coupled to the read/write circuit via a respective pair of data bit lines (i.e., to carry differential signals), and via a respective pair of mask bit lines (the data bit lines and mask bit lines are shown together as signal paths 1226 in FIG. 12). Each pair of data bit lines is coupled to data storage elements within the corresponding column of CAM cells, and a corresponding pair of mask bit lines is coupled to mask storage elements within the column of CAM cells. In alternative embodiments, single-ended signaling may be used such that only one data bit line and one mask bit line is provided per column of CAM cells. Also, a single bit line (or pair of bit lines) may be coupled to both the data and mask storage elements within a given column of CAM cells, with the bit line being time multiplexed to carry, at different times, data and mask information. In one embodiment, each column of priority cells within the priority index table is coupled to the read/write circuit via a respective pair of priority bit lines 1228, though a single priority bit line per column may be used in alternative embodiments.

Still referring to the embodiment of FIG. 12, the read/write circuit 1211 includes read/write control logic 1213, selective coding logic 1219, array read/write circuit 1215 and priority read/write logic circuit 1217. The read/write control logic 1213 is responsive to instruction information 1216 from the instruction decoder 1225 to enable read and write access the CAM array 1201 and/or priority index table 1203. For example, when an array read instruction is received (i.e., an instruction to read a CAM word or mask word from a word-line-selected row of CAM cells within the CAM array), the read/write control logic 1213 outputs one or more enable signals to a sense amplifier circuit within the array read/write circuit 1215 to enable the sense amplifier circuit to sense a CAM word or mask word (according to the type of read instruction) from a selected row of CAM cells and to output the CAM word or mask word onto the data bus 1204. Similarly, when an array write instruction is received, the read/write control logic 1213 outputs one or more enable signals to a driver circuit within the array read/write circuit 1215 to enable the driver circuit to output a host-supplied CAM word or mask word (i.e., supplied via the data bus) to a selected row of CAM cells. The read/write control logic 1213 similarly enables a sense amplifier circuit within the priority read/write circuit 1217 to read a selected priority number in response to a priority read instruction, and enables a driver circuit within the priority read/write circuit 1217 to output a host-supplied priority number to a selected row of priority cells in response to a priority write instruction.

In one embodiment, search mode information is included within or associated with each priority write instruction (e.g., included within an operation code or operand of the instruction) to indicate whether the corresponding priority write data is a priority number or an IP prefix length value (i.e., a value, as discussed above, that indicates the number of bits within an Internet Protocol prefix that are to be unmasked during a compare operation within the CAM array 1201). The instruction decoder 1225 forwards the search mode information to the read/write control logic in the form of a control signal, referred to herein as a mode select signal 1214. If the mode select signal 1214 indicates that the write data is a priority number, then the read/write control logic 1213 signals the selective coding logic 1219, via a deasserted control signal 1232, to select the incoming write data to be forwarded to the priority read/write circuit 1217 and enables the priority read/write circuit 1217 to write the priority number to the selected row of priority cells within the priority index table 1203. If the mode select signal 1214 indicates that the write data is an IP prefix length value, on the other hand, the read/write control logic 1213 asserts the control signal 1232 to signal the selective coding logic 1219 to select a priority number generating circuit within the selective coding logic 1219 to provide a priority number to the priority read/write circuit 1217 and to select a mask generating circuit within the selective coding logic 1219 to provide a mask word to the array read/write circuit 1215. The read/write control logic 1213 further responds to the prefix length indication by enabling the array read/write circuit 1215 and the priority read/write circuit 1217 to concurrently (i.e., at least partly overlapping in time) output, to the CAM array and priority index table, respectively, the mask word and priority number generated by the selective coding logic 1219.

In one embodiment, the mask word and priority number generated within the selective coding logic 1219 are generated according to the incoming write data (i.e., IP prefix length value). Thus, the read/write circuit 1211 is responsive to the mode select signal 1214 to either store externally supplied write data in the priority index table 1203, or store a priority number and mask value generated from the externally supplied write data in the priority index table 1203 and CAM array 1201, respectively. As discussed below, in alternative embodiments, only the mask value or only the priority number is generated from the externally supplied write data. Also, the state of the mode select signal 1214 may be controlled by configuration information stored within the CAM device 1200, rather than by incoming priority write instructions. For example, the CAM device 1200 may include a storage circuit (e.g., configuration register) to store, in response to a host instruction, a mode value that determines the state of the mode select signal 1214. The CAM device may alternatively or additionally include a one-time programmable circuit (including a non-volatile storage circuit or fuse-programmable circuit) that may be programmed during an initialization operation or at device production time to set the state of the mode select signal 1214.

FIG. 13 illustrates an embodiment of a selective coding logic circuit 1300 that includes a decoder circuit 1301 to generate a mask value and an inverter circuit 1303 to generate a priority number. The decoder circuit 1301 is coupled to receive write data from the data bus 1204 (the write data may optionally be stored in a priority/prefix register 1302 within or external to the selective coding logic 1300) and includes circuitry to decode the write data to generate a corresponding mask word. The inverter circuit 1303 is also coupled to receive the write data from the data bus 1204 (or register 1302) and includes circuitry to invert each bit of an incoming IP prefix length value to generate a corresponding priority number. In one embodiment, the decoder circuit 1301 and inverter circuit 1303 operate on an N-bit IP prefix length value to generate a $2^N$-bit mask word and an N-bit priority number, respectively, as follows:

TABLE 2

| IP Prefix Length | Mask | Priority Number |
|---|---|---|
| 0 | 0111 1111 . . . 1111 | $2^N - 1$ |
| 1 | 0011 1111 . . . 1111 | $2^N - 2$ |
| 2 | 0001 1111 . . . 1111 | $2^N - 3$ |
| . | . | . |
| . | . | . |
| . | . | . |
| $2^N - 2$ | 0000 0000 . . . 0001 | 1 |
| $2^N - 1$ | 0000 0000 . . . 0000 | 0 |

The mode select signal 1214 is applied to respective control inputs of multiplexers 1305 and 1307 to select a data supplier for the array read/write circuit and for the priority read/write circuit. More specifically, if the mode select signal is in a first logic state (e.g., logic high), the mask value generated by the decoder circuit 1301 is selected to be output to the array read/write circuit, and the priority number generated by the inverter circuit 1303 is selected to be output to the priority read/write circuit. Conversely, if the mode select signal 1214 is in a second logic state, the write data from the data bus (or priority/prefix register) is selected to be output to the array read/write circuit and to the priority read/write circuit. Note that the priority number is inverted to achieve an ascending priority order (i.e., priority is inversely proportional to numeric value). In an embodiment in which a descending priority order is used, the inverter circuit 1303 and multiplexer 1307 may be omitted.

In one embodiment, the state of the mode select signal 1214 is determined by a search mode indication provided in an operation code or operand of a write instruction (or, alternatively, specified by a configuration storage circuit within the CAM device). For example, a host device may issue an LPM write instruction that includes (e.g., within an operation code and/or operand of the instruction) a longest prefix match value and an indication of an LPM search mode, or the host device may issue a classification write instruction that includes a priority number. The instruction decoder (e.g., element 1225 of FIG. 12) responds to the LPM write instruction by setting the mode select signal 1214 to the first state, thereby selecting, within selective coding logic 1300, the mask value generated by the decoder circuit 1301 to be output to the array read/write circuit, and the priority number generated by the inverter circuit 1303 to be output to the priority read/write circuit. The instruction decoder responds to the classification write instruction by setting the mode select signal 1214 to the second state, thereby selecting the host-provided priority number to be output to the priority number storage circuit. In other host applications, a host device may issue other types of instructions to the CAM device that include information to indicate whether the mode select signal 1214 is to be set to the first state or the second state. Also, as discussed above, the state of the mode select signal may be determined by configuration information stored within the CAM device rather than on an instruction-by-instruction basis. Referring again to FIG. 12, it should be noted that instead of supplying an IP prefix length value and instructing the CAM device 1200 to store a self-generated mask value and self-generated priority number (i.e., generated from the IP prefix length value), a host device may supply a mask value to the CAM device and instruct the CAM device to store the mask value and a self-generated priority number (i.e., generated from the mask value). That is, in an alternative embodiment, the selective coding logic may generate a priority number based on an incoming mask value, instead of generating a mask value based on an incoming IP prefix length value. FIG. 14 illustrates a selective coding logic circuit 1400 according to such an alternative embodiment. The selective coding logic 1400 includes an encoder circuit 1401 that receives an N-bit write data value from the data bus 1204 (the write data may optionally be stored in a priority/prefix register 1302 within or external to the selective coding logic 1400) and encodes the write data value into a $\log_2 N$-bit priority number as follows:

TABLE 3

| Write Data (Mask) | Priority Number |
|---|---|
| 0111 1111 . . . 1111 | $2^N - 1$ |
| 0011 1111 . . . 1111 | $2^N - 2$ |
| 0001 1111 . . . 1111 | $2^N - 3$ |
| . | . |
| . | . |
| 0000 0000 . . . 0001 | 1 |
| 0000 0000 . . . 0000 | 0 |

Different encodings (e.g., an encoding that corresponds to a descending priority order) may be used in alternative embodiments. If the mode select signal 1214 is asserted (e.g., active high), the multiplexer 1403 selects the priority number generated by the encoder circuit 1401 to be output to the priority read/write circuit. If the mode select signal 1214 is not asserted, the write data from the data bus 1204 (or priority/prefix register 1302) is output to the priority read/write circuit.

CAM Device having Programmable Word Width and Programmable Priority

Figure 15:
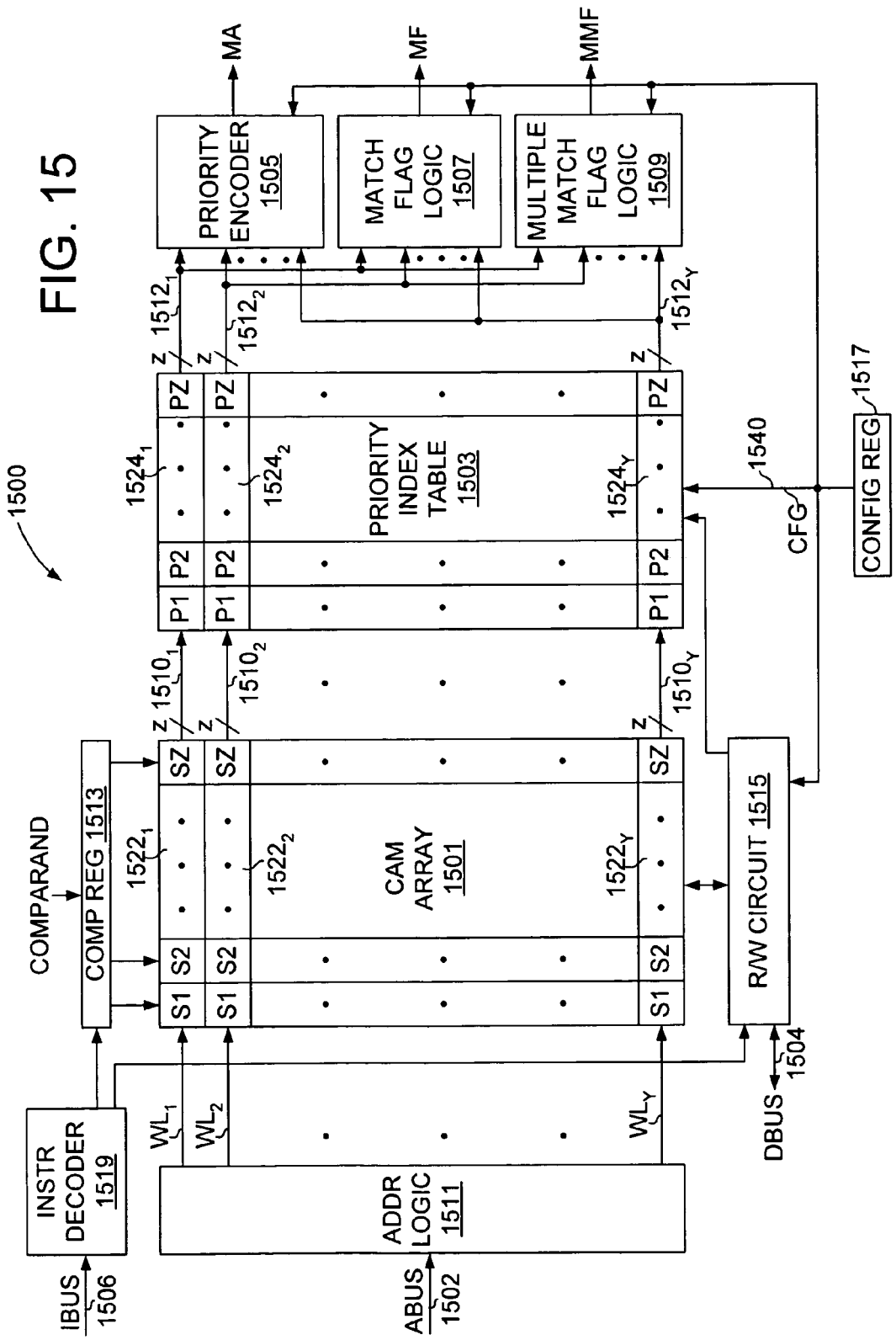
FIG. 15 illustrates an embodiment of a CAM device having a programmable data storage width and a programmable priority function.

FIG. 15 illustrates an embodiment of a CAM device 1500 having a programmable data storage width and a programmable priority function. The CAM device 1500 includes a CAM array 1501, address logic 1511, instruction decoder 1519, comparand register 1513, priority index table 1503, priority encoder 1505, read/write circuit 1515, configuration register 1517, match flag logic 1507 and multiple match flag logic 1509. The configurable CAM array includes Y rows $1522_1$-$1522_Y$ of CAM cells each segmented into Z row segments S1-SZ of W CAM cells each, where W, Y, and Z are any integer numbers. The W CAM cells that may be any type of CAM cells including binary and ternary CAM cells. One or more of the row segments may also include a different number of CAM cells than others of the row segments. Further, the CAM array 1501, priority index table 1503, and read/write circuit 1515 may be the CAM array, priority index table, and read/write circuit, respectively, of any of the CAM device embodiments described above. For example, the CAM device 1500 may be a particular embodiment of the CAM device of FIG. 12 that has a programmable data storage width and a programmable priority function.

CAM array 1501 can be configured into n different ZY/n width by nW depth configurations, where n is an integer from 1 to Z. In an exemplary embodiment, each of 2048 rows of CAM cells within the CAM array includes eight row segments of 32 CAM cells each (i.e., W=32, Y=2048 (2k), and Z=8), and may be used to store multiple CAM words that span either one, two, or four row segments, or a single CAM word that spans all eight row segments. In such an embodiment, referred to herein as a four-span embodiment to reflect the four possible CAM word widths, the CAM device can be programmed to have the following four different configurations:

TABLE 4

| Configuration | Number of Row Segments Spanned | Word Width (bits) | Storage Depth (i.e., number of available storage locations) | Overall Storage Dimension (depth × width) |
| --- | --- | --- | --- | --- |
| x32 | 1 | 32 | 16384 | 16k × 32 |
| x64 | 2 | 64 | 8192 | 8k × 64 |
| x128 | 4 | 128 | 4096 | 4k × 128 |
| x256 | 8 | 256 | 2048 | 2k × 256 |

By providing for selectable configurations in this manner (i.e., providing for a programmable storage width and depth), a single CAM device is enabled to store and maintain a different table size in each different mode of operation. The four-span embodiment is described in numerous instances below for purposes of example only. Numerous other configurations and numbers of row segment spans may be used in alternative embodiments. Also, for other embodiments, the CAM array 1501 can be configured on a row-by-row or section-by-section basis to store data words of selected sizes. For example, a first half of the CAM array 1501 may be configured as 1k×256, a next quarter of the array configured as 1k×128, a next eighth of the array configured as 1k×64, and a final eighth of the array configured as 2k×32. This flexibility allows the CAM device 1500 to store and maintain multiple tables of different sizes.

In one implementation of the CAM device 1500, the size of the priority numbers stored in the priority index table 1503 varies according to a storage width selected for the CAM array 1501 and/or a search mode selected for the CAM device 1500. In one embodiment, referred to herein as a uniform-priority-width embodiment, each priority number storage circuit includes enough priority cells (i.e., is wide enough) to store an entire priority number, regardless of the CAM array configuration and device search mode. That is, regardless of the number of row segments spanned by a given CAM word and regardless of the search mode, the priority of the CAM word is indicated by a priority number stored in a single priority number storage circuit (or portion thereof) within the priority index table 1503.

In an alternative embodiment, referred to herein as a programmable-priority-width embodiment, each priority number storage circuit is wide enough to store a minimum-width priority number, and circuitry is provided within the priority index table 1503 to concatenate two or more of the priority number storage circuits to store wider priority numbers for other CAM array configurations and/or search modes. Referring to the four-span embodiment, for example, when the CAM array 1501 is in the ×32 configuration, a priority number that spans a single priority number storage circuit is stored within the priority index table 1503 to indicate the priority of a CAM word stored in a corresponding row segment within the CAM array 1501. When the CAM array 1501 is in a ×64, ×128 or ×256 configuration, a priority number that spans one priority number storage circuit and at least part of another priority number storage circuit is stored within the priority index table 1503 to indicate the priority of a CAM word stored in a corresponding group of row segments within the CAM array 1501. Note that, in both the uniform-priority-width embodiment and the programmable-priority-width embodiment, numerous criteria other than (or in addition to) the CAM array configuration and device search mode may be used to determine the width of priority numbers stored in the priority index table 1503.

In one embodiment, configuration information that indicates a selected storage configuration for CAM array 1501 is stored in configuration register 1517 and used to generate one or more configuration signals collectively shown as CFG signal 1540. In the embodiment of FIG. 15, the configuration signal 1540 is provided to the read/write circuit 1515, priority index table 1503, priority encoder 1505, match flag logic 1507 and/or multiple match flag logic 1509. The configuration circuit may be provided to additional circuit blocks within the CAM device 1500 in alternative embodiments. Also, in alternative embodiments configuration register 1118 may be omitted and the configuration signal 1540 provided directly to one or more circuit blocks within the CAM device 1500 via an external interface. For another embodiment, the configuration signal 1540 may be generated by the instruction decoder 1519 in response to a read, write or compare instruction received via the instruction bus IBUS 1506.

In the four-span embodiment discussed above, the configuration signal CFG includes four component signals (only one of which is set at a given time) that specify the configuration of the CAM device as follows:

TABLE 5

| CFG[3] (SZ256) | CFG[2] (SZ128) | CFG[1] (SZ64) | CFG[0] (SZ32) | CAM Array Configuration |
| --- | --- | --- | --- | --- |
| 0 | 0 | 0 | 1 | x32 |
| 0 | 0 | 1 | 0 | x64 |
| 0 | 1 | 0 | 0 | x128 |
| 1 | 0 | 0 | 0 | x256 |

In an alternative embodiment, only two signals are used to indicate the four exemplary configurations, with each configuration corresponding to a respective one of four states (i.e., 00, 01, 10, 11). In yet another embodiment, three signals are used to indicate the four exemplary configurations, with one of the configurations being implied when none of the other bits is set. More or fewer component signals may be used to support more or fewer CAM array configurations in alternative embodiments.

Instruction decoder 1519 decodes various instructions provided on instruction bus IBUS 1506. The instructions may include instructions to program the word width and other operating parameters of the CAM device 1500, instructions to write data or mask words to one or more row segments of the CAM array 1501, instructions to read data or mask words from one or more row segments of the CAM array 1501, instructions to write priority numbers to one or more priority number storage circuits of the priority index table 1524, instructions to read priority numbers from one or more priority number storage circuits of the priority index table, and/or instructions to compare comparand data with one or more row segments of the CAM array. In one embodiment, comparand data is provided on the data bus DBUS 1504 (or another bus, such as a dedicated comparand bus) and stored in comparand register 1513 in preparation for a compare operation within the CAM array. Alternatively, the comparand register 1513 may be omitted and the comparand data provided directly to the CAM array 1501. The CAM system may also include one or more global mask registers (not shown) that can be loaded with mask values and used to mask selected bits within the comparand data before the comparand data is input to the CAM array 1501.

The instruction decoder 1519 provides various control signals to the address logic 1511, read/write circuitry 1515, and comparand register 1513 to control the execution of host-requested operations (e.g., read, write and compare operations, configuration operations, etc.). Additionally, the instruction decoder may provide one or more control signals to CAM array 1501, priority index table 1503, priority encoder 1505, match flag logic 1507, multiple match flag logic 1509, and configuration register 1517 to enable these circuits to perform their respective functions at an appropriate time. For an alternative embodiment, instruction decoder 1519 may be omitted and various read, write and compare control signals may be provided directly to one or more of the circuit blocks.

Reading and Writing Data and Priority Numbers

Data words and local mask words can be written to (i.e., stored) and read from selected row segments of the CAM array 1501 using address logic 1511 and read/write (data access) circuit 1515. Similarly, priority numbers can be written to and read from selected priority number storage circuits within the priority index table 1503 using the address logic and read/write circuit 1515.

Address logic 1511 uniquely selects one row of CAM cells within the CAM array 1501 and a corresponding row of priority number storage circuits within the priority index table 1503 in response to an input address. The input address may be received from a number of sources including, without limitation, address bus 1502, or an internal register within the CAM device (not shown), or an address counter (also not shown). In one embodiment, the address logic 1511 decodes a predetermined number of bits within the input address to activate (e.g., drive to a logic high state) a corresponding one of the word lines $WL_1$-$WL_Y$. Each of the word lines $WL_1$-$WL_Y$ is coupled to a corresponding row of CAM cells (i.e., the CAM cells that form row segments S1-SZ) and also to a corresponding row of priority cells (i.e., the priority cells that form priority number storage circuits P1-PZ) and, when activated, enables (i.e., selects) the row of CAM cells and the row of priority cells to receive data from the read/write circuit 1515 during a read operation and to output data to the read/write circuit 1515 during a write operation. The read/write circuit is coupled to the data bus and includes output circuitry to output data from the selected row of CAM cells and/or priority cells to the data bus during a read operation, and driver circuitry to forward data from the data bus to the selected row of CAM and/or priority cells during a write operation.

In one embodiment, the most significant bits of the input address are used within the address logic 1511 to select the row of CAM cells and/or priority cells to be accessed (i.e., to be read from or written to), while the least significant bits of the input address (e.g., address bits 0 through $\log_2 Z-1$) are provided to the read/write circuit 1515 to select one or more row segments within the selected row of CAM cells and/or one or more priority number storage circuits within the selected row of priority cells. That is, the most significant bits of the input address form a row address, while the least significant bits of the input address form a segment address.

Further, in one implementation, an input address includes only those bits necessary to uniquely identify a data word, mask word or priority number for a particular configuration of the CAM array 1501. Using the four-span embodiment described above as an example, bits within an incoming address may be allocated between the row address and segment address as follows:

TABLE 6

| Configuration (word width) | Incoming Address Bits | Allocated to Row Address | Allocated to Seg Address | # Data Storage Locations Per Row | # Pnum Storage Locations Per Row |
|---|---|---|---|---|---|
| x32 | $A_{13}$-$A_0$ | $A_{13}$-$A_3$ | $A_2$-$A_0$ | 8 | 8 |
| x64 | $A_{12}$-$A_0$ | $A_{12}$-$A_2$ | $A_1$-$A_0$ | 4 | 4 |
| x128 | $A_{11}$-$A_0$ | $A_{11}$-$A_1$ | $A_0$ | 2 | 2 |
| x256 | $A_{10}$-$A_0$ | $A_{10}$-$A_0$ | none | 1 | 1 |

Note that in all four configurations, 11 bits are allocated to the row address, thereby allowing activation of a unique one of the $2^{11}=2048$ word lines. Note also, that the number of bits allocated to the segment address decreases as the word width increases. Thus, in the x32 configuration in which each data word spans only one of the eight row segments, and the corresponding priority number spans only one of the eight priority number storage circuits, three address bits are allocated to the segment address to allow unique selection of one of $2^3=8$ row segments or priority number storage circuits. In the x64 configuration, each data word spans a pair of row segments and each priority number spans a pair of priority number storage circuits, so that there are only four addressable storage locations per row of the CAM array 1501 or priority index table 1503. Accordingly, two bits are allocated to the segment address to allow unique selection of one of the four pairs of row segments or one of four pairs of priority number storage circuits. In one embodiment of the ×128 configuration, each data word spans four row segments and each priority number spans one of two pairs of priority number storage circuits (a predetermined two of the four pairs of digits are unused). Accordingly, a single bit is allocated to the segment address to allow unique selection of one of the two groups of four row segments or one of the two pairs of priority number storage circuits. Finally, in the ×256 configuration, each data word spans all eight row segments within a given row of the CAM array 1501, and each priority number spans a predetermined pair of priority number storage circuits (the remaining three pairs of priority number storage circuits are unused). Accordingly, no segment address bits are needed for segment selection or priority number storage circuit selection in the ×256 configuration and, therefore, none of the input address bits are allocated to the segment address.

In an alternative addressing format, referred to herein as a uniform-address format, the number of address bits in the input address remains the same for each configuration of the CAM array, with one or more of the least significant bits being unused for word-widths that span two or more row segments. Using the four-span embodiment as an example, bits within an incoming address may be allocated between the row address and segment address as follows:

TABLE 7

| Configuration (word width) | Incoming Address Bits | Row Address Field | Segment Address Field | Unused Bits |
|---|---|---|---|---|
| ×32 | $A_{13}$-$A_0$ | $A_{13}$-$A_3$ | $A_2$-$A_0$ | None |
| ×64 | $A_{13}$-$A_0$ | $A_{13}$-$A_3$ | $A_2$-$A_1$ | $A_0$ |
| ×128 | $A_{13}$-$A_0$ | $A_{13}$-$A_3$ | $A_2$ | $A_1$, $A_0$ |
| ×256 | $A_{13}$-$A_0$ | $A_{13}$-$A_3$ | None | $A_2$, $A_1$, $A_0$ |

Because the row address field is independent of the word width configuration (i.e., same bits within the incoming address are used regardless of the word width), the uniform-address embodiment is particularly useful in CAM devices that permit more than one word-width configuration, such as a CAM device having multiple, independently configurable CAM arrays as discussed below. In the descriptions of embodiments that follow below, the uniform address format is used, although the addressing format described in reference to Table 6 may alternatively be used.

Although a CAM device according to the present invention may be used to store data and mask words that span any number of segments within a row (or even multiple rows), it may be desirable or necessary to limit the width of the data bus used to read and write the data and mask words (e.g., to reduce the bus capacitance and therefore increase the bus data rate, to facilitate backplane layout, etc.). For example, in one implementation of the four-span embodiment described above, a 64-bit wide data bus is used. Accordingly, when the CAM device is operated in the ×128 or ×256 configurations, data and mask words are read and written in successive component words of 64-bits each until the complete data word or mask word has been read or written. More specifically, in the ×128 configuration, two component words are written or read in succession to complete the 128-bit access, while in the ×256 configuration, four component words are written or read in succession to complete the 256-bit access. Thus, in such an embodiment, additional addressing information may be provided to control the selection of 64-bit component fields within the 128-bit or 256-bit storage fields. (Alternatively, a predetermined selection order may be assumed such that additional addressing information is not needed.) Herein, data words that exceed the signal path width (and therefore must be transmitted over the signal path in a multiplexed manner) are referred to as long words and are said to be stored in long word storage locations within the CAM array 1501.

Figure 16:
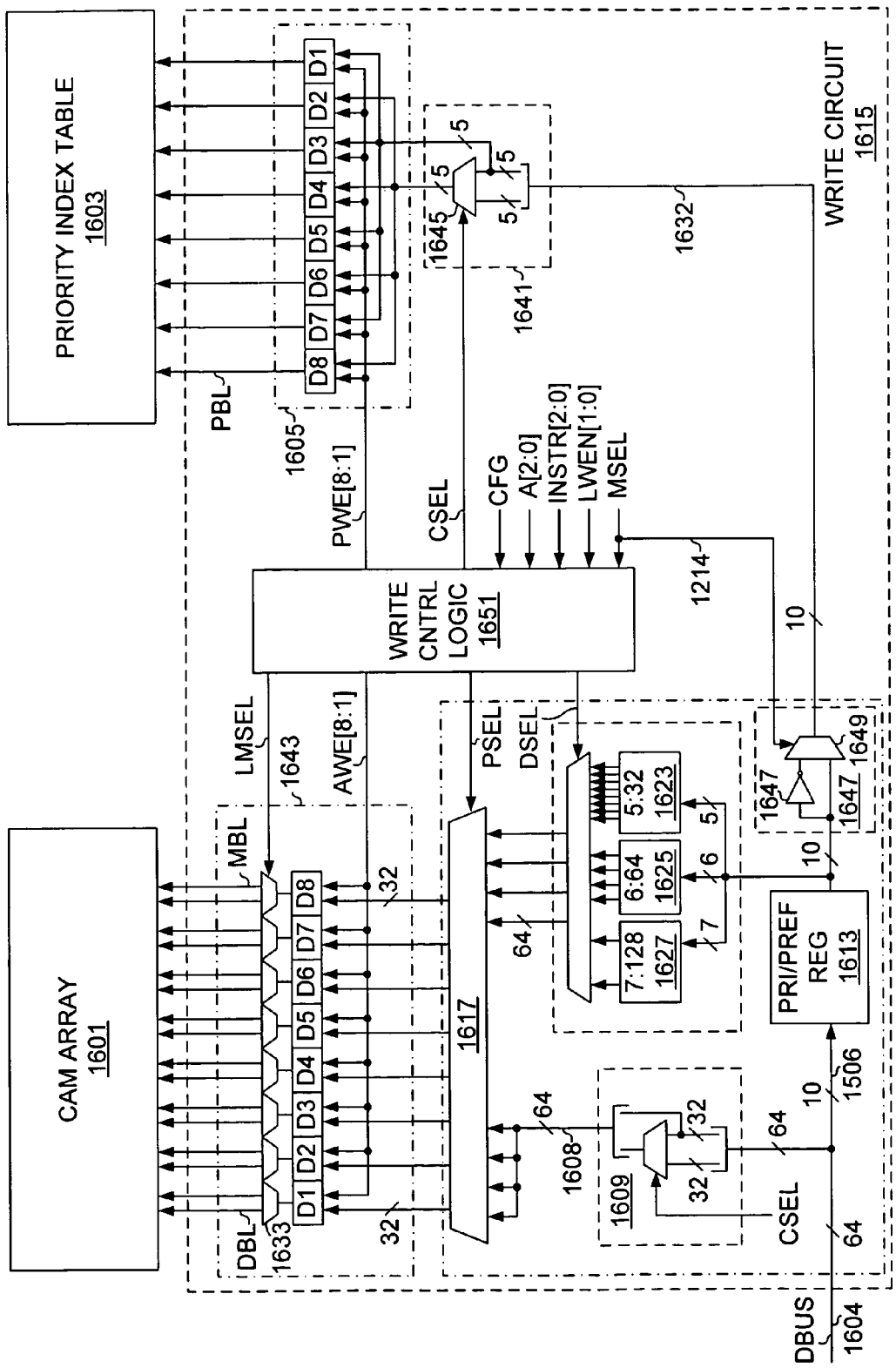
FIG. 16 illustrates an embodiment of a write data path within the read/write circuit of FIG. 15.

FIG. 16 illustrates a write circuit 1615 that corresponds to the four-span CAM device embodiment described above, and that may be used within the read/write circuit 1515 of FIG. 15. The write circuit 1615 is coupled to receive write data (e.g., priority numbers, data words, mask words, and components of long data words and long mask words) from a data bus 1604 and includes write control logic 1651, array write driver 1643, priority write driver 1605, selective coding logic 1607 and chunk select circuit 1641. In the particular embodiment shown, the data bus includes 64 signal lines (i.e., a 64-bit data bus), a least significant ten of which are bifurcated to form a 10-bit priority bus 1606. Other data bus and priority bus sizes may be used in alternative embodiments.

The write control logic 1651 responds to instruction, address, configuration and operating mode signals to control the delivery of write data (or data generated therefrom) to the array write driver 1643 and priority driver circuit 1605, and to activate selected driver banks within the array and priority driver circuits. Referring specifically to the write data path for a CAM array 1601, the write control logic 1651 outputs a path select signal, PSEL, to multiplexer 1617 within the selective coding logic 1607 to select either the data bus 1604 or a configuration dependent decoder circuit 1611 to provide data to the array write driver 1643. If the data bus 1604 is selected to provide data to the array write driver 1643, a data or mask value received via the data bus 1604 is input to each of eight 32-bit array driver banks, D1-D8, within the array write driver 1643. Accordingly, when a selected one of array write enable signals AWE[8:1] is asserted, the corresponding driver bank within the array driver circuit 1603 is enabled to drive the 32-bit data or mask word onto the corresponding data or mask bit lines (DBL or MBL), respectively, within the CAM array 1601. The data word or mask word is then stored in a word-line selected row segment within a column of row segments coupled to the driven data or mask bit lines.

When the CAM device is configured for ×32 data storage, the write control logic 1651 asserts a chunk select signal, CSEL, to a chunk select circuit 1609 within the selective coding logic 1607 to select a lower half of the data bus (i.e., signal lines 0-31) to source signals on both the upper and lower halves of a 64-bit signal path 1608. Multiplexer 1617 couples the upper half of the signal path to array driver banks D2, D4, D6 and D8 of the array write driver 1643, and the lower half of the signal path 1608 to driver banks D1, D3, D5 and D7. By this arrangement, a 32-bit data or mask word received via the data bus 1604 is input to each of the array driver banks D1-D8 within the array write driver 1643.

When the configuration signal 1540 indicates a ×64, ×128 or ×256 CAM array configuration, the chunk select signal is deasserted (e.g., set to a logic low state) to select the upper 32 signal lines of the data bus to provide data to the driver banks D2, D4, D6 and D8 such that a 64 bit data or mask value received via the data bus is provided to each of the array driver bank pairs D1|D2, D3|D4, D5|D6 and D7|D8 within the array write driver 1643.

Note that in an alternative embodiment, a 32-bit data or mask word may be output on both halves of the data bus 1604 by the device or circuit supplying the write data. In such an embodiment, the chunk select circuit 1609 may be omitted. Also, the CAM device may be configured to allow a 32-bit value to be received on either half of the data bus and provided to all the array driver banks. In that case, the chunk select circuit 1609 may include additional circuitry to steer a 32-bit value from a selected half of the data bus 1604 to both halves of the 64-bit signal path 1608.

As described previously with respect to FIGS. 12-14, the mode select signal 1214 is in a first state to indicate a first type of search mode, and a second state to indicate a second type of search mode. In the exemplary embodiments discussed below, the mode select signal 1214 is described as indicating either an LPM search mode (in which case the corresponding priority write data is an IP prefix length value) or a classification search mode (in which case the corresponding priority write data is a priority number). Numerous other search modes may be indicated by the mode select signal 1214 in alternative embodiments, and the mode select signal 1214 may include constituent signals to allow indication of more than two search modes. Also, the mode select signal 1214 may indicate mode information other than search mode information.

In the embodiment of FIG. 16, the decoder circuit 1611 is used to provide mask data to the array driver circuit 1643 during a priority number write operation when the mode select signal 1214 indicates that the incoming write data is, for example, a IP prefix length value. In that circumstance, the prefix length value is received via the priority bus 1606 (i.e., a subset of the signal lines that form data bus 1604) and stored in a priority/prefix register 1613 (as discussed above in reference to FIGS. 13 and 14, the priority/prefix register may be omitted in alternative embodiments). Each of a plurality of decoder subcircuits (1623, 1625 and 1627) within the decoder circuit 1611 receives and decodes the prefix length value to generate a corresponding mask word. In the embodiment of FIG. 16, for example, the decoder circuit 1611 includes three decoder subcircuits: a 5:32 decoder subcircuit 1623 to decode a five-bit prefix length value into a 32-bit mask word; a 6:64 decoder subcircuit 1625 to decode a six-bit prefix length value into a 64-bit mask word; and a 7:128-bit decoder subcircuit 1627 to decode a seven-bit prefix length value into 128-bit mask word. Depending on the word width configuration indicated by signal 1540, the write control logic 1651 outputs one or more decode select signals DSEL to multiplexer 1621 to select one of the three decoder subcircuits (1623, 1625, or 1627) to provide a mask data word for storage in the CAM array 1601. More specifically, if the 5:32 decoder subcircuit 1623 is selected, the 32-bit mask word generated by the decoder is forwarded via multiplexers 1621 and 1617 to each of the eight array driver banks, D1-D8, within the array write circuit 1603. If the 6:64 decoder is selected, the 64-bit mask word generated by the decoder is forwarded to each of the pairs of array driver banks (i.e., D1|D2, D3|D4, D5|D6 and D7|D8). If the 7:128 decoder is selected the 128-bit mask word generated by the decoder is forwarded to each group of four array driver banks (i.e., D1|D2|D3|D4 and D5|D6|D7|D8). In the particular embodiment of FIG. 16, no decoder subcircuit is used in the ×256 mode. In alternative embodiments, one or more additional decoder subcircuits may be provided to support other decoding functions including, without limitation, a decoder subcircuit to decode a priority number into a 256-bit mask value (or mask value of any other size). In the embodiment of FIG. 16, eight array write enable signals, AWE[8:1], are coupled to respective enable inputs of the array driver banks, D1-D8 within the array write driver 1643. When asserted (e.g., to a logic high state), an array write enable signal enables the corresponding array driver bank to drive a 32-bit data or mask word (i.e., the value provided via the data bus 1604 or generated by the decoder circuit 1611) onto bit lines of the CAM array 1601 for storage in a row segment within the selected row of CAM cells. The write control logic 1651 outputs a local mask select signal, LMSEL, to demultiplexer bank 1633 to select either data bit lines (coupled to data memory elements within respective columns of CAM cells) or mask bit lines (coupled to local mask memory elements within the columns of CAM cells) to receive the write data word. As discussed below, the array write enable signals are generated by the write control logic 1651 according to the low order bits of the input address (A[2:0]), instruction signals (INSTR[2:0]), configuration signals (CFG), mode select signal (MSEL) and long word enable signals (LWEN[1:0]).

The priority number write path includes the priority bus 1606, priority register 1613, inverter circuit 1615, chunk select circuit 1641 and priority write driver 1605. In one embodiment, the size and interpretation of the value received via the priority bus corresponds to the word-width configuration for the CAM array 1601 and the device search mode (LPM search or packet classification (PC)) as follows:

TABLE 8

| Word Width Configuration | Search Mode | Incoming Value | Number of Significant Bits |
|---|---|---|---|
| x32 | LPM | Prefix | 5 |
| x64 | LPM | Prefix | 6 |
| x128 | LPM | Prefix | 7 |
| x64 | PC | Priority Number | 10 |
| x128 | PC | Priority Number | 10 |
| x256 | PC | Priority Number | 10 |

Thus, when the LPM search mode is selected, less than all the signals provided on the 10-bit priority bus are used. The priority register 1613 is used to store an incoming priority value or prefix length value and may be omitted in an alternative embodiment. The inverter circuit 1615 is provided to convert a prefix length value to an ascending-order priority number and may be omitted if a descending priority order is used. As discussed above, the mode select signal 1214 is asserted if the CAM device is configured for (or an incoming instruction specifies) the LPM search mode. Accordingly, the mode select signal 1214 is output to the multiplexer 1649 select either an inverted or non-inverted version of value stored in the priority register 1613 to be provided to the priority driver circuit 1605. More specifically, when the mode select signal 1214 is asserted (indicating LPM search mode), an inverted version of a prefix length value (i.e., inverted by inverter 1647) is output to the priority driver circuit 1605, and when the MSEL signal is deasserted (indicating classification search mode), a priority number received via the priority bus 1606 is output to the priority driver circuit 1605.

Still referring to FIG. 16, the priority number output by the inverter circuit 1615 is provided to a chunk select circuit 1641. When the CAM device is configured in a ×32 configuration (a configuration 5-bit priority number as shown above in Table 8), the write control logic 1651 outputs the chunk select signal, CSEL to the chunk select circuit 1641 to select the least significant five signal lines of the 10-bit path 1632 to provide the same 5-bit priority number to each of the eight drive circuit banks, D1-D8, within the priority driver 1605. Accordingly, when a selected one of priority write enable signals PWE[8:1] is asserted, the corresponding driver bank within the priority driver circuit 1605 is enabled to drive the 5-bit priority number onto corresponding priority bit lines (PBL) within the priority index table 1603. The priority number is then stored in a word-line-selected priority number storage circuit within a column of priority number storage circuits coupled to the driven priority bit lines.

When the CAM device is not in the ×32 configuration, the priority number includes more than five bits and therefore spans more than one priority number storage circuit. In one embodiment, a least significant digit (e.g., least significant five bits) of the priority number is provided to driver banks D1, D3, D5 and D7 within the priority driver circuit 1605, and a most significant digit of the priority number (which may be one, two or five bits when the priority number configurations of Table 8 are used) is provided to driver banks D2, D4, D6 and D8. Thus, the full ten bits of the priority number (not all of which are necessarily used) is provided to driver bank pairs D1|D2, D3|D4, D5|D6 and D7|D8 within the priority driver circuit. Accordingly, when a particular pair of priority write enable signals PWE[8:7]-PWE[2:1] is asserted, the corresponding pair of driver banks within the priority driver circuit 1605 is enabled to drive a 6-bit to 10-bit priority number onto corresponding priority bit lines within the priority index table 1603 to store the priority number in a pair of priority number storage circuits within a row of priority cells selected by an activated word line. Alternatively, in the uniform-priority-width embodiment discussed above, each priority number storage circuit within the priority index table 1603 is wide enough to store all bits of a priority number, regardless of its size. Thus, in the uniform-priority-width embodiment, a single priority write enable signal is asserted to store a priority number in a selected priority number storage circuit (i.e., selected by incoming address) regardless of the CAM array configuration and device search mode.

As mentioned, the write control logic 1651 generates the priority write enable signals and array write enable signals in accordance with the configuration signal, low order address bits, long word enable signal, instruction signal and mode select signal. In one embodiment, the instruction decoder generates the instruction signals, INSTR[2:0], and the mode select 1214 signal based on an instruction received from a host processor or other instruction-issuing device as follows:

TABLE 9

| Instruction | INSTR[2] Array/ PTable | INSTR[1] Mask/Data | INSTR[0] R/W | MSEL 0 = PC 1 = LPM |
|---|---|---|---|---|
| Write Data | 0 | 0 | 0 | 0 |
| Read Data | 0 | 0 | 1 | 0 |
| Write Mask | 0 | 1 | 0 | 0 |
| Read Mask | 0 | 1 | 1 | 0 |
| Write Priority - Classif. Mode | 1 | X | 0 | 0 |
| Write Priority - LPM Mode | 1 | X | 0 | 1 |
| Read Priority | 1 | X | 1 | 0 |

In one embodiment, the write control logic 1651 derives the local mask select signal LMSEL, discussed above, as well as array read and write control signals, AR and AW (discussed below), and priority number read and write control signals, PR and PW (also discussed below), from the mode select signal 1214 and instruction signals, INSTR[2:0], as follows:

TABLE 10

| MSEL | INSTR[2] 0 = Array 1 = PTable | INSTR[1] 0 = Data 1 = Mask | INSTR[0] 0 = Read 1 = Write | AR | AW | PR | PW | LMSEL |
|---|---|---|---|---|---|---|---|---|
| X | 0 | 0 | 0 | 1 | 0 | 0 | 0 | 0 |
| X | 0 | 1 | 0 | 1 | 0 | 0 | 0 | 1 |
| X | 1 | X | 0 | 0 | 0 | 1 | 0 | 0 |
| X | 0 | 0 | 1 | 0 | 1 | 0 | 0 | 0 |
| X | 0 | 1 | 1 | 0 | 1 | 0 | 0 | 1 |
| 0 = PC | 1 | X | 1 | 0 | 0 | 0 | 1 | 0 |
| 1 = LPM | 1 | X | 1 | 0 | 1 | 0 | 1 | 1 |

Note that both the array write (AW) and priority write signals (PW) are asserted when the mode select signal indicates the LPM search mode and a priority table write instruction is received. In that circumstance, a mask value generated by the prefix decoder circuit discussed above is stored in the CAM array 1601 concurrently (i.e., at least partly overlapping in time) with storage of a priority number in the priority index table 1603.

Figure 17:
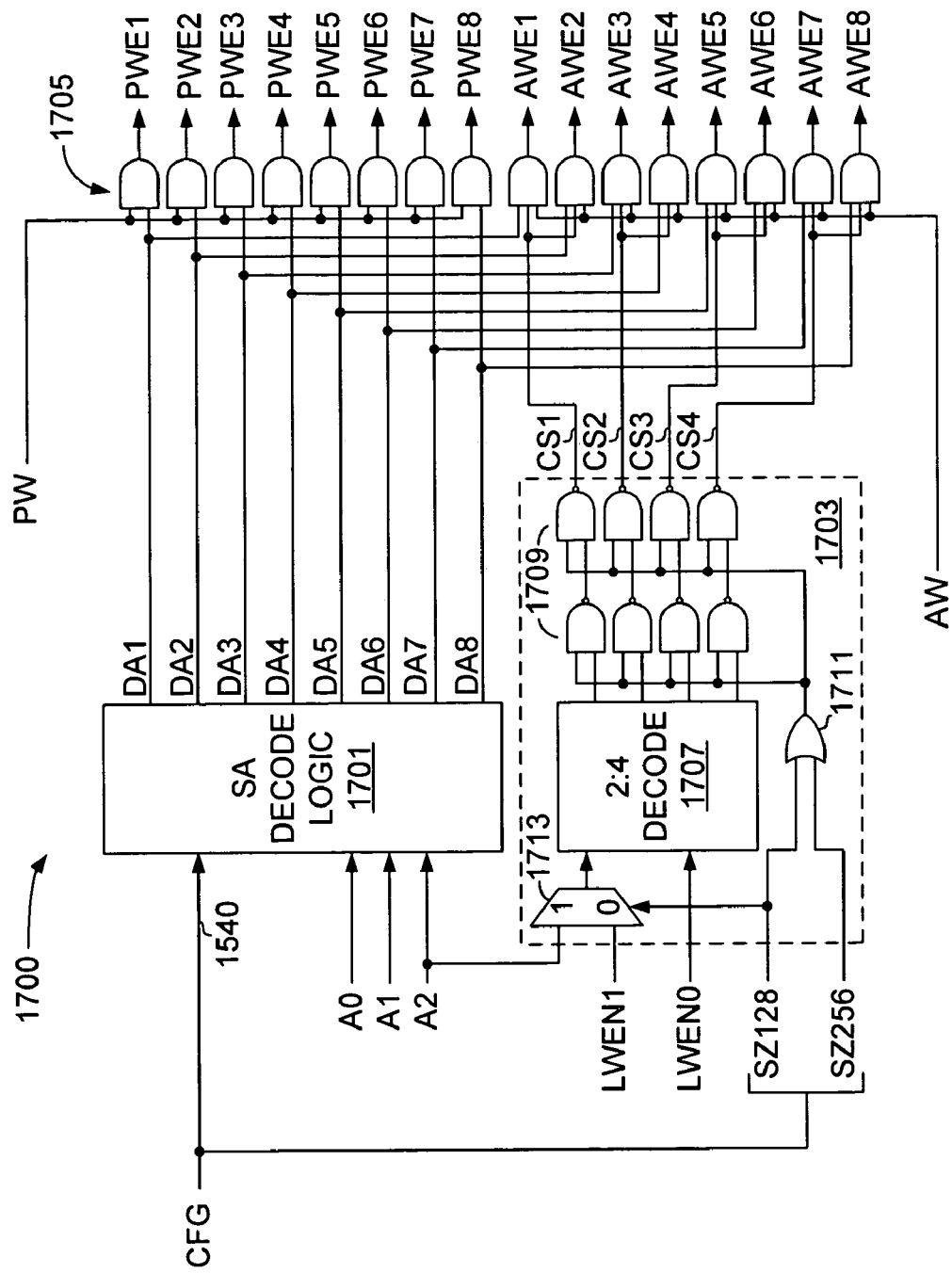
FIG. 17 illustrates a write enable logic circuit according to one embodiment.

FIG. 17 illustrates a write enable logic circuit 1700 within the write control logic 1651 that uses the array write signal, AW, and priority write signal, PW, along with the address, configuration and long word enable signals, to generate the priority write enable signals PWE[8:1] and the array write enable signals AWE[8:1]. In the embodiment of FIG. 17, the write enable logic circuit 1700 includes segment address decode logic 1701, a component select circuit 1703 and an AND gate array 1705. The segment address decode logic 1701 decodes the address bits A2, A1 and A0 according to the configuration signals 1540 to generate a plurality of decoded address signals, DA8-DA1, as follows:

TABLE 11

| Array Configuration | | | | Address | | | Decoded Address | | | | | | | |
|---|---|---|---|---|---|---|---|---|---|---|---|---|---|---|
| x256 | x128 | x64 | x32 | A2 | A1 | A0 | DA8 | DA7 | DA6 | DA5 | DA4 | DA3 | DA2 | DA1 |
| X | X | X | 1 | 0 | 0 | 0 | 0 | 0 | 0 | 0 | 0 | 0 | 0 | 1 |
| X | X | X | 1 | 0 | 0 | 1 | 0 | 0 | 0 | 0 | 0 | 0 | 1 | 0 |
| X | X | X | 1 | 0 | 1 | 0 | 0 | 0 | 0 | 0 | 0 | 1 | 0 | 0 |
| X | X | X | 1 | 0 | 1 | 1 | 0 | 0 | 0 | 0 | 1 | 0 | 0 | 0 |
| X | X | X | 1 | 1 | 0 | 0 | 0 | 0 | 0 | 1 | 0 | 0 | 0 | 0 |
| X | X | X | 1 | 1 | 0 | 1 | 0 | 0 | 1 | 0 | 0 | 0 | 0 | 0 |
| X | X | X | 1 | 1 | 1 | 0 | 0 | 1 | 0 | 0 | 0 | 0 | 0 | 0 |
| X | X | X | 1 | 1 | 1 | 1 | 1 | 0 | 0 | 0 | 0 | 0 | 0 | 0 |
| X | X | 1 | 0 | 0 | 0 | X | 0 | 0 | 0 | 0 | 0 | 0 | 1 | 1 |
| X | X | 1 | 0 | 0 | 1 | X | 0 | 0 | 0 | 0 | 1 | 1 | 0 | 0 |
| X | X | 1 | 0 | 1 | 0 | X | 0 | 0 | 1 | 1 | 0 | 0 | 0 | 0 |
| X | X | 1 | 0 | 1 | 1 | X | 1 | 1 | 0 | 0 | 0 | 0 | 0 | 0 |
| X | 1 | 0 | 0 | 0 | X | X | 0 | 0 | 0 | 0 | 1 | 1 | 1 | 1 |
| X | 1 | 0 | 0 | 1 | X | X | 1 | 1 | 1 | 1 | 0 | 0 | 0 | 0 |
| 1 | 0 | 0 | 0 | X | X | X | 1 | 1 | 1 | 1 | 1 | 1 | 1 | 1 |

Accordingly, if the PW signal is asserted (indicating that a priority table write operation is to be performed), priority write enable signals are activated as follows:

TABLE 12

| Array Configuration | | | | Address | | | Priority Write Enable | | | | | | | |
|---|---|---|---|---|---|---|---|---|---|---|---|---|---|---|
| x256 | x128 | x64 | x32 | A2 | A1 | A0 | PWE8 | PWE7 | PWE6 | PWE5 | PWE4 | PWE3 | PWE2 | PWE1 |
| X | X | X | 1 | 0 | 0 | 0 | 0 | 0 | 0 | 0 | 0 | 0 | 0 | 1 |
| X | X | X | 1 | 0 | 0 | 1 | 0 | 0 | 0 | 0 | 0 | 0 | 1 | 0 |
| X | X | X | 1 | 0 | 1 | 0 | 0 | 0 | 0 | 0 | 0 | 1 | 0 | 0 |
| X | X | X | 1 | 0 | 1 | 1 | 0 | 0 | 0 | 0 | 1 | 0 | 0 | 0 |
| X | X | X | 1 | 1 | 0 | 0 | 0 | 0 | 0 | 1 | 0 | 0 | 0 | 0 |
| X | X | X | 1 | 1 | 0 | 1 | 0 | 0 | 1 | 0 | 0 | 0 | 0 | 0 |
| X | X | X | 1 | 1 | 1 | 0 | 0 | 1 | 0 | 0 | 0 | 0 | 0 | 0 |
| X | X | X | 1 | 1 | 1 | 1 | 1 | 0 | 0 | 0 | 0 | 0 | 0 | 0 |
| X | X | 1 | 0 | 0 | 0 | X | 0 | 0 | 0 | 0 | 0 | 0 | 1 | 1 |
| X | X | 1 | 0 | 0 | 1 | X | 0 | 0 | 0 | 0 | 1 | 1 | 0 | 0 |
| X | X | 1 | 0 | 1 | 0 | X | 0 | 0 | 1 | 1 | 0 | 0 | 0 | 0 |
| X | X | 1 | 0 | 1 | 1 | X | 1 | 1 | 0 | 0 | 0 | 0 | 0 | 0 |
| X | 1 | 0 | 0 | 0 | X | X | 0 | 0 | 0 | 0 | 1 | 1 | 1 | 1 |
| X | 1 | 0 | 0 | 1 | X | X | 1 | 1 | 1 | 1 | 0 | 0 | 0 | 0 |
| 1 | 0 | 0 | 0 | X | X | X | 1 | 1 | 1 | 1 | 1 | 1 | 1 | 1 |

As discussed below, in one embodiment, selected columns of priority storage circuits are disabled in the ×128 and ×256 configurations so that storing duplicate priority numbers within the priority index table 1603 (e.g., four instances of a priority number are stored when all eight priority enable signals are asserted, three of the four being unused) does not affect subsequent priority number compare operations.

The array write enable signals AWE[8:1] are generated by the same decoded address signals as the priority write enable signals, but are gated by the array write signal, AW, instead of the priority write signal, PW, and are qualified by the component select circuit 1703. The component select circuit 1703 is provided to select a long word component in accordance with address bit, A2, and the long word enable signals, LWEN0 and LWEN1, and outputs four component select signals, CS1-CS4. When the CAM device is operated in a non-long word configuration (i.e., the ×32 configuration or the ×64 configuration in the exemplary four-span embodiment), the output of logic OR gate 1711 goes low, resulting in all four of the component select signals, CS1-CS4, being driven to a high logic state by logic NAND gates 1709. As a result, the array write enable signals AWE[8:1] are driven to a logic high or low state according to the decoded address signals, DA1-DA8.

In the ×128 and ×256 configurations, the output of logic OR gate 1711 goes high, thereby enabling one of the four component select signals CS1-CS4 selected by 2:4 decoder circuit 1707 to be driven to a logic high level by logic NAND gates 1709. A multiplexer 1713 forwards address bit A2 to a first input of the 2:4 decoder circuit 1707 when the ×128 mode is selected (e.g., when SZ128 is high) and the LWEN1 signal to the first input of the 2:4 decoder circuit 1707 when the ×128 mode is not selected. The LWEN0 signal is applied to a second input of the 2:4 decoder circuit 1707. The following table summarizes the operation of the component select circuit 1703:

TABLE 13

| CFG | A2 | LWEN1 | LWEN0 | CS4 | CS3 | CS2 | CS1 |
|---|---|---|---|---|---|---|---|
| ×32 | X | X | X | 1 | 1 | 1 | 1 |
| ×64 | X | X | X | 1 | 1 | 1 | 1 |
| ×128 | 0 | X | 0 | 0 | 0 | 0 | 1 |
| ×128 | 0 | X | 1 | 0 | 0 | 1 | 0 |
| ×128 | 1 | X | 0 | 0 | 1 | 0 | 0 |
| ×128 | 1 | X | 1 | 1 | 0 | 0 | 0 |
| ×256 | X | 0 | 0 | 0 | 0 | 0 | 1 |
| ×256 | X | 0 | 1 | 0 | 0 | 1 | 0 |
| ×256 | X | 1 | 0 | 0 | 1 | 0 | 0 |
| ×256 | X | 1 | 1 | 1 | 0 | 0 | 0 |

In the long word configurations (i.e., ×128 and ×256 in the four-span embodiment), the component select signals CS1-CS4 are used to select pairs of array write enable signals within the four or eight write enable signals otherwise enabled by the segment decode logic 1701 and array write instruction, AW. Specifically, when the array write signal, AW, is asserted, the component select circuit 1703 and segment address decode logic 1701 respond to the address, configuration and long word enable signals to activate array write enable signals as follows:

TABLE 14

| CFG | A2 | LWEN1 | LWEN0 | AWE8 | AWE7 | AWE6 | AWE5 | AWE4 | AWE3 | AWE2 | AWE1 |
|---|---|---|---|---|---|---|---|---|---|---|---|
| ×128 | 0 | X | 0 | 0 | 0 | 0 | 0 | 0 | 0 | 1 | 1 |
| ×128 | 0 | X | 1 | 0 | 0 | 0 | 0 | 1 | 1 | 0 | 0 |
| ×128 | 1 | X | 0 | 0 | 0 | 1 | 1 | 0 | 0 | 0 | 0 |
| ×128 | 1 | X | 1 | 1 | 1 | 0 | 0 | 0 | 0 | 0 | 0 |
| ×256 | X | 0 | 0 | 0 | 0 | 0 | 0 | 0 | 0 | 1 | 1 |
| ×256 | X | 0 | 1 | 0 | 0 | 0 | 0 | 1 | 1 | 0 | 0 |
| ×256 | X | 1 | 0 | 0 | 0 | 1 | 1 | 0 | 0 | 0 | 0 |
| ×256 | X | 1 | 1 | 1 | 1 | 0 | 0 | 0 | 0 | 0 | 0 |

In alternative embodiments, the data bus width may be selectively configured to use less than all available signal lines. In that case, additional long word enable signals may be provided to select yet smaller components within a long word.

Figure 18:
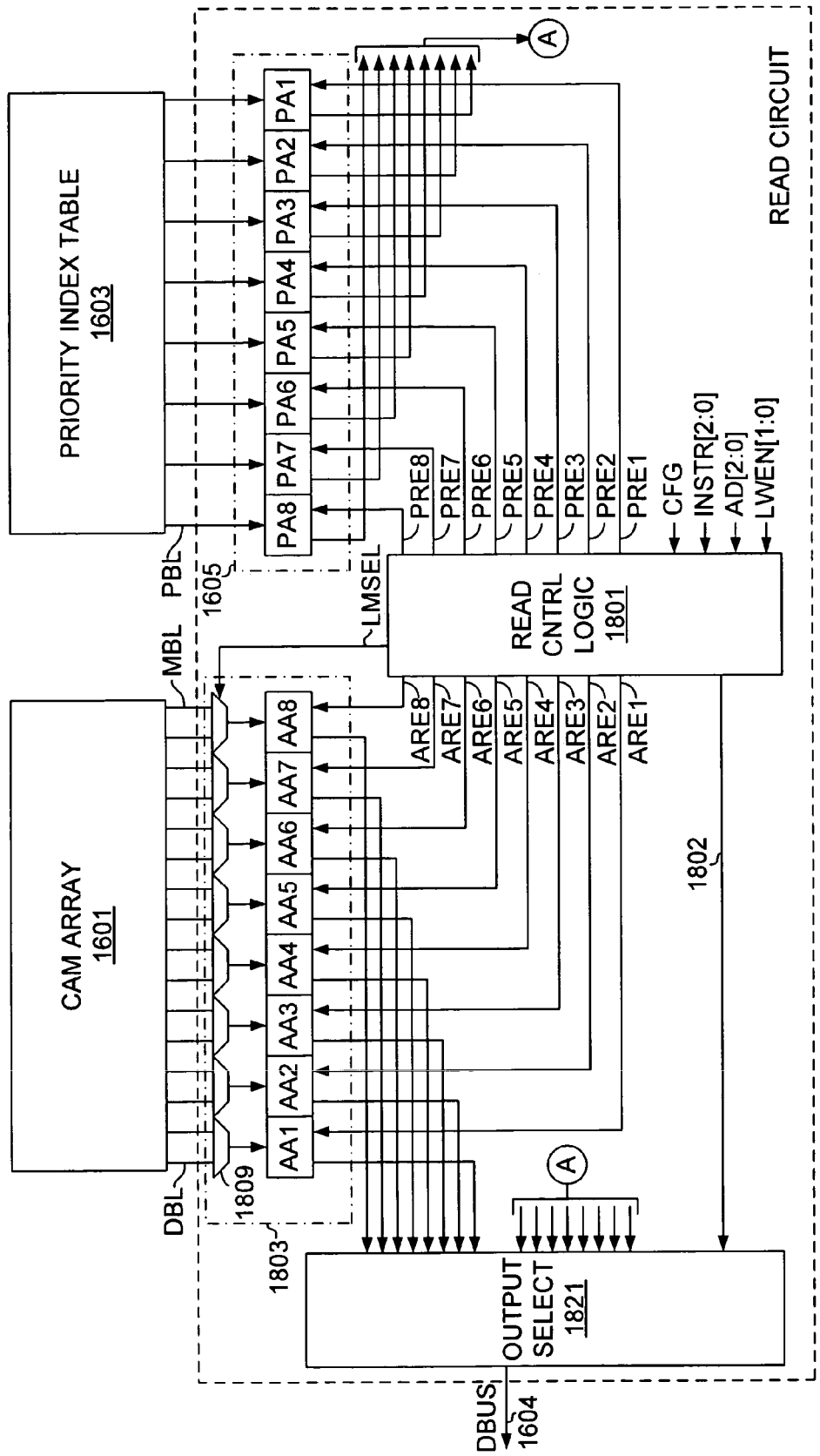
FIG. 18 illustrates a read circuit according to one embodiment.

FIG. 18 illustrates a read circuit 1615 that corresponds to the four-span CAM device embodiment described above, and that may be used within the read/write circuit 1515 of FIG. 15. Referring first to the CAM array read path, an array read circuit 1803 includes a set of sense amplifier banks, AA1-AA8, each coupled to a respective column of row segments within the CAM array 1601. A bank of multiplexers 1809 is provided to select, according to the local mask select signal (LMSEL), either the data bit lines (DBL) or mask bit lines (MBL) of the CAM array 1601 to provide read data to the amplifier banks of the array read circuit 1803, and a set of array read enable signals, ARE[8:1], is generated by the read control logic 1801 to enable selected amplifier banks within the array read circuit 1803 to output a data or mask word (or component thereof) to an output select circuit 1821. In one embodiment, the array read enable signals are generated in the same manner as the array write enable signals (i.e., as described above in reference to FIG. 17 and Tables 11 and 14), except that the signals are enabled by an array read signal, AR (described above in reference to Table 10), instead of the array write signal, AW.

Referring to the priority read path, a priority read circuit 1805 includes a set of amplifier banks, PA1-PA8, each coupled to a respective column of priority number storage circuits within the priority index table 1603. A set of priority read enable signals, PRE[8:1], are coupled respectively to the amplifier banks of the priority read circuit 1805 to enable selected amplifier banks or groups of amplifier banks to output a priority number to the output select circuit 1821. In one embodiment, the priority read enable signals are generated in the same manner as the priority write enable signals (i.e., as described above in reference to FIG. 17 and Tables 11 and 12), except that the signals are enabled by a priority read signal, PR (described above in reference to Table 10), instead of the priority write signal, PW.

The output select circuit 1821 selects, according to control signals 1802, one or more of the array amplifier banks or priority amplifier banks to drive a value onto the data bus 1604. In one embodiment, discussed below in reference to FIG. 19, the control signals 1802 include the decoded address signals generated by the segment address decode logic 1701 of FIG. 17, the component select signals CS[4:1] generated by the component select circuit 1703 of FIG. 17, and the configuration signals, CFG.

Figure 19:
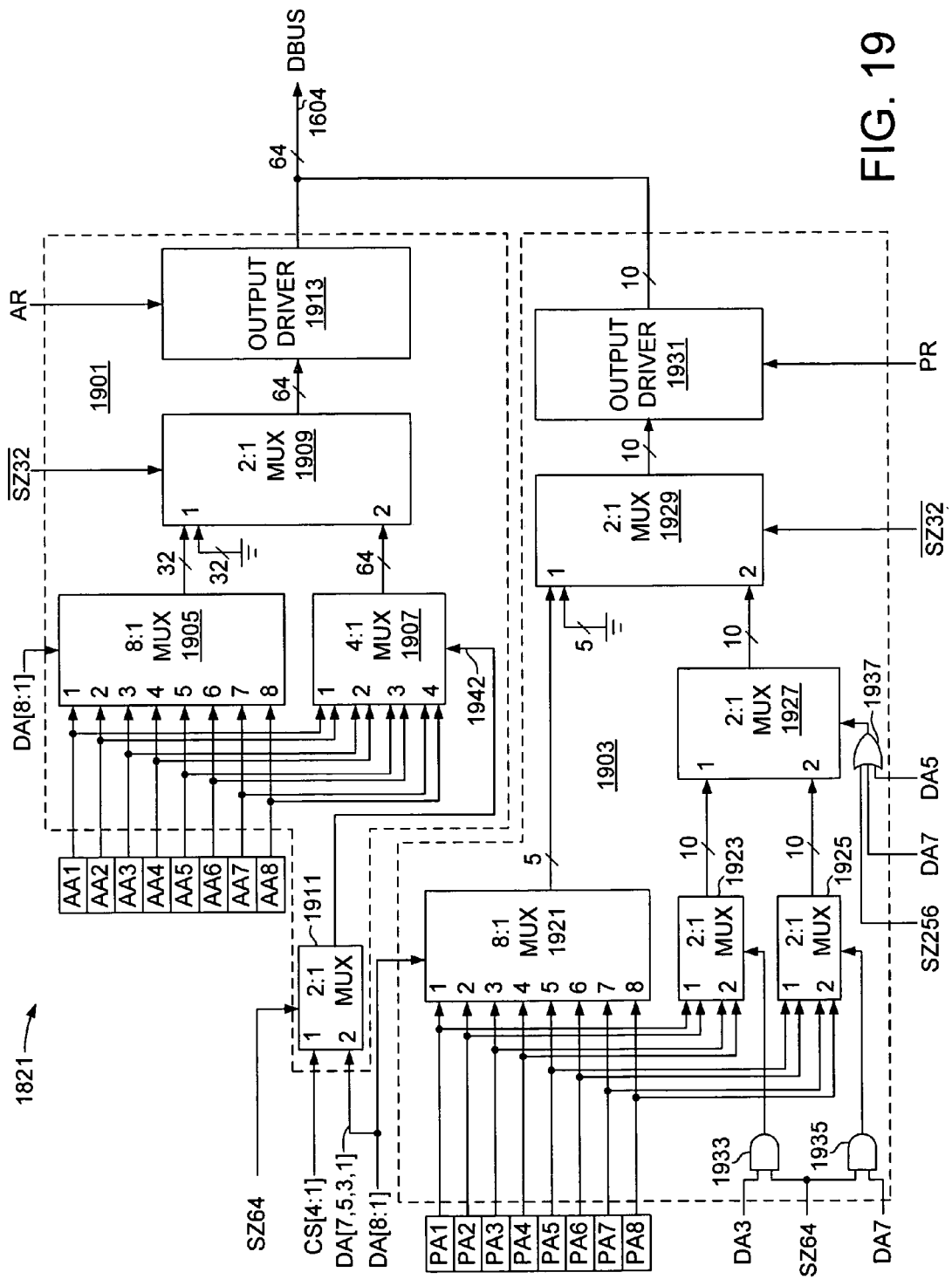
FIG. 19 illustrates an embodiment of the output select logic of FIG. 18.

FIG. 19 illustrates an embodiment of the output select logic 1821 of FIG. 18. The output select logic 1821 includes an array output select circuit 1901 and a priority output select circuit 1903. The array output select circuit 1901 includes four multiplexer circuits (1905, 1907, 1909, 1911) and an output driver circuit 1913. Multiplexer circuit 1905 is an 8-to-1 multiplexer that selects, according to the decoded address signals, DA[8:1], generated by the segment address decode logic described above in reference to FIG. 17 and Table 11, one of the eight array amplifier banks, AA1-AA8, to provide a 32-bit mask or data word to port 1 of multiplexer circuit 1909. In one embodiment, when the CAM array 1601 is in the x32 configuration, the SZ32 signal is high, selecting the 32-bit mask or data word input to port 1 of the multiplexer 1909 to be forwarded to the output driver 1913. In the embodiment of FIG. 19, the input and output ports of the multiplexer 1909 are each 64 bits wide, and the unused half of the port 1 inputs are coupled to a reference voltage (ground in this example) to ensure a known state for each of the 64 signals output to the driver 1913.

The multiplexer 1907 is a 4-to-1 multiplexer that selects, according to a set of four select signals 1942 output from multiplexer 1911, one of four pairs of array amplifier banks (i.e, one of amplifier bank pairs AA1|AA2, AA3|AA4, AA5|AA6, and AA7|AA8) to output a 64-bit mask or data word (or component thereof) to port 2 of the multiplexer circuit 1909. When the CAM array 1601 is in the x64 configuration (i.e., SZ64), the decoded address signals DA7, DA5, DA3 and DA1, one of which will be asserted by the segment address decode logic 1701 of FIG. 17, are selected by multiplexer 1911 as the select signals 1942. As discussed above in reference to FIG. 17 and Table 12, the decoded address signals DA7, DA5, DA3 and DA1 are generated in response to the array configuration signals, and the low order address bits (e.g., A[2:0]) to select an address 64-bit value when the CAM array is in a x64 configuration. Note that decoded address signals DA8, DA6, DA4, and DA2 may be used to drive select signals 1942 in the x64 configuration instead of signals DA7, DA5, DA3 and DA1. Also, logical AND combinations of the decoded address signals (i.e., DA8\*DA7, DA6\*DA5, DA4\*DA3, DA2\*DA1, the '\*' symbol indicating a logical AND operation) may be used to drive select signals 1942 in the x64 configuration instead of signals DA7, DA5, DA3, and DA1. When the CAM array 1601 is in a long word configuration (i.e., the x128 or x256 configuration), the SZ64 signal is deasserted and the component select signals CS[4:1], one of which will be asserted by the component select circuit 1703 of FIG. 17, are selected by multiplexer 1911 as the select signals 1942. As discussed above in reference to FIG. 17 and Table 13, the component select signals, CS[4:1], are generated in response to the array configuration signals, address bit A2 and long word enable signals to select 64-bit components of long words when the CAM array is in the x128 or x256 configuration. When the CAM array 1601 is in any configuration other than the x32 configuration, the 64-bit value selected by multiplexer circuit 1907 is forwarded via multiplexer 1909 to the output driver 1913. When the array read signal, AR (described in reference to Table 10 above), is asserted, the output driver 1913 outputs the 64-bit value received from multiplexer 1909 onto the data bus 1604.

The priority output select circuit 1903 includes five multiplexer circuits (1921, 1923, 1925, 1927, 1929) and an output driver circuit 1931. Multiplexer circuit 1921 is an 8-to-1 multiplexer that selects, according to the decoded address signals, DA[8:1], generated by the segment address decode logic described above in reference to FIG. 17 and Table 11, one of the eight priority amplifier banks, PA1-PA8, to provide a 5-bit priority number to port 1 of multiplexer circuit 1921.

In one embodiment, when the CAM array 1601 is in the x32 configuration, the SZ32 signal is high, selecting the 5-bit priority number input to port 1 of the multiplexer 1929 to be forwarded to the output driver 1931. In the embodiment of FIG. 19, the input and output ports of the multiplexer 1929 are each 10 bits wide, and the unused half of the port 1 inputs are coupled to a reference voltage (ground in this example) to ensure a known state for each of the 10 signals output to the driver 1913.

Multiplexers 1923, 1925 and 1927 are used to select one of the four pairs of priority amplifier banks, to provide a 10-bit priority number to port 2 of the multiplexer 1929. In all CAM array configurations except the x32 configuration, multiplexer 1929 outputs the value provided at port 2 to the output driver circuit 1931.

When the CAM array is in the x64 configuration, multiplexer 1923 selects between amplifier bank pairs PA1|PA2 and PA3|PA4 according to the state of the DA3 signal, multiplexer circuit 1925 selects between amplifier bank pairs PA5|PA6 and PA7|PA8 according to the DA7 signal, and multiplexer 1927, which receives the selections of multiplexers 1923 and 1925, selects between the multiplexer 1923 output and the multiplexer 1925 output according to the DA5 and DA7 signals.

When the CAM array is in the x128 or x256 configuration, multiplexer circuits 1923 and 1925 pass the outputs of amplifier banks pairs PA1|PA2 and PA5|PA6, respectively, to the port 1 and port 2 inputs of the multiplexer circuit 1927. The multiplexer circuit 1927 selects either amplifier bank pair PA1|PA2 or amplifier bank pair PA5|PA6 according to the DA3 and DA5 signals. When the CAM device is in the x256 configuration, the multiplexer circuit 1927 selects the bank pair PA5|PA6 to be output to port 2 of the multiplexer 1929. When the priority read signal, PR (described in reference to Table 10 above), is asserted, the output driver 1931 outputs the 10-bit value from the 2:1 multiplexer 1929 onto the data bus 1604.

The following table describes the operation of the priority output driver circuit 1821 in terms of the CAM array configuration and the low order address bits used to generate the DA[8:1] signals:

TABLE 15

| CFG | A2 | A1 | A0 | Output |
| --- | --- | --- | --- | --- |
| x32 | 0 | 0 | 0 | [X][PA1] |
| x32 | 0 | 0 | 1 | [X][PA2] |
| x32 | 0 | 1 | 0 | [X][PA3] |
| x32 | 0 | 1 | 1 | [X][PA4] |
| x32 | 1 | 0 | 0 | [X][PA5] |
| x32 | 1 | 0 | 1 | [X][PA6] |
| x32 | 1 | 1 | 0 | [X][PA7] |
| x32 | 1 | 1 | 1 | [X][PA8] |
| x64 | 0 | 0 | X | [PA2][PA1] |

TABLE 15-continued

| CFG | A2 | A1 | A0 | Output |
|---|---|---|---|---|
| x64 | 0 | 1 | X | [PA4][PA3] |
| x64 | 1 | 0 | X | [PA6][PA5] |
| x64 | 1 | 1 | X | [PA8][PA7] |
| x128 | 0 | X | X | [PA2][PA1] |
| x128 | 1 | X | X | [PA6][PA5] |
| x256 | X | X | X | [PA6][PA5] |

It will be appreciated that when the ×256 and ×128 CAM array configurations are selected, only one or two 10-bit priority numbers are stored in the priority index table per row of CAM cells. That is, one-half to three-fourths of the priority number storage circuits within each row are unused. In one embodiment, the least significant pairs of priority number storage circuits within each set of four adjacent priority number storage circuits within a row of priority cells are used to store priority numbers in the ×128 configuration (i.e., priority number storage circuit pairs that correspond to amplifier bank pairs PA6|PA5 and PA2|PA1), and the priority number storage circuit pair that corresponds to amplifier bank pair PA6|PA5 is used to store the sole priority number used, per row, in the ×256 configuration. Different priority number storage circuits may be selected for use in the ×128 and ×256 configurations (or yet other configurations) in alternative embodiments.

Although output driver 1931 is depicted in FIG. 19 as driving only 10 of the 64 data bus lines, the output driver 1931 may drive all 64 bus lines in an alternative embodiment (e.g., by coupling the upper or lower 54 bus lines to a reference voltage). More generally, referring to FIGS. 16-19, read and write circuits and their constituent circuit blocks have been described in reference to a specific number of CAM array configurations, priority number configurations and signal path widths. The read and write circuits may be readily adapted to accommodate any number of CAM array configurations, priority number configurations, and signal path widths in alternative embodiments.

Loading the Comparand Data

With reference again to FIG. 15, comparand data may be compared with the data stored in one or more of the row segments in CAM array 1501. The comparand data may be provided on the data bus 1504 (or another signal path) and stored in comparand register 1513, or provided directly to CAM array 1501 for comparison with CAM words stored therein.

For one embodiment, the width of the data bus 1504 is the same as the total number of CAM cells in a row of CAM cells (i.e., ZW bits). When the system is configured in ZY×W mode, Z copies of the comparand data can be loaded into the comparand register 1513 for comparison with each of the Z segments in each row 1522₁-1522ᵧ. Similarly, in the ZY/2×2W mode, Z/2 copies of the comparand data can be loaded into the comparand register 1513. This methodology can be used until, in the Y×ZW mode, the comparand data is as wide (has as many bits) as an entire row 1522 of the CAM array 1501.

Figure 20:
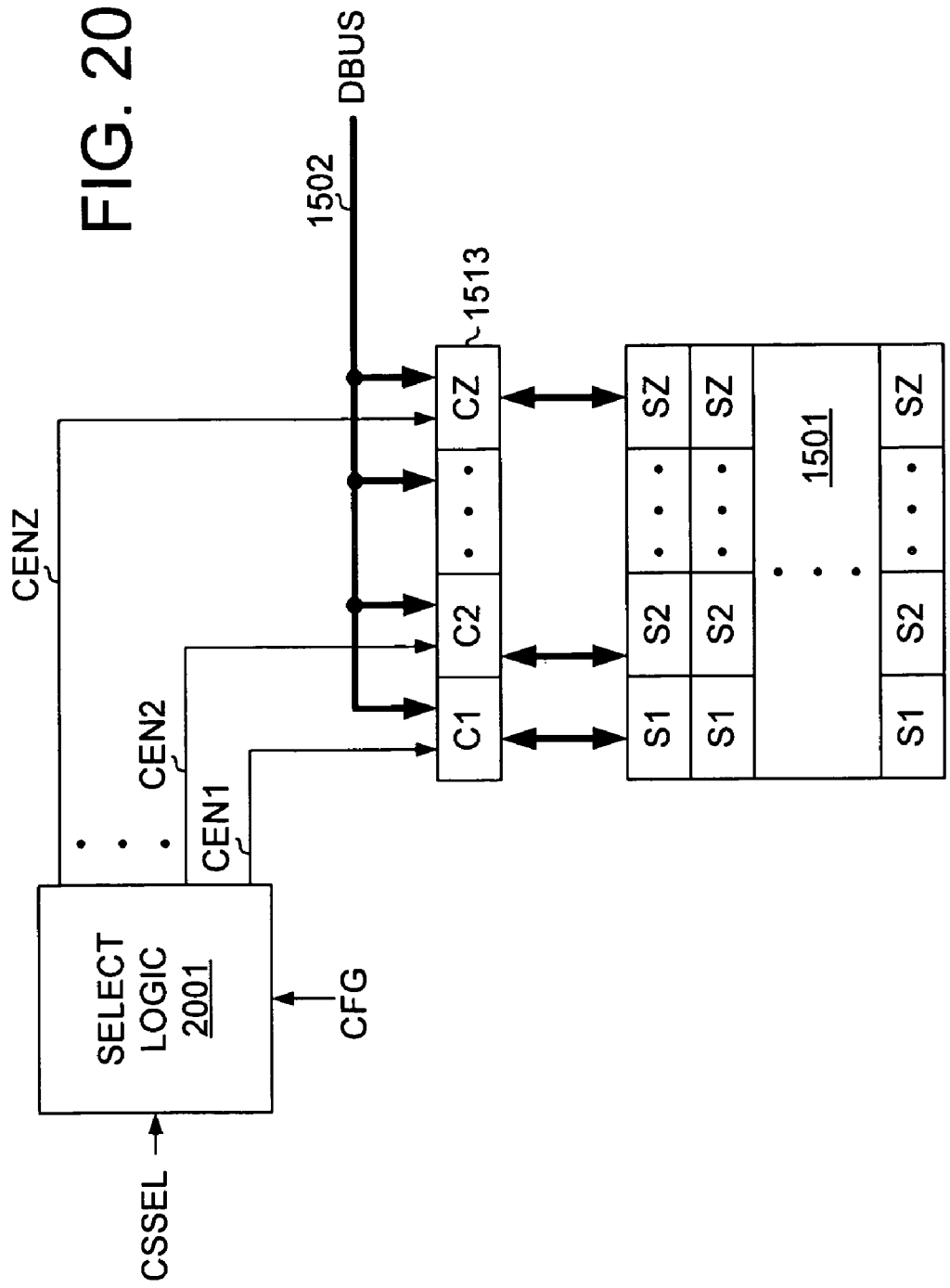
FIG. 20 illustrates a comparand load circuit according to one embodiment.

For other embodiments, the data bus 1504 may have a smaller number of bits than the total number of bits for the rows 1522. For one example, the width of the data bus may be the same as the number of CAM cells in a row segment (i.e., W bits) and the comparand data sequentially and successively provided to each of the row segments S1-SZ for comparison. The comparand register may be segmented into Z segments each corresponding to one of the Z row segments in each of rows 1522 as shown in FIG. 20. Comparand data can be separately loaded into each of the segments C1-CZ of the comparand register 1513 by enabling signals, CEN1-CENZ, respectively. Select logic 2001 generates the enable signals in response to the comparand segment select signals, CSSEL, and the configuration signal, CFG. The CSSEL signals may be generated by the instruction decoder 1519 in response to a compare instruction, or may be separately generated by the user. When the system is configured in ZY×W mode, the CSSEL signals cause select logic 2001 to enable all the CEN signals such that the same comparand data is simultaneously written into all the comparand register segments, C1-CZ. In the ZY/2× 2W mode (i.e., two row segments per group), the CSSEL signals cause select logic 2001 to enable the odd CEN signals CEN1, CEN3, etc. such that the same first portion of comparand data is written into the first comparand segments associated with the first row segments S1, S3, etc. of CAM array 1501. In a subsequent cycle, the CSSEL signals cause select logic 2001 to enable the even CEN signals CEN2, CEN4, etc. such that the same second portion of comparand data is written into the second comparand segments associated with the second row segments S2, S4, etc. The first and second portions of comparand data together form the entire (2W) comparand data. This methodology continues until, in the Y×ZW mode, the CEN signals are sequentially enabled to consecutively load each portion (W) of the ZW comparand data into one of the Z comparand segments. The operation of this embodiment is further illustrated by the example of FIG. 21.

Figure 21:
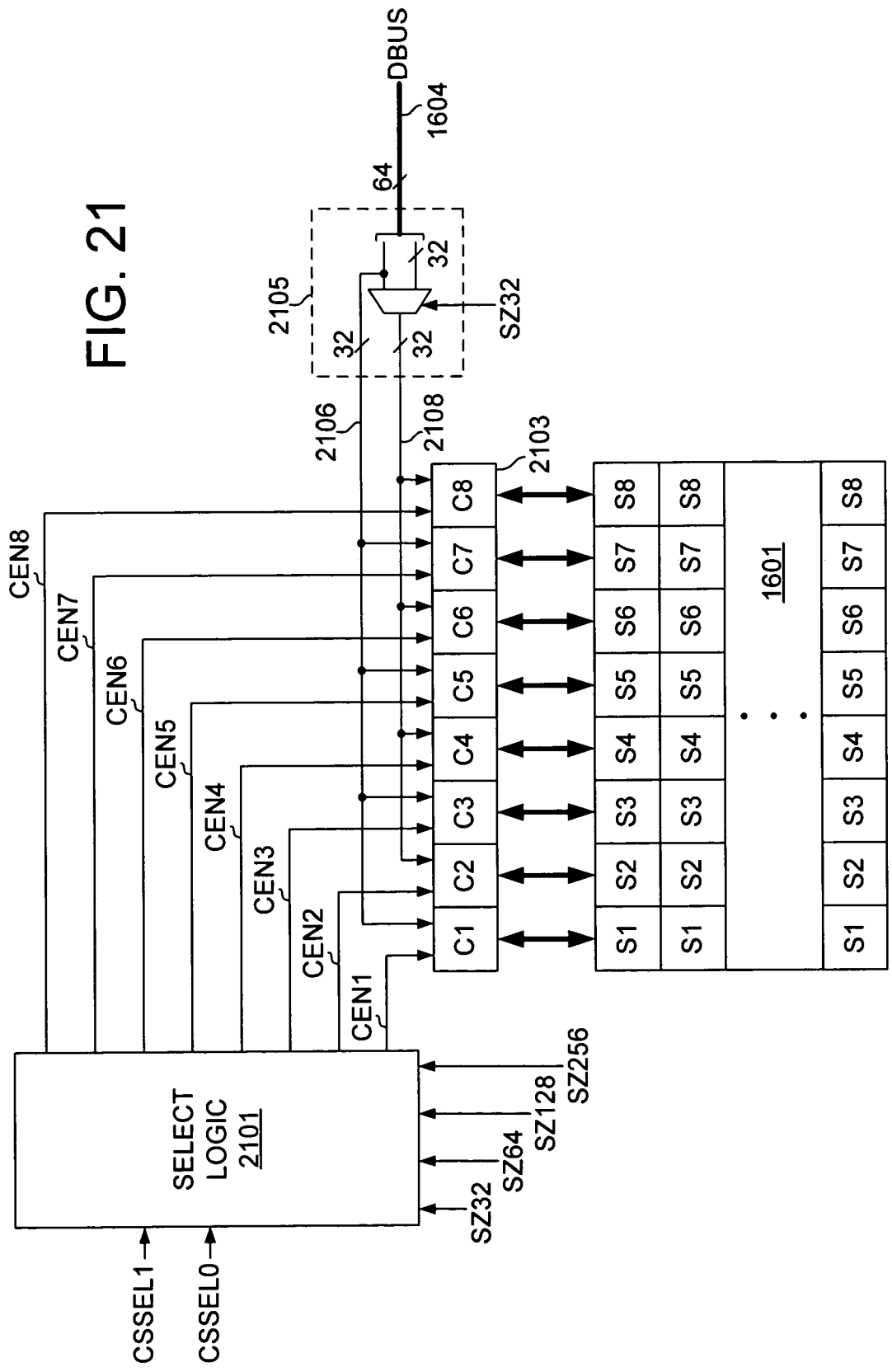
FIG. 21 illustrates an embodiment of a comparand load circuit which may be used in the exemplary CAM device of FIGS. 16-19.

FIG. 21 illustrates an embodiment of a comparand load circuit which may be used in the exemplary CAM device described above in reference to FIGS. 16-19 (i.e., 64-bit wide data bus 1604, and a CAM array 1601 that includes Z=8 row segments (S1-S8) per row, each row segment having W=32 CAM cells). A comparand register 2103 includes eight comparand register segments, C1-C8, to store as many as eight corresponding comparand segments. Comparand register segments C1, C3, C5 and C7 are coupled to receive comparand data from the lower 32 signal lines of the data bus 1604 (i.e., signal path 2106), while comparand register segments C2, C4, C6 and C8 are coupled to receive comparand data from a multiplexer circuit 2105 via signal path 2108. When the CAM array 1601 is in a ×32 configuration, the multiplexer circuit 2105 selects the lower 32 signal lines of the data bus to provide comparand data to comparand register segments C2, C4, C6 and C8, such that all eight comparand register segments are coupled to receive the same 32-bit value from the data bus 1604. When the CAM array 1601 is configured for ×64, ×128 or ×256 operation, the multiplexer circuit 2105 selects the upper 32 signal lines of the data bus to provide comparand data to comparand register segments C2, C4, C6 and C8, such that comparand register segment pairs C1|C2, C3|C4, C5|C6 and C7|C8 are coupled to receive a 64-bit data value from the data bus 1604. In the embodiment of FIG. 21, the multiplexer circuit is controlled by the configuration signal, SZ32 (a component of the CFG signal) to select either the lower or upper half of the data bus 1604 to source data for the even numbered comparand register segments.

Figure 22:
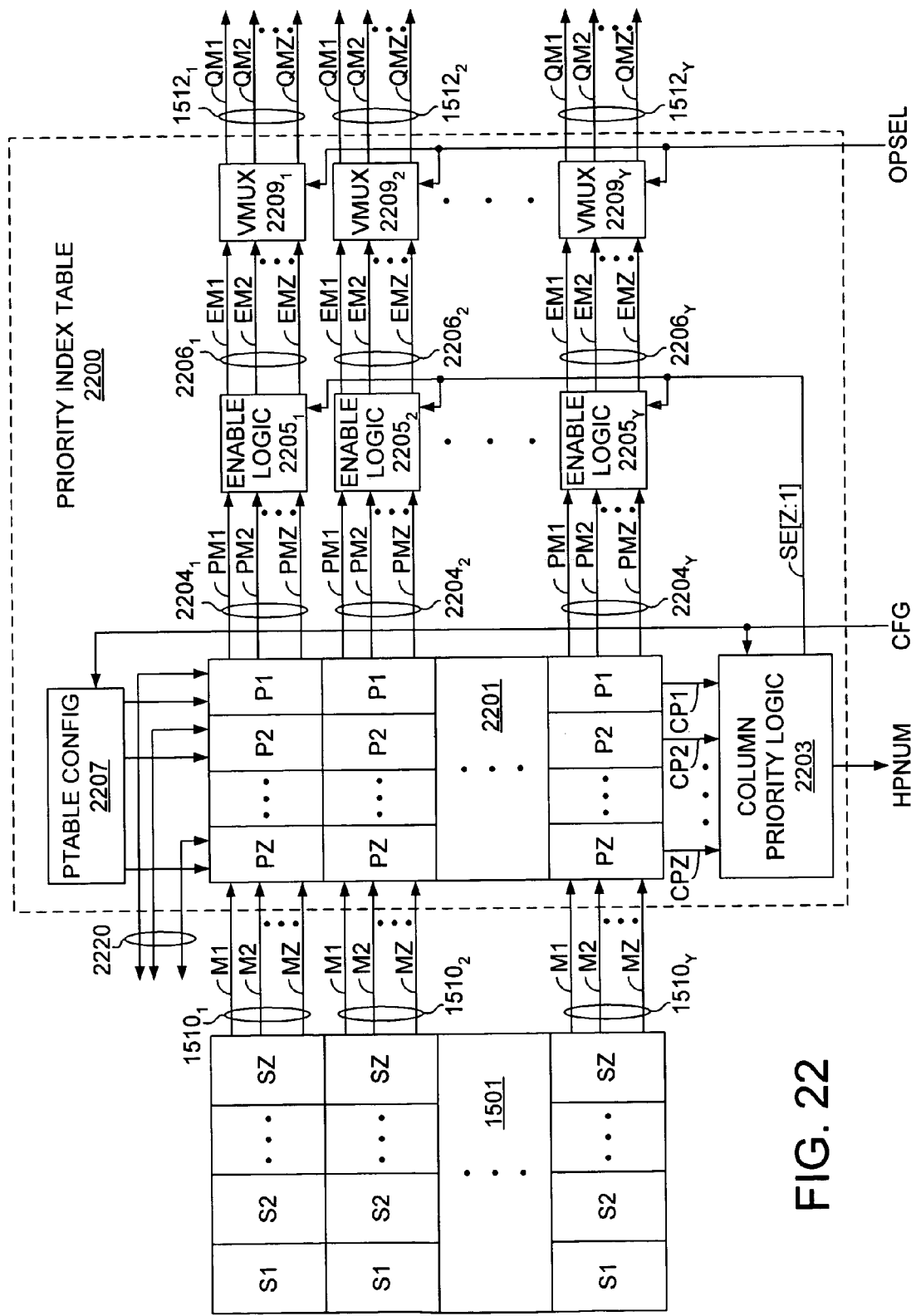
FIG. 22 illustrates an embodiment of a priority index table that may be used within the CAM device of FIG. 15

Comparand enable signals, CEN[8:1], are generated in accordance with the configuration signals (i.e., SZ32, SZ64, SZ128 and SZ256) and comparand segment select signals CSSEL1 and CSSEL0 to enable selected comparand register segments to be loaded with comparand data. More specifically, the configuration signals indicate the size of an incoming comparand word (i.e., ×32, ×64, ×128 or ×256) and, when the incoming comparand word is larger than the data bus (i.e., a ×128 long comparand word or ×256 long comparand word), the CSSEL1 and CSSEL0 signals are used to load a 64-bit component of the long comparand word into the appropriate pair of comparand register segments. In one embodiment, when the comparand word is a 64-bit value (i.e., SZ=64), the 64-bit comparand word is loaded into all four comparand register segment pairs simultaneously. Similarly, when the comparand word is a 32-bit value (i.e., SZ=32), the 32-bit comparand word is loaded into all eight comparand register segments simultaneously. The following table illustrates the pattern of comparand enable signals generated by the select logic 2101 based on the configuration and comparand select signals:

therein being referred to herein as a match-selected priority number storage circuit and match-selected priority number, respectively). The priority number compare operation within each column of priority number storage circuits (i.e., $P1_1$-$P1_y$, $P2_1$-$P2_y$, etc.), referred to herein as a column priority comparison, is performed in the manner described above in reference to FIGS. 8 and 9. In the context of FIG. 22, each column priority comparison generates a respective column priority number (i.e., the highest priority of the match-selected priority numbers within the column) and results in assertion of a prioritized match signal (PMZ) for each match-enabled priority number that is equal to the column priority number. As an example, if, during a compare operation, there is a match-enabled priority number within

TABLE 16

| CFG | CSSEL1 | CSSEL0 | CEN8 | CEN7 | CEN6 | CEN5 | CEN4 | CEN3 | CEN2 | CEN1 |
|---|---|---|---|---|---|---|---|---|---|---|
| x32 | X | X | 1 | 1 | 1 | 1 | 1 | 1 | 1 | 1 |
| x64 | X | X | 1 | 1 | 1 | 1 | 1 | 1 | 1 | 1 |
| x128 | X | 0 | 0 | 0 | 0 | 1 | 1 | 0 | 0 | 1 | 1 |
| x128 | X | 1 | 1 | 1 | 1 | 0 | 0 | 1 | 1 | 0 | 0 |
| x256 | 0 | 0 | 0 | 0 | 0 | 0 | 0 | 0 | 1 | 1 |
| x256 | 0 | 1 | 0 | 0 | 0 | 0 | 1 | 1 | 0 | 0 |
| x256 | 1 | 0 | 0 | 0 | 1 | 1 | 0 | 0 | 0 | 0 |
| x256 | 1 | 1 | 1 | 1 | 0 | 0 | 0 | 0 | 0 | 0 |

In one embodiment, the CSSEL1 and CSSEL0 signals are the same signals as the LWEN1 and LWEN0 signals discussed above.

Configurable Priority Index Table

FIG. 22 illustrates an embodiment of a priority index table 2200 that may be used within the CAM device of FIG. 15. The priority index table 2200 includes a segmented priority number storage array 2201 (referred to herein as a priority array), priority table configuration logic 2207, column priority logic 2203, enable logic circuits $2205_1$-$2205_Y$, and validity multiplexers $2209_1$-$2209_y$. The priority index table 2200 receives priority numbers from, and outputs priority numbers to, a read/write circuit (e.g., as described above in reference to FIGS. 16-19) via priority bit lines 2220. During a compare or array write operation, the priority index table 2200 receives Y sets of match signals $1510_1$-$1510_Y$ from the CAM array 1501 and generates Y corresponding sets of qualified match signals $1512_1$-$1512_Y$ in accordance with the array configuration (indicated by configuration signal, CFG) and an operation select signal, OPSEL.

In the embodiment of FIG. 22, the priority array 2201 includes Y rows of priority cells, each segmented into Z priority number storage circuits P1-PZ. During a compare operation, each row of priority number storage circuits receives a respective set of Z match signals, M1-MZ (i.e., a single set of the match signals 1510), from a corresponding row of the CAM array 1501 and outputs a corresponding set of Z prioritized match signals, PM1-PMZ (i.e., one of the sets of signals $2204_1$-$2204_y$). The match signals that result from match determinations are asserted (e.g., to a logic high state), while the match signals that result from mismatch determinations (including mismatch determinations due to absence of a valid CAM word) are deasserted. Each asserted match signal is used within the priority array to enable a corresponding priority number storage circuit to participate in a priority number compare operation with other such enabled priority number storage circuits within the same column of priority number storage circuits (the enabled priority number storage circuit and priority number stored each of the Z columns of priority number storage circuits of the priority array 2201, then Z column priority numbers will be output from the priority array to the column priority logic, and at least Z prioritized match signals will be asserted (i.e., at least one for each column of priority number storage circuits). More than one prioritized match signal may be asserted for a given column if the column contains more than one match enabled priority number equal to the column priority number, thus providing a potential source of multiple-match indications, as discussed below.

The column priority logic 2203 compares the column priority numbers received from the priority array 2201 to generate a highest priority number, HPNUM, that is the highest priority one of the column priority numbers. The column priority logic 2203 further generates a set of Z segment enable signals SE[Z:1], each segment enable signal being asserted or deasserted according to whether a corresponding one of the Z column priority storage circuits contains a priority number equal to HPNUM. Thus, in the embodiment of FIG. 22, if only one column of priority number storage circuits contains a priority number equal to HPNUM, then only one of the eight segment enable signals will be asserted. Conversely, if more than one column of priority number storage circuits contains a priority number equal to HPNUM, then more than one of the eight segment enable signals may be asserted. As discussed above, in certain CAM array configurations multiple priority number storage circuits are spanned by a single priority number, in effect reducing the number of columns of priority number storage circuits within the priority array. In such configurations, discussed below, more than one segment enable signal may be asserted per column of priority number storage circuits.

Each of the enable logic circuits $2205_1$-$2205_Y$ receives a respective set of the prioritized match signals 2204 from the priority array 2201 and outputs, according to the segment enable signals SE[Z:1], a corresponding set of enabled match signals, EM1-EMZ (i.e., one of the sets of signals $2206_1$-$2206_Y$). Each enable logic circuit 2205 receives the segment enable signals SE[Z:1] and generates the enabled match signals EM1-EMZ by gating each of the prioritized match signals according to whether the corresponding segment enable signal is deasserted (i.e., deasserting the prioritized match signal if the corresponding segment enable signal is deasserted). Thus, the column priority logic 2203 and the enable logic circuits $2205_1$-$2205_Y$ operate to enable only those prioritized match signals asserted by priority number storage circuits that contain a priority number equal to HPNUM to result in assertion of enabled match signals. That is, each asserted enabled match signal corresponds to a match-enabled priority number storage circuit having HPNUM stored therein.

Each of the sets of the enabled match signals $2206_1$-$2206_Y$ is input to a respective one of the validity multiplexers $2209_1$-$2209_Y$ which outputs a corresponding set of qualified match signals 1512 in accordance with an operation select signal, OPSEL. If the operation select signal indicates a compare operation, each validity multiplexer 2209 selects the set of enabled match signals 2206 from the corresponding enable logic circuit 2205 to be output as the corresponding set of qualified match signals 1512. If the operation select signal indicates a write operation, each validity multiplexer outputs a set of validity signals, V1-VZ (not shown in FIG. 22), to indicate which row segments within the corresponding row of CAM cells have valid data words stored therein. As discussed below, the validity signals may be used to identify a next free address within the CAM array during a write operation and to generate a full-flag signal indicative of whether the CAM array is full. Note that in an alternative embodiment (e.g., an embodiment that does not identify a next free address during a write operation), the validity multiplexers may be omitted. Further, it should be noted that the qualified match signals 1512 (or the enabled match signals if the validity multiplexers are omitted) are similar to the signals asserted on the internal address lines (IAD) discussed above in reference to FIGS. 4, 6 and 11, except that the qualified match signals represent match results for a configurable priority index table.

As discussed above, priority numbers stored within the priority index table 2200 may include different numbers of bits according to the CAM array configuration and search mode. Referring to the embodiment described above in reference to Table 8, for example, 5-bit priority numbers are stored within the priority array 2201 when the CAM array configuration is ×32, 6-bit priority numbers are stored within the priority array 2201 when the CAM array configuration is ×64 and a LPM search mode is selected, 7-bit priority numbers are stored within the priority array when the CAM array configuration is ×128 and the LPM search mode is selected, and 10-bit priority numbers may be stored within the priority array when a packet classification search mode is selected. These configurations are described for exemplary purposes only. Priority numbers having more or fewer bits may be used in various different configurations and operating modes in alternative embodiments.

In a programmable-priority-width embodiment, each column of priority number storage circuits within the priority array 2201 is wide enough to store the smallest-width priority number, and the priority table configuration logic 2207 is used to concatenate priority number storage circuits as necessary to accommodate wider priority numbers in different CAM array configurations and device operating modes (the storage circuit resulting from concatenation of two or more priority number storage circuits is referred to herein as a composite priority number storage circuit). Also, in one embodiment, the priority table configuration logic 2207 includes logic to disable unused priority cells within a single or composite priority number storage circuit. Alternatively, in a uniform-priority-width embodiment, each priority number storage circuit is wide enough to store an entire priority number regardless of CAM array configuration, search mode or other criteria. Accordingly, concatenation circuitry (described below) may be omitted in a uniform-priority-width embodiment.

Figure 23:
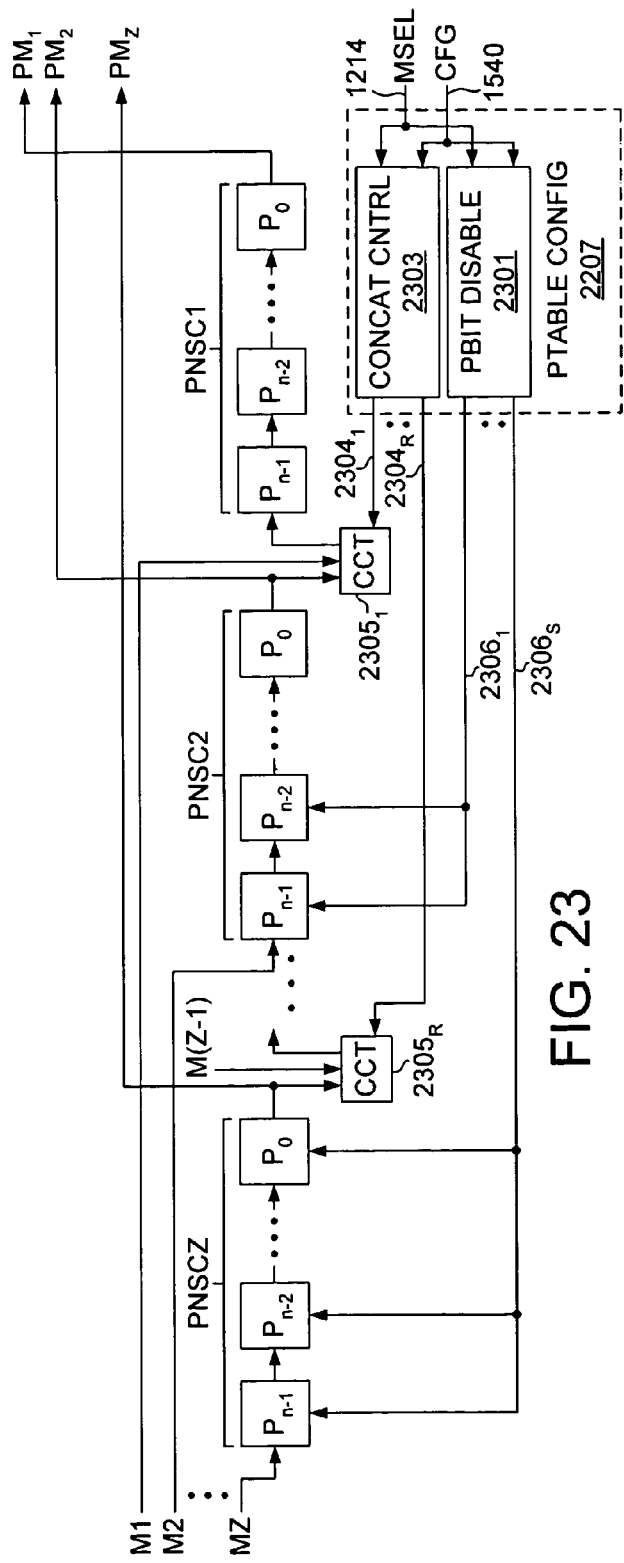
FIG. 23 illustrates the operation of the priority table configuration logic of FIG. 22 according to one embodiment.

FIG. 23 illustrates the operation of the priority table configuration logic 2207 to configure a set of Z priority number storage circuits (PNSC1-PNSCZ), each priority number storage circuit containing n priority cells, $P_0$-$P_{n-1}$. The priority table configuration logic 2207 includes a concatenation control circuit 2303 and a priority bit disable circuit 2301, both of which receive the configuration signal 1540 and the mode select signal 1214. The priority bit disable circuit outputs control signals 23061-2306S to disable selected columns of priority cells in accordance with the configuration signal 1540 and mode select signal 1214. The concatenation control circuit 2303 outputs a plurality of control signals $2304_1$-$2304_R$ to corresponding concatenation (CCT) circuits $2305_1$-$2305_R$ associated with respective pairs of the priority number storage circuits. Each of the concatenation circuits 2305 is responsive to the corresponding control signal 2304 to either concatenate or not concatenate the associated pair of priority number storage circuits. Thus, in a CAM array configuration and/or device search mode in which priority numbers are wider than n bits, the concatenation control circuit 2303 asserts control signal $2304_1$ to enable the concatenation circuit to logically combine prioritized match signal, PM2, (i.e., the priority compare result form priority number storage circuit PNSC2) with the match signal M1 and to output the logical combination to the match input of priority number storage circuit PNSC1 (i.e., to the input of priority cell $P_{n-1}$, of PNSC1). In one embodiment, control signal $2304_1$ is input to multiple concatenation circuits $2305_{1,1}$ to $2305_{Y,1}$ (i.e., one concatenation circuit $2305_i$ per row of the priority array) to concatenate the pair of PNSC2 and PNSC1 circuits within each row of the priority array. Consequently, the PNSC1 match result, PM1, will reflect a column priority comparison (e.g., as described above in reference to FIGS. 8 and 9) of an entire column of concatenated PNSC2 and PNSC1 circuits. The remaining concatenation circuits $2305_2$-$2305_R$ respond to assertion of corresponding control signals $2304_2$-$2304_R$ in the same manner as described above to concatenate respective pairs of priority number storage circuits within each of Y rows of the priority array. In one embodiment, a single concatenation control signal 2304 is asserted to concatenate all pairs of priority number storage circuits in the priority array such that the priority array is selectively configurable to store either Z×Y n-bit priority numbers, or (Z/2)×Y 2n-bit priority numbers.

Figure 24:
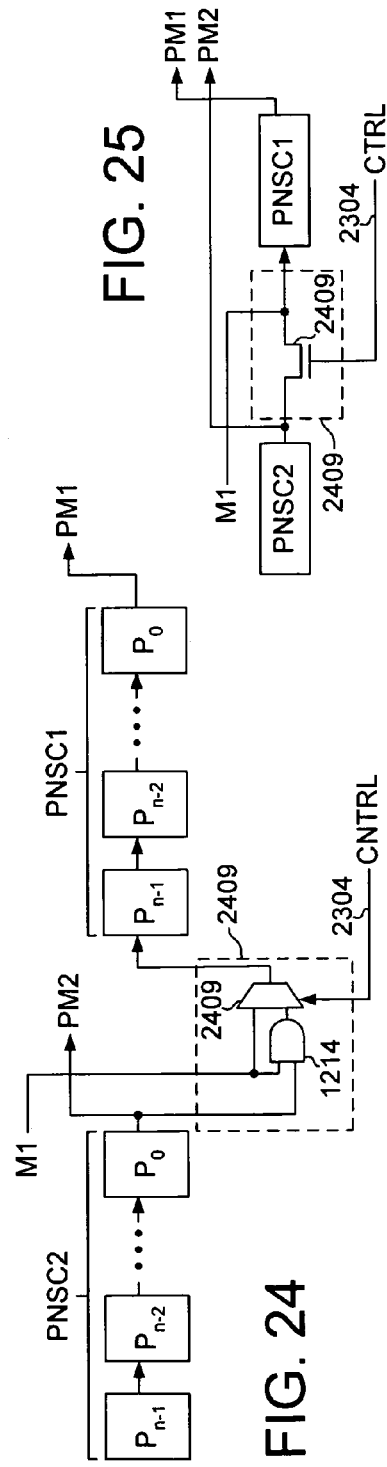
FIG. 24 illustrates an embodiment of a concatenation circuit that may be used to concatenate a pair of priority number storage circuits.

FIG. 24 illustrates an embodiment of a concatenation circuit 2405 that may be used to concatenate a pair of priority number storage circuits, PNSC2 and PNSC1, within the priority array 2201 of FIG. 22. The concatenation circuit 2405 includes a multiplexer 2409 to select either match signal, M1, or a logical AND combination of M1 and the prioritized match signal, PM2, to be provided to the match signal input of priority number storage circuit PNSC1. Accordingly, if the control signal 2304 (e.g., provided by the concatenation control circuit 2303 of FIG. 23) is deasserted (e.g., logic low), the match signal, M1, will be selected for input to the priority number storage circuit, PNSC1. If the control signal 2304 is in a concatenation state (e.g., logic high), the logical AND combination of M1 and PM2 will be input to the priority number storage circuit PNSC1. By this arrangement, the priority number stored in circuit PNSC1 will be enabled to source a column priority number (or portion thereof) and assert a prioritized match signal (PM1) only if the match signal, M1, indicates a match between a comparand value and the corresponding row segment within the CAM array and if the priority number stored in PNSC2 is the highest priority number stored within the column of PNSC2 circuits. Thus, when concatenated with PNSC2, PNSC1 effectively becomes a least significant priority number storage circuit within a composite priority number storage circuit formed by circuits PNSC2 and PNSC1, thereby enabling a priority number that spans both PNSC2 and PNSC1 to be stored and compared with other similarly-sized priority numbers.

Figure 25:
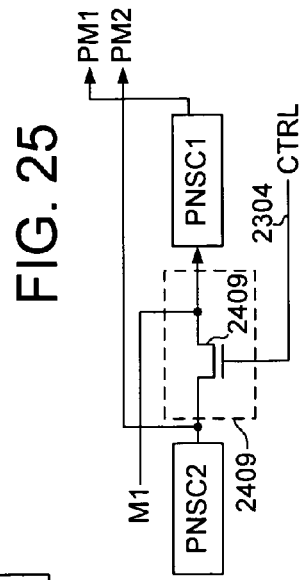
FIG. 25 illustrates a concatenation circuit that may be used to implement the concatenation circuit of FIG. 24.

FIG. 25 illustrates a concatenation circuit 2505 that may be used to implement the concatenation circuit 2405 of FIG. 24. The concatenation circuit 2505 includes a transistor 2507 that, when switched on by active-high assertion of the control signal 2304, effects a wired AND combination of match signal, M1, and the prioritized match signal, PM2, and couples the wired AND result to match input of priority number storage circuit PNSC1. When the control signal 2304 goes low, transistor 2507 is switched off (i.e., placed in a substantially non-conducting state), so that the match signal, M1, alone is input to the priority number storage circuit PNSC1. Numerous other concatenation circuits may be used in alternative embodiments.

FIG. 26 illustrates exemplary concatenations and disabled cells within a row of priority cells to achieve the priority number configurations described above in reference to Table 8. When the CAM array is in the ×32 configuration and an LPM search mode of operation is selected (indicated in FIG. 26 by the notation "×32F," the 'F' indicating LPM-based forwarding), all of the priority cells in the row are enabled and no pairs of the priority number storage circuits are concatenated with one another. That is, the forty priority cells are allocated equally among eight priority number storage circuits PNSC1-PNSC8, each priority number storage circuit including five priority cells and therefore being capable of storing a five-bit priority number. Each of the eight priority number storage circuits within a given row of the priority array corresponds to a respective one of eight row segments within the same row of the CAM array.

When a ×64 CAM array configuration is selected in conjunction with an LPM search mode, priority number storage circuits PNSC1 and PNSC2 are concatenated (indicated in FIG. 26 by a '•' symbol) to form a composite priority number storage circuit capable of storing a 6-bit priority number. Priority number storage circuits PNSC3 and PNSC4, PNSC5 and PNSC6, and PNSC7 and PNSC8 are similarly concatenated to form the remaining three of four composite priority number storage circuits. In one embodiment, the unused priority cells within each of the four composite priority number storage circuits are disabled by the priority bit disable circuit 2301 to prevent those priority cells from affecting priority number comparisons (the disabled priority cells are indicated in FIG. 26 by a slash (i.e., '\') through the cell). In alternative embodiments any or all of the unused priority cells may not be disabled and instead may be loaded with null data (e.g., all ones in an ascending priority order CAM device or all zeros in a descending priority order CAM device) to prevent the unused priority cells from affecting priority number comparisons. In any case, each of the four composite priority number storage circuits within a given row of the priority array corresponds to a respective pair of row segments within the same row of the CAM array.

When a ×128 CAM array configuration is selected in conjunction with an LPM search mode, priority number storage circuits PNSC1 and PNSC2 are concatenated to form a first composite priority number storage circuit and priority number storage circuits PNSC5 and PNSC6 are concatenated to form a second composite priority number storage circuit. The upper three bits of each of the composite priority number storage circuits are disabled such that each composite priority number storage circuit is capable of storing a 7-bit priority number. All other priority cells within the priority array (e.g., the cells included in circuits PNSC3, PNSC4, PNSC7 and PNSC8) are disabled. As discussed above, any or all of the unused priority cells may be loaded with null data rather than being disabled.

When a ×64 CAM array configuration is selected in conjunction with a packet classification search mode (designated ×64C in FIG. 26), pairs of the priority number storage circuits are concatenated as in the LPM/×64 configuration, but none of the priority cells are disabled, thus allowing a 10-bit priority number to be associated with each pair of row segments in the CAM array. Similarly, when a ×128 CAM array configuration is selected in conjunction with a packet classification search mode, the priority number storage circuits PNSC1-PNSC2 and PNSC5-PNSC6 are concatenated as in the LPM/×128 configuration, but none of the priority cells in the resulting composite priority number storage circuits is disabled (unused priority cells in priority number storage circuits PNSC3, PNSC4, PNSC7, and PNSC8 are disabled, though, as discussed above, those storage circuits may be loaded with null data rather than being disabled). Finally, when a ×256 CAM array configuration is selected in conjunction with a packet classification search mode, priority number storage circuits PNSC5 and PNSC6 are concatenated to form a composite priority number storage circuit indicative of the priority of a data word that spans all eight row segments within the corresponding row of CAM cells. The priority cells within all the other columns of priority number storage circuits (i.e., PNSC1-PNSC4 and PNSC7 and PNSC8) are disabled, though they may instead be loaded with null data. It should be noted that any other pair of priority number storage circuits may be concatenated to form the composite priority number storage circuit in the classification/×256 configuration, and further that more than two priority number storage circuits may be concatenated to allow storage of a priority number more than 10 bits wide. Similarly, in the ×128 mode, different pairs of priority number storage circuits may be concatenated and/or larger composite priority number storage circuits may be formed by concatenating three or four priority number storage circuits. More generally, any arrangement of priority number storage circuits, composite or otherwise, and any number of enabled priority cells within each of the priority number storage circuits may be used without departing from the spirit and scope of the present invention.

FIG. 27 illustrates an embodiment of the priority bit disable circuit 2303 of FIG. 23 that outputs active low disable signals $2306_1$-$2306_5$ in response to the mode select signal 1214 and configuration signal 1540 to achieve the patterns of disabled priority cells illustrated in FIG. 26 (except that, as an alternative arrangement, the ×64 and ×128 modes each have seven enabled priority cells). More specifically, if a ×32 CAM array configuration is selected (e.g., SZ64=SZ128=SZ256=0; MSEL=X), or if a classification/× 64 configuration is selected (e.g., SZ64=1; MSEL=0), all of the disable signals are deasserted (i.e., logic high) such that none of the priority cells in the priority array are disabled. (Note that the signal lines used to carry disable signals $2306_1$-$2306_5$ may be pulled up to a logic high level when not being driven low by the priority bit disable circuit 2303. Alternatively, the priority bit disable circuit 2303 may drive the signal lines high when the corresponding disable signals are in the deasserted state.) If a LPM/×64 configuration is selected (e.g., SZ64=1; MSEL=1), disable signals $2306_2$, $2306_3$ and $2306_4$ are asserted (i.e., driven or pulled low) to disable priority cells in priority array columns 8-10 (choosing the right-most priority cell to be cell number 1), 18-20, 28-30 and 38-40. If a LPM/×128 configuration is selected (e.g., SZ128=1; MSEL=1), disable signals $2306_1$, $2306_2$, $2306_3$ and $2306_4$ are asserted to disable priority cells in columns 8-20, and 28-40. If a classification/×128 configuration is selected (e.g., SZ128=1; MSEL=0), disable signals $2306_1$, $2306_2$ are asserted to disable priority cells in columns 11-20 and 31-40, and if a ×256 configuration is selected (e.g., SZ256=1, MSEL=X), disable signals $2306_1$, $2306_2$, $2306_4$ and $2306_5$ are asserted to disable priority cells in columns 1-20 and 31-40. As discussed above, numerous other priority cell arrangements may be used in alternative embodiments. For example, in one alternative embodiment, priority number storage circuits PNSC2 and PNSC1 are used to store a composite priority number in the ×256 configuration instead of PNSC6 and PNSC5.

Figure 28:
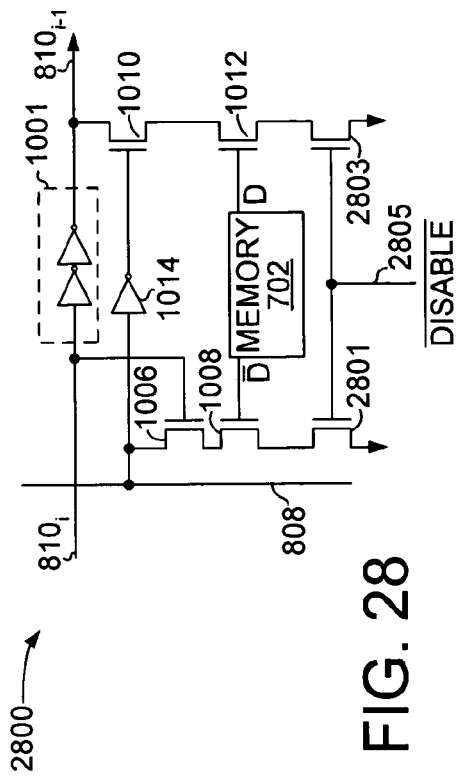
FIG. 28 illustrates an embodiment of a priority cell that may be used to implement the priority array of FIG. 22.

FIG. 28 illustrates an embodiment of a priority cell 2800 that may be used to implement the priority array 2201 of FIG. 22. The priority cell 2800 includes a memory storage element 702, transistors 1006, 1008, 1010 and 1014, and isolation circuit 1001 each being coupled as described above in reference to FIG. 10 to match line segments $810_i$ and $810_{i-1}$, and signal line 808. The priority cell additionally includes a pair of disable transistors 2801 and 2803, with transistor 2801 being coupled between transistor 1008 and a reference potential (ground in this example), and transistor 2803 being coupled between transistor 1012 and the reference potential. A gate terminal of each of the disable transistors 2801 and 2803 is coupled to a disable line. When an active-low disable signal 2805 is asserted on the disable line, transistors 2801 and 2803 are switched off, thereby preventing the compare circuit within priority cell 2800 from pulling match line segment $810_{i-1}$ or signal line 808 low. Thus, when the disable signal is asserted, the priority cells is prevented from affecting a priority number comparison result. By contrast, when the disable signal is deasserted (i.e., driven or pulled up to a logic high level), the disable transistors are switched on, enabling the compare circuit within the priority cell to pull lines 808 and $810_{i-1}$ low according to the priority bit stored in the memory element and the signal level on input match line $810_i$. Note that transistors 1006, 1008, and 2801 may be connected in any order between line 808 and the reference potential. Similarly, transistors 1010, 1012 and 2803 may be connected in any order between line $810_{i-1}$ and the reference potential. For example, in one embodiment, transistor 2801 is connected between line 808 and transistor 1006 instead of between transistor 1008 and ground; and transistor 2803 is connected between line $810_{i-1}$ and transistor 1010 instead of between transistor 1012 and ground.

It should be noted that when the priority cell of FIG. 28 is disabled, the cell is prevented from affecting a match result, but does not prevent a match indication from propagating from match line segment $810_i$ to $810_{i-1}$. Thus, referring to ×256 priority cell arrangement of FIG. 26 (i.e., cells 1-20 and 31-40 disabled), the match signals from row segments that correspond to the disabled priority number storage circuits (i.e., match signals M1-M4, M7 and M8, from row segments S1-S4, S7 and S8) pass through the disabled priority number storage circuits to drive the corresponding prioritized match signals and, ultimately, the qualified match signals 1512 supplied to the match flag logic 1507, multiple match flag logic 1509 and priority encoder 1505 of FIG. 15. A similar result may be achieved by loading selected priority cells with null data as described above. Thus, the disable function of priority cell 2800 may be omitted in an alternative embodiment. Also, if a disable function is used, numerous other circuit arrangements may be used to disable priority cells in alternative embodiments.

Figure 29:
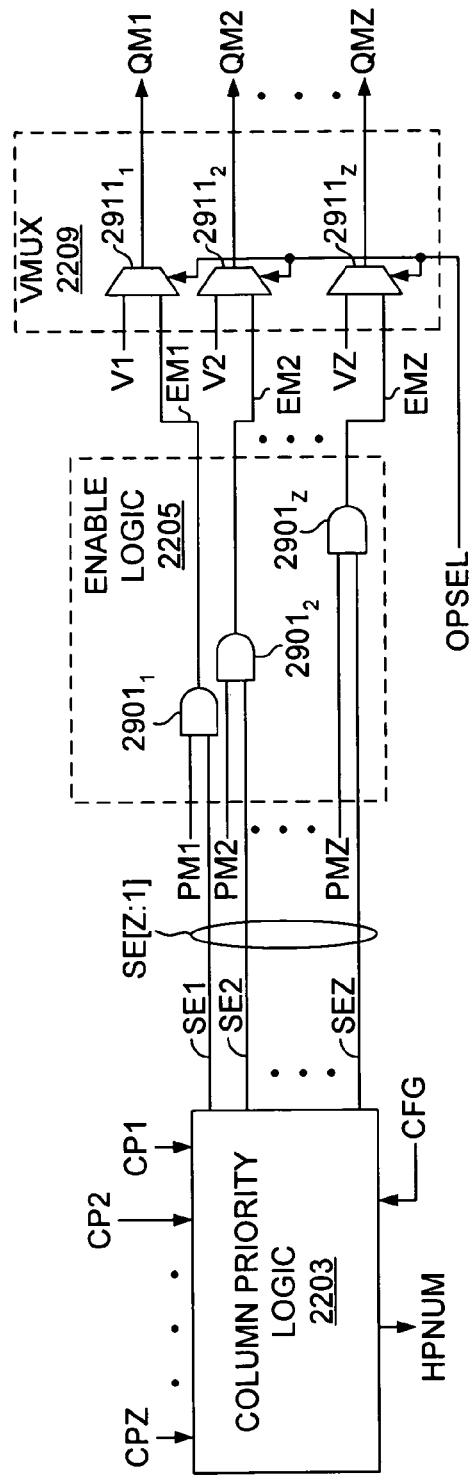
FIG. 29 illustrates the enable logic circuit and validity multiplexer of FIG. 22 according to one embodiment.

FIG. 29 illustrates the enable logic circuit 2205 and validity multiplexer 2209 of FIG. 22 according to one embodiment. As discussed above, the column priority logic compares the column priority numbers received from the priority array (designated CP1-CPZ in FIG. 29) to generate a plurality of segment enable signals SE1-SEZ, each segment enable signal indicating whether the corresponding column priority number is equal to HPNUM (i.e., a highest priority one of the column priority numbers). In the embodiment of FIG. 29, each of the segment enable signals is logically ANDed with a corresponding one of the prioritized match signals, PM1-PMZ, to generate a corresponding enabled match signal, EM1-EMZ. By this arrangement, only those prioritized match signals generated by priority number storage circuits having HPNUM stored therein will be enabled to assert a corresponding enabled match signal. Note that, in the case of composite priority number storage circuits, the prioritized match signals from each of the component priority number storage circuits will be high if the composite priority number storage circuit contains a composite device priority number, HPNUM.

The validity multiplexer 2209 is responsive to the operation select signal, OPSEL, to select, for each row segment within a row of the CAM array (and priority number storage circuit within a row of the priority array) either the enabled match line, or a validity indicator for the row segment to be output as the qualified match signal. In one embodiment, if the operation select signal indicates a compare operation, the validity multiplexer 2209 selects the enabled match signals, EM1-EMZ, to be output as the qualified match signals, QM1-QMZ, respectively. By contrast, if the operation select signal indicates a write operation, the validity multiplexer 2209 selects the validity indicators, V1-VZ, to be output as the qualified match signals QM1-QMZ, respectively. In one implementation, the validity indicators are active low signals which, if high, indicate that the corresponding row segment within the CAM array does not have a valid data word stored therein. That is, the validity indicators may be interpreted as active high not-full signals. Accordingly, when the validity multiplexer selects the validity indicators to be output as the qualified match signals, QM1-QMZ, the qualified match signals effectively represent a set of not-full flags for the CAM array. As discussed below, the not-full flags may be used to generate an index indicative of a next free address within the CAM array. In one embodiment, the validity indicators are formed by one or more bits stored in the CAM array within the corresponding row segment. In an alternative embodiment, to facilitate circuit layout, validity storage circuits are provided both in the CAM array and in a location physically near the validity multiplexers. The validity values stored in the validity storage circuits located near the validity multiplexers mirror the values stored within the CAM array and are used to drive the qualified match signals when a write operation is selected. As discussed above, the validity multiplexers may be omitted altogether in an alternative embodiment.

Figure 30:
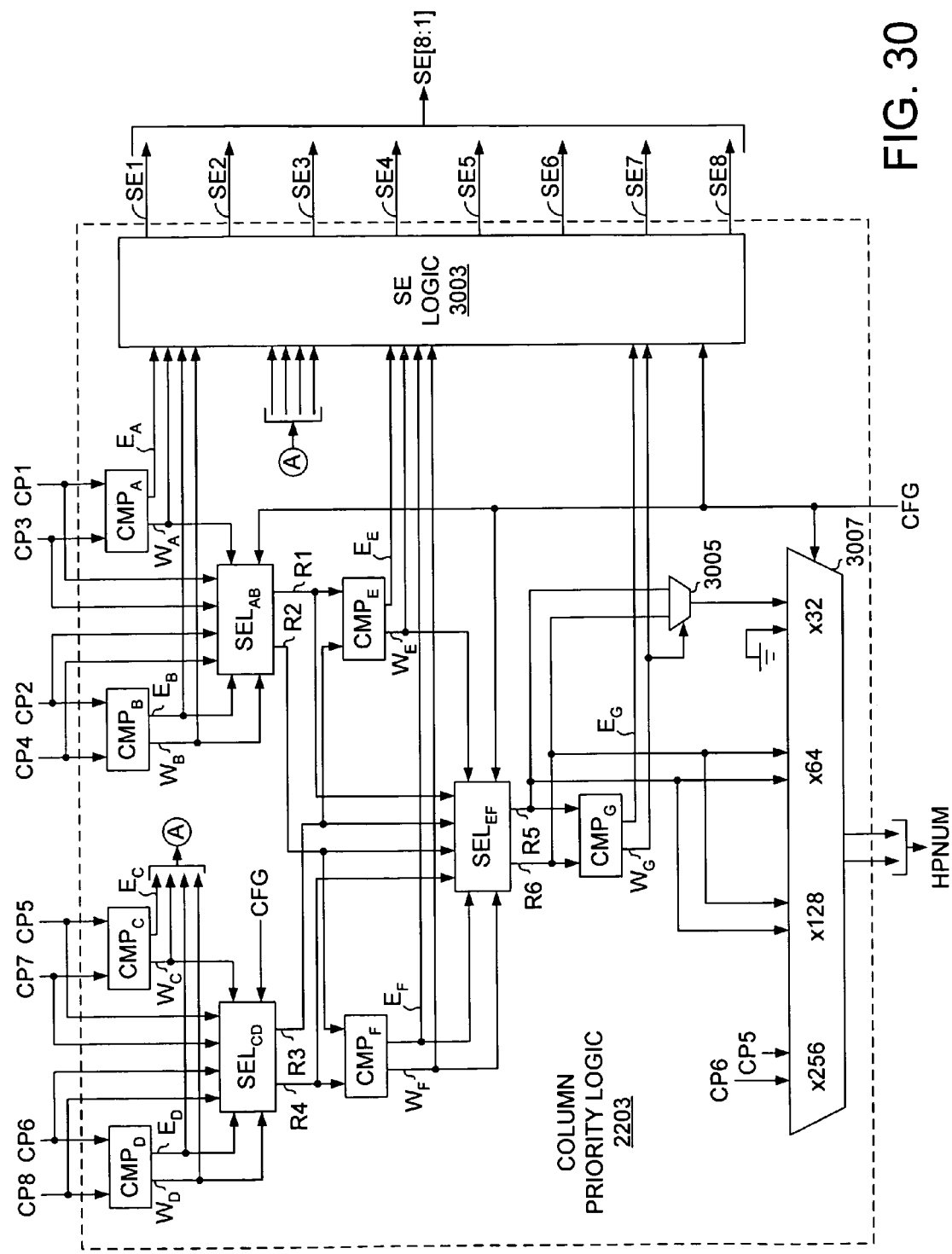
FIG. 30 illustrates an embodiment of the column priority logic of FIG. 22.

FIG. 30 illustrates an embodiment of the column priority logic 2203 of FIG. 22 that is adapted for use in the exemplary four-span CAM device described above. The column priority logic 2203 includes comparator circuits $CMP_A$-$CMP_G$; selector circuits $SEL_{AB}$, $SEL_{CD}$ and $SEL_{EF}$; multiplexers 3005 and 3007 and segment enable logic 3003. The column priority logic 2203 receives the configuration signal, CFG, and the column priority numbers, CP1-CP8 (each representing the highest priority number of all match-enabled priority numbers stored within a corresponding column of priority number storage circuits), from each of eight columns of priority number storage circuits and, in response, outputs HPNUM and segment enable signals, SE[8:1] to indicate which columns of the priority array contain HPNUM.

In one embodiment, each of the comparators, $CMP_A$-$CMP_G$, includes circuitry to compare a pair of five-bit priority numbers (or 5-bit portions of a composite priority number) and output an equality signal (E) to indicate whether the priority numbers are equal, and a win signal (W) to indicate which of the priority numbers has a higher priority than the other. Referring to comparator $CMP_A$, for example, the state of the equality and win signals indicate a comparison result as follows (note that the greater-than symbol '>' indicates higher priority, and not necessarily higher numeric value):

TABLE 17

| $E_A$ | $W_A$ | result |
|---|---|---|
| 0 | 0 | HP1 > HP3 |
| 0 | 1 | HP3 > HP1 |
| 1 | X | HP1 = HP3 |
| X | 0 | HP1 ≧ HP3 |
| X | 1 | HP3 ≧ HP1 |

Similar tables may be constructed for each of comparators $CMP_B$-$CMP_G$. The win and equality signals output by comparators $CMP_A$-$CMP_G$, are provided to the segment enable logic 3003 where they are used to generate the segment enable signals SE[8:1]. Also, the win and equality signals from each of the comparator pairs CMPB|CMPA, CMPD|CMPC and CMPF|CMPE are used to control the selection of a winning pair of priority numbers (or a winning or predetermined composite priority number) in selector circuits $SEL_{AB}$, $SEL_{CD}$, and $SEL_{EF}$, respectively. Together with the multiplexer circuits 3005 and 3007 the selector circuits, $SEL_{AB}$, $SEL_{CD}$ and $SEL_{EF}$, operate according to the configuration information to select the highest priority one of column priority numbers CP1-CP8 (or composite priority number formed by CP2|CP1, CP4|CP3, CP6|CP5 or CP8|CP7) to be the HPNUM output.

When the CAM array is in a x32 configuration, each of the column priority numbers CP1-CP8 represents a separate and independent priority number (i.e., not a composite priority number). Accordingly, the three selector circuits and the multiplexer circuits 3005 and 3007 operate to select a highest priority one of the eight priority numbers to be output as HPNUM. More specifically, first stage selector $SEL_{AB}$ selects, according to win signals $W_A/W_B$ and equality signal $E_B$, the highest priority number (i.e., winner) between CP3 and CP1, and the winner between CP4 and CP2 to be output as stage two priority numbers R1 and R2, respectively. Similarly, first stage selector $SEL_{CD}$ selects, according to win signals $W_C/W_D$ and equality signal ED, the winner between CP5 and CP7 and the winner between CP6 and CP8 to be output as stage two priority numbers R3 and R4, respectively. Second stage selector $SEL_{EF}$ selects, according to win signals $W_E/W_F$ and equality signal $W_F$, a winner between R1 and R3 and a winner between R2 and R4 to be output as stage three priority numbers R5 and R6, respectively. Finally, the multiplexer 3005 selects, according to win signal $W_G$, either R5 or R6 to be routed to the ×32 port of multiplexer circuit 3007 to be output as HPNUM.

For the ×32 CAM array configuration, the operation of the comparators, selector circuits and multiplexer circuits may be expressed as follows:

$SEL_{AB}$ Operation:
R2=winner(CP4, CP2)
R1=winner(CP3, CP1)

$SEL_{CD}$ Operation:
R4=winner(CP8, CP6)
R3=winner(CP7, CP5)

$SEL_{EF}$ Operation:
R6=winner(R4, R2)
R5=winner(R3, R1)

Multiplexer 3005 Operation:
HPNUM=winner (R6, R5)

In terms of the win signals $W_A$-$W_G$, the ×32 operation of the selector circuits and multiplexer 3005 may be expressed as follows (note that, in this example, the expression "if $W_B$" means "if $W_B$=1"):

$SEL_{AB}$ Operation:
if $W_B$, then R2←CP4, else R2←CP2
if $W_A$, then R1←CP3, else R1←CP1

$SEL_{CD}$ Operation:
if WD, then R4←CP8, else R4←CP6
if $W_C$, then R3←CP7, else R3←CP5

$SEL_{EF}$ Operation:
if $W_F$, then R6←R4, else R6←R2
if $W_E$, then R5←R3, else R5←R1

Multiplexer 3005 Operation
if $W_G$, then HPNUM ←R6, else HPNUM ←R5

When the CAM array is in a ×64 configuration, each pair of column priority numbers CP2|CP1, CP4|CP3, CP6|CP5 and CP8|CP7 represents one of four composite priority numbers. Accordingly, the three selector circuits, $SEL_{AB}$, $SEL_{CD}$ and $SEL_{EF}$, and the multiplexer circuits 3005 and 3007 operate to select a highest priority one of the four composite priority numbers to be output as HPNUM. Selector $SEL_{AB}$ selects, according to win signals $W_A/W_B$ and equality signal $E_B$, the winner between composite priority numbers CP4|CP3 and CP2|CP1 to be output as composite priority number R2|R1. More specifically, if the $W_B$ and $E_B$ signals indicate that CP4 is greater (i.e., higher priority) than CP2, then the composite priority number CP4|CP3 is output as R2|R1. Conversely, if the $W_B$ and $E_B$ signals indicate that CP4 is less than CP2, then the composite priority number CP2|CP1 is output as R2|R1. Finally, if CP4 is equal to CP2 (e.g., $E_B$ is high), then if CP3 is greater than or equal to CP1 (i.e., $W_A$ is high), composite priority number CP4|CP3 is output as R2|R1 and if CP3 is not indicated to be greater than or equal to CP1 (i.e., $W_A$ is low), composite priority number CP2|CP1 is output as R2|R1.

Still referring to the ×64 configuration, selector $SEL_{CD}$ selects between composite priority numbers CP6|CP5 and CP8|CP7 in the same manner that selector $SEL_{AB}$ selects between composite priority numbers CP4|CP3 and CP2|CP1.

That is, selector $SEL_{CD}$ selects, according to win signals $W_C/W_D$ and equality signal $E_D$, the winner between composite numbers CP8|CP7 and CP6|CP5 to be output as composite priority number R4|R3. Finally, selector $SEL_{EF}$ selects between the composite priority numbers R4|R3 and R2|R1 (output by $SEL_{CD}$ and $SEL_{AB}$, respectively) in the same manner that selector $SEL_{AB}$ selects between composite priority numbers CP4|CP3 and CP2|CP1. That is, selector $SEL_{EF}$ selects, according to win signals $W_E/W_F$ and equality signal $E_F$, the winner between composite priority numbers R4|R3 and R2|R1 to be output as a composite priority number R6|R5. In the ×64 configuration, comparator $CMP_G$ and multiplexer 3005 are unused, the composite priority number R6|R5 being supplied to the ×64 port of the multiplexer 3007 to be output as the HPNUM.

For the ×64 CAM array configuration, the operation of the comparators, and selector circuits may be expressed as follows:

$SEL_{AB}$ Operation:
  R2|R1=winner(CP4|CP3, CP2|CP1)

$SEL_{CD}$ Operation:
  R4|R3=winner(CP8|CP7, CP6|CP5)

$SEL_{EF}$ Operation:
  HPNUM=R6|R5=winner(R4|R3, R2|R1)

In terms of the win signals $W_A$-$W_F$ and equality signals $W_B$, $W_D$ and $W_F$, the ×64 operation of the selector circuits may be expressed as follows (note that in the following expressions the symbol '+' indicates a logical OR operation and the symbol '*' indicates a logical AND operation):

$SEL_{AB}$ Operation:
  if $W_B+(E_B*W_A)$, then R2←CP4 and R1←CP3, else R2←CP2 and R1←CP1

$SEL_{CD}$ Operation:
  if $W_D+(E_D*W_C)$, then R4←CP8 and R3←CP7, else R4←CP6 and R3←CP5

$SEL_{EF}$ Operation:
  if $W_F+(E_F*W_D)$, then R6←R4 and R5←R3, else R6←R2 and R5←R1 HPNUM←R6|R5

When the CAM array is in a ×128 configuration, priority numbers CP2 and CP1 form one of two composite priority numbers and priority numbers CP6 and CP5 form the other of the two composite priority numbers (priority numbers CP3, CP4, CP7 and CP8 are unused). Accordingly, the three selector circuits, $SEL_{AB}$, $SEL_{CD}$ and $SEL_{EF}$, operate to select a highest priority one of the two composite priority numbers to be output as HPNUM. Because priority numbers CP3, CP4, CP7 and CP8 are unused, selectors $SEL_{AB}$ and $SEL_{CD}$ output composite priority numbers CP2|CP1 and CP6|CP5 as composite priority numbers R2|R1 and R4|R3, respectively, without regard to win or equality signals. Selector $SEL_{EF}$ then selects, according to win signals $W_E/W_F$ and equality signal $E_F$, the winner between composite priority numbers R4|R3 and R2|R1 to be output as composite priority number R6|R5. In the ×128 configuration, the composite priority number R6|R5 routed to the ×128 port of multiplexer 3007 for output as the HPNUM, comparator $CMP_G$ and multiplexer 3005 being unused.

For the ×128 CAM array configuration, the operation of the comparators, and selector circuits may be expressed as follows:

$SEL_{AB}$ Operation:
  R2|R1=CP2|CP1

$SEL_{CD}$ Operation:
  R4|R3=CP6|CP5

$SEL_{EF}$ Operation:
  HPNUM=R6|R5=winner(R4|R3, R2|R1)

In terms of the win signals $W_E$ and $W_F$, and equality signal $W_F$, the ×128 operation of the selector circuits may be expressed as follows:

$SEL_{AB}$ Operation:
  R2←CP2, R1←CP1

$SEL_{CD}$ Operation:
  R4←CP6, R3←CP5

$SEL_{EF}$ Operation:
  if $W_F+(E_F*W_D)$, then R6←R4 and R5←R3, else R6←R2 and R5←R1 HPNUM←R6|R5

In one embodiment, when the CAM array is in a ×256 configuration, all columns of priority number storage circuits are disabled except the columns that produce composite priority number CP6|CP5. Accordingly, composite priority number CP6|CP5 represents the highest priority number in the priority array and is output by multiplexer 3007 as the HPNUM.

Figure 31:
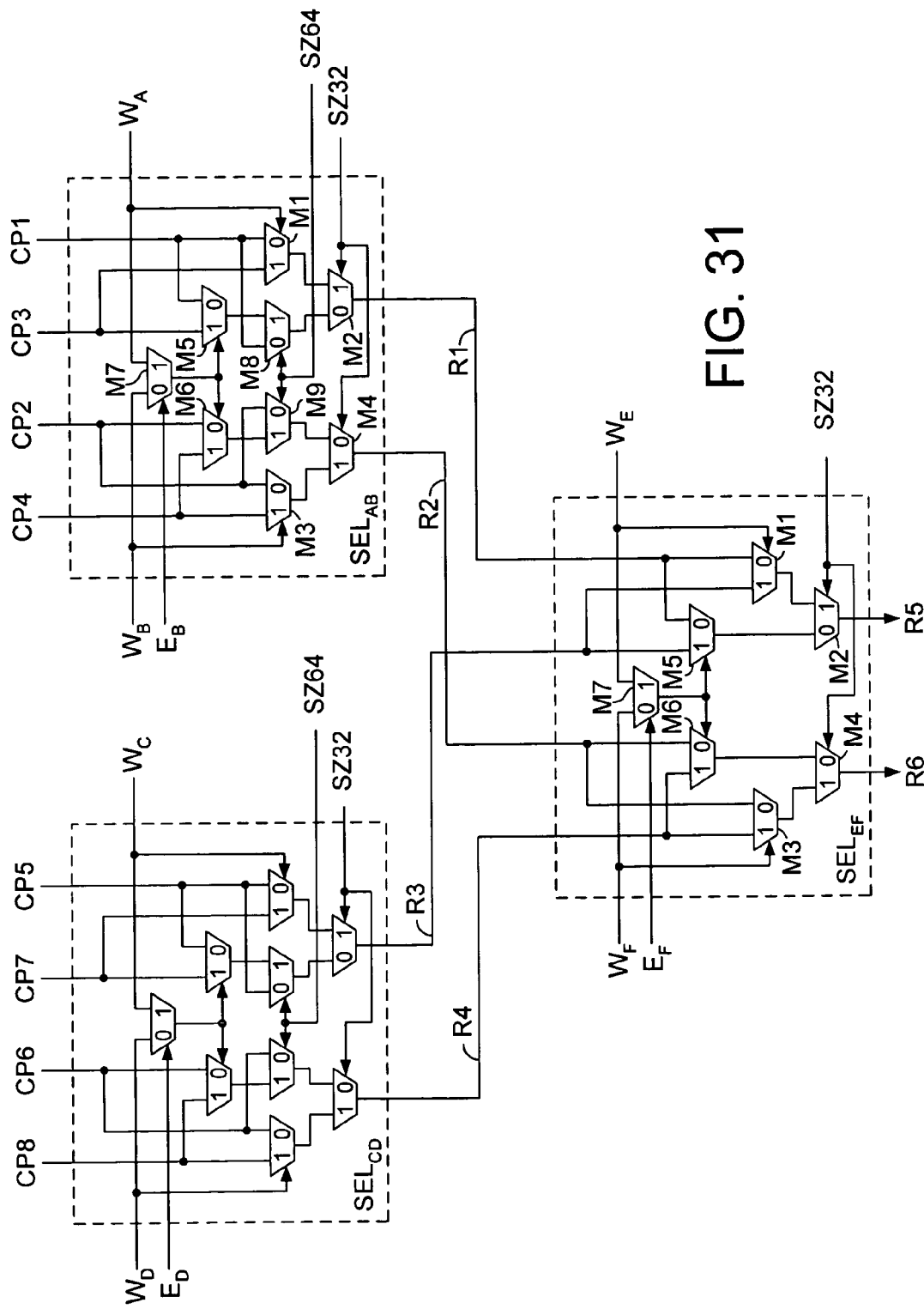
FIG. 31 illustrates the internal structure of the selector circuits of FIG. 30 according to one embodiment.
Figures 32, 33, 34, 35:
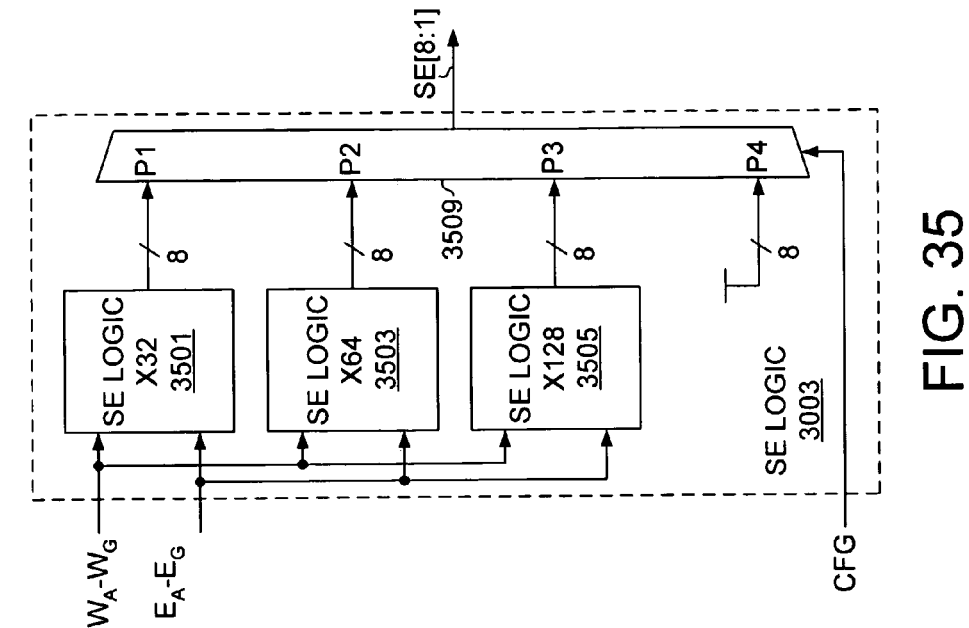
FIG. 32 is a table that describes the operation of a first selector circuit of FIG. 30.
FIG. 33 is a table that describes the operation of a second selector circuit of FIG. 30.
FIG. 34 is a table that describes the operation of a third selector circuit of FIG. 30.
FIG. 35 is a block diagram of the segment enable logic of FIG. 30 according to one embodiment.

FIG. 31 illustrates the internal structure of selectors $SEL_{AB}$, $SEL_{CD}$ and $SEL_{EF}$ of FIG. 30 according to one embodiment. Referring first to selector $SEL_{AB}$, when the CAM array is in the ×32 configuration, the winner between CP1 and CP2 (selected according to $W_A$ by multiplexer M1) is selected by multiplexer M2 as the R1 output, and the winner between CP2 and CP4 (selected according to $W_B$ by multiplexer M3) is selected by multiplexer M4 as the R2 output. In the ×64 configuration, multiplexers M4 and M2 select the winner between composite priority numbers CP4|CP3 and CP2|CP1 as the R2|R1 output. That is, if $E_B$ is low, indicating that CP4 and CP2 are not equal, then $W_B$ is selected by multiplexer M7 to select between CP4 and CP2 in multiplexer M6 and between CP3 and CP1 in multiplexer M5. The net logical effect of multiplexers M5, M6 and M7 is to select CP4|CP3 as the winner over CP2|CP1 if the Boolean expression, $W_B+(E_B*W_A)$, is true. In ×64 mode, multiplexers M9 and M4 route the output of multiplexer M6 to the R2 output and multiplexers M8 and M2 route the output of multiplexer M5 to the R1 output. Still referring to selector $SEL_{AB}$, when the CAM array is in the ×128 configuration, multiplexers M9 and M4, and M8 and M2 select CP2|CP1 to be output as R2|R1 without regard to the state of signals $W_B$, $E_B$ or $W_A$. FIG. 32 is a table that describes the logical relationship between the CAM array configuration, comparator $CMP_A$ and $CMP_B$ output signals, and the R2 and R1 outputs of selector $SEL_{AB}$.

In the embodiment of FIG. 31, the structure of selector $SEL_{CD}$ is identical to the structure of selector $SEL_{AB}$ so that selector $SEL_{CD}$ selectively routes a pair of the CP5-CP8 priority numbers to the R4|R3 output in the same manner that selector $SEL_{AB}$ routes a pair of the CP1-CP4 priority numbers to the R2|R1 output. FIG. 33 is a table that describes the logical relationship between the CAM array configuration, comparator $CMP_C$ and $CMP_D$ output signals, and the R4|R3 output of selector $SEL_{CD}$.

The structure of selector $SEL_{EF}$ is similar to that of selectors $SEL_{AB}$ and $SEL_{CD}$, except that multiplexers M8 and M9 are omitted. Instead, in ×32 mode, multiplexer M1 selects, according to $W_E$, a winner between R3 and R1, and multiplexer M3 selects, according to $W_F$, a winner between R4 and R2. The winning priority numbers selected by multiplexers M1 and M3 are output by multiplexers M2 and M4, respectively, as the R5 and R6 priority numbers. In the ×64 mode (i.e., when SZ=32 is low), multiplexers M5, M6 and M7 are used to select either R4|R3 or R2|R1 as a winning composite priority number in same manner that multiplexers M5, M6 and M7 in selector $SEL_{AB}$ select between composite priority numbers CP4|CP3 and CP2|CP1. FIG. 34 is a table that describes the logical relationship between the CAM array configuration, comparator $CMP_E$ and $CMP_F$ outputs, and the R6|R5 output of selector $SEL_{EF}$.

FIG. 35 is a block diagram of the segment enable logic 3003 of FIG. 30 according to one embodiment. The segment enable logic 3003 includes separate segment enable subcircuits for the ×32, ×64 and ×128 CAM array configurations (i.e., subcircuits 3501, 3503 and 3505), and a multiplexer 3509 to select one of the subcircuits (3501, 3503, 3505) or, in the ×256 configuration, a set of pulled up signal lines to be output as the segment enable signals SE[8:1]. In addition to the configuration information, the segment enable logic receives the win signals, $W_A$-$W_G$, and enable signals $E_A$-$E_G$, output by comparators $CMP_A$-$CMP_G$. In one embodiment, all the win signals and enable signals are supplied to the ×32 segment enable subcircuit, and respective subsets of the win signals and enable signals are supplied to the ×64 and ×128 segment enable subcircuits.

FIG. 36 illustrates an embodiment of the ×32 segment enable subcircuit 3501 (i.e., ×32 subcircuit) of FIG. 35. The ×32 subcircuit 3501 generates a set of enable signals, S1-S8 according to the relative priorities of column priority numbers CP1-CP8. More specifically, if any one (or more) of the priority numbers CP1-CP8 is determined to be equal to the device priority number, HPNUM, then the corresponding enable signal, S1-S8, is asserted (e.g., driven or pulled up to a logic high level). If the CAM array is configured for ×32 operation, the multiplexer 3509 of FIG. 35 will select S1-S8 from the ×32 subcircuit 3501 to be output as segment enable signals SE[8:1].

The logic gates depicted in FIG. 36 are configured to generate the S1-S8 signals according to the following logical combinations of win signals $W_A$-$W_G$ and equality signals $E_A$-$E_G$ (the '+' symbol indicates a logical OR operation, the '*' symbol indicates a logical AND operation, and the '/' symbol indicates signal inversion):

$S1=[(CP1 \geq CP3)*(R1 \geq R2)*(R5 \geq R6)=(/W_A+E_A)*(/W_E+E_E)*(/W_G+E_G)$ $S3=[(CP3 \geq CP1)*(R1 \geq R2)*(R5 \geq R6)=(W_A+E_A)*(/W_E+E_E)*(/W_G+E_G)$ $S5=[(CP5 \geq CP7)*(R3 \geq R1)*(R5 \geq R6)=(/W_C+E_C)*(W_E+E_E)*(/W_G+E_G)$ $S7=[(CP7 \geq CP5)*(R3 \geq R2)*(R5 \geq R6)=(W_C+E_C)*(W_E+E_E)*(/W_G+E_G)$ $S2=[(CP2 \geq CP4)*(R2 \geq R4)*(R6 \geq R5)=(/W_B+E_B)*(/W_F+E_F)*(W_G+E_G)$ $S4=[(CP4 \geq CP2)*(R2 \geq R4)*(R6 \geq R5)=(W_B+E_B)*(/W_F+E_F)*(W_G+E_G)$ $S6=[(CP6 \geq CP8)*(R4 \geq R3)*(R6 \geq R5)=(/W_D+E_D)*(W_F+E_F)*(W_G+E_G)$ $S8=[(CP6 \geq CP8)*(R4 \geq R3)*(R6 \geq R5)=(W_D+E_D)*(W_F+E_F)*(W_G+E_G)$ FIG. 37 illustrates an embodiment of the ×64 segment enable subcircuit 3503 (i.e., the ×64 subcircuit) of FIG. 35. The ×64 subcircuit 3503 also generates a set of enable signals, S1-S8, with each pair of the enable signals (i.e., S1|S2, S3|S4, S5|S6 and S7|S8) corresponding to a respective one of the composite priority numbers, CP1|CP2, CP3|CP4, CP5|CP6 and CP7|CP8. Accordingly, if any one (or more) of the composite priority numbers is determined to be equal to the device priority number, HPNUM, then the corresponding pair of enable signals are asserted. If the CAM array is configured for ×64 operation, the multiplexer 3509 of FIG. 35 will select S1-S8 from the ×64 subcircuit 3503 to be output as segment enable signals SE[8:1].

The logic gates depicted in FIG. 37 are configured to generate the S1-S8 signals according to the following logical combinations of win signals $W_A$-$W_F$ and equality signals $E_B$, $E_D$ and $E_F$:

$S1 = S2 = \{(CP2 > CP4) + [(CP2 = CP4)*(CP1 \geq CP3)]\} *$ $\{(R2 > R4) + [(R2 = R4)*(R1 \geq R3)]\}$ $= [(/W_B^*/E_B) + (E_B^*(/W_A + E_A))] *$ $[(/W_F^*/E_F) + (E_F^*(/W_E + E_E))]$ $S3 = S4 = \{(CP4 > CP2) + [(CP4 = CP2)*(CP3 \geq CP1)]\} *$ $\{(R2 > R4) + [(R2 = R4)*(R1 \geq R3)]\}$ $= [(W_B^*/E_B) + (E_B^*(W_A + E_A))] *$ $[(/W_F^*/E_F) + (E_F^*(/W_E + E_E))]$ $S5 = S6 = \{(CP6 > CP8) + [(CP6 = CP8)*(CP5 \geq CP7)]\} *$ $\{(R4 > R2) + [(R4 = R2)*(R3 \geq R1)]\}$ $= [(/W_D^*/E_D) + (E_D^*(/W_C + E_C))] *$ $[(W_F^*/E_F) + (E_F^*(W_E + E_E))]$ $S7 = S8 = \{(CP4 > CP2) + [(CP4 = CP2)*(CP3 \geq CP1)]\} *$ $\{(R2 > R4) + [(R2 = R4)*(R1 \geq R3)]\}$ $= [(W_D^*/E_D) + (E_D^*(W_C + E_C))] *$ $[(W_F^*/E_F) + (E_F^*(W_E + E_E))]$ FIG. 38 illustrates an embodiment of the ×128 segment enable subcircuit 3505 (i.e., ×128 subcircuit) of FIG. 35. The ×128 subcircuit 3505 also generates a set of enable signals, S1-S8, with each group of four of the enable signals (i.e., S1|S2|S3|S4 and S5|S6|S7|S8) corresponding to a respective one of the composite priority numbers, CP1|CP2 and CP5|CP6. Accordingly, if either of the composite priority numbers is determined to be equal to the device priority number, HPNUM, then the corresponding group of four enable signals are asserted. If the CAM array is configured for ×128 operation, the multiplexer 3509 of FIG. 35 will select S1-S8 from the ×128 subcircuit 3505 to be output as segment enable signals SE[8:1].

The logic gates depicted in FIG. 38 are configured to generate the S1-S8 signals according to the following logical combinations of win signals $W_A$-$W_F$ and equality signals $E_B$, $E_D$ and $E_F$:

$S1=S2=S3=S4=(R2>R4)+[(R2=R4)*(R1 \geq R3)]=(/W_F^*/E_F)+(E_F^*(/W_E+E_E))$ $S5=S6=S7=S8=(R4>R2)+[(R4=R2)*(R3 \geq R1)]=(W_F^*/E_F)+(E_F^*(W_E+E_E))$ It should be noted that the ×32, ×64 and ×128 subcircuits described in reference to FIGS. 36, 37 and 38, respectively, are designed to assert multiple segment enable signals in the event that two or more columns of priority number storage circuits (including composite priority number storage circuits) output HPNUM to the column priority logic. That is, the above described ×32, ×64 and ×128 subcircuits enable multiple match detections. In an alternative embodiment where multiple match indication is not needed (e.g., because no multiple match flag is generated), the logic implemented by the subcircuits may be simplified by omitting certain equality signal inputs and corresponding logic gates. More specifically, because the state of a win signal alone is sufficient to establish a greater-than-or-equal relationship or a less-than-or-equal relationship between two priority numbers, no equality signals need be input to the ×32 subcircuit 3501 in a non-multiple-match embodiment. That is, in an alternative embodiment, the ×32 subcircuit may generate S1-S8 by logically combining signals $W_A$-$W_G$ as follows:

$$S1 = [(CP1 \geq CP3)*(R1 \geq R2)*(R5 \geq R6)] = /W_A*/W_E*/W_G$$

$$S3 = [(CP3 \geq CP1)*(R1 \geq R2)*(R5 \geq R6)] = W_A*/W_E*/W_G$$

$$S5 = [(CP5 \geq CP7)*(R3 \geq R4)*(R6 \geq R5)] = /W_C*W_E*/W_G$$

$$S7 = [(CP7 \geq CP5)*(R3 \geq R4)*(R6 \geq R5)] = W_C*W_E*/W_G$$

$$S2 = [(CP2 \geq CP4)*(R2 \geq R1)*(R5 \geq R6)] = /W_B*/W_F*W_G$$

$$S4 = [(CP4 \geq CP2)*(R2 \geq R1)*(R5 \geq R6)] = W_B*/W_F*W_G$$

$$S6 = [(CP6 \geq CP8)*(R4 \geq R3)*(R6 \geq R5)] = /W_D*W_F*W_G$$

$$S8 = [(CP6 \geq CP8)*(R4 \geq R3)*(R6 \geq R5)] = W_D*W_F*W_G$$

As a further example, the ×64 subcircuit may be implemented according to the following expressions in a non-multiple-match embodiment:

$$S1 = S2 = \{(CP2 > CP4) + [(CP2 = CP4)*(CP1 \geq CP3)]\} *$$
$$\{(R2 > R4) + [(R2 = R4)*(R1 \geq R3)]\}$$
$$= [(/W_B^*/E_B) + (E_B^*/W_A)] * [(/W_F^*/E_F) + (E_F^*/W_E)]$$

$$S3 = S4 = \{(CP4 > CP2) + [(CP4 = CP2)*(CP3 \geq CP1)]\} *$$
$$\{(R2 > R4) + [(R2 = R4)*(R1 \geq R3)]\}$$
$$= [(W_B^*/E_B) + (E_B^*W_A)] * [(/W_F^*/E_F) + (E_F^*/W_E)]$$

$$S5 = S6 = \{(CP6 > CP8) + [(CP6 = CP8)*(CP5 \geq CP7)]\} *$$
$$\{(R4 > R2) + [(R4 = R2)*(R3 \geq R1)]\}$$
$$= [(/W_D^*/E_D) + (E_D^*/W_C)] * [(W_F^*/E_F) + (E_F^*W_E)]$$

$$S7 = S8 = \{(CP4 > CP2) + [(CP4 = CP2)*(CP3 \geq CP1)]\} *$$
$$\{(R2 > R4) + [(R2 = R4)*(R1 \geq R3)]\}$$
$$= [(W_D^*/E_D) + (E_D^*W_C)] * [(W_F^*/E_F) + (E_F^*W_E)]$$

Further, the ×128 subcircuit may be implemented according to the following expressions in a non-multiple-match embodiment:

$$S1 = S2 = S3 = S4 = (R2 > R4) + [(R2 = R4)*(R1 \geq R3)] = (/W_F*/E_F) + (E_F*/W_E)$$

$$S5 = S6 = S7 = S8 = (R4 > R2) + [(R4 = R2)*(R3 \geq R1)] = (W_F*/E_F) + (E_F*W_E)$$

For an alternative embodiment of segment priority logic 2203 of FIG. 22, a priority index table such as that described above with respect to FIGS. 4 and 7-10 may be used to compare CP1-CPZ output from the columns of the priority number storage circuits. The priority logic of the priority index table compares CP1-CPZ to determine HPNUM and generate SE[Z:1] (e.g., as IAD signals) for enable logic 2205$_1$-2204$_Y$. For example, as shown in FIG. 8, each of CP1-CPZ may be stored in respective rows of memory elements 702 such that CP1 is stored in row 1 associated with SE1, CP2 is stored in row 2 associated with SE2, and the like such that if CP1 is HPNUM then SE1 is asserted and the PM1 signals are enabled to propagate to the EM1 signals, and if CP2 is HPNUM then SE2 is asserted and the PM2 signals are enabled to propagate to the EM2 signals, and SE3-SEZ generated in similar fashion. Alternatively, each of CP1-CPZ need not be stored in memory elements 702 before comparison with each other; rather, respective bits of CP1-CPZ may be coupled directly to corresponding compare circuits 806 in FIG. 8. U.S. patent application Ser. No. 09/815,778, filed Mar. 24, 2001, which is hereby incorporated by reference in its entirety, describes alternative embodiments for comparing priority numbers and disabling match signals based on the compare results.

FIG. 39 illustrates an embodiment of the match flag logic 1507 of FIG. 15. Match flag logic 1507 includes row match circuits 3901$_1$-3901$_Y$, each associated with a corresponding row of CAM cells within the CAM array and a corresponding row of priority number storage circuits within the priority index table. Each row match circuit 3901 receives a set of qualified match signals 1512 (i.e., QM1-QMZ) from the corresponding row of priority number storage circuits. In response to the qualified match signals and the configuration information, each row match circuit generates a row match signal MR. Each row match signal is indicative of whether one or more row segments within the CAM array (i.e., for ZY×W mode), or one or more groups of row segments within the CAM array (i.e., for ZY/n×nW mode, where n is greater than 1), for a corresponding row stores the highest priority CAM word that matches the comparand data for a particular configuration. The row match signals MR1-MRY are then logically combined by array match circuit 3903 to generate a match flag signal, MF, for the entire CAM device. For one embodiment, array match circuit 3903 includes OR logic that logically ORs the states of the row match signals MR1-MRY.

FIG. 40 shows row match circuit 4000 that is one embodiment of row match circuit 3901$_1$ of FIG. 39. Row match circuit 4000 may be used for each row match circuit. Row match circuit 4000 includes match one logic 4001, group match logic circuits 4003$_1$-4003$_{n-1}$, and match configuration logic 4005. Match one logic 4000 determines a match condition in a corresponding row of the CAM array for the ZY×W mode (e.g., ×32 mode). Match one logic 4001 receives each of the qualified match signals, QM1-QMZ, from respective priority number storage circuits P1-PZ within a corresponding row of the priority index table, and generates MONE to indicate whether any corresponding priority number storage circuit has been enabled by a match signal from the corresponding row segment within the CAM array (i.e., a match-enabled priority number storage circuit) and has a priority number stored therein which is equal to HPNUM. That is, match one logic 4001 determines when at least one of the qualified match signals QM1-QMZ output by the corresponding row of priority number storage circuits is asserted (e.g., in a logic high state). When configuration signal SZ1 (e.g., SZ32) is enabled, match configuration logic 4005 outputs MONE as the row match signal MR1. For one embodiment, match one logic 4001 is an OR logic circuit 4101 that logically combines the logic states of the qualified match signals, QM1-QMZ, to generate MONE as shown by OR gate 4101 in FIG. 41.

Each group match logic circuit 4003$_1$-4003$_{n-1}$ determines a match condition within the corresponding row of the CAM array for a respective configuration of the CAM system. Each group match logic circuit 4003 receives each of the qualified match signals, QM1-QMZ, from priority number storage circuits P1-PZ, respectively, and logically combines unique groupings of the qualified match signals to generate group match signals $MG_1$-$MG_{n-1}$. Each unique grouping corresponds to the number of row segments within the CAM array that are spanned by a data storage field in a given configuration of the CAM array. For one embodiment, there are n−1 groups of row segments, where n−1=$2^x$ and x is an integer from 1 to $\log_2 Z$, and where x is a unique number for each group match circuit. For example, in ZY/2×2W mode (e.g., ×64 mode), the row segments in each row of the CAM array are grouped by pairs. Group match logic circuit $4003_1$ determines whether one or more pairs of qualified match signals, M1|M2, M3|M4, etc., indicate a match condition. For this first grouping of qualified match signals, match configuration logic 4005 outputs $MG_1$ as MR1 when SZG(1) (e.g., SZ64) is enabled. One embodiment of group match logic $4003_1$ is shown in FIG. 42 and includes Z/2 AND gates $4201_1$-$4201_{Z/2}$ each having two inputs coupled to receive a unique pair of qualified match signals from the priority index table. The outputs of AND gates 4201 are logically combined by OR gate 4203 to generate $MG_1$.

Similarly, in ZY/4×4W mode (e.g., ×128 mode), the row segments in each row of the CAM array are grouped four segments at a time. Group match logic circuit $4003_2$ determines whether one or more quartets of qualified match signals M1-M4, M5-M8, etc., indicate a match condition. For this second grouping of qualified match signals, match configuration logic 4005 will output $MG_2$ as MR1 when SZG(2) (e.g., SZ128) is enabled. One embodiment of group match logic $4003_2$ is shown in FIG. 43 and includes Z/4 AND gates $4301_1$-$4301_{Z/4}$ each having four inputs coupled to receive a unique, consecutive quartet of qualified match signals from the priority index table. The outputs of AND gates 4301 are logically combined by OR gate 4303 to generate $MG_2$.

This methodology continues until in Y×ZW mode (e.g., ×256 mode), the row segments in each row of the CAM array are grouped Z segments at a time. Group match logic circuit $4003_{n-1}$ determines whether all of the qualified match signals for the row of CAM cells indicate a match condition. For this last grouping of qualified match signals, match configuration logic 4005 will output $MGN_{n-1}$ as MR1 when SZG(n−1) (e.g., SZ256) is enabled. One embodiment of group match logic circuit $4003_{n-1}$ is shown in FIG. 44 as an AND gate 4401 that combines QM1-QMZ to generate $MG_{n-1}$.

FIG. 45 shows one embodiment of match configuration logic 4005 of FIG. 40. Other embodiments may be used. For this embodiment, AND gate 4501 determines whether both MONE and SZ1 are enabled, and provides the result to OR gate 4505. AND gates $4503_1$-$4503_{n-1}$ determine whether one of the group match signals $MG_1$-$MG_{n-1}$ and a corresponding configuration signal SZG(1)-SZG(n−1) are enabled, and the results are provided to OR gate 4505. OR gate 4505 provides MR1. For another embodiment, match configuration logic 4005 may be a multiplexer with MONE and $MG_1$-$MG_{n-1}$ as the inputs, the configuration signals as the select signals, and the row match signal as the output.

FIG. 46 shows row match circuit 4600 that is one embodiment of row match circuit 4000 of FIG. 40 for a CAM system having Z=8 row segments and eight corresponding qualified match line signals, QM1-QM8. The match one logic is represented by OR gate 4601 that logically ORs each of the logic states of signals QM1-QM8 to generate MONE. This embodiment has three group match logic circuits: a first group match logic circuit formed by AND gates 4603 and OR gate 4605; a second group match logic circuit formed by AND gates 4603, AND gates 4607 and OR gate 4609; and a third group match logic circuit formed by AND gates 4603, AND gates 4607 and AND gate 4611. Each of the four AND gates 4603 is coupled to receive a respective one of the qualified match signal pairs, QM1|QM2, QM3|QM4, QM5|QM6 and QM7|QM8. OR gate 4605 generates $MG_1$ by combining the outputs of AND gates 4603. Each of the two AND gates 4607 is coupled to receive the outputs of a respective pair of the AND gates 4603, such that the output of one of the AND gates 4607 represents a logical AND of qualified match signals QM1-QM4, and the output of the other of the AND gates 4607 represents a logic AND of qualified match signals QM5-QM8. OR gate 4609 generates $MG_2$ by combining the outputs of AND gates 4607. Finally, AND gate 4611 logically ANDs the outputs of each of AND gates 4607 to generate a signal, $MG_3$, which is representative of a logical AND of qualified match signals QM1-QM8. AND gates 4613, 4615, 4617 and 4619 logically combine SZ1 with MONE, SZG(1) with $MG_1$, SZG(2) with $MG_2$, and SZG(3) with $MG_3$, respectively, to provide inputs for OR gate 4621. OR gate 4621 provides MR1.

Referring again to FIG. 39, it should be noted that the significance of the qualified match signals input to the match flag logic 1507, and therefore the significance of the resulting match flag signal, MF, depends on the operation being performed. More specifically, as discussed above in reference to FIGS. 22 and 29, during a compare operation, the qualified match signals are asserted (e.g., to a logic high state) to indicate a qualified match condition (i.e., match in the corresponding row segment or group of row segments and corresponding priority number storage circuit contains highest priority number of all match-enabled priority number storage circuits). During a write operation, however, the qualified match signals are asserted if the corresponding row segment or group of row segments are free to store a data word. Accordingly, an asserted match flag signal indicates match detection during a compare operation, and a not-full condition during a write operation. Conversely, a deasserted match flag signal (e.g., logic low match flag signal) indicates that no match was detected during a compare operation, and that a full condition within the CAM array was detected during a write operation.

Numerous other implementations of the above described match flag logic, row match circuits, match one and group match circuits may be used in alternative embodiments. For example, U.S. Pat. No. 6,542,391, which is hereby incorporated by reference in its entirety, describes at least one match flag logic embodiment that may be used in place of the above-described match flag logic.

Multiple Match Flag

With reference again to FIG. 15, multiple match flag logic 1116 monitors the qualified match signals $1512_1$-$1512_Y$ output by the priority index table 1503, and enables a multiple match flag MMF when comparand data is indicated to match highest priority data (i.e., data having a priority number equal to HPNUM) stored in more than one of the row segments in array 1501 in ZY×W mode (as indicated by the configuration information), or when comparand data is indicated to match highest priority data stored in more than one group of row segments in array 1501 in other configurations.

Figures 47, 48:
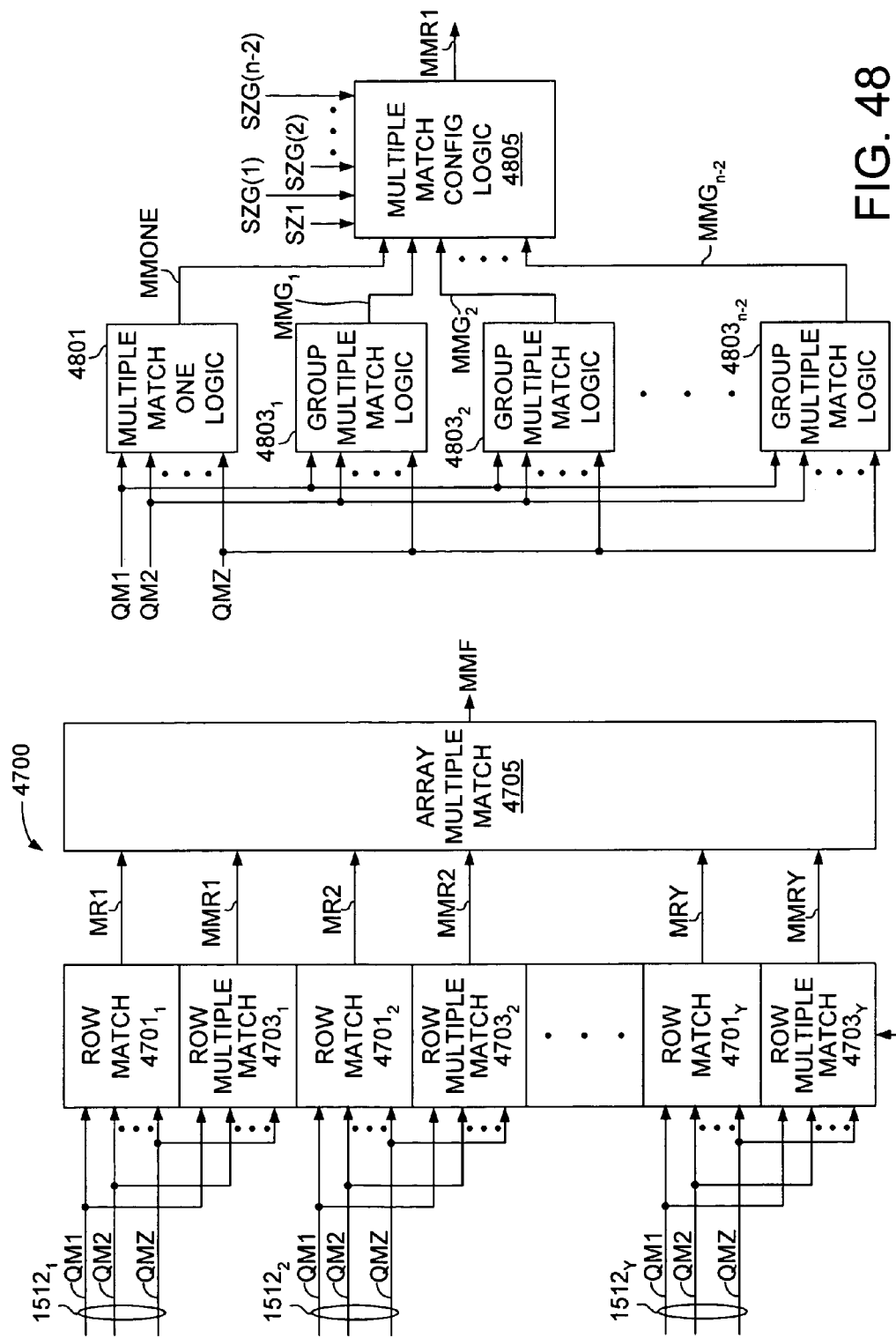
FIG. 47 illustrates an embodiment of the multiple match flag logic of FIG. 15.
FIG. 48 illustrates a row match circuit embodiment that may be used within the row multiple match circuit of FIG. 47.

FIG. 47 shows multiple match flag logic 3600 that is one embodiment of multiple match flag logic 1509 of FIG. 15. Multiple match flag logic 4700 includes a row match circuit 4701 and a row multiple match circuit 4703 for each corresponding row of CAM cells within the CAM array.

Each row match circuit 4701 may be the same row match circuit 3901 of FIG. 39 that receives the qualified match signals QM1-QMZ from a corresponding row of priority number storage circuits within the priority index table and, in response to the configuration information, generates a row match signal MR. Each row match signal is indicative of whether one or more row segments (i.e., for ZY×W mode), or one or more groups of row segments (i.e., for ZY/n×nW mode, where n is greater than 1), for a corresponding row stores highest priority data that matches the comparand data for a particular configuration. Array multiple match circuit 4705 monitors the state of the row match signals, and enables MMF when there is a match indication for more than one row segment, or more than one group of row segments, in different rows of CAM cells for a given configuration.

Each row multiple match circuit 4703 receives the qualified match signals QM1-QMZ (i.e., signals 1512) from the corresponding row of priority number storage circuits and, in response to the configuration information, generates a row multiple match signal MMR. Each row multiple match signal is indicative of whether more than one row segment (i.e., for ZY×W mode), or more than one groups of row segments (i.e., for ZY/n×nW mode, where 1<n<Z), of the corresponding row stores highest priority data that matches the comparand data for a particular configuration. Array multiple match circuit 4705 monitors the match results of the row multiple match signals and enables MMF when at least one of the row multiple match signals is enabled for a given configuration.

FIG. 48 shows row multiple match circuit 4800 that is one embodiment of row multiple match circuit 4703 of FIG. 47. Row multiple match circuit 4800 may be used for each row multiple match circuit. Row multiple match circuit 4800 includes multiple match one logic 4801, group multiple match logic circuits $4803_1$-$4803_{n-2}$, and multiple match configuration logic 4805. Multiple match one logic 4801 determines a multiple match condition in a corresponding row of the CAM array for the ZY×W mode. Multiple match one logic 4801 receives each of the qualified match signals QM1-QMZ from respective priority number storage circuits P1-PZ within a corresponding row within a corresponding row of the priority index table, and generates MMONE to indicate whether more than one of the corresponding priority number storage circuits is match-enabled (i.e., has been enabled by a match signal from the corresponding row segment with in the CAM array) and has a priority number stored therein which is equal to HPNUM. That is, multiple match one logic 4801 determines when two or more of the qualified match signals QM1-QMZ output by the corresponding row of priority number storage circuits are asserted (e.g., in a logic high state). When configuration signal SZ1 is enabled, multiple match configuration logic 4805 outputs MMONE as the row multiple match signal MMR1. Any multiple match logic circuitry can be used for logic 4801 to determine a multiple match condition. One embodiment of multiple match one logic is shown in FIG. 49. For this embodiment, r two-input AND gates, $4901_1$-$4901_r$, each receive a unique combination of two of the qualified match signals, where r is determined by the combinatorial formula r=Z!/(2!(Z−2)!). The output of each AND gate 4901 is provided to OR gate 4903 to generate MMONES. One example of the approach of FIG. 49 for a CAM array having eight row segments is shown in FIG. 50, where all of the combinations of eight qualified match signals taken two at a time are provided to AND gates $5001_1$-$5001_{28}$, and the outputs of the AND gates are provided to OR gate 5003.

Each group multiple match logic circuit $4803_1$-$4803_{n-2}$ determines a multiple match condition within a corresponding row of the CAM array for a different configuration of the CAM system. Each group multiple match logic 4803 circuit receives each of the qualified match line signals QM1-QMZ from respective priority number storage circuits P1-PZ within the corresponding row of the priority index table, and logically combines unique groupings of the qualified match signals to generate group multiple match signals $MMG_1$-$MMG_{n-2}$. Each unique grouping corresponds to the number of row segments within the CAM array that are spanned by a data storage field in a given configuration of the CAM array (i.e., for a given word-width selection). For one embodiment, there are n−2 groups of row segments, where n−2=2x and x is an integer from 1 to $\log_2 Z$, and where x is a unique number for each group multiple match circuit. For example, in ZY/2×2W mode, the row segments in each row of the CAM array are grouped by pairs. Group multiple match logic circuit $4003_1$ determines whether more than one of the pairs of qualified match signals, QM1|QM2, QM3|QM4, etc., indicate a match condition. For this first grouping of qualified match signals, multiple match configuration logic 4805 outputs $MMG_1$ as MMR1 when SZG (1) is enabled. One embodiment of multiple match logic $4003_1$ is shown in FIG. 51 and includes Z/2 AND gates $5101_1$-$5101_{Z/2}$ each having two inputs coupled to receive a unique, consecutive pair of qualified match signals. The outputs of AND gates 5101 are provided to multiple match logic 5103 to generate $MMG_1$. Logic 5103 may be any multiple match logic circuit.

Similarly, in ZY/4×4W mode, the row segments in each CAM array are grouped in four segments at a time. Group multiple match logic circuit $4003_2$ determines whether more than one quartet of qualified match signals QM1-QM4, QM5-QM7, etc. indicate a match condition. For this second grouping of qualified match signals, multiple match configuration logic 4805 outputs $MMG_2$ as MMR1 when SZG (2) is enabled. One embodiment of multiple match logic $4003_2$ is shown in FIG. 52 and includes Z/4 AND gates $5201_1$-$5201_{Z/4}$ each having four inputs coupled to receive a unique, consecutive quartet of qualified match signals. The outputs of AND gates 5201 are provided to multiple match logic 5203 to generate $MMG_2$. Logic 5203 may be any multiple match logic circuit.

This methodology continues until, in ZY/(Z−1)×(Z−1)W mode, the row segments in each row of the CAM array are grouped Z/2 segments at a time. Group multiple match logic circuit $4003_{n-2}$ determines whether both of the Z/2 groupings of qualified match signals QM1-QM(Z/2) and QM(Z/2+1)-QMZ indicate a match condition. For this grouping of qualified match signals, multiple match configuration logic 4805 will output $MMG_{n-2}$ as MMR0 when SZG(n−2) is enabled. One embodiment of multiple match logic $4003_{n-2}$ is shown in FIG. 53 and includes two AND logic circuits $5301_1$ and $5301_2$ each having Z/2 inputs coupled to receive a unique, consecutive grouping of Z/2 qualified match signals. The outputs of AND gates 5301 are provided to multiple match logic 5303 to generate $MMG_{n-2}$. Logic 5303 may be any multiple match logic circuit. For one embodiment, multiple match logic 5303 may be AND logic that logically ANDs the outputs of AND gates 5301.

The final grouping of row segments in which all row segments are grouped for a given row (i.e., Y×ZW mode) is taken care of by the row match circuits (as will be described below), and does not require a separate group multiple match logic circuit.

FIG. 54 shows one embodiment of multiple match configuration logic 4805 of FIG. 48. Other embodiments may be used. For this embodiment, AND gate 5401 determines whether both MMONE and SZ1 are enabled and provides the result to OR gate 5405. AND gates $5403_1$-$5403_{n-1}$ determine whether one of the group multiple match signals $MMG_1$-$MMG_{n-2}$ and a corresponding configuration signal SZG(1)-SZG(n–2) are enabled, and the results are provided to OR gate 5405. OR gate 5405 provides MMR1. For another embodiment, multiple match configuration logic 4805 may be multiplexer with MMONE and $MMG_1$-$MMG_{n-2}$ as the inputs, the configuration signals as the select signals, and the row match signal as the output.

FIG. 55 shows array multiple match logic 5500 that is one embodiment of array multiple match logic 4705 of FIG. 47. Logic 5500 includes multiple match logic 5501 that receives the row match signals MR1-MRY, and generates an inter-row multiple match signal MMI when there is a qualified match (i.e., match within the CAM array that results in assertion of a corresponding qualified match signal) in more than one row segment, or more than one group of row segments, in different rows of CAM cells for a given configuration. MMI is provided to one input of OR logic 5503. OR logic 5503 also receives the row multiple match signals MMR1-MMRY to enable MMF when there is a qualified match in more than one row segment, or more than one group of row segments, within a row of CAM cells for a given configuration.

With reference again to FIG. 15, priority encoder logic 1505 monitors the qualified match signals $1512_1$-$1512_Y$ that correspond to each CAM row, and determines, during a compare operation, a match address or index MA that is the address of a row segment or group of row segments (depending on the configuration information) within the CAM array for which a stored data word matches the comparand data and for which the priority index table asserts a qualified match signal. The highest priority address may be the lowest numerical address, the highest numerical address, or any other predetermined priority. During a write operation, the match address corresponds to the highest priority row segment or group of row segments (priority being determined, according to physical or logical location within the CAM array) to be free to receive a data word (i.e., that is indicated not to have a data word stored therein), an address referred to herein as a next free address.

FIG. 56 shows priority encoder logic 5600 that is one embodiment of priority encoder logic 1505 of FIG. 15. Priority encoder logic 5600 includes a row match circuit 5601 and a row priority encoder 5603 for each corresponding row of CAM cells within the CAM array. Each row match circuit may be the same row match circuit 3901 of FIG. 39 that receives the qualified match signals from a corresponding row of priority number storage circuits within the priority index table and, in response to the configuration information, generates a row match signal MR. Main priority encoder 5605 monitors the match results reflected by the Y row match signals MR1-MRY and generates a row match address PRA that has $\log_2 Y$ address bits. The row address corresponds to the address of the highest priority row of CAM cells within the CAM array, as determined by the priority index table, that has a row segment or a group of row segments that stores data that matches the comparand data for a given configuration.

Each row priority encoder 5603 receives the qualified match signals from a corresponding row of priority number storage circuits and, in response to the configuration information, generates a segment address PSA that that corresponds to the address of a row segment or a group of row segments within a particular row of CAM cells that is responsible for assertion of a corresponding qualified match signal. The row address PRA and the segment addresses PSA1-PSAY are provided to select logic 5607 to generate the match address in response to the configuration information.

For one embodiment, each segment address has $\log_2 Z$ address bits that may reflect different values depending on the configuration of the corresponding row (and array 1501). For example, FIG. 57 shows row priority encoder $5603_1$ for an embodiment where W=32 and Z=8. For this example, row priority encoder $5603_1$ outputs segment address bits PSA1(2), PSA1(1) and PSA1(0) according to the states of the qualified match signals QM1-QMZ received from the corresponding row of priority number storage circuits 1622 within the priority index table and according to configuration signals SZ32, SZ64 and SZ128, which are indicative of three exemplary configurations for the CAM array; namely, a ×32 bit mode, a ×64 bit mode and a ×128 bit mode. A ×256 bit mode which utilizes all of the row segments within row of the CAM array as one entire group does not need a separate configuration signal as the segment address outputs will be ignored and the row address PRA will reflect the match address MA.

In the ×36 mode, SZ32 is enabled (e.g., logic high) and each row segment S1-SZ is uniquely addressable such that S1 has address 0, S2 has address 1, S3 has address 2, and so forth to S8 which has address 7. In the ×64 mode, SZ64 is enabled and each group of two segments S1|S2, S3|S4, S5|S6 and S7|S8 is uniquely addressable such that S1|S2 has address 0, S3|S4 has address 1, S5|S6 has address 2 and S7|S8 has address 3. In the ×128 mode, SZ128 is enabled and each group of four segments S1|S2|S3|S4 and S5|S6|S7|S8 is uniquely addressable such that S1|S2|S3|S4 has address 0, S5|S6|S7|S8 has address 1. FIG. 58 shows truth tables implemented by one embodiment of row priority encoder $5603_1$ for the exemplary ×32, ×64 and ×128 modes. The '•' indicates a logical ANDing of qualified match lines. The logical operation of row priority encoder $5603_1$ may be defined by other truth tables in alternative embodiments, including truth tables in which one or more of the signals shown in FIG. 58 are logically complemented. Any logic or circuitry may be used to implement the truth tables of FIG. 58.

FIG. 59 illustrates an embodiment of the select logic circuit 5607 of FIG. 56. Other embodiments may be used. For this embodiment, select logic 5607 includes decoder 5901, multiplexer 5905, and translation logic 5903. Decoder 5901 decodes row address PRA and provides the decoded row address as select signals to multiplexer 5905. In response to the decoded row address, multiplexer 5905 selects and outputs one of the segment addresses PSA1-PSAY associated with the row of CAM cells at row address PRA. The row address and the selected segment address together make up an internal match address IMA. In Y×ZW mode, translation logic 5903 provides IMA as MA. For other configurations, however, not all of the segment address bits are used (e.g., least significant bit PSA1(0) in the ×64 bit mode and the two least significant bits PSA1(1) and PSA1 (0) in the ×128 mode for the exemplary embodiments described above in reference to FIGS. 57 and 58), or none of the segment address bits are used (e.g., in ZY×W mode where only PRA is used to generate MA) as part of the match address MA. Alternatively, the number of bits in the match index, MA, remain the same for all configurations, with the least significant bits being unused. For these configurations, translation logic 5903 translates or shifts the bits of IMA such that the match address starts at its least significant bit. For alternative embodiments, the unused least significant bits of MA may simply be ignored and translation logic 5903 omitted. Alternatively, the number of bits in the match index, MA, may remain the same for all configurations, with the least significant bits being undefined (i.e., unused) in the ×64, ×128 and ×256 modes.

Numerous other implementations of the above described priority encoder logic may be used in alternative embodiments. For example, U.S. Pat. No. 6,542,391, describes at least one priority encoder logic embodiment that may be used in place of the above-described priority encoder logic.

Partitionable CAM Device with Intra-Row Configurability

FIG. 60 illustrates an embodiment of a CAM device 6000 that includes multiple independently selectable CAM blocks, 1-K, instruction decoder 6019, address logic 6011, global flag circuit 6031, global priority encoder 6033, and a block control circuit 6027. As shown by the exploded view of CAM block 1, each of the CAM blocks includes a configurable CAM array 6001, configurable priority index table 6003, configurable match flag logic and multiple match flag logic (depicted in FIG. 60 as a block flag circuit 6007), configurable priority encoder logic (depicted in FIG. 60 as a block priority encoder 6005), and mode-responsive read/write circuitry 6015, all as described above in reference to FIGS. 4-59.

Instructions such as read, write and compare instructions are issued to the CAM device 6000 by a host processor (not shown) via an instruction bus 6002. In the case of read and write instructions, the host processor may additionally issue address values to the CAM device 6000 via address bus 6006 to specify storage locations to be accessed in the CAM array 6001 and/or priority index table 6003 of one of the CAM blocks.

The instruction decoder 6019 responds to instructions received via the instruction bus 6002 by signaling other circuit blocks within the CAM device 6000 to perform the instructed operation. In one embodiment, incoming instructions may include a class code to specify a storage partition within the CAM device (i.e., one or more of the CAM blocks and/or portions of CAM blocks within the CAM array) to which the instruction is directed. The class code may be part of an operation code of the instruction (e.g., encoded in the operation code), part of an operand associated with the instruction or a distinct operand associated with the instruction. Further, the different portions of a given instruction (e.g., operation code, class code, other operands, etc.) may be received at different times, for example, in distinct transmissions or in packet-based transmissions. Also, class-based instructions may be executed according to a previously received class code. For example, a class code specifying a first storage partition within the CAM device may initially be provided to the CAM device 6000. Thereafter, class-based compare, read and write instructions, though themselves not specifying a particular class, cause corresponding compare, read and write operations to be performed on the first storage partition of the CAM device 6000 until a different class code is provided.

In one embodiment, each class code corresponds to a width/depth configuration of a storage partition (i.e., the width depth of the CAM array within one or more CAM blocks) so that the number of different class codes is determined by the number of permitted width/depth configurations. In an alternative embodiments, different class codes may be assigned according to additional or alternative criteria including, without limitation, the type of data stored within the corresponding storage partition (e.g., ATM (Asynchronous Transfer Mode), IPv4, IPv4 multicast, IPv6, Ethernet, URL (Uniform Resource Locator), MPLS (Multiprotocol Label Switching), policy statements, etc.); the type or purpose of the operation to be performed on the data stored within the corresponding storage partition (e.g., one class of storage partition may be used to support an LPM search mode (or other type of forwarding search mode), while another class of storage partition may be used for classification-based searching), or by any combination of data type, storage configuration, or operation type/purpose. Referring to CAM device 6000, for example, IPv4 values may be stored in CAM block 1 and policy statements in CAM block 2. By assigning different class codes to the IPv4 and policy statement databases, it becomes possible to perform operations (e.g., compare, write, read) on the specific CAM blocks containing those values, regardless of whether those CAM blocks have the same or different width/depth configurations. In general, any criterion for distinguishing between storage partitions may be used without departing from the spirit and scope of the present invention.

In the embodiment of FIG. 60, the instruction decoder 6019 outputs the class code 6010 to the block control circuit 6027 which, in response, outputs respective block select signals $6016_1$-$6016_K$ and block configuration signals $6018_1$-$6018_K$ to each of the K CAM blocks. In one embodiment, each block select signal 6016 is used to selectively enable or disable the corresponding CAM block from participating in a compare operation by preventing comparand data from being applied to the compare circuits within the CAM array 6001 of the CAM block and by preventing the block flag circuit 6007 of the CAM block from asserting a match or multiple match indication. Also, each block select signal 6016 may be used to selectively enable or disable the corresponding CAM block from participating in the generation of a next free address (i.e., address of a highest priority storage location with a CAM block or group of CAM blocks that is free to store a data word) by preventing the block flag circuit of the CAM block from asserting a not-full indication.

In the embodiment of FIG. 60, each of the CAM blocks includes a comparand driver 6025 (CPDR) to output a comparand value received via the data bus 6004 (the comparand value may first be stored in a comparand register as described in reference to FIGS. 20 and 21 above) onto the comparand lines of the corresponding CAM array 6001. The comparand driver circuit 6025 within each CAM block is selectively disabled from outputting the comparand value to the comparand lines according to the state of the corresponding block select signal 6016.

FIG. 61 shows a 1-bit comparand driver 6100 that may be used in an embodiment of the comparand driver 6025 of FIG. 60. Driver 6100 includes AND gates 6101, 6103 and 6105, and buffers 6107 and 6109. AND gate 6101 includes input terminals to receive a control signal 6102 (e.g., a clock signal or other timing control signal) and the block select signal 6016, and an output terminal coupled to first input terminals of AND gates 6103 and 6105. AND gate 6103 includes a second input terminal coupled to a data line D, and an output terminal coupled to the buffer 6107, which in turn drives a comparand line CL. AND gate 6105 includes a second input terminal coupled to a complementary data line $\overline{D}$, and an output terminal coupled to the buffer 6109, which in turn drives a complementary comparand line $\overline{CL}$. Buffers 6107 and 6109 may be any suitable buffers to drive comparand data onto the comparand lines CL and $\overline{CL}$. A plurality of drivers 600 may share the AND gate 6101.

During a compare operation, a comparand bit is provided to AND gate 6103 via data line D, and a complementary comparand bit is provided to AND gate 6105 via complementary data line $\overline{D}$. When CNTRL is logic high, the block select signal 6016 propagates through AND gate 6101 to AND gates 6103 and 6105. If the block select signal 6016 is asserted to logic high, AND gate 6103 passes the comparand bit to the buffer 6107, which in turn drives the comparand bit onto the comparand line CL. Similarly, AND gate 6105 passes the complementary comparand bit to the buffer 6109, which in turn drives the complementary comparand bit onto the complementary comparand line $\overline{CL}$. Thus, when the block select signal 6016 is asserted, the comparand driver 6100 drives the comparand lines CL and $\overline{CL}$ with the comparand data received from a comparand register (or from the data bus) via data lines D and $\overline{D}$.

Conversely, if the block select signal 6016 is de-asserted to a logic low state to indicate that the corresponding CAM block is not to participate in the compare operation, the output of AND gate 6101 goes low, thereby causing the outputs of AND gates 6103 and 6105 to go low. In response to the low outputs from AND gates 6103 and 6105, respectively, buffers 6107 and 6109 force the comparand line CL and the complementary comparand line $\overline{CL}$, respectively, to a logic low state. In this manner, when the block select signal 6016 is de-asserted, the comparand driver 6100 does not drive complementary comparand data onto the comparand lines CL and $\overline{CL}$, thereby precluding the corresponding CAM block from participating in the compare operation and, therefore, reducing power consumption in the CAM block.

Referring again to FIG. 60, in one embodiment, each block configuration signal $6018_1$-$6018_K$ is a multi-bit signal that indicates one of a number of word-width configurations for the CAM array of the corresponding CAM block (e.g., each block configuration signal includes the configuration signals SZ32, SZ64, SZ128 and SZ256 discussed above). As with the configuration signal, CFG, in the single CAM block architecture described above in reference to FIG. 15, each block configuration signal 6018 is supplied to the read/write circuit 6015, priority index table 6003, flag logic 6007 and priority encoder 6005 within the corresponding CAM block to support block-level generation of read/write control signals, qualified match signals, match flag, multiple match flag, full flag and match address signals for the different CAM array configurations.

In one embodiment, the read/write circuit 6015 within each block is implemented for configurable operation as described above in reference to FIGS. 16-20, except that block-level write and read enable signals are generated based on a block identifier portion of an incoming address (e.g., $\log_2 K$ additional bits in an incoming address that are decoded to select one of the K blocks) and used to gate the generation of array read and write enable signals and the priority read and write enable signals within each block. Accordingly, in one embodiment, a single set of Y word lines is coupled to address logic 6011 and is common to all K blocks such that an activated word line enables access to a selected row of CAM cells and priority cells within each of the K CAM blocks, the access being isolated to one of the K blocks by the block identifier portion of the incoming address. In an alternative embodiment, address logic 6011 and an associated set of Y word lines may be replicated as necessary avoid excessive loading of word lines. For example, in an eight-block CAM device, two instances of address logic 6011 may be provided, each receiving an incoming address value from address bus 6006 (or an address value from an address source within the CAM device 6000) and each decoding the address value to activate one of Y word lines. The Y word lines from a first instance of the address logic 6011 may be coupled to half of the CAM blocks (e.g., CAM blocks 1-4) and the Y word lines from a second instance of the address logic 6011 may be coupled to the other half of the CAM blocks. By this arrangement, the same one-out-of-Y word lines is effectively activated within each of the K CAM blocks. Address logic 6011 may also include a block decoder and one or more row decoders each associated with one or more CAM blocks. For example, the block decoder may enable one of the row decoders to decode a row address on bus 6006 to select one or more rows of CAM cells in its corresponding CAM block.

The block flag circuit 6007 within each CAM block includes the configurable match flag logic and the configurable multiple match flag logic described above (e.g., in reference to FIGS. 15, and 39-55) to generate a block-level match flag, multiple match flag and full-flag signals, respectively. Also, each CAM block includes a configurable priority index table 6003 and a configurable priority encoder (i.e., block priority encoder 6005), that operate as described above in reference to FIGS. 15 and 22-38 to generate, for the corresponding block, a highest priority number and corresponding match address, referred to in the multi-block context of FIG. 60 as a block priority number (BPN) and block index (BIN), respectively.

Still referring to FIG. 60, the class code 6010 is also supplied to the address logic 6011 along with a control signal 6044 and a select signal 6042. As discussed below, the address logic 6011 may include register banks for maintaining class-based addresses which are used to access selected storage partitions within the CAM device 6000 in response to certain read and write instructions. In alternative embodiments, the class code 6010 may be supplied to the block control circuit 6027 and/or the address logic 6011 directly from the instruction bus 6002 or the data bus 6004.

FIG. 62 illustrates an embodiment of the block control circuit 6027 that includes a separate subcircuit $6201_1$-$6201_K$ for each of the K blocks of the CAM device 6000. Each of the subcircuits $6201_1$-$6201_K$ includes a respective block configuration register $6205_1$-$6205_K$, comparator circuit $6207_1$-$6207_K$, and a gating circuit $6203_1$-$6203_K$. The block configuration registers $6205_1$-$6205_K$ may be distinct registers or respective portions of a single register, such as configuration register 1517 of FIG. 15. Each comparator circuit 6207 is coupled to receive a block configuration signal from the corresponding block configuration register 6205 and the class code 6010 from the instruction decoder (or, alternatively, directly from the instruction bus or data bus). The comparator circuits $6207_1$-$6207_K$ each include circuitry to compare the incoming class code 6010 with the content of the corresponding block configuration register 6205 to generate a respective block select signal 6016. If the class code 6010 matches the content of the corresponding block configuration register 6205, the comparator circuit 6207 asserts the block select signal 6016 for the corresponding CAM block. Conversely, if the class code 6010 does not match the content of the corresponding block configuration register 6205, the comparator circuit 6207 deasserts the block select signal 6016 for the corresponding CAM block.

Each of the gating circuits $6203_1$-$6203_K$ is coupled to receive a respective block select signal 6016 from the corresponding comparator circuit 6207 and the block configuration signal from the corresponding block configuration register 6205. Each gating circuit 6203 includes logic to output a respective one of the multi-bit block configuration signals $6018_1$-$6018_K$ in accordance with the stored block configuration value if the corresponding block select signal 6016 is asserted. If the corresponding block select signal 6016 is not asserted, the block configuration signal 6018 is masked, for example, by forcing all component signals (not shown in FIG. 62) of the block configuration signal 6018 to a logic low state. In alternative embodiments, the gating circuits 6203 are omitted so that the block configuration signals $6018_1$-$6018_K$ are output to respective block priority encoders 6005 and block flag circuits 6007 regardless of the state of the corresponding block select signals $6016_1$-$6016_K$. In such alternative embodiments, it may be necessary to gate the signals generated by block flag circuits and/or block priority encoders according to the state of the corresponding block select signal. Such embodiments are described in U.S. Pat. No. 5,542,391.

FIG. 63 illustrates a block configuration register 6205 according to one embodiment. The block configuration register 6205 includes a first storage field 6301 (formed by a plurality of storage elements) to store CAM array configuration information for the corresponding CAM block (i.e., SZ1, and SZG(1)-SZG(n−1)), a second storage field 6303 to store a block search mode (SM), and a third storage field to store a block priority assignment (i.e., BPA(0)-BPA(R−1) that may be used to allow programmable priorities between CAM blocks 1-K. Note that the block search mode may be a multiple-bit value in alternative embodiments and therefore have a multiple-bit storage field instead of the single bit storage field 6303 shown in FIG. 63. Also, numerous other types of block configuration information may also be stored within the block configuration register 6205 in alternative embodiments including, without limitation, data type information that indicates the type of data stored (or to be stored) within the corresponding CAM block.

Although the block configuration value stored within storage field 6301 is depicted in FIG. 63 as being stored in a decoded format (i.e., one bit per possible array configuration), an encoded format may alternatively be used. In an embodiment in which the CAM array within each CAM block may be configured in ×32, ×64, ×128 or ×256 configurations, for example, a two-bit, encoded block configuration value may be stored within the block configuration register 6205 to indicate one of the four possible block configurations. Together, the encoded block configuration value and search mode value may be used to define a block classification for each of the K CAM blocks as follows:

TABLE 18

| Search Mode<br>0 = LPM, 1 = PC | Word Width Configuration<br>00 = x32, 01 = x64, 10 = x128, 11 = x256 | Block<br>Classification | Matching<br>Class Code |
|---|---|---|---|
| 0 | 00 | x32F | 0 (000b) |
| 0 | 01 | x64F | 1 (001b) |
| 0 | 10 | x128F | 2 (010b) |
| 1 | 01 | x64C | 5 (101b) |
| 1 | 10 | x128C | 6 (110b) |
| 1 | 11 | x256C | 7 (111b) |

Block classification values corresponding to the above block classifications may be provided to the block control circuit 6027 of FIG. 60 via the data bus 6004 (or another path) and, in response to a block configuration store instruction, stored within the block configuration registers. In one embodiment, each of the block configuration registers $6205_1$-$6205_K$ itself constitutes a respective block storage field within a storage register having K such storage fields (i.e., one for each block) and all or a selected portion of the block storage fields may be simultaneously loaded with respective block classification values in response to a host instruction. Although the block classifications listed in Table 18 are described in examples that follow, it should be noted that numerous other block classification values may be formed by other combinations of storage fields within the block configuration registers $6205_1$-$6205_K$ in alternative embodiments.

FIG. 64 illustrates an embodiment of the global flag circuit 6031 of FIG. 60. The global flag circuit 6031 includes a global multiple match circuit formed by multiple match circuit 6403 and OR logic gate 6405, as well as a device flag generator formed by OR logic gate 6401. Each of the block flag signals, $BF_1$-$BF_K$, from the respective CAM blocks is input to the OR logic gate 6401 which, accordingly, asserts the device flag signal 6054 whenever one or more of the block flag signals, $BF_1$-$BF_K$, is asserted.

The global multiple match circuit formed by multiple match circuit 6403 and OR logic gate 6405 operates on the block flag signals, $BF_1$-$BF_K$, and the block multiple match flag signals, $BMMF_1$-$BMMF_K$, in the same manner as the multiple match circuit 5500 described above in reference FIG. 55 operates on the row flag signals and the row multiple match signals. That is, the individual block flag signals, $BF_1$-$BF_K$, are input to multiple match circuit 6403 which asserts an inter-block multiple match signal 6402 if more than one of the block flag signals is asserted (e.g., active high). The inter-block multiple match signal 6402 is input to the logic OR circuit 6405 along with the block multiple match signals, $BMMF_1$-$BMMF_K$. Accordingly, the device multiple match flag 6058 is asserted if the inter-block multiple match signal 6402 or any of the block multiple match signals is asserted.

As discussed above in the context of the single-array device of FIG. 15, each block match flag signal indicates a match/no-match condition within the corresponding CAM block during a compare operation, and a full/not-full condition the corresponding CAM block during a write operation. Accordingly, the device flag signal 6054 shown in FIG. 60 is indicative of a match/no-match condition for a selected class of CAM blocks (i.e., one or more CAM blocks selected by a host-supplied class code) during a compare operation, and a full/not-full condition for the selected class of CAM blocks during a write operation. Similarly, the device multiple match signal 6058 is indicative of a multiple match condition within a selected class of CAM blocks during a compare operation. Thus, match, multiple match, and not-full conditions may be signaled on a class-by-class basis according to a host-supplied class code.

As with the device flag signal 6054 and device multiple match signal 6058, the device index 6052 generated by the global priority encoder 6033 represents either a highest priority match address within a selected class of CAM blocks during a compare operation or a next free address within the selected class of CAM blocks during a write operation, thereby permitting generation of a highest priority match address and next free address on a class-by-class basis according to a host-supplied class code.

FIG. 65 illustrates an embodiment of the global priority encoder 6533 that may be used within the multiple-block CAM device 6000 of FIG. 60 (note that the global priority encoder may also be referred to as a device index processor). The global priority encoder 6533 includes a compare logic 6501, priority encoder 6505, and index selection unit 6503. Compare logic 6501 compares the block priority numbers $BPN_1$-$BPN_K$ received from CAM blocks 1-K, respectively, to determine a highest priority one of the block priority numbers (e.g., a block priority number having the lowest or highest numerical block priority number). The comparison results are reflected by select signals, $SEL_1$-$SEL_K$. Each select signal corresponds to a respective one of the CAM blocks and is asserted if the block priority number from the corresponding CAM block is the most significant (i.e., highest priority one) of all the block priority numbers. For example, signal $SEL_1$ indicates whether the block priority number output by CAM block 1 is the most significant block priority number, $SEL_2$ indicates whether the block priority number output by CAM block 2 is the most significant block priority number, and so on. In one embodiment, the CAM blocks are prioritized relative to one another with CAM block 1 having a highest priority and CAM block K having a lowest priority (other block-to-block priority schemes may be used in alternative embodiments) so that, if two or more CAM blocks each output the most significant block priority number (i.e., there is a tie between two or more block priority numbers), then the block-to-block priorities are used to determine which one of the select signals to assert. In any case, the block priority number indicated by the asserted one of the select signals, $SEL_1$-$SEL_K$, is output from the global priority encoder as the device priority number 6056. The device level priority number may be output from the CAM device via a dedicated interface (e.g., dedicated pins of an integrated circuit (IC) package) or via a multiplexed interface, such as a result or status bus (not shown).

Still referring to FIG. 65, the priority encoder 6505 is coupled to receive the select signals $SEL_1$-$SEL_K$ from the compare logic 6501 and includes circuitry to determine and output a block identifier that corresponds to an asserted one of the select signals, $SEL_1$-$SEL_K$ (and which corresponds, therefore, to the CAM block which sourced the most significant block priority number). In an exemplary CAM device having eight CAM blocks, for example, the priority encoder may output a block identifier in accordance with the following table (the suffix 'b' indicates a binary number):

TABLE 19

| Asserted Select signal | Block Identifier (MSBID) |
|---|---|
| $SEL_1$ | 0 (000b) |
| $SEL_2$ | 1 (001b) |
| $SEL_3$ | 2 (010b) |
| $SEL_4$ | 3 (011b) |
| $SEL_5$ | 4 (100b) |
| $SEL_6$ | 5 (101b) |
| $SEL_7$ | 6 (110b) |
| $SEL_8$ | 7 (111b) |

The block identifier that is output from the priority encoder 6505 is given the designation of most significant block priority identifier (MSBID).

The index selection unit 6503 within global priority encoder 6533 includes multiplexing logic to select, according to which of the select signals $SEL_1$-$SEL_K$ is asserted, one of the block indices $BIN_1$-$BIN_K$ to be output as a selected block index. In the embodiment of FIG. 65, the selected block index and the most significant block identifier are output from the global priority encoder 6533 to form the device index. In one embodiment, the most significant block identifier forms a block address component of the device index and constitutes the most significant bits of the device index 6052. In alternative embodiments, the most significant block identifier may be used to source the least significant bits of the device index 6052, or bits in other positions within the device index 6052. As with the device priority number, the device index may be output from the CAM device via a dedicated or multiplexed interface.

Figure 67:
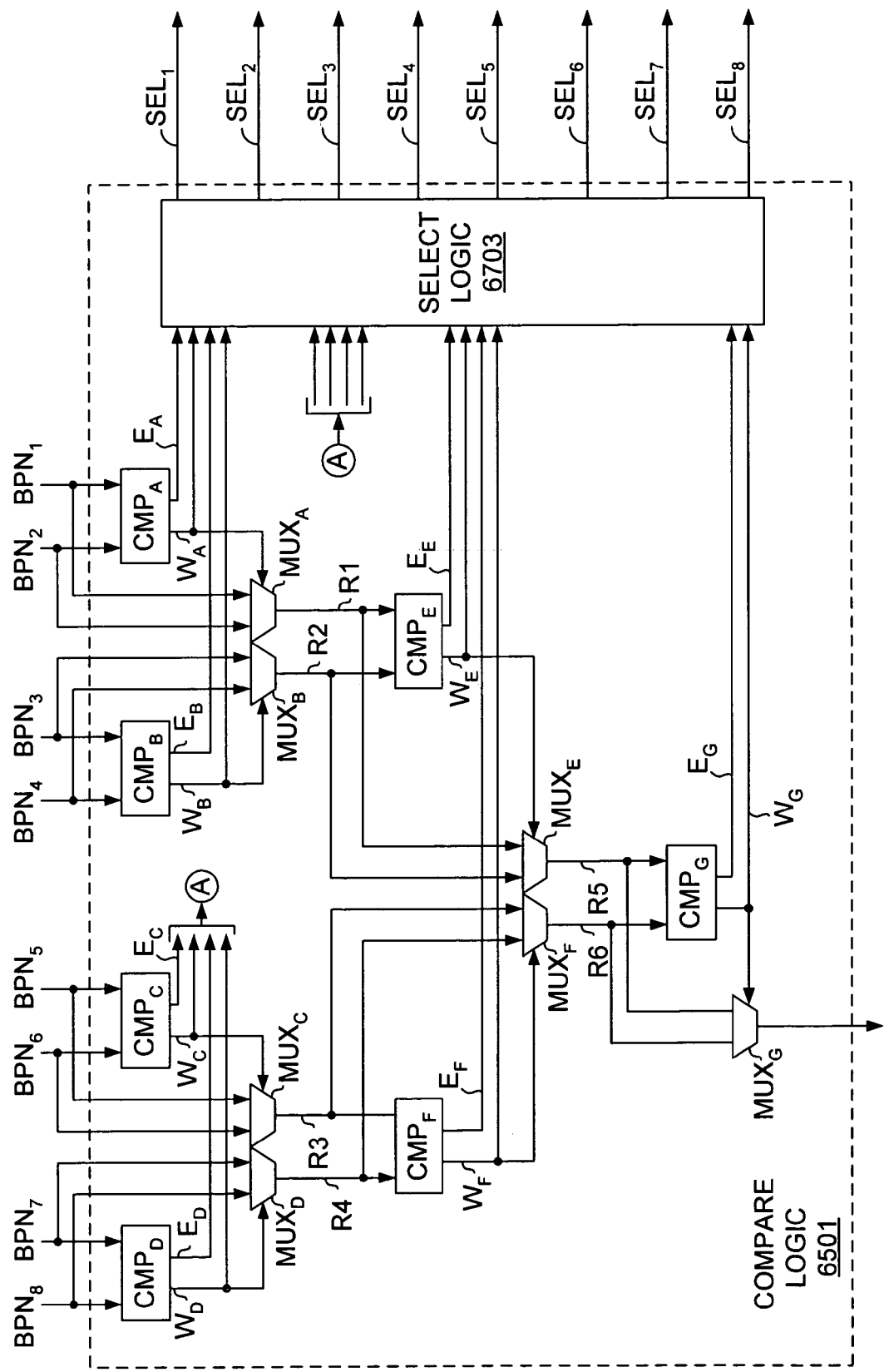
FIG. 67 illustrates an embodiment of the compare logic of FIG. 65.

FIG. 67 illustrates an embodiment of the compare logic 6501 of FIG. 65 for use in an exemplary CAM device having eight CAM blocks. The compare logic 6501 is similar in structure and operation to the column priority logic 2203 described above in reference to FIG. 30, except that the input block priority numbers, $BPN_1$-$BPN_8$, each have a fixed bit width (e.g., 10 bits, as when the exemplary column priority logic 2203 of FIG. 30 is included within the priority index tables of the CAM blocks of FIG. 60) rather than a configuration-specific bit width. Block priority number having configuration-specific bit-widths may alternatively be used.

The compare logic 6501 includes comparator circuits $CMP_A$-$CMP_G$, multiplexer circuits $MUX_A$-$MUX_G$, and select logic 6703. The comparator circuits and multiplexer circuits are used to select a highest priority one of the block priority numbers $BPN_1$-$BPN_8$ (received from respective CAM blocks 1-8) to be output as the device priority number 6056, and the select logic 6703 responds to signals generated by the comparator circuits to generate the set of select signals, $SEL_1$-$SEL_8$, described above.

In one embodiment, each of the comparators, $CMP_A$-$CMP_G$, includes circuitry to compare a pair of block priority numbers (e.g., 10-bit priority numbers) and output an equality signal (E) to indicate whether the priority numbers are equal, and a win signal (W) to indicate which of the priority numbers has a higher priority than the other. Referring to comparator $CMP_A$, for example, the state of the equality and win signals indicate a comparison result as follows (note that the greater-than symbol '>' indicates higher priority, and not necessarily higher numeric value):

TABLE 20

| $E_A$ | $W_A$ | Result |
|---|---|---|
| 0 | 0 | BPN1 > BPN3 |
| 0 | 1 | BPN3 > BPN1 |
| 1 | X | BPN1 = BPN3 |
| X | 0 | BPN1 ≧ BPN3 |
| X | 1 | BPN3 ≧ BPN1 |

Similar tables may be constructed for each of comparators $CMP_B$-$CMP_G$. Each of the win and equality signals output by comparators $CMP_A$-$CMP_G$ (i.e., win signals $W_A$-$W_G$ and equality signals $E_A$-$E_G$) is provided to the select logic 6703 for generation of the select signals $SEL_1$-$SEL_8$. Also, each of the win signals $W_A$-$W_F$ is supplied to the control input of a respective one of multiplexers $MUX_A$-$MUX_F$ to select a winning one of the pair of input priority numbers to be output to a next stage comparator circuit. Win signal $W_G$ is supplied to the control input of multiplexer $MUX_G$, to select a winning priority number (i.e., between the priority numbers output by multiplexers $MUX_E$ and $MUX_F$) to be output as the device priority number, DPN.

In the context of compare logic 6501, a winning priority number is either the highest priority one of two priority numbers, or, if the priority numbers are equal, a predetermined one of the priority numbers. In one embodiment, for example, the priority number sourced by the lowest numbered CAM block is selected as the winning priority number over a priority number having an equal numeric value, but sourced by a higher numbered CAM block. In such an embodiment, block-to-block priorities are hardwired to establish CAM block 1 as the highest priority CAM block of CAM blocks 1-K, and CAM block K is the lowest priority CAM block. In an alternative embodiment, the block-to-block priorities may be reversed to establish CAM block K as the highest priority CAM block and CAM block 1 as the lowest priority CAM block (e.g., by selecting the priority number sourced by the higher numbered CAM block to be the winning one of two equal priority numbers).

Overall, multiplexers $MUX_A$-$MUX_G$ respond to the win signals generated by comparators $CMP_A$-$CMP_G$ to route the highest priority one of block priority numbers $BPN_1$-$BPN_8$ to the DPN output. More specifically, the comparators and multiplexer circuits operate in three stages to generate a device priority, with each stage operating as follows:

First Stage
$CMP_A/MUX_A$: R1=winner(BPN2, BPN1)
$CMP_B/MUX_B$: R2=winner(BPN4, BPN3)
$CMP_C/MUX_C$: R3=winner(BPN6, BPN5)
$CMP_D/MUX_D$: R4=winner(BPN8, BPN7)
Second Stage
$CMP_E/MUX_E$: R5=winner(R2, R1)
$CMP_F/MUX_F$: R6=winner(R4, R3)
Third Stage
$CMP_G/MUX_G$: DPN=winner(R6, R5)
R1=winner(HP3, HP1)

In terms of the win signals $W_A$-$W_G$, the operation of the multiplexer circuits $MUX_A$-$MUX_G$ may be expressed as follows (note that, in this example, the expression "if/$W_A$" means "if $W_A$=0"):

$MUX_A$: if/$W_A$, then R1←BPN1, else R1←BPN2
$MUX_B$: if/$W_B$, then R2←BPN3, else R2←BPN4
$MUX_C$: if/$W_C$, then R3←BPN5, else R3←BPN6
$MUX_D$: if/$W_D$, then R4←BPN7, else R4←BPN8
$MUX_E$: if/$W_E$, then R5←R1, else R5←R2
$MUX_F$: if/$W_F$, then R6←R3, else R6←R4
$MUX_G$: if/$W_G$, then DPN ←R5, else DPN←R6

Note that, the above expressions result in CAM block 1 having the highest priority one of CAM blocks 1-K. Alternatively, the multiplexers $MUX_A$-$MUX_G$ may operate as follows to establish CAM block K as the highest priority one of CAM blocks 1-K:

$MUX_A$: if $W_A$, then R1←BPN2, else R1←BPN1
$MUX_B$: if $W_B$, then R2←BPN4, else R2←BPN3
$MUX_C$: if $W_C$, then R3←BPN5, else R3←BPN5
$MUX_D$: if $W_D$, then R4←BPN6, else R4←BPN7
$MUX_E$: if $W_E$, then R5←R2, else R5←R1
$MUX_F$: if $W_F$, then R6←R4, else R6←R3
$MUX_G$: if $W_G$, then DPN←R6, else DPN←R5

The select logic 6703 generates select signals $SEL_1$-$SEL_8$ according to the highest priority one of the block priority numbers. That is, if $BPN_1$ is determined to be the highest priority block priority number, then $SEL_1$ is asserted (e.g., driven or pulled to a logic high level), if $BPN_2$ is determined to be the highest priority block priority number, then $SEL_2$ is asserted and so forth. In one embodiment, the CAM blocks are prioritized such, in the case of a tie between any or all of the block priority numbers, the select signal that corresponds to the lowest numbered CAM block involved in the tie is asserted. For example, if all the block priority numbers are equal (and therefore all constitute a highest priority block priority number), select signal $SEL_1$ is asserted. In one such embodiment, the select logic generates select signals $SEL_1$-$SEL_8$ in accordance with the following Boolean expressions:

$SEL_1 = [(BPN_1 \geq BPN_2)*(R1 \geq R2)*(R5 \geq R6) = (/W_A)*(/W_E)*(/W_G)$ $SEL_2 = [(BPN2>BPN1)*(R1 \geq R2)*(R5 \geq R6) = (W_A*/E_A) *(/W_E)*(/W_G)$ $SEL_3 = [(BPN3 \geq BPN4)*(R2>R1)*(R5 \geq R6) = (/W_B)* (W_E*/E_E)*(/W_G)$ $SEL_4 = [(BPN4>BPN3)*(R2>R1)*(R5>R6) = (W_B*/E_B)* (W_E*/E_E)*(/W_G)$ $SEL_5 = [(BPN5 \geq BPN6)*(R3 \geq R4)*(R6 \geq R5) = (/W_C)*(/W_F)*(W_G*/E_G)$ $SEL_6 = [(BPN6>BPN5)*(R3 \geq R4)*(R6 \geq R5) = (W_C*/E_C)*(/W_F)*(W_G*/E_G)$ $SEL_7 = [(BPN7 \geq BPN8)*(R4>R3)*(R6>R5) = (/W_D)* (W_F*/E_F)*(W_G*/E_G)$ $SEL_8 = [(BPN8>BPN7)*(R4>R3)*(R6>R5) = (W_D*/E_D) *(W_F*/E_F)*(W_G*/E_G)$ It should be noted that in an alternative embodiment, the priority between CAM blocks may be arranged in descending order (i.e., CAM block 8 having the highest priority and CAM block 1 having the lowest priority) and that the compare logic may be configured to select between tying block priority numbers accordingly. Also, in an alternative embodiment, the compare logic 6501 may be implemented by a priority index table. For example, a priority index table such as that described above with respect to FIGS. 4 and 7-10 may be used to compare the block priority numbers $BPN_1$-$BPN_K$ output from CAM blocks 1-K. The priority logic of the priority index table compares $BPN_1$-$BPN_K$ to determine the device priority number (DPN) and generate select signals $SEL_1$-$SEL_K$ (e.g., as IAD signals) for use in index selection unit 6503 and priority encoder 6505. For example, as shown in FIG. 8, each of the block priority numbers $BPN_1$-$BPN_K$ may be stored in respective rows of memory elements 702 such that BPN$_1$ is stored in row 1 associated with SEL$_1$, BPN$_2$ is stored in row 2 associated with SEL$_2$, and the like such that if BPN$_1$ is the device priority number then SEL$_1$ is asserted, and if BPN$_2$ is the device priority number then SEL$_2$ is asserted, and SEL$_3$-SEL$_K$ generated in similar fashion. Alternatively, each of the block priority numbers BPN$_1$-BPN$_K$ need not be stored in memory elements 702 before comparison with each other; rather, respective bits of the block priority numbers BPN$_1$-BPN$_K$ may be coupled directly to corresponding compare circuits 806 in FIG. 8.

In the global priority encoder 6533 of FIG. 65, the relative priorities between the CAM blocks are fixed according to the implementation of the compare logic 6501. For certain applications, however, it may be desirable to enable a user (i.e., processor or other instruction issuing device) to specify the relative priorities between the CAM blocks, rather than using a fixed block-to-block priority arrangement. Accordingly, in one embodiment of a multiple-block CAM device, block priority assignments may be programmed by a host processor, for example, by storing a respective block priority assignment in a storage field within the block configuration register for each CAM block. By this arrangement, a host processor, and therefore a network architect, administrator or other operator, may select which CAM blocks will have priority in the event of a tie between block priority numbers.

Referring to the block configuration register of FIG. 63, a block priority storage field formed by R=log$_2$(K) storage elements (K being the number of CAM blocks in the CAM device) may be used to store a block priority assignment. For example, in a CAM device having eight CAM blocks, a respective 3-bit (i.e., log$_2$8) block priority assignment may be stored in the block configuration register for each CAM block and thereby permitting complete control over the relative priorities between CAM blocks.

FIG. 66 illustrates an embodiment of a global priority encoder 6633 that may be used within a multiple-block CAM device having programmable block priorities. The global priority encoder 6633 operates similarly to the global priority encoder of FIG. 65, except that the compare logic 6601 receives, at each of K comparator input ports, a composite block priority value from a respective CAM block that includes the block priority number (BPN) in the most significant bit positions, and the block priority assignment (BPA) in the least significant bit positions (the bit positions may be in any order in alternative embodiments). The compare logic 6601 compares the composite block priority values and asserts, according to the highest priority one of the composite block priority values, one of K select signals, SEL$_1$-SEL$_K$. The compare logic also outputs the block priority number constituent of the highest priority composite block priority value as the device priority number. In one embodiment, the compare logic 6601 within the global priority encoder 6633 is identical to the compare logic 6501 described in reference to FIG. 67, except that the width of each priority number path (and therefore the number of bits evaluated by each comparator circuit within compare logic 6601) is increased by the number of bits used to form the block priority assignment. Note that, in an embodiment in which the device priority number 6056 output by the compare logic 6601 omits the block priority assignment, multiplexer MUX$_G$ of FIG. 67 need not include input or output nodes for the block priority assignment portion of the input and output block priority numbers. In an alternative embodiment in which the device priority number 6056 includes the block priority assignment, multiplexer MUX$_G$ may include the full complement of input and output nodes for selecting and outputting a composite block priority number.

Still referring to FIG. 66, the priority encoder 6505 and index selection unit 6503 may be identical to the priority encoder and index selection unit included within the global priority encoder 6533 of FIG. 65. Thus in one embodiment, the select signal asserted by the compare logic 6601 is used by priority encoder 6505 as described above in reference to FIG. 65 to generate a most significant block identifier (i.e., a value indicative of the CAM block which sourced the highest priority composite block priority value), and also by the index selection unit 6503 as described above in reference to FIG. 65 to select the block index from the CAM block that provided the highest priority composite block priority value. The most significant block identifier and selected block index are output from the global priority encoder as the device index 6052 in the same manner as described above in reference to FIG. 65. Also, in an alternative embodiment, the compare logic 6601 may be implemented by a priority index table. For example, a priority index table such as that described above with respect to FIGS. 4 and 7-10 may be used to compare the composite block priority values BPN$_1$|BPA$_1$-BPN$_K$|BPA$_K$ to determine the device priority number (DPN) and generate select signals SEL$_1$-SEL$_K$ (e.g., as IAD signals) for use in index selection unit 6503 and priority encoder 6505. For example, as shown in FIG. 8, each of the composite block priority values BPN$_1$|BPA$_1$-BPN$_K$|BPA$_K$ may be stored in respective rows of memory elements 702 such that BPN$_1$|BPA$_1$ is stored in row 1 associated with SEL$_1$, BPN$_2$|BPA$_2$ is stored in row 2 associated with SEL$_2$, and the like such that if BPN$_1$|BPA$_1$ is the highest priority composite block priority value then SEL$_1$ is asserted, and if BPN$_2$ is the highest priority composite block priority value then SEL$_2$ is asserted, and SEL$_3$-SEL$_K$ generated in similar fashion. Alternatively, each of the composite block priority values BPN$_1$|BPA$_1$-BPN$_K$|BPA$_K$ need not be stored in memory elements 702 before comparison with each other; rather, respective bits of the composite block priority values BPN$_1$|BPA$_1$-BPN$_K$|BPA$_K$ may be coupled directly to corresponding compare circuits 806 in FIG. 8.

FIG. 68 illustrates an embodiment of an address circuit 6800 that may be included within the address circuit 6011 of FIG. 60. A NFA (next free address) register bank 6802 contains a plurality of NFA registers, NFA0-NFA(m−1), and a HPM (highest priority match) register bank 6804 contains a plurality of HPM registers, MPM0-HPM(m−1). Each NFA register is coupled to the global priority encoder to receive the device index 6052 and also to a load control circuit (not shown) to receive a respective one of register load signals LDNFA0-LDNFA(m−1). Each HPM register is similarly coupled to receive the device index 6052 from the global priority encoder and to receive a respective one of the register load signals LDHPM0-LDHPM(m−1). The load control circuit, which may be included within the address logic 6011, generates the register load signals LDNFA0-LDNFA(m−1) and LDHPM0-LDHMP(m−1) in response to signals from the instruction decoder and the device flag. The operation of the load control circuit is discussed in greater detail below.

Each of the NFA registers within the NFA register-bank 6802 is coupled to a respective input port of a NFA multiplexer 6806. The NFA multiplexer 6806 is responsive to the class code to select the content of one of the NFA registers to be input to an address selector 6810. Similarly, each of the HPM registers within the HPM register bank 6804 is coupled to a respective input port of a HPM multiplexer 6808 which selects, in response to the class code, the content of one of the HPM registers to be input to the address selector 6810. The address bus 5925 is also coupled to an input port of the address selector 6810 to allow selection of host-supplied addresses in certain read and write operations. In alternative embodiments, additional address sources may be input to the address selector 6810.

When an instruction is received indicating write access to a next free location of a class, the class code portion of the instruction 6010, if any, is used to select one of the NFA registers and one of the HPM registers to supply a next free address and a highest priority match address, respectively, to the address selector 6810. The select signal 6042 indicates the nature of the operation to be performed and, in the case of a read or write access to the CAM array, is used within the address selector 6810 to select the appropriate address source. For example, in the case of a WRITE@NFA@CLASS instruction, the class code 6010 selects the content of one of the NFA registers within the NFA register bank 6802 to be input to the address selector 6810 and the select signal 6042 selects the NFA register to supply the next free address for the selected class to the address logic 6812. The address logic 6812 decodes the input address to activate a corresponding word line within each CAM block of the CAM array and to activate appropriate write enable signals within a selected one of the CAM blocks. Similarly, in the case of a $RE_AD$@HPM@CLASS instruction, the class code 6010 selects the content of one of the HPM registers within the HPM register bank 6804 to be input to the address selector 6810, and the select signal 6042 selects the HPM register to supply the highest priority match address for the selected class to the address logic 6812.

FIG. 69 illustrates a load control circuit 6900 that may be used within the address circuit 6800 of FIG. 68 to generate the HPM register load signals LDHPM0-LDHPM(m−1) and NFA register load signals LDNFA0-LDNFA(m−1). In the embodiment of FIG. 69, the load control circuit 6900 receives the select signal 6042, control signal 6044 and class code 6010 from the instruction decoder, and the device flag signal 6054 from the global flag circuit. As mentioned above, in alternative embodiments any or all of the select signal 6042, control signal 6044, and class code 6010 may be received directly from the instruction bus instead of from the instruction decoder. In one embodiment, the select signal 6042 includes two component signals, SEL_NFA and SEL_HPM, to select a register within either the NFA register bank or the HPM register bank, respectively, to be loaded with a new address. Also, in an exemplary embodiment, the CAM device has eight CAM blocks each assigned to one of six different classes according to their intra-row configuration and search mode (e.g., as shown in Table 18 above). These class assignments may be specified, for example, by component signals SZ32, SZ64, SZ128 and SZ256 that correspond to the array configuration value stored for each CAM block, and by a mode select signal (e.g., MSEL discussed above in reference to FIGS. 12-19 and 63) that corresponds to the search mode value stored for each CAM block. In such an embodiment, the load control circuit 6900 may generate NFA and HPM register load signals according to the following table (the class code (CC) value being interpreted in accordance with Table 18 above):

TABLE 21

| SEL | CC | CTRL | DEVICE FLAG | Asserted Load Signal: |
|---|---|---|---|---|
| X | X | X | 0 | NONE |
| X | X | 0 | X | NONE |
| SEL_NFA | x32F | 1 | 1 | LDNFA0 |
| SEL_NFA | x64F | 1 | 1 | LDNFA1 |
| SEL_NFA | x128F | 1 | 1 | LDNFA2 |
| SEL_NFA | x64C | 1 | 1 | LDNFA3 |
| SEL_NFA | x128C | 1 | 1 | LDNFA4 |
| SEL_NFA | x256C | 1 | 1 | LDNFA5 |
| SEL_HPM | x32F | 1 | 1 | LDHPM0 |
| SEL_HPM | x64F | 1 | 1 | LDHPM1 |
| SEL_HPM | x128F | 1 | 1 | LDHPM2 |
| SEL_HPM | x64C | 1 | 1 | LDHPM3 |
| SEL_HPM | x128C | 1 | 1 | LDHPM4 |
| SEL_HPM | x256C | 1 | 1 | LDHPM5 |

As shown, the when the control signal is deasserted, no register load signal is asserted. Thus, when an incoming instruction specifies an operation (e.g., a read operation) that does not produce a device index, the instruction decoder may deassert the control signal to prevent the HPM and NFA register banks from being loaded. Also, no register load signal is asserted when the device flag signal 6054 is deasserted. Recalling that the device flag signal 6054 is asserted when a match is detected during a compare operation or when a storage partition includes at least one unfilled storage location after a write operation, a deasserted device flag conversely indicates that no match was found in the compare operation or that the storage-partition is full after the write operation. In either event, the device index does not represent a valid address within the CAM array (i.e., neither a match address nor a not-full address) when the device flag 6054 is deasserted. Accordingly, no register load signal is asserted when the device flag 6054 is not asserted.

In alternative embodiments, a register load operation to register bank 6802 or 6804 may be performed regardless of the state of the device flag 6054. Also, the number of registers within each of the register banks 6802 and 6804 of FIG. 68 is shown to be 'm,' where m is an integer number representative of the maximum number of storage classes. In one embodiment, each storage class corresponds to the CAM block classifications described above in reference to Table 18. In an alternative embodiments, storage classes may be defined by other criteria including, without limitation, the type of data stored within the corresponding storage partition (e.g., ATM, IPv4, IPv4 multicast, IPv6, Ethernet, URL, MPLS, policy statements, etc.); the type or purpose of the operation to be performed on the data stored within the corresponding storage partition (e.g., one class of storage partition may store data to be used in compare operations to determine forwarding addresses, while another class of storage partition may store data to be used in compare operations for classification purposes), or by any combination of data type, storage configuration, or operation type/purpose. More generally, any criterion for distinguishing between storage partitions may be used without departing from the spirit or scope of the present invention.

FIG. 70 illustrates an exemplary operation of the instruction decoder 6019 of FIG. 60 in response to an instruction to write to the next free address of a class-based storage partition of the CAM device (i.e., a WRITE@NFA@CLASS instruction). In block 7001, the instruction decoder issues the appropriate select and class code signals to the address circuit (e.g., element 6011 of FIG. 60) to select the NFA register for the specified class code to source the address for a write access to the CAM array. A first predetermined time later, in block 7003, the instruction decoder signals a write circuit within the CAM device (e.g., element 6015 of FIG. 60) to write data into a CAM block and CAM array location selected by the address circuit. After a second predetermined time, the instruction decoder asserts the control signal (the class code remaining asserted and select signals remaining asserted) to enable the device index to be stored in the NFA register specified by the class code. As discussed in reference to FIG. 68, if the device flag indicates that the device index represents a valid not-full address, the device index is stored in the NFA register.

FIG. 71 illustrates an exemplary operation of the instruction decoder 6019 of FIG. 60 in response to an instruction to compare a comparand with the contents of a class-based storage partition of the CAM device (i.e., a COMPARE@CLASS instruction). In block 7101, the instruction decoder initiates execution of the compare operation. At block 7103, the instruction decoder issues the select and class code signals to the address circuit (e.g., element 6011 of FIG. 60) to select the HPM register for the specified class in preparation for a load operation. Note that the select and class code signals may be issued to the address circuit in parallel with execution of the compare operation in block 7101 or at a later time. In either case, a predetermined time after initiation of the compare operation, the instruction decoder asserts the control signal to enable the device index to be stored in the HPM register specified by the class code. As discussed in reference to FIG. 68, if the device flag indicates that the device index represents a valid match address, the device index is stored in the HPM register.

FIG. 72 illustrates an exemplary operation of the instruction decoder 6019 of FIG. 60 in response to an instruction to read a CAM word from the highest priority match address of a class-based storage partition of the CAM device (i.e., a $RE_AD@HPM@CLASS$ instruction). In block 7201, the instruction decoder issues the appropriate select and class code signals to the address circuit (e.g., element 6011 of FIG. 60) to select the HPM register for the specified class code to source the address for a read access to a CAM array within one of the CAM blocks. A first predetermined time later, in block 7203, the instruction decoder signals a read circuit within the CAM device (e.g., element 6015 of FIG. 60) to sense data output from the CAM block and CAM array location selected by the address circuit.

Figure 73:
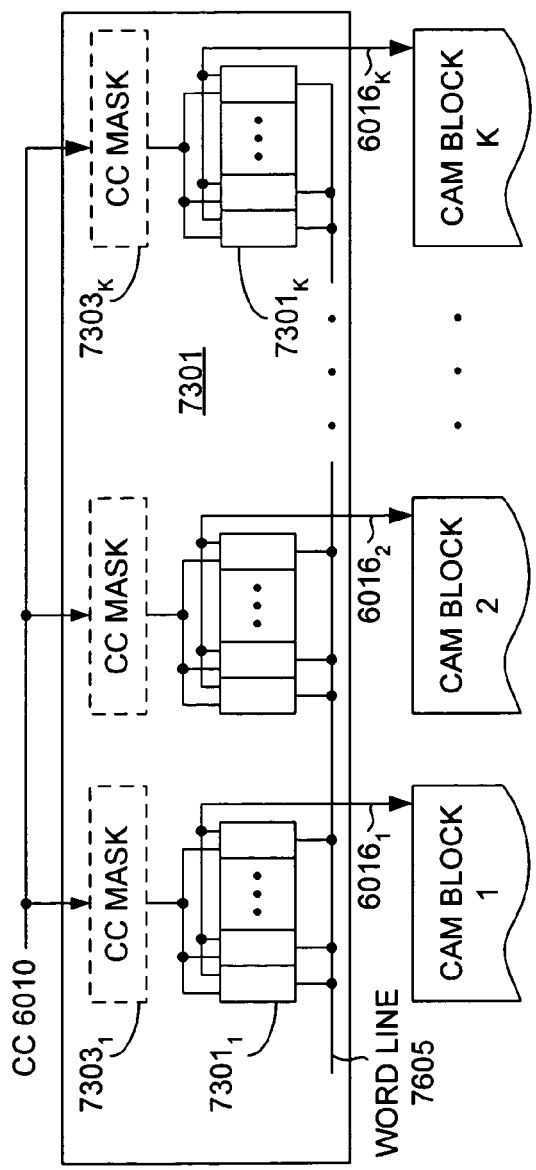
FIG. 73 depicts an alternative block select circuit which may be used in the CAM device of FIG. 60.

FIG. 73 depicts an alternative block select circuit 7301 which may be used in the CAM device of FIG. 60 to generate block select signals. The block select circuit 7302 includes a plurality of sets of CAM cells $7301_1$-$7301_K$ that are used to store block class values for respective CAM blocks 1-K, and to compare the block class values with an incoming class code 6010. In one embodiment, each set of CAM cells $7301_1$-$7301_K$ is coupled to a word line 7305 and also to respective sets of bit lines (not shown). Accordingly, when the word line 7305 is asserted, respective block class values are stored in the sets of CAM cells. In an alternative embodiment, each set of CAM cells $7301_1$-$7301_K$ may be coupled to a respective, dedicated word line and therefore may be individually addressed to store a block class value for the corresponding CAM block.

Still referring to FIG. 73, each set of CAM cells $7301_1$-$7301_K$ is coupled to a respective match line which is used to provide a block select signal 6016 to the corresponding CAM block. Thus, when an incoming class code 6010 is determined to match the contents of a given set of CAM cells $7301_1$-$7301_K$, a corresponding one of block select signals $6016_1$-$6016_K$ will be asserted on the corresponding match line. By this arrangement, the store and compare function of the CAM cells fulfills the functions of the block configuration registers 6205 and the comparator circuits 6207 of the block select circuit depicted in FIG. 62.

Figure 74:
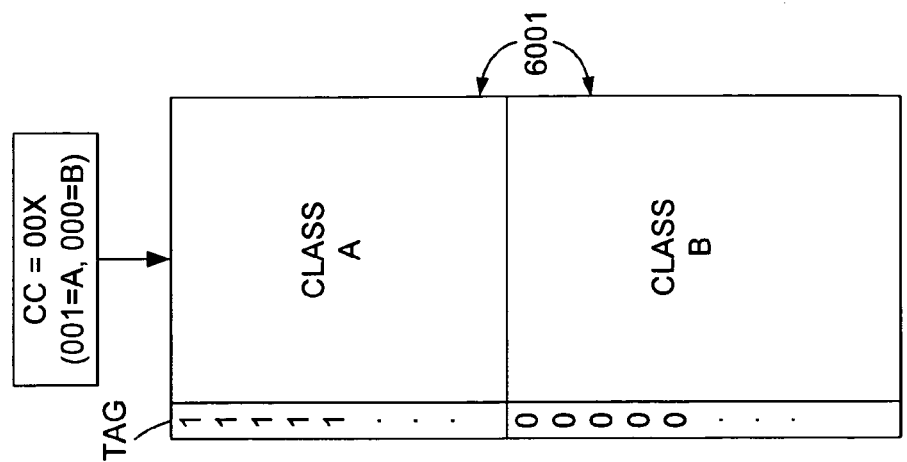
FIG. 74 depicts a CAM block having two classes of data stored therein.

In one embodiment each CAM cell in the sets of CAM cells $7301_1$-$7301_K$ is a ternary CAM cell capable of storing either a logical '1,' a logical '0,' or a mask state (i.e., don't care state). Accordingly, by setting a selected bit (or bits) of a block class value to the masked state, the block class value may be determined to match more than one class code. Referring to FIG. 74, for example, if two classes of data, class A and class B, are stored in a CAM array 6001, then the bit (or bits) used to distinguish between the two class codes may be masked so that the block 6001 is selected to participate in a compare operation directed to either class. In the example shown, the class code for class A is '001' and the class code for class B is '000.' Accordingly, by setting the least significant bit in the set of CAM cells 7301 that corresponds to block 6001 to the mask state, the stored block class value will be determined to match both the class A and class B class codes. One or more tag bits may be set within each CAM word stored in the block 6001 to designate the CAM word as belonging to either the class A or class B storage partition (note that while the class A and class B storage areas are depicted as distinct in FIG. 74, the CAM words within each storage class may be interspersed with one another). For example, if the most significant bit of each CAM word is used as a tag bit and set to '1' for class A and set to '0' for class B, then the corresponding most significant bit of an incoming comparand value will effectively select the storage class to be searched. That is, if the most significant bit of the incoming comparand is a '1,' then none of the class B entries will match the comparand, effectively excluding class B from the search. Conversely, if the most significant bit of the incoming comparand is a '0,' then none of the class A entries will match the comparand, effectively excluding class A from the search. Although shown in the leftmost bit position in FIG. 74, the tag bit(s) may be located in any bit position within a row or row segment.

Note that, instead of (or in addition to) using ternary CAM cells within the block select circuit 7302, a set of class code mask values $7303_1$-$7303_K$ may be applied to allow each (or any one) of the stored block class values to match multiple class codes. The class code mask values may be provided together with the class code 6010 or in a separate transmission. Also, instead of multiple class code mask values $7303_1$-$7303_K$, a single class code mask value may alternatively be applied to mask the class code 6010 before the class code is compared with the block class code values stored in the sets of CAM cells $7301_1$-$7301_K$.

System Structure and Operation

Figure 75:
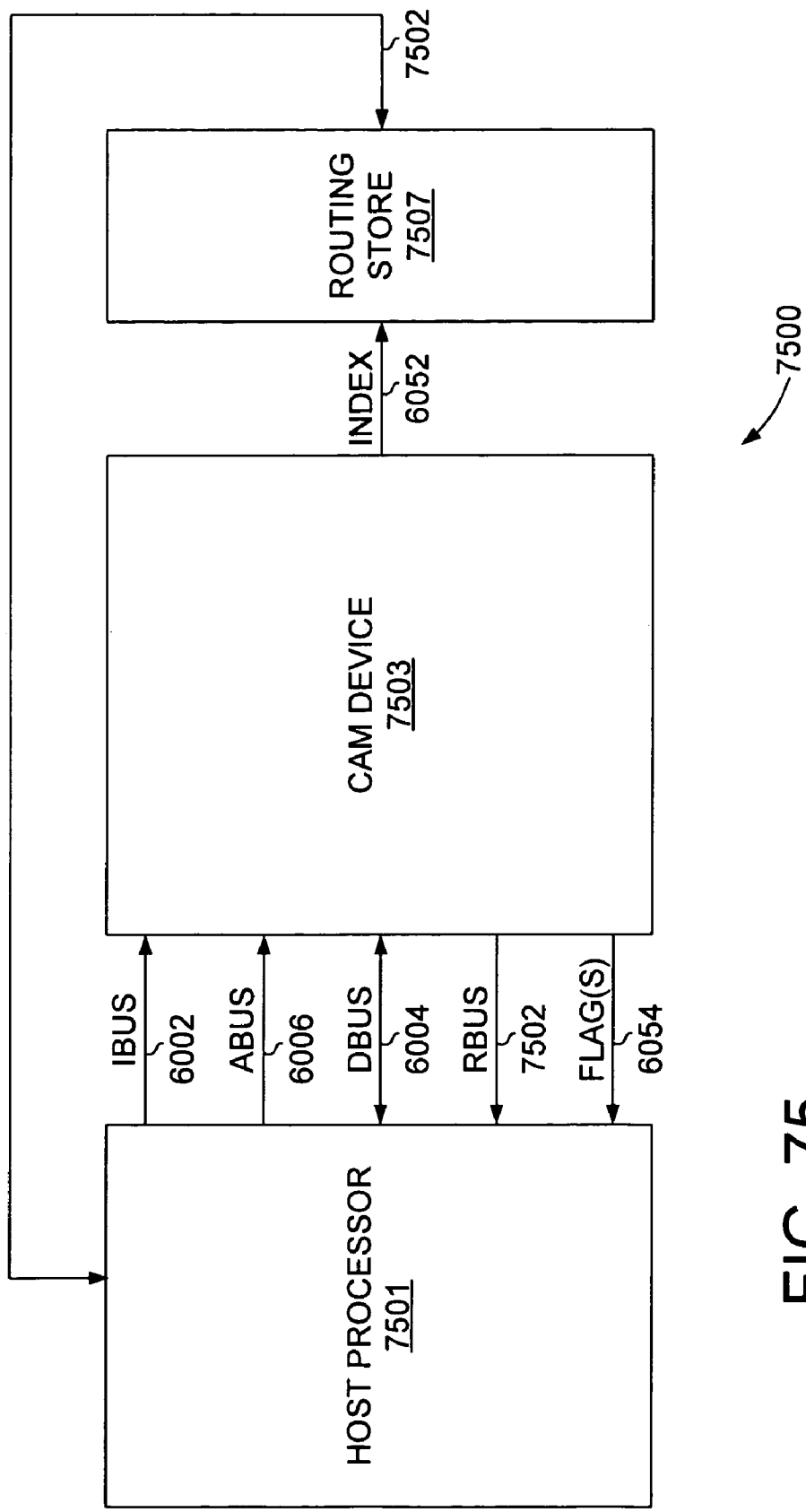
FIG. 75 illustrates a system that includes a processor and a CAM device according to an embodiment of the present invention.

FIG. 75 illustrates a system 7500 that includes a processor 7501 (e.g., general purpose processor, digital signal processor, network processor, application-specific integrated circuit (ASIC), etc.), CAM device 7503 according to one of the embodiments described herein, and routing store 7507. The system device may be, for example, a network switch or router, or any other type of device in which the compare capability of the CAM device 7503 may be useful.

The host processor 7501 issues addresses, comparands, and instructions to the CAM device 7503 via the address, data and instruction buses, respectively (i.e., ABUS 6006, DBUS 6004 and IBUS 6002), and receives status and other information from the CAM device 1701 via a result bus (RBUS 7502). In particular, the host processor 7501 issues instructions to program or otherwise select the word widths (i.e., array configurations), search modes, priority number sizes and other programmable or selectable features of one or more CAM blocks within the CAM device 7503, as discussed above. In the embodiment of FIG. 17, the flag signal 6054 (e.g., device-level match flag, multiple match flag, full flag, etc.) is output directly to the host processor 7501, however, the flag signal (or flag signals) may alternatively or additionally be output to the host processor 7501 via the result bus 149, for example in a status word. The device index 6052 may be output to an associated storage (e.g., routing store 7507, which may be included within the same integrated circuit (IC) or IC package as the CAM device 7503 and/or host processor 7501) and/or to the host processor 7501. The information output from the routing store 7507 (i.e., in response to the device index 6052) may be provided to the host processor 7501, or other processor or control device within the system 7500.

In alternative embodiments, one or more of the buses (e.g., ABUS, DBUS, IBUS, or RBUS) may be omitted and the corresponding information time multiplexed onto another of the buses. Further, the CAM device 7503 and host processor 7501 may be implemented in distinct integrated circuits (ICs) and packaged in distinct IC packages, or in a single IC (e.g., in an ASIC, system-on-chip, etc.), or in an IC package that includes multiple ICs (e.g., a multi-chip package, paper thin package, etc.).

In the foregoing specification the invention has been described with reference to specific exemplary embodiments thereof. It will, however, be evident that various modifications and changes may be made thereto without departing from the broader spirit and scope of the invention. The specification and drawings are, accordingly, to be regarded in an illustrative rather than restrictive sense.

What is claimed is:

1. A content addressable memory (CAM) device comprising:
   a plurality of CAM arrays;
   a plurality of configuration registers to store respective configuration values that control a logical storage depth and width of each of the plurality of CAM arrays; and
   a plurality of priority tables coupled respectively to the plurality of CAM arrays, each of the priority tables including circuitry to store a plurality of priority numbers that indicate relative priorities of entries within the corresponding CAM array.

2. The CAM device of claim 1 wherein each of the plurality of CAM arrays includes a plurality of rows of CAM cells, each of the rows of CAM cells including a plurality of row segments that include a respective portion of the CAM cells for the row, and wherein each of the configuration values indicates, for a corresponding one of the CAM arrays, a number N of the row segments that are applied to store a data word.

3. The CAM device of claim 1 wherein at least one of the CAM arrays comprises Y rows of CAM cells each segmented into Z row segments with W CAM cells per row segment, and wherein one of the configuration values that corresponds to the at least one of the CAM arrays indicates a logical storage depth and width that ranges at least from a depth of Y logical rows by a width of W×Z CAM cells to a depth of Y×Z logical rows by a width of W CAM cells, where 'x' denotes multiplication.

4. The CAM device of claim 1 wherein each of the configuration values further controls a logical storage depth of each of the priority tables such that the logical storage depth of each priority table matches the logical storage depth of the corresponding CAM array.

5. The CAM device of claim 1 further comprising a plurality of priority encoders coupled to the plurality of priority tables, each to output a respective block index value during a search operation within the CAM device.

6. The CAM device of claim 5 wherein each of the priority encoders is coupled to receive match signals from a corresponding one of the priority tables and the configuration value from a respective one of the configuration registers, each of the priority encoders including circuitry to combine groups of two or more of the match signals if the configuration value indicates a logical CAM array depth less than a maximum CAM array depth.

7. The CAM device of claim 5 wherein each of the priority tables further includes circuitry to compare the priority numbers stored within the priority table during a search operation to output, as a block priority number, a highest-priority priority number associated with an comparand-matching entry within the corresponding CAM array.

8. The CAM device of claim 7 further comprising a global priority encoder coupled to receive, during a search operation, the block priority numbers output from the plurality of priority tables and the block index values output from the plurality of priority encoders.

9. The CAM device of claim 8 wherein the global priority encoder includes circuitry to determine a highest-priority one of the block priority numbers and to output, as a match address, one of the block index values that corresponds to the highest-priority one of the block priority numbers and a value that indicates which of the CAM arrays sourced the one of the block index values.

10. The CAM device of claim 2 wherein each of the configuration registers includes storage circuitry to store a search-mode value that indicates a type of search to be performed within a corresponding one of the CAM arrays.

11. The CAM device of claim 10 wherein at least one of the types of search that may be indicated by the search-mode value is a longest-prefix match search.

12. The CAM device of claim 10 wherein at least one of the types of search that may be indicated by the search-mode value is a packet classification search.

13. The CAM device of claim 1 wherein each of the configuration registers includes storage circuitry to store a data-type value that indicates a type of data to be stored within a corresponding one of the CAM arrays.

14. A method of operation within a CAM device, the method comprising:
   storing configuration values within a plurality of configuration registers to define logical storage depths and widths for each of a plurality of CAM arrays; and
   storing priority numbers within a plurality of priority tables that correspond respectively to the plurality of CAM arrays, the priority numbers within each of the priority tables indicating relative priorities of entries within the corresponding CAM array.

15. The method of claim 14 wherein each of the plurality of CAM arrays includes a plurality of rows of CAM cells, each of the rows of CAM cells including a plurality of row segments that include a respective portion of the CAM cells for the row, and wherein storing configuration values within a plurality of configuration registers to define logical storage depths and widths for each of a plurality of CAM arrays comprises storing at least one configuration value that indicates, for a corresponding one of the CAM arrays, a number N of the row segments that are applied to store a data word.

16. The method of claim 14 wherein at least one of the CAM arrays comprises Y rows of CAM cells each segmented into Z row segments with W CAM cells per row segment, and wherein storing configuration values within a plurality of configuration registers to define logical storage depths and widths for each of a plurality of CAM arrays comprises storing at least one configuration value that indicates, for a corresponding one of the CAM arrays, a logical storage depth and width that ranges at least from a depth of Y logical rows by a width of W×Z CAM cells to a depth of Y×Z logical rows by a width of W CAM cells, where '×' denotes multiplication.

17. The method of claim 14 wherein each of the configuration values further controls a logical storage depth of each of the priority tables such that the logical storage depth of each priority table matches the logical storage depth of the corresponding CAM array.

18. The method of claim 14 further comprising:
performing a search operation within a first CAM array of the CAM arrays to generate a plurality of match signals that correspond respectively to the priority numbers stored within the priority table that corresponds to the first CAM array;
determining a highest-priority priority number from among the priority numbers for which the corresponding to match signals indicate a match detection; and
generating a block index that indicates a location within the first CAM array of an entry that corresponds to the highest-priority priority number.

19. The method of claim 18 further comprising outputting the highest-priority priority number from the priority table that corresponds to the first CAM array and comparing the highest-priority priority number with one or more highest-priority priority numbers output from other CAM arrays of the plurality of CAM arrays to determine a device priority number.

20. The method of claim 19 further comprising outputting, as a device index, a value that indicates which of the priority tables sourced the device priority number and one of a plurality of block indices selected according to the value that indicates which of the priority tables sourced the device priority number, the plurality of block indices including the block index that indicates the location within the first CAM array of the entry that corresponds to the highest-priority priority number.

21. The method of claim 14 further comprising storing in each of the configuration registers a value that indicates a type of search to be performed within a corresponding one of the CAM arrays.

22. The method of claim 14 further comprising storing in each of the configuration registers a value that indicates a type of data to be stored within a corresponding one of the CAM arrays.

23. A content addressable memory (CAM) device comprising:
a plurality of CAM arrays;
means for storing configuration values within a plurality of configuration registers to define logical storage depths and widths for each of the plurality of CAM arrays; and
means for storing a plurality of sets of priority numbers, each set of priority numbers to indicate relative priorities of entries within a respective one of the CAM arrays.

* * * * *

UNITED STATES PATENT AND TRADEMARK OFFICE
CERTIFICATE OF CORRECTION

PATENT NO. : 7,246,198 B2 Page 1 of 1
APPLICATION NO. : 11/154066
DATED : July 17, 2007
INVENTOR(S) : Bindiganavale S. Nataraj It is certified that error appears in the above-identified patent and that said Letters Patent is hereby corrected as shown below:

In the Claims:

Claim 10, Column 80, Line 32, "The CAM device of claim 2" replace with --The CAM device of claim 1--.

Signed and Sealed this

Second Day of October, 2007

JON W. DUDAS
*Director of the United States Patent and Trademark Office*